US010200077B2

(12) United States Patent
Liu et al.

(10) Patent No.: US 10,200,077 B2
(45) Date of Patent: *Feb. 5, 2019

(54) SHIELDED DIVERSITY RECEIVE MODULE

(71) Applicant: SKYWORKS SOLUTIONS, INC., Woburn, MA (US)

(72) Inventors: Yi Liu, San Diego, CA (US); Anthony James Lobianco, Irvine, CA (US); Matthew Sean Read, Foothill Ranch, CA (US); Hoang Mong Nguyen, Fountain Valley, CA (US); Howard E. Chen, Anaheim, CA (US); Stephane Richard Marie Wloczysiak, Irvine, CA (US); William J. Domino, Yorba Linda, CA (US); Bipul Agarwal, Irvine, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/582,291

(22) Filed: Apr. 28, 2017

(65) Prior Publication Data

US 2017/0317710 A1 Nov. 2, 2017

Related U.S. Application Data

(60) Provisional application No. 62/330,046, filed on Apr. 29, 2016.

(51) Int. Cl.
H04B 1/46 (2006.01)
H04B 1/48 (2006.01)
(Continued)

(52) U.S. Cl.
CPC ............. *H04B 1/48* (2013.01); *H04B 1/0057* (2013.01); *H04B 1/0458* (2013.01);
(Continued)

(58) Field of Classification Search
CPC ........... H04B 1/48; H01Q 1/523; H01Q 1/526
(Continued)

(56) References Cited

U.S. PATENT DOCUMENTS 5,105,167 A * 4/1992 Peczalski ................ H03F 3/601
330/286
5,937,361 A * 8/1999 Smith ..................... H04B 15/00
455/351

(Continued)

*Primary Examiner* — Eugene Yun
(74) *Attorney, Agent, or Firm* — Chang & Hale LLP

(57) ABSTRACT

Described herein are radio-frequency (RF) modules that include shielding for improved RF performance. The RF modules including a packaging substrate with a receiving system implemented thereon. The RF module includes a shield implemented to provide RF shielding for at least a portion of the receiving system. The receiving system can include any combination of pre-amplifier or post-amplifier bandpass filters, amplifiers, switching networks, impedance matching components, phase-shifting components, input multiplexers, and output multiplexers. The shielding can include a conductive layer within a conformal shielding on an upper side and side walls of the RF module. The shielding can be an overmold formed over the packaging substrate. The conductive layer can be connected to one or more ground planes. The packaging substrate can include contact features on an underside of the substrate for mounting an underside component.

16 Claims, 111 Drawing Sheets

(51) Int. Cl.
    *H04B 1/00*     (2006.01)
    *H04B 1/04*     (2006.01)
    *H01Q 1/52*     (2006.01)

(52) U.S. Cl.
    CPC ....... *H01L 2224/11* (2013.01); *H01L 2224/97* (2013.01); *H01Q 1/523* (2013.01); *H01Q 1/526* (2013.01)

(58) Field of Classification Search
    USPC .......................................................... 455/79
    See application file for complete search history.

(56)               References Cited

U.S. PATENT DOCUMENTS

| | | | |
|---|---|---|---|
| 9,825,660 B2 * | 11/2017 | Wloczysiak | H04B 1/18 |
| 2013/0159587 A1 * | 6/2013 | Nygren | G11C 5/063 |
| | | | 710/306 |

\* cited by examiner

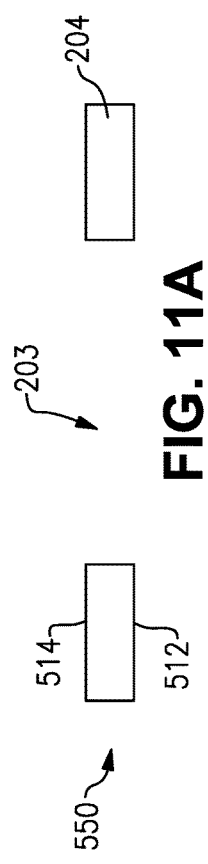
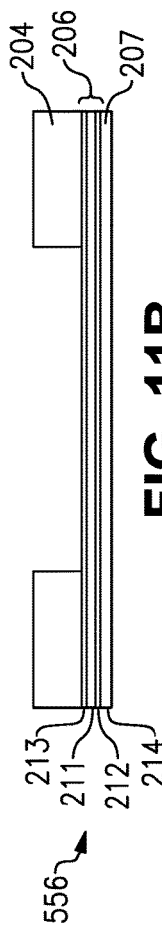
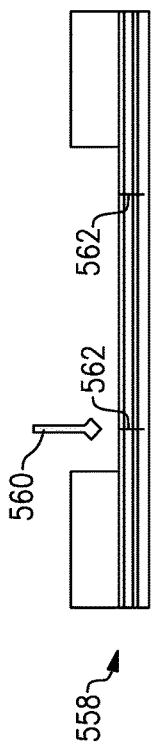
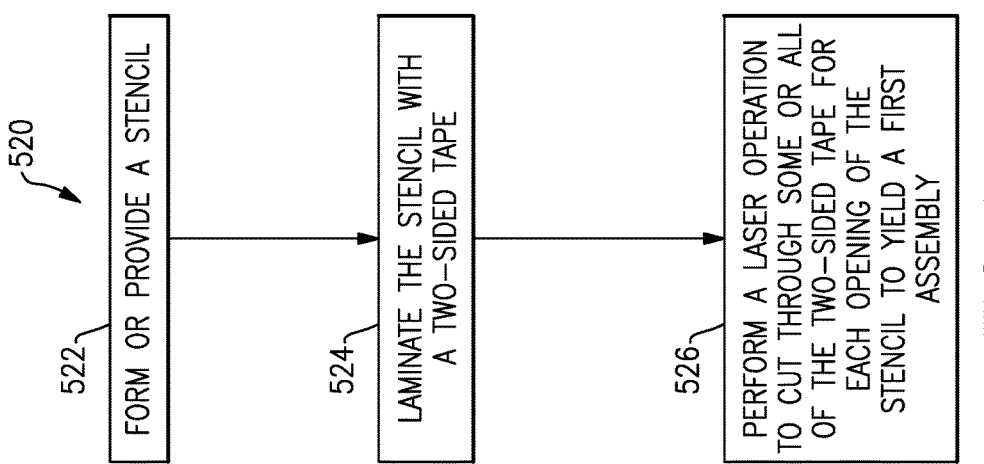

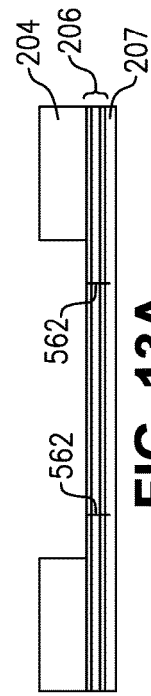
FIG. 13A
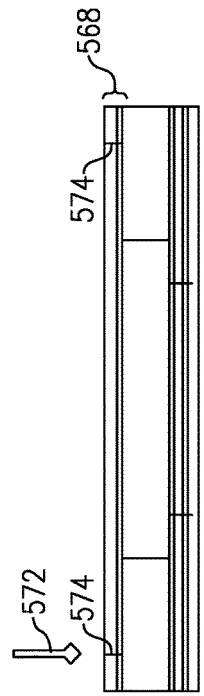
FIG. 13B
FIG. 13C
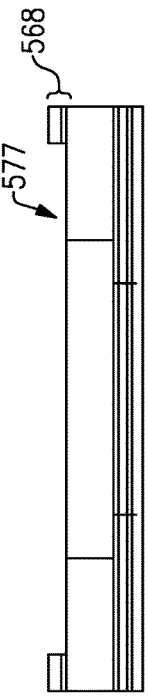
FIG. 13D
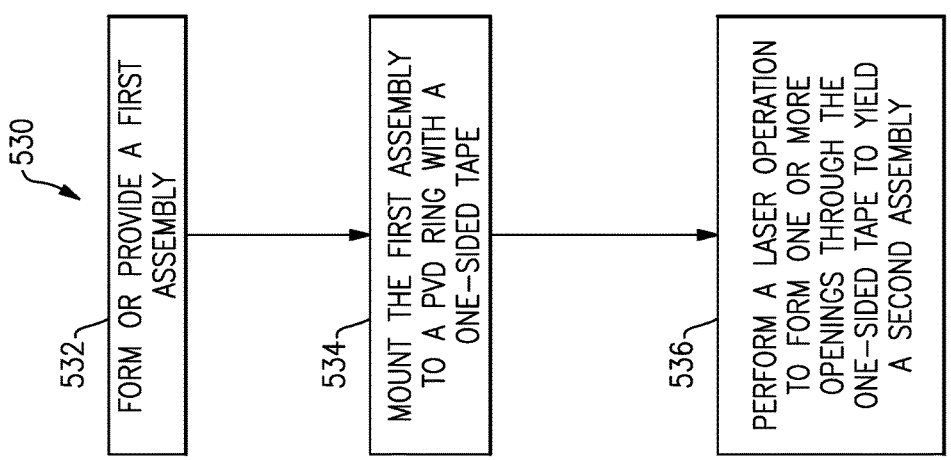
FIG. 12

SHIELDED DIVERSITY RECEIVE MODULE

CROSS-REFERENCE TO RELATED APPLICATIONS

This application claims priority to U.S. Prov. App. No. 62/330,046 filed April 29, 2016 and entitled "SHIELDED DIVERSITY RECEIVE MODULE," which is expressly incorporated by reference herein in its entirety for all purposes.

BACKGROUND

Field

The present disclosure generally relates to electronic modules with shielding such as shielded radio-frequency (RF) modules, and relates in particular to shielded diversity receive modules.

Description of Related Art

In wireless communication applications, size, cost, and performance are examples of factors that can be important for a given product. For example, to increase performance, wireless components such as a diversity receive antenna and associated circuitry are becoming more popular.

In many radio-frequency (RF) applications, a diversity receive antenna is placed physically far from a primary antenna. When both antennas are used at once, a transceiver can process signals from both antennas in order to increase data throughput.

In such RF applications, RF circuits and related devices can be implemented in a packaged module. Such a packaged module can include shielding functionality to inhibit or reduce electromagnetic interference associated with some or all of such RF circuits.

SUMMARY

According to a number of implementations, the present disclosure relates to a radio-frequency (RF) module that includes a packaging substrate configured to receive a plurality of components. The RF module also includes a receiving system implemented relative to the packaging substrate, the receiving system including a controller configured to selectively activate one or more of a plurality of paths between an input of the receiving system and an output of the receiving system. The receiving system also includes a plurality of amplifiers, each one of the plurality of amplifiers disposed along a corresponding one of the plurality of paths and configured to amplify a signal received at the amplifier. The receiving system also includes one or more of a first feature, a second feature, a third feature, a fourth feature, a fifth feature, and a sixth feature, implemented for the RF receiving system. The first feature includes a plurality of bandpass filters, each one of the plurality of bandpass filters disposed along a corresponding one of the plurality of paths and configured to filter a signal received at the bandpass filter to a respective frequency band, and at least some of the plurality of amplifiers implemented as a plurality of variable-gain amplifiers (VGAs), each one of the plurality of VGAs configured to amplify the corresponding signal with a gain controlled by an amplifier control signal received from the controller. The second feature includes a plurality of phase-shift components, each one of the plurality of phase-shift components disposed along a corresponding one of the plurality of paths and configured to phase-shift a signal passing through the phase-shift component. The third feature includes a plurality of impedance matching components, each one of the plurality of impedance matching components disposed along a corresponding one of the plurality of paths and configured to reduce at least one of an out-of-band noise figure or an out-of-band gain of the one of the plurality of paths. The fourth feature includes a plurality of post-amplifier bandpass filters, each one of the plurality of post-amplifier bandpass filters disposed along a corresponding one of the plurality of paths at an output of a corresponding one of the plurality of amplifiers and configured to filter a signal to a respective frequency band. The fifth feature includes a switching network having one or more single-pole/single-throw switches, each one of the switches coupling two of the plurality of paths, the switching network configured to be controlled by the controller based on a band select signal. The sixth feature includes an input multiplexer configured to receive one or more RF signals at one or more input multiplexer inputs and to output each of the one or more RF signals to one or more of a plurality of input multiplexer outputs to propagate along a respective one or more of the plurality of paths, and an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs. The RF module also includes a shield implemented to provide RF shielding for at least a portion of the receiving system.

In some embodiments, the shield includes a conformal shield implemented on an upper side and side walls of the RF module. In some embodiments, the shield includes an overmold formed over the packaging substrate. In further embodiments, the overmold includes a conductive layer on an upper surface of the overmold. In further embodiments, side walls of the overmold include the conductive layer. In further embodiments, the conductive layer is electrically connected to one or more ground planes implemented within the packaging substrate. In further embodiments, the electrical connection between the conductive layer and the one or more ground planes is made through one or more conductive features that are implemented within the packaging substrate and partially exposed to the corresponding side walls.

In some embodiments, an underside of the packaging substrate is configured for a circuit board to be mounted thereon. In further embodiments, the packaging substrate includes a plurality of contact features formed on the underside of the packaging substrate, the plurality of contact features configured to provide mounting and electrical connection functionalities to the RF module.

In some embodiments, an underside of the packaging substrate is configured for an underside component to be mounted thereon. In some embodiments, the RF module further includes an underside component mounted to the underside of the packaging substrate. In further embodiments, the underside of the packaging substrate includes an array of solder balls. In further embodiments, a circuit board mounted to the underside of the packaging substrate using the array of solder balls.

In some embodiments, the RF receiving system includes a combination of at least two of the first feature, the second feature, the third feature, the fourth feature, the fifth feature, or the sixth feature. In some embodiments, the RF receiving system includes a combination of at least three of the first feature, the second feature, the third feature, the fourth feature, the fifth feature, or the sixth feature. In some embodiments, the RF receiving system includes a combination of at least four of the first feature, the second feature, the third feature, the fourth feature, the fifth feature, or the sixth feature. In some embodiments, the RF receiving system includes a combination of at least five of the first feature, the second feature, the third feature, the fourth feature, the fifth feature, or the sixth feature. In some embodiments, the RF receiving system includes the first feature, the second feature, the third feature, the fourth feature, the fifth feature, and the sixth feature.

According to a number of implementations, the present disclosure relates to a wireless device that includes a first antenna configured to receive one or more radio-frequency (RF) signals. The wireless device also includes a first front-end module (FEM) in communication with the first antenna, the first FEM including a packaging substrate configured to receive a plurality of components. The first FEM further includes a receiving system implemented on the packaging substrate. The receiving system includes a controller configured to selectively activate one or more of a plurality of paths between an input of the receiving system and an output of the receiving system. The receiving system also includes a plurality of amplifiers, each one of the plurality of amplifiers disposed along a corresponding one of the plurality of paths and configured to amplify a signal received at the amplifier. The receiving system also includes one or more of a first feature, a second feature, a third feature, a fourth feature, a fifth feature, and a sixth feature, implemented for the RF receiving system. The first feature includes a plurality of bandpass filters, each one of the plurality of bandpass filters disposed along a corresponding one of the plurality of paths and configured to filter a signal received at the bandpass filter to a respective frequency band, and at least some of the plurality of amplifiers implemented as a plurality of variable-gain amplifiers (VGAs), each one of the plurality of VGAs configured to amplify the corresponding signal with a gain controlled by an amplifier control signal received from the controller. The second feature includes a plurality of phase-shift components, each one of the plurality of phase-shift components disposed along a corresponding one of the plurality of paths and configured to phase-shift a signal passing through the phase-shift component. The third feature includes a plurality of impedance matching components, each one of the plurality of impedance matching components disposed along a corresponding one of the plurality of paths and configured to reduce at least one of an out-of-band noise figure or an out-of-band gain of the one of the plurality of paths. The fourth feature includes a plurality of post-amplifier bandpass filters, each one of the plurality of post-amplifier bandpass filters disposed along a corresponding one of the plurality of paths at an output of a corresponding one of the plurality of amplifiers and configured to filter a signal to a respective frequency band. The fifth feature includes a switching network having one or more single-pole/single-throw switches, each one of the switches coupling two of the plurality of paths, the switching network configured to be controlled by the controller based on a band select signal. The sixth feature includes an input multiplexer configured to receive one or more RF signals at one or more input multiplexer inputs and to output each of the one or more RF signals to one or more of a plurality of input multiplexer outputs to propagate along a respective one or more of the plurality of paths, and an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs. The wireless device also includes a shield implemented to provide RF shielding for at least a portion of the receiving system. The wireless device also includes a transceiver configured to receive a processed version of the one or more RF signals from the receiving system and generate data bits based on the processed version of the one or more RF signals.

In some embodiments, the wireless device is a cellular phone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 10 shows an example process where a two-sided tape is mated to a bare stencil to yield a first assembly.

FIGS. 11A, 11B and 11C show example states associated with the process of FIG. 10.

FIG. 12 shows an example process where the first assembly of FIG. 10 is mounted to a PVD ring to yield a second assembly.

FIGS. 13A, 13B, 13C and 13D show example states associated with the process of FIG. 12.

FIGS. 124A and 124B show that in some embodiments, a diversity receiver configuration may include one or more features of Example D as described herein and one or more features of Example E as described herein.

FIG. 125 shows that in some embodiments, a diversity receiver configuration may include one or more features of Example A as described herein and one or more features of Example F as described herein.

FIG. 126 shows that in some embodiments, a diversity receiver configuration may include one or more features of Example B as described herein and one or more features of Example F as described herein.

FIG. 127 shows that in some embodiments, a diversity receiver configuration may include one or more features of Example C as described herein and one or more features of Example F as described herein.

FIG. 128 shows that in some embodiments, a diversity receiver configuration may include one or more features of Example D as described herein and one or more features of Example F as described herein.

FIG. 129 shows that in some embodiments, a diversity receiver configuration may include one or more features of Example E as described herein and one or more features of Example F as described herein.

FIG. 130 shows that in some embodiments, a diversity receiver configuration may include one or more features of Example A as described herein, one or more features of Example E as described herein, and one or more features of Example F as described herein.

FIG. 131 shows that in some embodiments, a diversity receiver configuration may include one or more features of Example B as described herein, one or more features of Example E as described herein, and one or more features of Example F as described herein.

FIG. 132 shows that in some embodiments, a diversity receiver configuration may include one or more features of Example C as described herein, one or more features of Example E as described herein, and one or more features of Example F as described herein.

FIG. 133 shows that in some embodiments, a diversity receiver configuration may include one or more features of Example D as described herein, one or more features of Example E as described herein, and one or more features of Example F as described herein.

FIG. 134 shows that in some embodiments, a diversity receiver configuration having one or more features as described herein may be implemented in a module such as a diversity receive (DRx) module.

FIG. 135 shows a diversity receiver architecture having one or more features as described herein.

Figure 136:
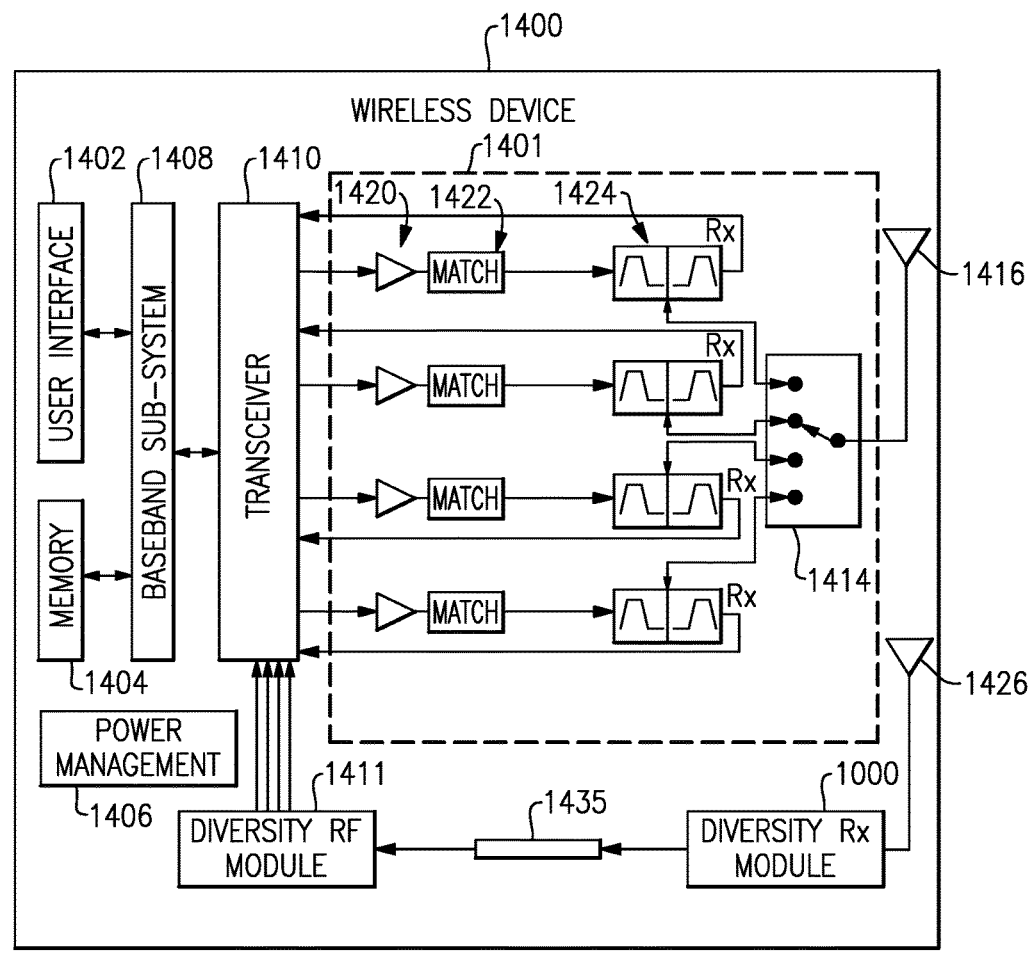

FIG. 136 shows a wireless device having one or more features as described herein.

DETAILED DESCRIPTION OF SOME EMBODIMENTS

The headings provided herein, if any, are for convenience only and do not necessarily affect the scope or meaning of the claimed invention.

Overview of Shielded DRx Modules

In some wireless applications, a diversity receive (DRx) functionality can be implemented to process a radio-frequency (RF) signal received through a diversity antenna. Since such an RF signal received through the diversity antenna is relatively weak, it is preferable to process the RF signal relatively close to the diversity antenna to, for example, reduce loss, reduce introduction of noise, etc.

In some wireless applications, the foregoing processing of the weak RF signal can also suffer from electromagnetic interference (EMI). In some situations, such an EMI can originate from a source external to a DRx module and impact one or more circuits within the DRx module. In some situations, such an EMI can originate from within a DRx module and impact one or more circuits within the DRx module, one or more circuits external to the DRx module, or both. Thus, in many wireless applications, shielding can be implemented for a DRx module.

Figure 1:
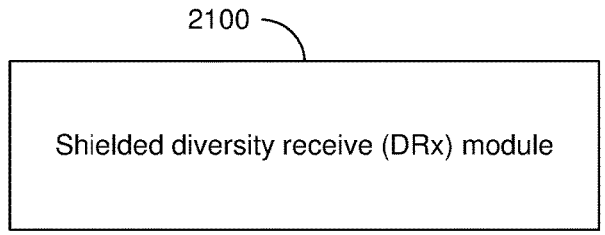
FIG. 1 depicts a diversity receive (DRx) module having a radio-frequency (RF) shielding feature.

FIG. 1 depicts a diversity receive (DRx) module 2100 having a radio-frequency (RF) shielding feature. Various examples related to such a shielded DRx module are disclosed herein. For the purpose of description, it will be understood that RF shielding, EMI shielding, simply shielding, or some variations thereof may be used interchangeably.

Figure 2:
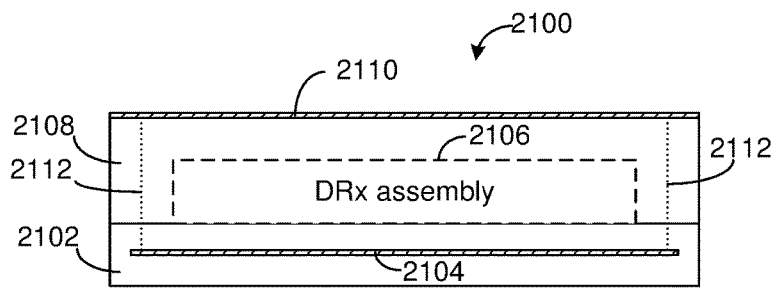
FIG. 2 illustrates an example RF shielding configuration that includes a DRx assembly implemented on a packaging substrate with an overmold formed over the packaging substrate.
Figure 3:
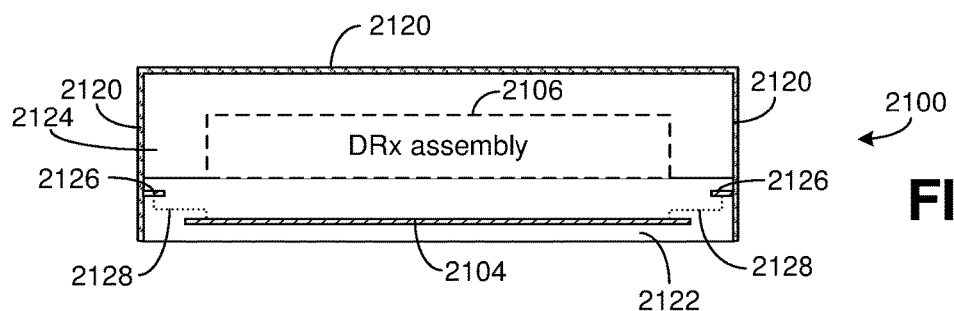
FIG. 3 illustrates an example RF shielding configuration with an overmold formed over the packaging substrate and an underside of a shielded DRx module being configured to allow mounting on a circuit board.
Figure 4:
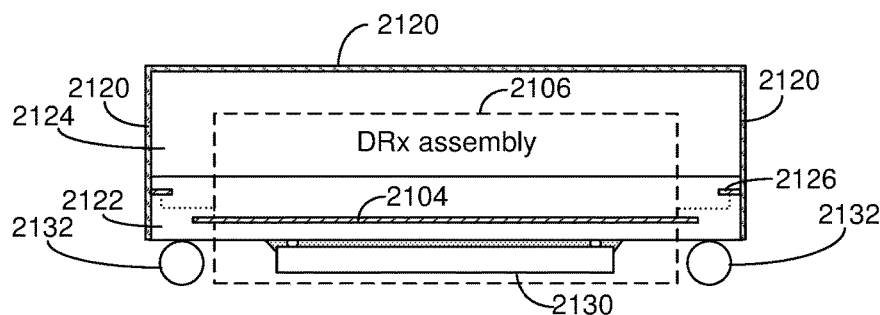
FIG. 4 illustrates an example RF shielding configuration with an overmold formed over the packaging substrate and an underside of a shielded DRx module being configured to allow mounting of an underside component.

FIGS. 2-4 show examples of RF shielding configurations. In FIG. 2, a shielded DRx module 2100 can include a DRx assembly 2106 implemented on a packaging substrate 2102. Examples related to the DRx assembly 2106 are disclosed herein in greater detail. It will be understood that in some embodiments, some of the DRx assembly 2106 may or may not be implemented within the packaging substrate 2102.

In the example of FIG. 2, an overmold 2108 can be formed over the packaging substrate 2102 to encapsulate various components mounted on the packaging substrate. In some embodiments, a conductive layer 2110 can be implemented on an upper surface of the overmold 2108. Such a conductive layer can be electrically connected to one or more ground planes (depicted as 2104) implemented within the packaging substrate 2102. In FIG. 2, such an electrical connection between the conductive layer 2110 and the ground plane 2104 is depicted as dotted lines 2112.

In some embodiments, the electrical connection 2112 between the conductive layer 2110 and the ground plane 2104 can be provided through one or more surface mount devices, through one or more shielding-wirebonds, or some combination thereof. Examples related to such surface mount devices and shielding-wirebonds are described in greater detail in U.S. Pat. Pub. No. 2014/0308907, published Oct. 16, 2014 and entitled "Apparatus and Methods Related to Ground Paths Implemented with Surface Mount Devices," and U.S. Pat. Pub. No. 2016/0014935, published Jan. 14, 2016 and entitled "Methods Related to Packaged Modules Having Tuned Shielding," each of which is expressly incorporated herein by reference in its entirety for all purposes.

In the example of FIG. 2, shielding functionality can be provided by the conductive layer 2110, the ground plane 2104, and the electrical connection(s) 2112.

In FIGS. 3 and 4, a shielded DRx module 2100 can include a DRx assembly 2106 implemented at least partially on a packaging substrate 2122. Examples related to the DRx assembly 2106 are disclosed herein in greater detail. It will be understood that in some embodiments, some of the DRx assembly 2106 may or may not be implemented within the packaging substrate 2122.

In the examples of FIGS. 3 and 4, an overmold 2124 can be formed over the packaging substrate 2122 to encapsulate various components mounted on the packaging substrate. In some embodiments, a conductive layer 2120 can be implemented on an upper surface of the overmold 2124 and side walls associated with the overmold 2124 and the packaging substrate 2122. Such a conductive layer can be electrically connected to one or more ground planes (depicted as 2104) implemented within the packaging substrate 2122. In FIGS. 3 and 4, such an electrical connection between the conductive layer 2120 and the ground plane 2104 can be made through one or more conductive features 2126 that are implemented within the packaging substrate 2122 and partially exposed to their corresponding side walls. Examples related to such conductive features (2126) are described in greater detail in U.S. Pat. Pub. No. 2016/0073490, published Mar. 10, 2016 and entitled "Devices and Methods Related to Metallization of Ceramic Substrates for Shielding Applications," which is expressly incorporated herein by reference in its entirety for all purposes.

In the examples of FIGS. 3 and 4, the conductive features 2126 are depicted as being electrically connected to the ground plane 2104 through electrical connections 2128. It will be understood that such electrical connections can be implemented in a number of different ways.

In the example of FIG. 3, an underside of the shielded DRx module 2100 can be configured to allow mounting on a circuit board such as a phone board. For example, a plurality of contact features can be formed on the underside of the packaging substrate 2122 to provide mounting and electrical connection functionalities for the shielded DRx module 2100.

In the example of FIG. 4, an underside of the packaging substrate 2122 can be configured to allow mounting of an underside component 2130. Such an underside component 2130 can be included as part of the shielded DRx module 2100, and such a shielded DRx module can be mounted to a circuit board (e.g., a phone board), with use of an array of solder balls 2132 (e.g., implemented as a ball grid array (BGA)).

In the example of FIG. 4, some or all of the underside component(s) 2130 can be part of the DRx assembly 2106.

In some embodiments, the conductive layer 2120 of the examples of FIGS. 3 and 4 can be implemented as a conformal shielding layer. Examples related to how such conformal shielding layer can be applied to a plurality of singulated devices (e.g., unfinished modules of FIGS. 3 and 4 without the conductive layer 2120), as well as the dual-sided packing configuration of FIG. 4, are described in greater detail herein and in particular with reference to FIGS. 7-36.

Figure 5:
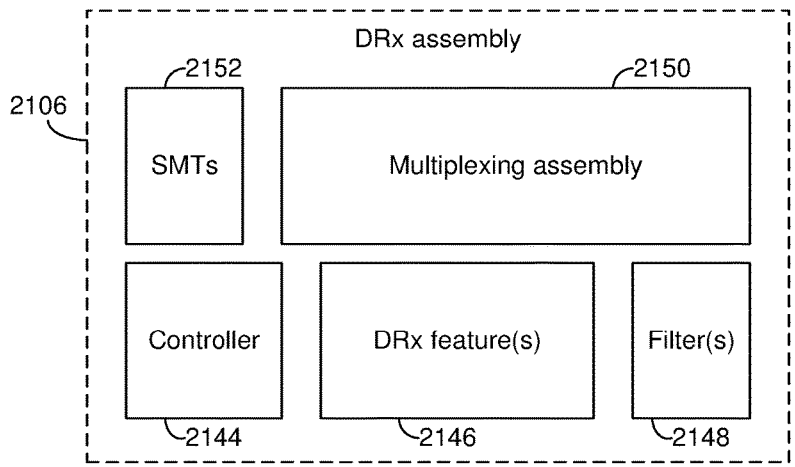
FIG. 5 illustrates an example DRx assembly.

FIG. 5 shows that in some embodiments, the DRx assembly 2106 of FIGS. 2-4 can be implemented as a DRx assembly 2106 having a controller 2144, one or more DRx features 2146, one or more filters or filter-based devices 2148, a multiplexing assembly 2150, and one or more SMT components 2152. Among others, described herein are Examples A-F, and how various combinations of such Examples can be implemented. In the example of FIG. 5, the DRx assembly 2106 can include any individual Example or a combination having two or more of the Examples.

In some implementations, a device and/or a circuit having one or more features described herein can be included in an RF electronic device such as a wireless device. In some embodiments, such a wireless device can include, for example, a cellular phone, a smart-phone, a hand-held wireless device with or without phone functionality, a wireless tablet, etc.

Figure 6:
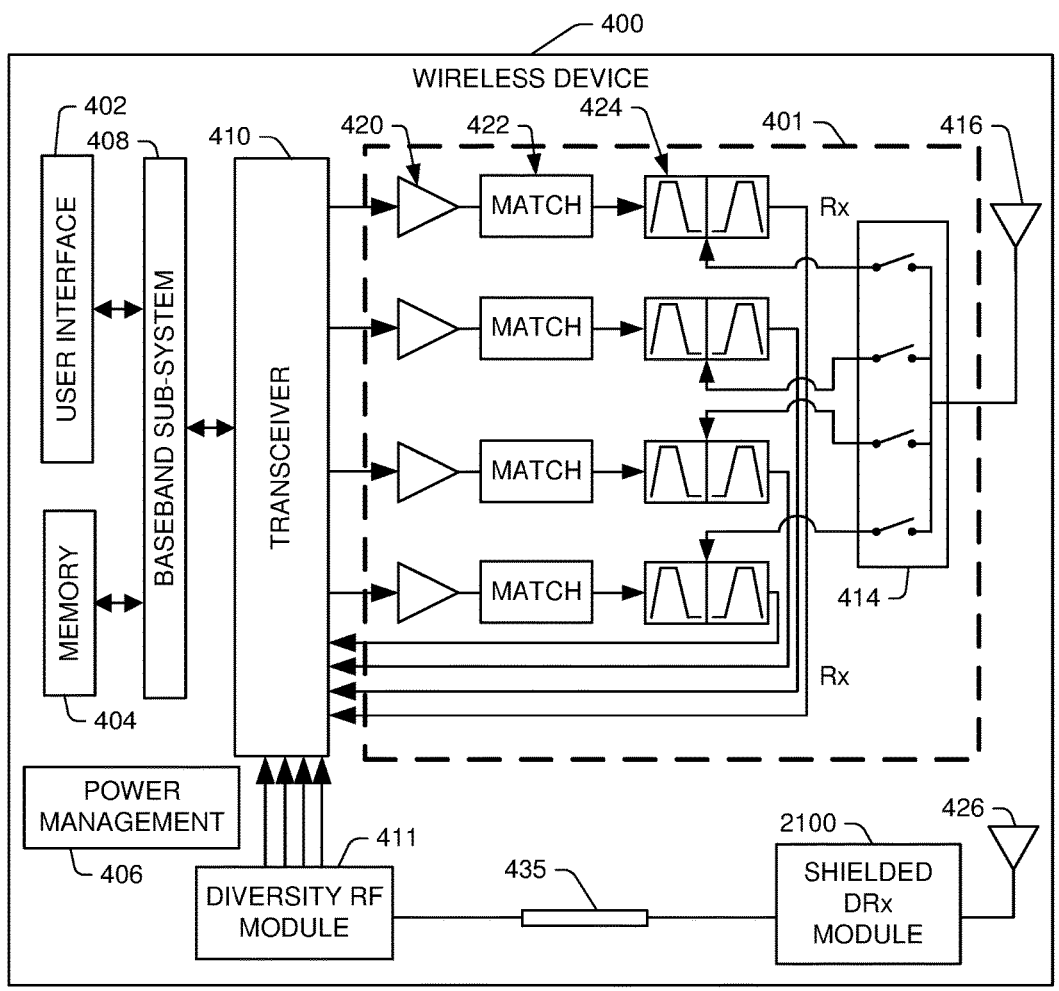
FIG. 6 illustrates an example wireless device having one or more advantageous features described herein.

FIG. 6 depicts an example wireless device 400 having one or more advantageous features described herein. In the example of FIG. 6, a shielded DRx module 2100 having one or more features of the present disclosure can be implemented close to a diversity antenna 426.

Referring to FIG. 6, power amplifiers (PAs) 420 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 424. Such amplified and filtered signals can be routed to a primary antenna 416 through an antenna switch 414 for transmission. In some embodiments, the duplexers 424 can allow transmit and receive operations to be performed simultaneously using a common antenna (e.g., primary antenna 416). In FIG. 6, received signals are shown to be routed to "Rx" paths that can include, for example, a low-noise amplifier (LNA).

In the example of FIG. 6, the wireless device 400 also includes the diversity antenna 426 and the shielded DRx module 2100 that receives signals from the diversity antenna 426. The shielded DRx module 100 processes the received signals and transmits the processed signals via a transmission line 435 to a diversity RF module 411 that further processes the signal before feeding the signal to the transceiver 410.

Examples of Fabrication of Shielded RF Modules

Figure 7:
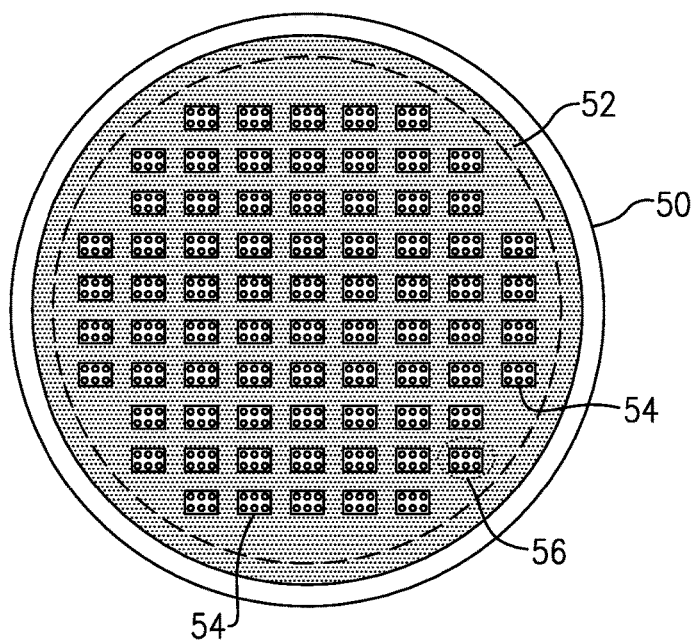
FIG. 7 shows an underside view of an example assembly that includes a ring having a tape attached to its underside, and an array of packaged devices mounted on the tape.

FIG. 7 shows an underside view of an example assembly that includes a ring 50 having a tape 52 attached to its underside. A region of the tape 52 within the inner boundary of the ring 50 is shown to have mounted thereon an array of devices 54 such as packaged devices. The ring 50 can be dimensioned to be mounted on an apparatus such as, for example, a physical vapor deposition (PVD) machine, to allow a PVD process to be performed on the upper side of the assembly.

Figures 8A, 8B:
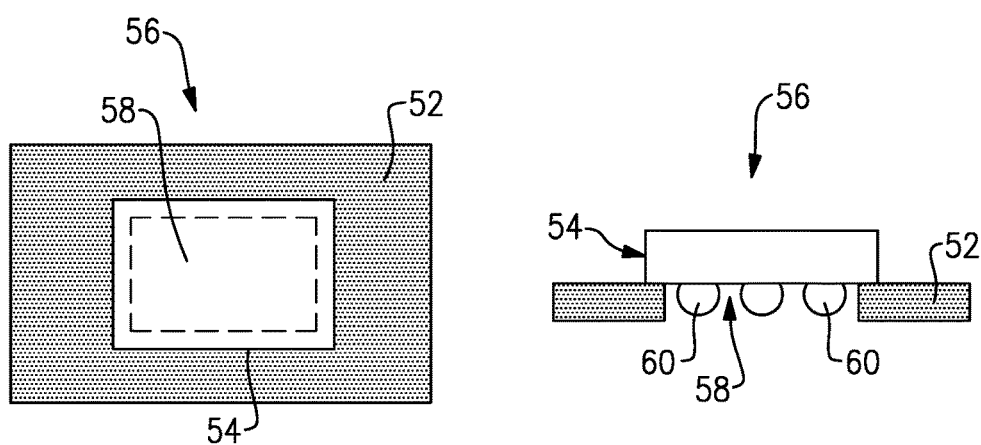
FIG. 8A shows an enlarged upper-side plan view of a portion of FIG. 7.
FIG. 8B shows an enlarged side sectional view of the same portion of FIG. 7.

In the example of FIG. 7, a portion indicated as 56 and representative of a packaged device 54 and its relation to the tape 52, is shown in greater detail in FIGS. 8A and 2B. FIG. 8A shows an enlarged upper-side plan view of the portion 56 of FIG. 7, and FIG. 8B shows an enlarged side sectional view of the same portion 56. The packaged device 54 is shown to include one or more irregular features or topography such as solder balls 60. Such a packaged device is shown to be mounted onto the upper surface of the tape 52. As shown in FIG. 7, the upper surface of the peripheral portion of the tape 52 is also shown to be attached to the underside of the ring 50.

In the example shown in FIGS. 8A and 8B, the irregular features or topography such as the solder balls 60 are shown to be accommodated by an opening 58 defined by the tape 52. Accordingly, the packaged device 54 can be held by the tape 52 such that the side walls and the upper surface of the packaged device 54 are generally exposed to the upper side of the assembly. In such a configuration, a deposition process such as a PVD process performed on the upper side of the assembly can result in conformal coating of material (e.g., conductive material such as metal) onto the side walls and the upper side of the packaged device 54, while the lower side (including the solder balls 60) generally remains uncoated during the PVD process. As described herein, such conformal coating of the packaged device 54 can provide radio-frequency (RF) shielding functionality.

In the example of FIGS. 7, 8A and 8B, the tape 52 is typically sufficiently flexible such that mechanical issues may arise. For example, when the array of packaged devices 54 are loaded onto the tape 52, the extra weight may cause the tape 52 to sag and thereby deviated from a generally planar configuration of the assembly. Such sagging can affect uniformity of coating resulting from the PVD process. Such sagging can also impact how the packaged devices 54 are handled during the loading (e.g., before the PVD process) and unloading (e.g., after the PVD process) steps.

Described herein are various examples of how a stencil can be utilized to hold devices (e.g., packaged devices) during a packaging fabrication process (e.g., a PVD process to form a conformal shielding layer). Such a stencil can be configured to provide a more stable platform than the tape example of FIGS. 7, 8A and 8B, for holding of the devices to be worked on. As also described herein, such a stencil can be assembled with a device such as a PVD ring to yield an assembly that benefits from the stability of the stencil as well as being able to utilize an existing PVD machine.

Among others, various examples related to stencils for holding packaged devices are described in PCT Application No. PCT/US2016/054652 titled DEVICES AND METHODS RELATED TO FABRICATION OF SHIELDED MODULES which is expressly incorporated herein by reference in its entirety, and its disclosure is to be considered part of the specification of the present application for all purposes. Among others, various examples related to packaged devices having irregular features such as solder balls are described in U.S. Publication No. 2016/0099192 titled DUAL-SIDED RADIO-FREQUENCY PACKAGE HAVING BALL GRID ARRAY which is expressly incorporated herein by reference in its entirety, and its disclosure is to be considered part of the specification of the present application for all purposes.

It is noted that in some embodiments, a packaged device such as a dual-sided package having a ball grid array disclosed in U.S. Publication No. 2016/0099192 can be configured with a packaging substrate having conductive features exposed on its side walls. Such conductive features can be electrically connected to a ground plane within the packaging substrate. Thus, a conformal shielding layer formed as described herein on the upper surface and the side wall surfaces of the packaged device is electrically connected to the ground plane through the conductive features, to thereby provide RF shielding functionality for the packaged device.

FIGS. 9A-9D show an example of how one or more features described in PCT Application No. PCT/US2016/054652 can be implemented to hold packaged devices for processing step(s). For the purpose of description, it will be understood that terms such as stencil, frame carrier, and plate can be utilized interchangeably in appropriate circumstances. For example, a frame carrier or a plate as described in PCT Application No. PCT/US2016/054652 can be utilized as a stencil described herein. In another example, a stencil as described herein can be utilized as a frame carrier or a plate in PCT Application No. PCT/US2016/054652.

In some embodiments, a stencil having one or more features as described herein can be a plate having a first side through which individual units (e.g., singulated units) can be introduced to and removed from the stencil. The second side of the plate can be the side opposite from the first side. For example, if the stencil is utilized so that individual units are introduced to and removed from the stencil at the stencil's upper side, then the stencil's upper side can be its first side, and the underside can be its second side. Similarly, if the stencil is utilized so that individual units are introduced to and removed from the stencil at the stencil's lower side, then the stencil's underside can be its first side, and the upper side can be its second side.

In some embodiments, the plate of the foregoing stencil can define an array of apertures. Each of such apertures can be dimensioned to receive at least a portion of an individual unit, such that a plurality of such individual units can be arranged in an array for further processing. Such portion received by the stencil can include, for example, irregular features such as solder balls on an underside of an individual packaged device.

In some embodiments, the foregoing stencil can be, for example, a metal plate or a plate having composition that can handle repeated exposures to operating conditions such as cleaning environment and tape-cutting laser operations. Such a plate can be in, for example, a rectangular shaped panel format, and have an appropriate thickness to provide one or more functionalities as described herein.

Figure 9A:
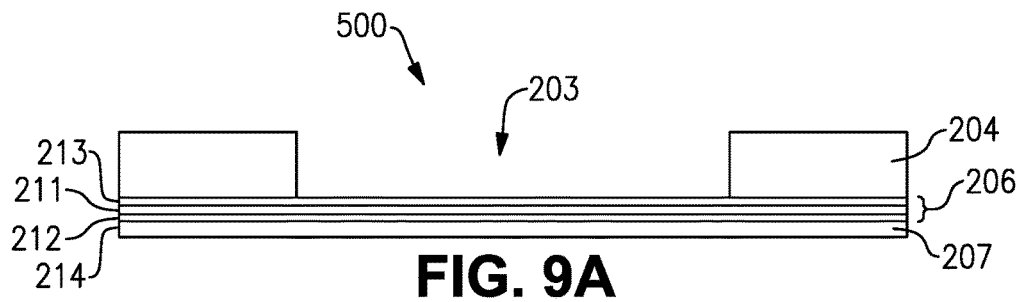
FIGS. 9A, 9B, 9C, and 9D show an example of how a stencil can be utilized to hold packaged devices for one or more processing steps.

In an example configuration 500 of FIG. 9A, a stencil 204 is shown to define an opening 203 dimensioned to receive a portion of a packaged device. Although one opening is shown for the purpose of description, it will be understood that a plurality of such openings can be implemented on the stencil 204. A double-sided tape 206 (also referred to herein as a two-sided tape) is shown to be attached to one side of the stencil 204. Such a tape can include, for example, a polyimide film 211 (e.g., Kapton) base having an adhesive layer implemented on each side. Thus, in the example shown, an adhesive layer 213 is shown to engage the stencil 204, and an adhesive layer 212 is shown to be covered by a cover layer 207 (e.g., PET film). Accordingly, the cover layer 207 can be peeled off to expose the adhesive layer 212.

Figure 9B:
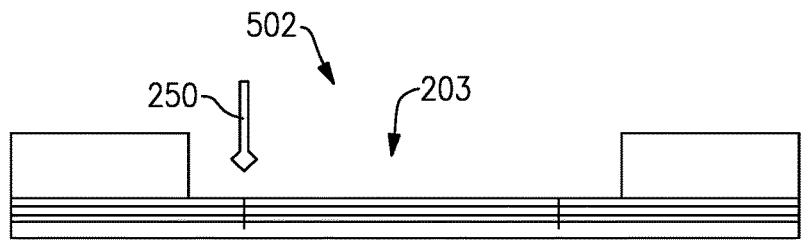

In the example configuration 502 of FIG. 9B, a laser beam 250 is shown to be applied to the two-sided tape 206 to form an opening through the two-sided tape 206. As described in PCT Application No. PCT/US2016/054652, such application of the laser beam 250 can be achieved in a number of ways. For example, the laser beam 250 can be applied from the underside (upper side in the inverted orientation of FIG. 9B), and the opening resulting from the laser cutting operation can result in an overhang of the two-sided tape 206 beyond each edge of the opening 203 of the stencil 204.

In some embodiments, the laser cutting operation of FIG. 9B can be configured such that the laser beam 250 generally burns through the two-side tape 206, but not completely through the cover layer 207. Thus, when the cover layer 207 is peeled from the two-sided tape 206, the cut portion of the two-sided tape 206 remains stuck to the cover layer 207 and thus be removed together.

Figure 9C:
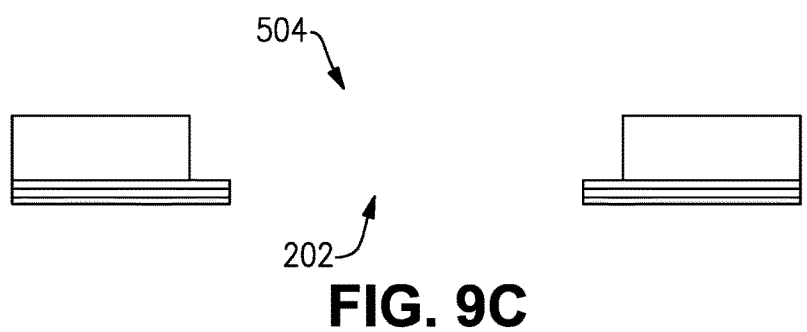

In the example configuration 504 of FIG. 9C, the laser cutting operation of FIG. 9B and the peeling of the cover layer are shown to yield an opening 202 through the two-sided tape. As described in PCT Application No. PCT/US2016/054652, such an opening can be dimensioned in different manners relative to the opening 203 of the stencil 204. In some embodiments, the opening 202 can be dimensioned so as to yield an overhang (when oriented as in FIG. 9D) of the two-sided tape 206 beyond the edge of the opening 203 of the stencil. In some processing applications, such an overhang of the two-sided tape can provide desirable functionalities when processing packaged devices. Examples related to such desirable functionalities are described herein in greater detail.

Figure 9D:
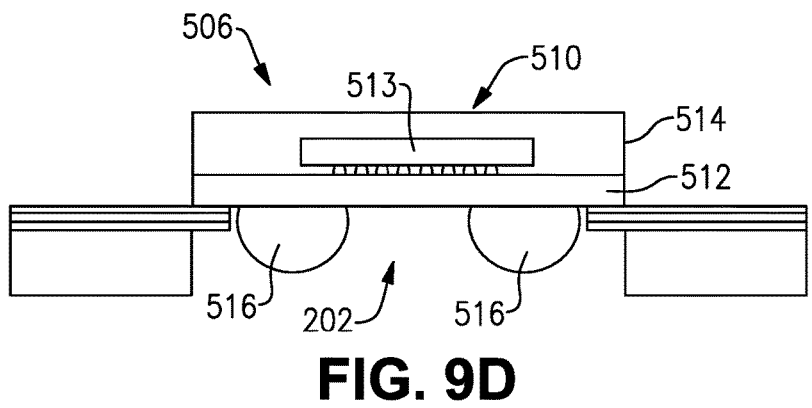

In the example configuration 506 of FIG. 9D, the assembly of FIG. 9C is shown to be inverted such that the two-sided tape 206 is over the stencil 204, with the adhesive layer 212 (as indicated in FIG. 9A) being exposed on top. On such oriented assembly, a packaged device 510 is shown to be mounted onto the two-sided tape 206, such that solder balls 516 extend through the opening 202 of the two-sided tape 206. Accordingly, the periphery of the underside of the package device 510 can be secured by the edge portion of the two-sided tape 206.

In the example of FIG. 9D, the packaged device 510 is shown to include a packaging substrate 512 (e.g., a PCB substrate, a laminate substrate, etc.), and a radio-frequency (RF) component 513 such as a die mounted on the packaging substrate 512. An overmold cap 514 can be formed over the packaging substrate 512 to yield an upper surface of the packaged device 510. In the example context of the packaging substrate 512 having a rectangular footprint shape, a box shape formed by the overmold cap 514 and the packaging substrate 512 defines four side walls of the packaged device 510. Accordingly, when the packaged device 510 is mounted on the two-sided tape 206 as shown in FIG. 9D, the four side walls and the upper surface of the packaged device 510 are exposed to allow deposition of material such as metal to provide RF shielding functionality. The underside of the packaged device 510, including the solder balls 516, is not exposed to the upper side of the stencil; thus, is not subjected to the deposition material.

In the example of FIG. 9D, the underside of the packaged device 510 may or may not include an underside-mounted component such as a die. Further, it will be understood that the solder balls 516 are examples of irregular features or topography associated with the example packaged device 510. Such irregular features or topography can include features other than or in addition to the solder balls. Examples related to the foregoing underside-mounted component and the irregular features or topography are described in U.S. Publication No. 2016/0099192.

In some manufacturing applications, it may be desirable to utilize an existing system such as a PVD system. As described in reference to FIGS. 7, 8A and 8B, a ring dimensioned for a PVD system can be utilized to mount an array of packaged devices by using a tape. However, such a configuration can yield one or more challenges due to, for example, flexibility of the tape.

In some embodiments, a stencil having one or more features as described herein can be implemented to specifically operate with a PVD system. Such a configuration can also face one or more challenges. For example, if the PVD-dedicated stencil is relatively large, there may be challenges in a laser system when making various cutting operations (e.g., through the two-sided tape).

Described herein are various examples of how a stencil can be mounted onto another structure (e.g., a PVD ring) so as to provide a number of advantageous features. For example, loading, processing, and unloading of packaged devices with the stencil can benefit due to stable and consistent property of the stencil. In another example, the stencil can be dimensioned appropriately to allow easier non-PVD operations such as laser-cutting operations.

Figure 14:
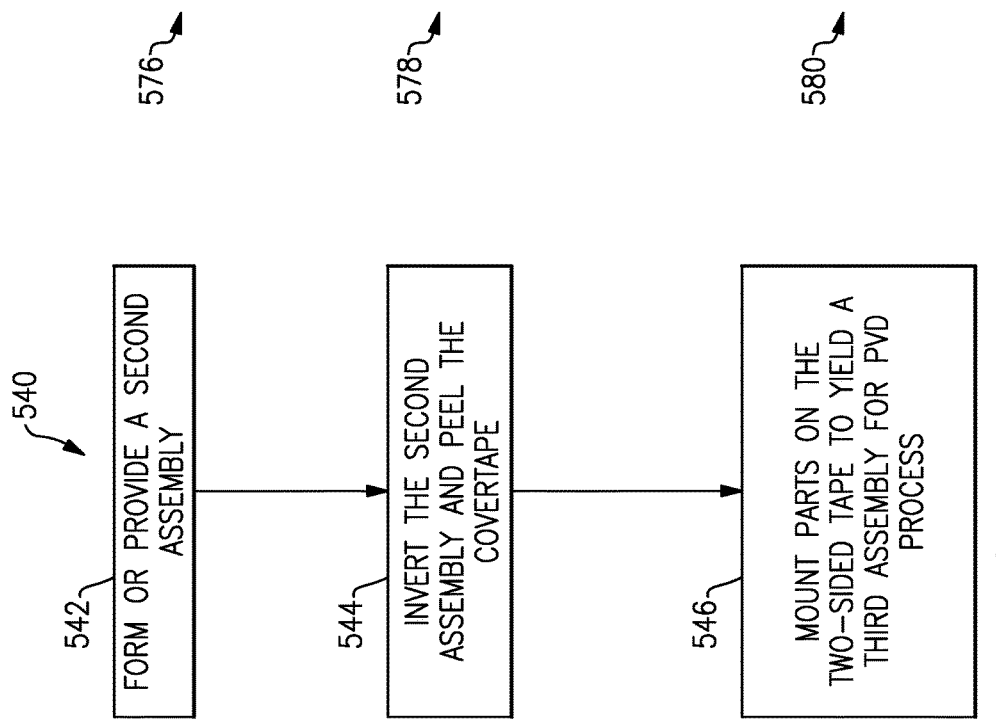
FIG. 14 shows an example process where the second assembly of FIG. 12 is prepared for loading of one or more packaged devices to yield a third assembly for a PVD process.

In some embodiments, a stencil can be mounted onto a PVD ring by use of a tape. FIGS. 10 and 11 show an example process and example states associated with such a process, where a two-sided tape is mated to a bare stencil to yield a first assembly. FIGS. 12 and 13 show an example process and example states associated with such a process, where the first assembly of FIGS. 10 and 11 is mounted to a PVD ring to yield a second assembly. FIGS. 14 and 15 show an example process and example states associated with such a process, where the second assembly of FIGS. 12 and 13 is utilized for loading of one or more packaged devices to yield a third assembly for a PVD process. FIGS. 16-22 show additional examples related to the foregoing examples of FIGS. 10-15.

In various examples depicted in FIGS. 11, 13 and 15, one representative opening is shown for clarity. However, it will be understood that a stencil can include a plurality of such openings (e.g., arranged in an array) to accommodate a plurality of packaged devices.

It is noted that various examples are described in the context of a PVD process. However, it will be understood that one or more features of the present disclosure can also be implemented for other types of deposition or fabrication processes.

In some embodiments, one or more features of the present disclosure can be utilized to form a conformal conductive layer on each of an array of packaged devices to yield an RF shielding functionality for each packaged device. Such formation of conformal conductive layer on the packaged device can be achieved by PVD and/or other types of fabrication processes.

Referring to FIGS. 10 and 11, a process 520 can include a block 522 where a stencil is formed or provided. Such a stencil is depicted as 204 in a configuration 550 of FIG. 11A. The stencil 204 is shown to include a first surface 512 and a second surface 514. The stencil 204 is also shown to include an opening 203 dimensioned to receive a portion of a packaged device as described herein.

The process 520 can further include a block 524 where the stencil is laminated with a two-sided tape. Such a laminated configuration is depicted as 556 in FIG. 11B, where the two-sided tape 206 is shown to include a polyimide film 211 (e.g., Kapton) base having an adhesive layer implemented on each side. Thus, in the example shown, an adhesive layer 213 is shown to engage the stencil 204, and an adhesive layer 212 is shown to be covered by a cover layer 207 (e.g., PET film). Accordingly, the cover layer 207 can be peeled off to expose the adhesive layer 212.

Figure 16A:
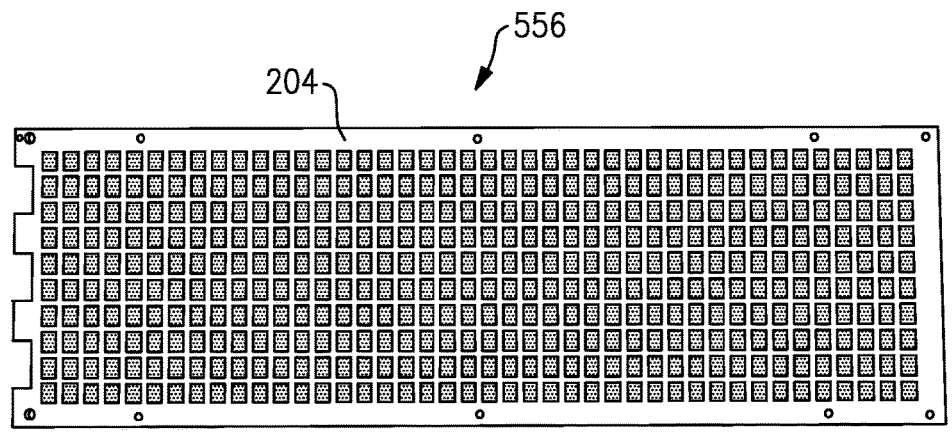
FIGS. 16A and 16B show both sides of an example laminated assembly where a stencil is laminated with a two-sided tape.
Figure 16B:
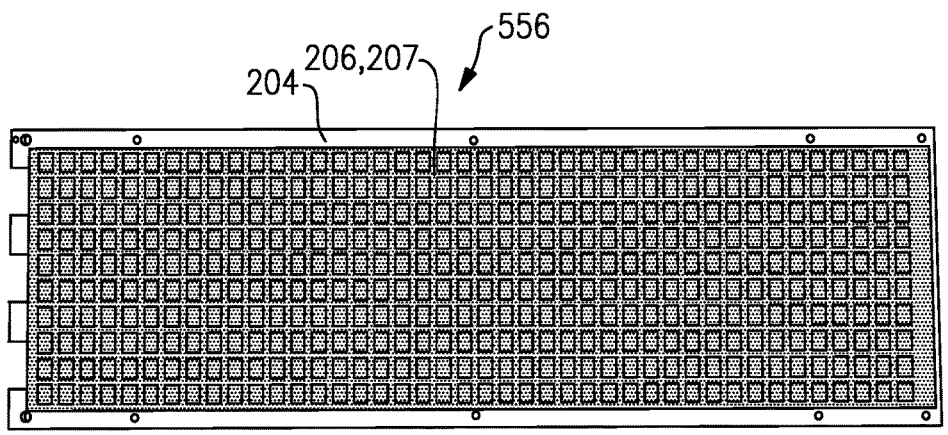

FIGS. 16A and 16B show both sides of an example laminated configuration 556. Such a configuration can correspond to the foregoing configuration 556 of FIG. 11 B. More particularly, FIG. 16A shows the side (e.g., underside) opposite from the side where packaged devices will be received. Accordingly, the adhesive layer (213 in FIG. 11 B) of the two-sided tape is shown to be exposed through each of the array of openings of the stencil 204. FIG. 16B shows the side (e.g., upper side) where the packaged devices will be received. Accordingly, the two-sided tape 206 with the cover layer 207 is shown to cover each of the array of openings of the stencil 204.

Referring to FIG. 10, the process 520 can further include a block 526 where a laser operation is performed to cut through some or all of the two-sided tape for each opening of the stencil, to yield a first assembly. Such a laser cutting configuration is depicted as 558, where a laser beam 560 is shown to be applied to the two-sided tape 206 to yield cuts 562. As described herein, such application of the laser beam 560 can be achieved in a number of ways. In some embodiments, the laser cutting operation of FIG. 11C can be configured such that the laser beam 560 generally burns through the two-side tape 206, but not completely through the cover layer 207. Thus, when the cover layer 207 is peeled away from the two-sided tape 206, the cut portion of the two-sided tape can remain stuck to the cover layer and thus be removed together.

Referring to FIGS. 12 and 13, a process 530 can include a block 532 where a first assembly as described in reference to FIGS. 10 and 11 can be formed or provided. In FIG. 13A, a configuration 564 resulting from the laser cutting configuration 558 of FIG. 11C is shown to include the first assembly in which laser cuts 562 are formed through the two-sided tape 206, but not through the cover layer 207.

The process 530 can further include a block 534 where the first assembly is mounted to a PVD ring with a tape (e.g., a one-sided tape). In FIG. 13B, such a configuration is depicted as 566, where a tape 568 is shown to be attached to the stencil 204 on the side opposite from the two-sided tape 206. In some embodiments, the tape 568 can be, for example, a one-sided tape.

Figure 17:
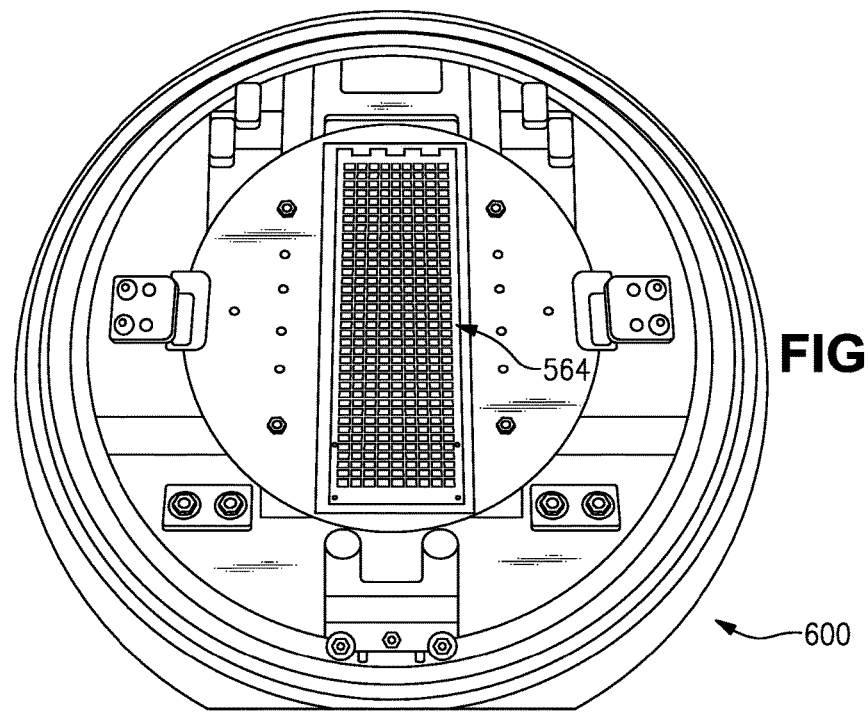
FIG. 17 shows an example where a first assembly similar to that of FIG. 14A is placed on a mounting platform, such that the un-taped surface of the stencil is exposed.
Figure 18:
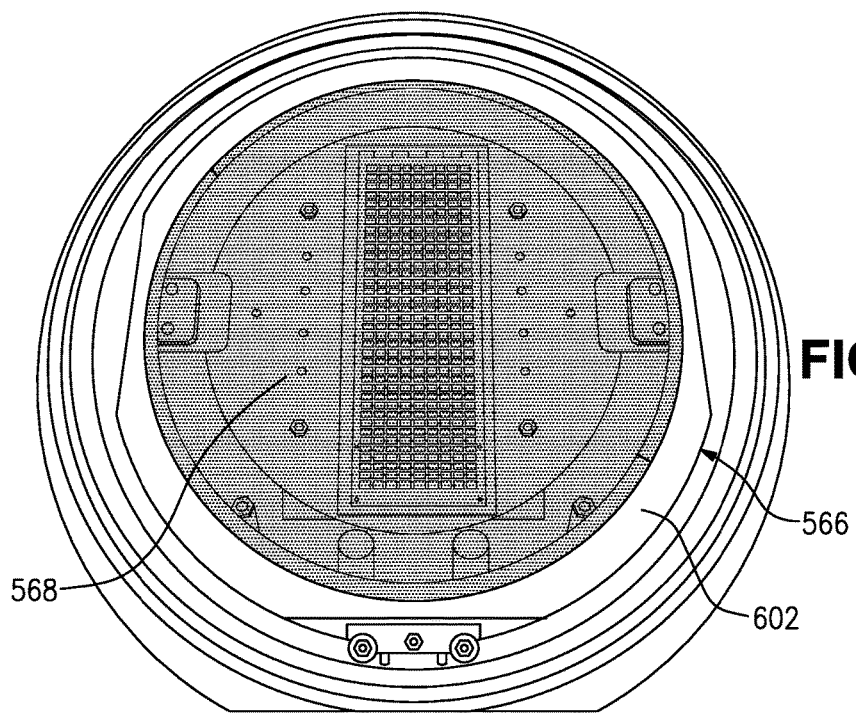
FIG. 18 shows an example where a PVD ring is positioned to encircle the first assembly, and a one-sided tape is positioned over the first assembly and the inner periphery of the PVD ring.
Figure 19:
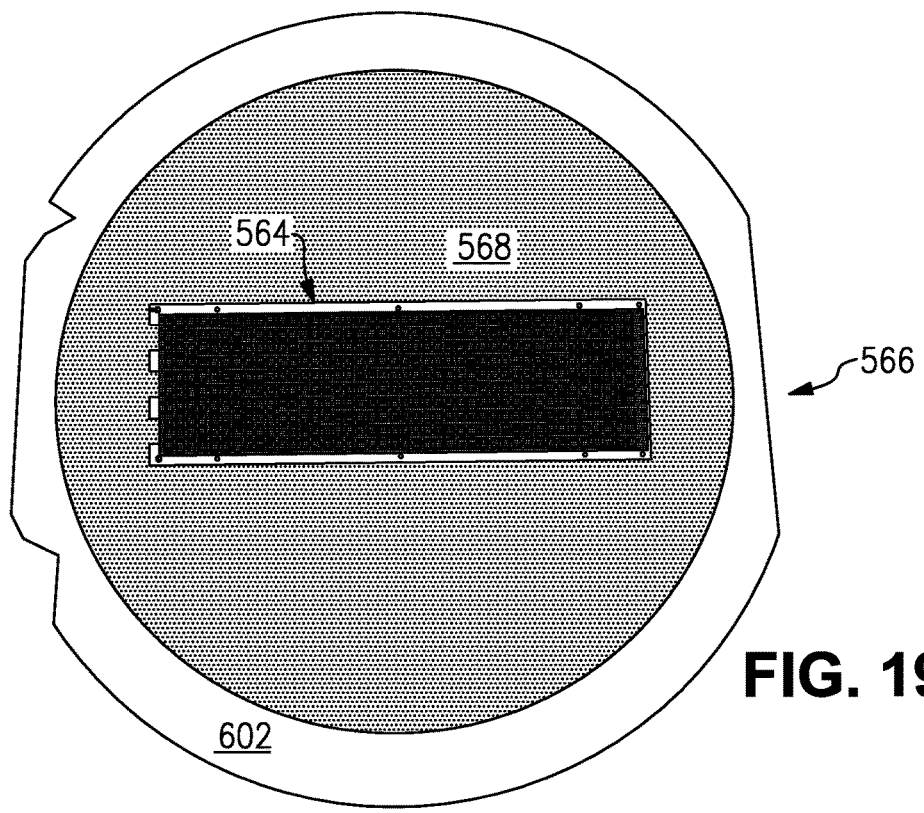
FIG. 19 shows one side of the assembly of the PVD ring, the one-sided tape, and the first assembly resulting from the example operation of FIG. 18.

In some embodiments, such a one-sided tape can extend to a PVD ring to thereby mount the first assembly (564) to the PVD ring. FIGS. 17-19 show an example of how the first assembly 564 can be mounted to such a PVD ring as described in reference to FIGS. 12 and 13B. In FIG. 17, a first assembly 564 similar to that of FIG. 13A is shown to be placed on a mounting platform 600, such that the un-taped surface of the stencil (e.g., the shown surface in FIG. 16A) is exposed. In FIG. 18, a PVD ring 602 is shown to have been positioned to encircle the first assembly 564, and a one-sided tape 568 is shown to be positioned over the first assembly 564 and the inner periphery of the PVD ring 602. Accordingly, the first assembly 564 (now attached to the one-sided tape 568) is shown to be secured to the PVD ring 602 by the tape 568. FIG. 19 shows the other side of the assembly 566 (also 566 in FIG. 13B) of the PVD ring 602, the one-sided tape 568, and the first assembly 564 resulting from the operation of FIG. 18.

Referring to FIGS. 12 and 13A-13D, the process 530 can further include a block 536 where a laser operation can be performed to form one or more openings through the one-sided tape to yield a second assembly. FIG. 13C shows an example of such a laser operation 570, where a laser beam 572 is being applied to the one-sided tape 568 to yield cuts indicated as 574. In some embodiments, such a laser cut can be made so that the stencil acts as a backstop to prevent cuts being made at other layer(s). Examples related to such selective laser cuts are described herein in greater detail.

FIG. 13D shows an example of a second assembly resulting from the laser operation of block 536 of FIGS. 12 and 13C. Such a laser operation is shown to result in the opening of the stencil being exposed on the side 577 of the one-sided tape 568. In the context of the examples of FIGS. 17-19, FIG. 20 shows an example of the side 577 of the assembly 564 being exposed from the laser cutting operation as described in reference to FIGS. 12 and 13C. In the example shown, one large opening is made to expose all of the openings of the stencil. It will be understood that other cut patterns can also be implemented. More detailed examples related to such exposure of the stencil openings are described herein in greater detail.

Figure 15A:
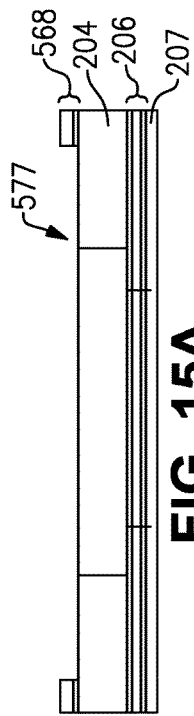
FIGS. 15A, 15B, and 15C show example states associated with the process of FIG. 14.

Referring to FIGS. 14 and 15, a process 540 can include a block 542 where a second assembly as described in reference to FIGS. 12 and 13A-13D can be formed or provided. In FIG. 15A, a configuration 576 resulting from the laser cutting configuration 570 of FIG. 13C is shown to include the second assembly in which the stencil opening is formed through the one-sided tape 568.

Figure 15B:
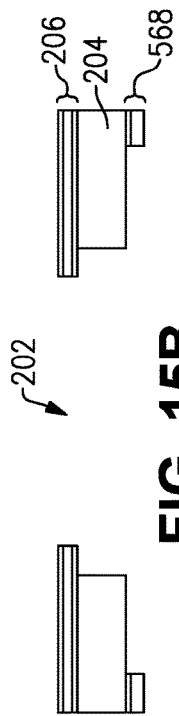

The process 540 can further include a block 544 where the second assembly can be inverted. Such a process block can also include the cover layer (207 in FIG. 15A) being peeled off of the two-sided tape 206, either before or after the inversion step. In FIG. 15B, such a configuration is depicted as 578, where the peeling of the cover layer 207 has resulted in the laser-cut portion of the two-sided tape 206 (e.g., as in FIG. 11C) being removed, thereby yielding an opening 202 through the two-sided tape 206.

Figure 21:
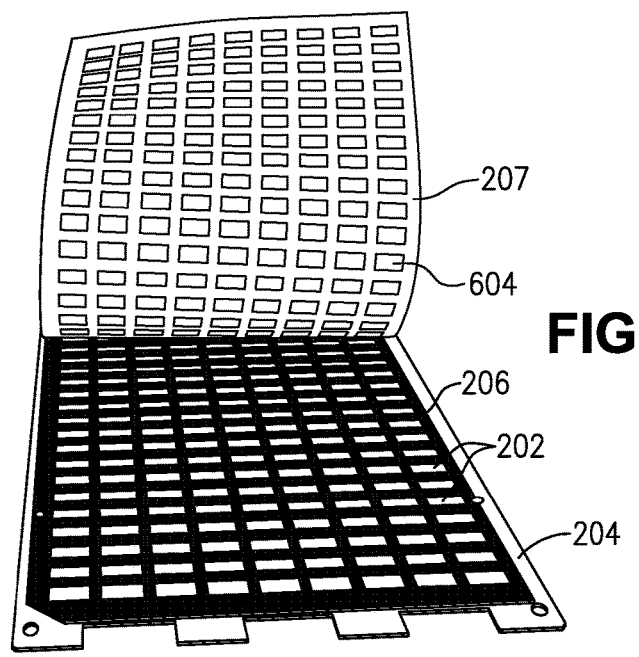
FIG. 21 shows an example of a cover layer being peeled from the two-sided tape that is attached to one side of a stencil.

FIG. 21 shows an example of the cover layer 207 being peeled away from the two-sided tape 206. The cover layer 207 is shown to have stuck to it the laser cut portions 604 of the two-sided tape. Accordingly, the two-sided tape 206 is shown to define an array of openings 202 corresponding to the openings of the stencil 204.

Figure 15C:
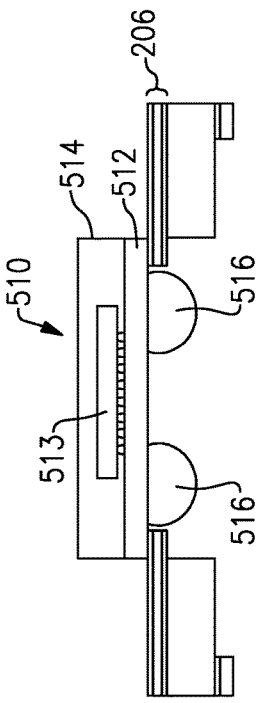

Referring to FIGS. 14 and 15A-15C, the process 540 can further include a block 546 where parts are mounted on the two-sided tape to yield a third assembly 580 suitable for a PVD process. In FIG. 15C, such parts are shown to include a packaged device 510 having a box-shaped body and irregular features (e.g., solder balls) on its underside. As described herein, the packaged device 510 can include, for example, a packaging substrate 512 (e.g., a PCB substrate, a laminate substrate, etc.), and an RF component 513 such as a die mounted on the packaging substrate 512. An overmold cap 514 can be formed over the packaging substrate 512 to yield an upper surface of the packaged device 510. In the example context of the packaging substrate 512 having a rectangular footprint shape, the overmold cap 514 and the packaging substrate 512 define four side walls of the packaged device 510. Accordingly, when the packaged device 510 is mounted on the two-sided tape 206 as shown in FIG. 15C, the side walls and the upper surface are exposed to allow deposition of material such as metal to provide RF shielding functionality. The underside of the packaged device 510, including the solder balls 516, are not exposed; thus, is not subjected to the deposition material.

In the example of FIG. 15C, the underside of the packaged device 510 may or may not include an underside-mounted component such as a die. Further, it will be understood that the solder balls 516 are examples of irregular features or topography associated with the example packaged device 510. Such irregular features or topography can include features other than or in addition to the solder balls.

Figure 22:
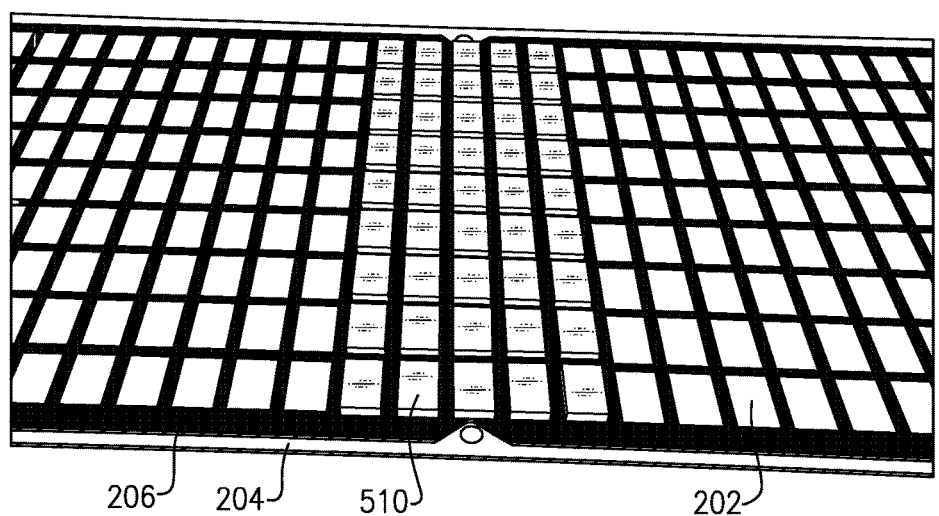
FIG. 22 shows an example where a plurality of packaged devices are mounted onto the exposed two-sided tape which is supported at least partially by the stencil.

FIG. 22 shows an example where a plurality of packaged devices 510 are mounted onto the two-sided tape 206 which is supported at least partially by the stencil 204. As described herein, the openings 202 formed through the two-sided tape 206 can accommodate irregular features such as solder balls associated with the packaged devices 510.

In some embodiments, one or more of the third assemblies of FIGS. 14 and 15C can be loaded onto a PVD apparatus for a deposition process. As described herein, such a deposition process can include, for example, a conformal coating of metal to facilitate RF shielding functionality for a given packaged device.

Figure 20:
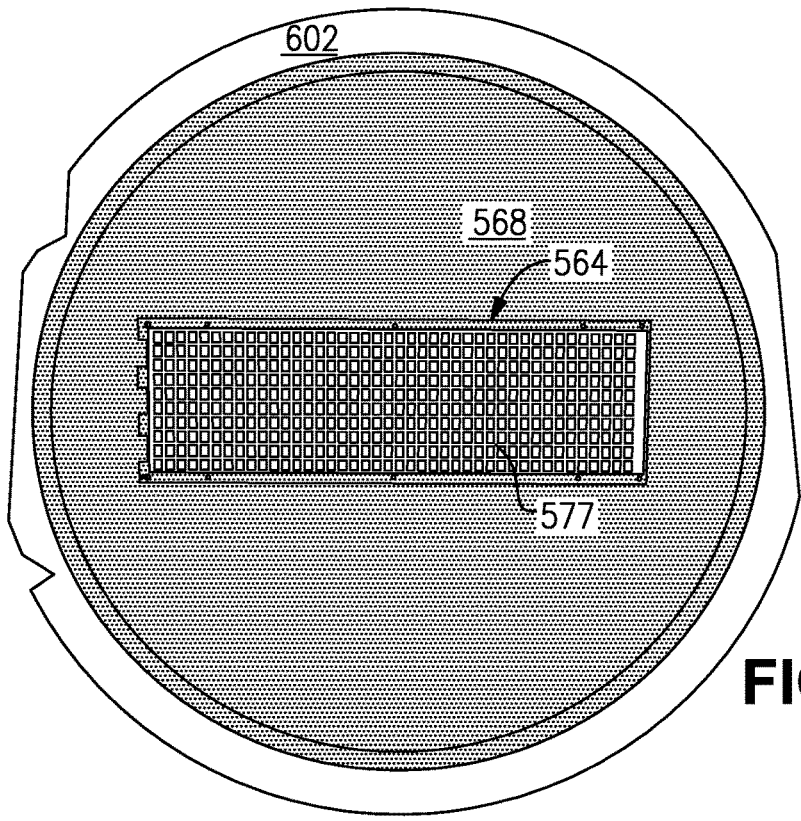
FIG. 20 shows an example where a portion of the other side of the assembly of FIG. 19 is exposed utilizing, for example, a laser cutting operation.
Figure 23:
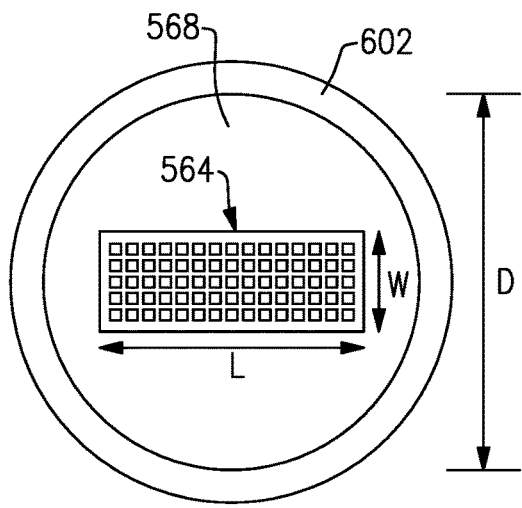
FIG. 23 depicts an assembly similar to the example of FIGS. 19 and 20, where a stencil/two-sided tape assembly is secured to a PVD ring with a tape.

FIG. 23 depicts an assembly similar to the example of FIGS. 19 and 20, where a stencil/two-sided tape assembly 564 is secured to a PVD ring 602 with a tape 568. The stencil is shown to have lateral dimensions of L×W, and the inner diameter of the PVD ring 602 is shown to have a dimension of D. In some embodiments, a laser system utilized for cutting processes (e.g., in FIG. 11C and 13C) may be better suited for operations within a lateral area defined by the stencil (L×W) than the entire lateral area within the inner diameter of the PVD ring 602. There may also be other processing operations for which the lateral dimensions L×W are more efficient than the larger area within the inner diameter of the PVD ring 602. Thus, one can see that use of an appropriately dimensioned stencil in combination with a PVD ring can provide a number of advantageous features as described herein.

Figure 24:
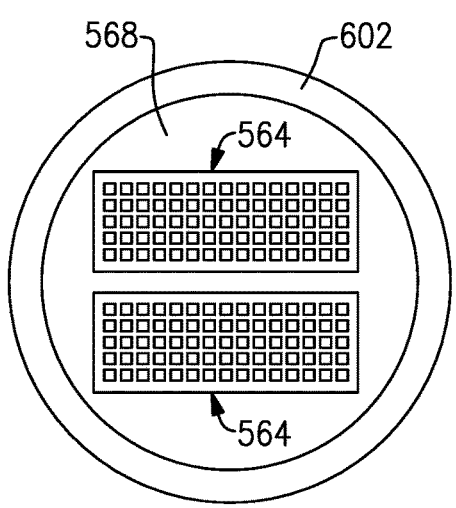
FIG. 24 shows that in some embodiments, more than one stencil/two-sided tape assembly can be secured to a PVD ring with a tape.

In some embodiments, a PVD ring and a stencil may be dimensioned to allow mounting of more than one stencil to the PVD ring. FIG. 24 shows an example where two stencil/two-sided tape assemblies 564 are secured to a PVD ring 602 with a tape 568. It is noted that the stencils in the example of FIG. 24 are not necessarily dimensioned the same as the stencil in the example of FIG. 23. It is also noted that the stencils in the example of FIG. 24 are not necessarily the same among themselves. Accordingly, a number of stencils can be dimensioned appropriately and mounted to a PVD ring as described herein to maximize or increase the efficiency in how space is utilized in the PVD ring.

Figure 25:
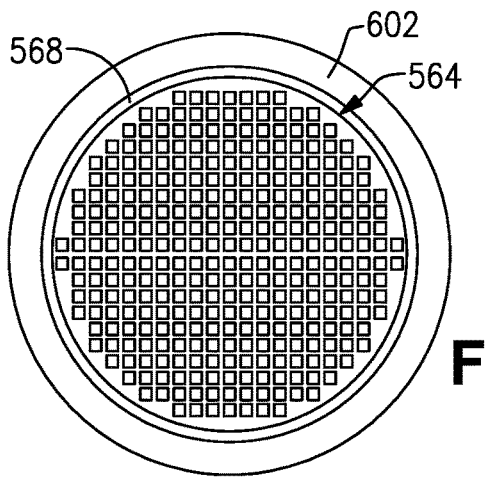
FIG. 25 shows an example where a stencil/two-sided tape assembly is based on a non-rectangular shaped stencil, such as a circular shaped stencil.

In various examples described herein, a stencil is depicted as having a rectangular shape. It will be understood that other shapes can be implemented for a stencil having one or more features as described herein. For example, FIG. 25 shows an example where a stencil/two-sided tape assembly 564 is based on a circular shaped stencil. Such a stencil can be dimensioned to fit within the inner diameter of a PVD ring 602. The stencil/two-sided tape assembly 564 can be secured to the PVD ring 602 with a tape 568 as described herein.

Figure 26:
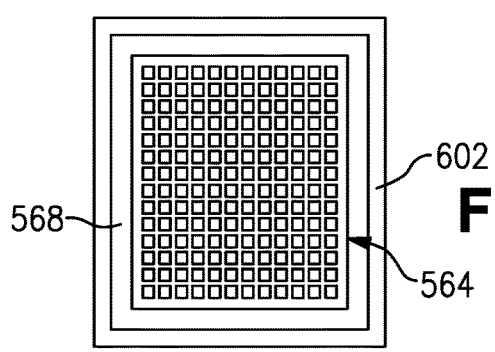
FIG. 26 shows an example where a ring structure for holding a stencil/two-sided tape assembly has a non-circular shape.

In various examples described herein, a PVD ring is depicted as having a generally circular shape to facilitate use in many PVD systems. It will be understood that such a circular shape is an example, and that other shapes can be implemented to accommodate other deposition systems where substrate holders are not necessarily circular. Accordingly, FIG. 26 shows an example where a ring structure 602 for holding a stencil/two-sided tape assembly 564 has a non-circular shape. For example, the ring 602 can have a rectangular shape. In the example of FIG. 26, the stencil/two-sided tape assembly 564 can be secured to the rectangular shaped ring 602 with a tape 568 as described herein.

In various examples described herein, a laser operation can be performed to cut a portion of a one-sided tape from the corresponding stencil. For example, FIGS. 13C, 13D and 20 show such a cut implemented to expose the openings of the stencil. In some embodiments, such openings of the stencil being exposed can facilitate easier handling of packaged devices during one or more process steps involving the stencil.

Figure 27:
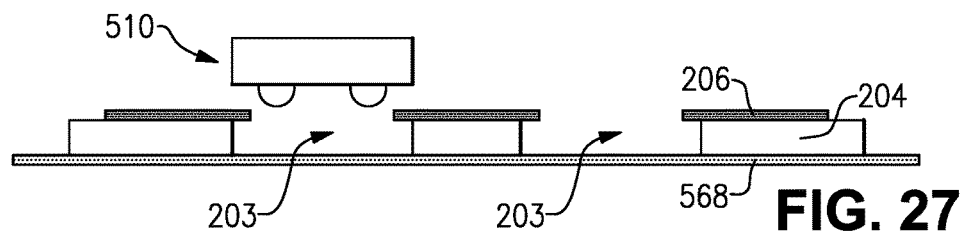
FIG. 27 shows an example configuration where a one-sided tape is implemented on one side of a stencil, and a two-sided tape is implemented on the other side of the stencil.

For example, FIG. 27 shows a configuration where a one-sided tape 568 is implemented on one side of a stencil 204, and a two-sided tape 206 is implemented on the other side of the stencil 204. The one-sided tape 568 is for securing of the stencil 204 to a PVD ring (not shown), and the two-sided tape 206 is for mounting of packaged devices 510 onto the stencil 204 such that irregular features such as solder balls can be accommodated by openings 203 of the stencil 204. In the example of FIG. 27, the 1-sided tape 568 is depicted as not having any opening. In such a configuration, ambient gas such as air can become trapped in the stencil openings 203 as the packaged devices 510 are mounted over the openings 203. Such trapped gas can make various processing steps more difficult. For example, when such an assembly (with packaged devices 510 mounted on the two-sided tape) is heated during steps such as cleaning and curing processes, the gas generally trapped in the openings 203 can expand significantly and cause the packaged devices 510 to become dislodged.

Figure 28:
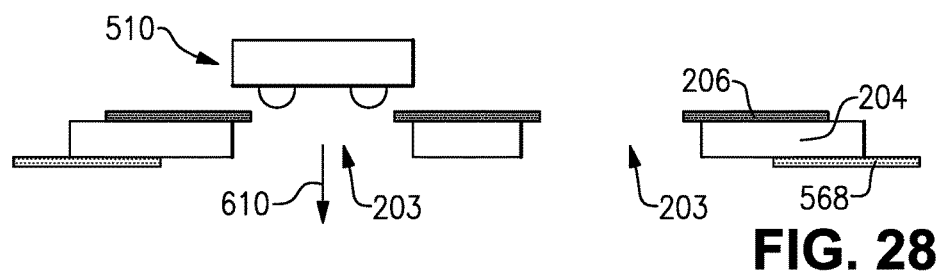
FIG. 28 shows an example configuration similar to the example of FIG. 20, where openings of a stencil are exposed by cutting away an appropriate portion of a one-sided tape.

FIG. 28 shows an example configuration similar to the examples described herein in reference to FIGS. 9D, 15C and 20, where openings 203 of a stencil 204 are exposed by cutting away appropriate portion of a one-sided tape 568. In such a configuration, ambient gas such as air is not trapped in the stencil openings 203 as packaged devices 510 are mounted over the openings 203. For example, any displacement of ambient gas resulting from mounting of the packaged devices 510 can exit (arrow 610) from the openings 203 due to the openings being exposed as a result of the cut made on the one-sided tape 568.

In various examples described herein, the foregoing cut formed on the one-sided tape (568) can expose all of the stencil openings (203). Such a technique can be advantageous, since one laser cutting operation can expose many stencil openings. However, it will be understood that exposing of stencil openings can be implemented in other manners. For example, there can be more than one laser cut, such that each cut results in a group of stencil openings being exposed.

Figure 29:
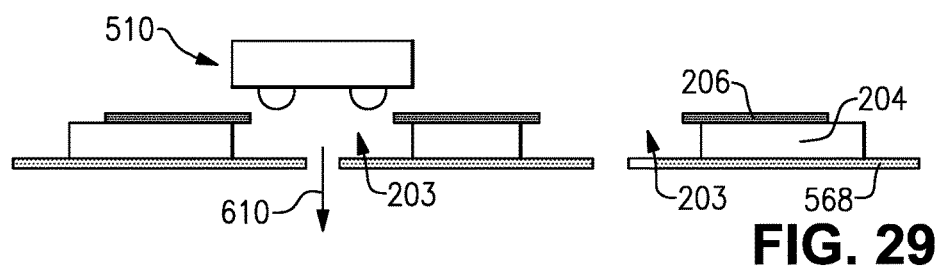
FIG. 29 shows an example where cutting or punching operations can yield openings on the one-sided tape at areas corresponding to the stencil openings.

In another example, each stencil opening can be partially or fully exposed separately from other stencil openings. FIG. 29 shows an example where cutting or punching operations can yield openings on the one-sided tape 568 at areas corresponding to the stencil openings 203. Accordingly, ambient gas can escape (arrow 610) through such openings of the one-sided tape 568 during process steps such as mounting of the packaged devices 510.

In some embodiments, a stencil can be secured to a PVD ring with a given tape, and the same tape can be utilized to hold packaged devices. For example, a two-sided tape having openings for receiving of packaged devices can extend beyond the corresponding stencil and be attached to a PVD ring. In such a configuration, a laser cutting operation can be performed to handle such a two-sided tape.

In some embodiments, and as described herein with various examples, two separate tapes can be utilized, where the first tape (e.g., a two-sided tape) can be implemented for mounting of packaged devices to a stencil, and the second tape (e.g., a one-sided tape) can be implemented to secure the stencil to a PVD ring. In such a configuration, laser cutting operations can involve cutting of the first tape and the second tape. Preferably, cuts made to the first and second tapes are configured such that laser cutting of one tape does not damage the other tape.

Figure 30:
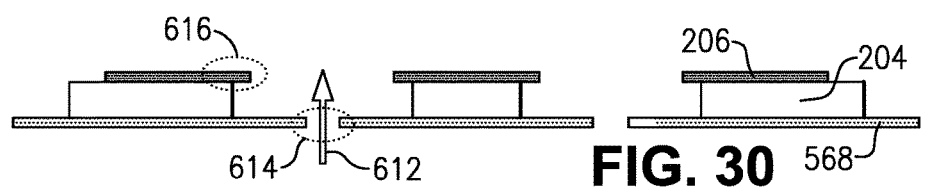
FIG. 30 shows an example cutting operation where a laser beam forms the openings on the one-sided tape of the example of FIG. 29.

For example, and in the context of the configuration of FIG. 29 where cuts are made on the one-sided tape 568 at or near a middle region of each stencil opening 203, FIG. 30 shows a cutting operation where a laser beam 612 forming such a cut (indicated as 614). As one can see, such a laser cut generally will not damage the overhanging portion (indicated as 616) of the two-sided tape 206, since the laser beam 612 is not incident on the two-sided tape 206. It is noted that in the example of FIG. 30, laser cuts for the two-sided tape 206 can be made prior to the application of the one-sided tape 568, so as to avoid the laser beam damaging the one-sided tape 568.

Figure 31:
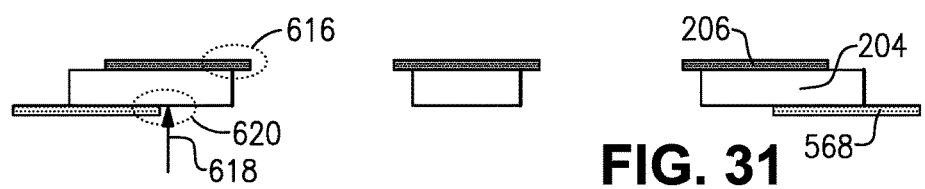
FIG. 31 shows an example cutting operation where a laser beam forms the portion of the one-sided tape of the example of FIG. 28.

In another example, and in the context of the configuration of FIG. 28 where a single large cut is made on the one-sided tape near the periphery of the stencil 204, FIG. 31 shows a cutting operation where a laser beam 618 forming such a cut (indicated as 620) is incident on the stencil itself after cutting through the one-sided tape 568. Accordingly, the two-sided tape 206, including the overhanging portion 616, is shielded from the laser beam 618.

In various examples described herein, a cut pattern on a two-sided tape (for holding of packaged devices) can include an overhang portion (e.g., 616 in FIGS. 30 and 31) relative to each stencil opening. FIGS. 32-35 show examples of how such overhang portions of the two-sided tape can be configured to provide advantageous features during various process steps.

Figure 32:
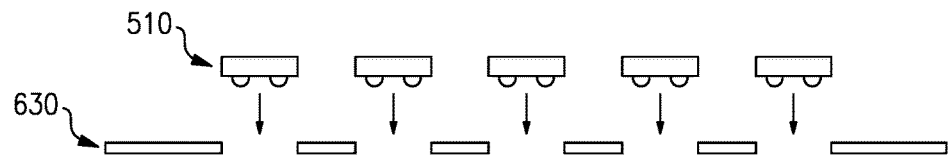
FIG. 32 shows an example process step where a plurality of packaged devices are being loaded onto an assembly that includes a stencil with a two-sided tape, in preparation for a PVD process.

FIG. 32 shows an example process step where a plurality of packaged devices 510 are being loaded onto an assembly 630. For the purpose of description, the assembly 630 can include a stencil and a two-side tape for holding the packaged devices. The assembly 630 may or may not include a one-sided tape on the other side of the stencil. As described herein, the packaged devices 510 being held by the assembly 630 can facilitate a PVD process to form a conformal shielding layer on each packaged device 510.

Figure 33:
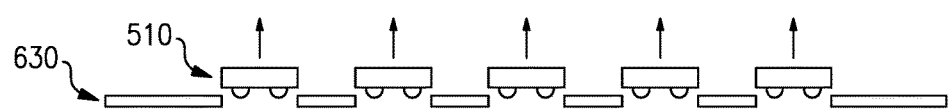
FIG. 33 shows an example process step where the packaged devices are being removed after the PVD process.

FIG. 33 shows an example process step where the packaged devices 510 are being removed after the PVD process. As described herein, the packaged devices 510 being held by the assembly 630 allows the foregoing formation of the conformal shielding layer on the side and upper surfaces of each packaged device 510, while keeping the underside of the packaged device uncoated.

Figure 34:
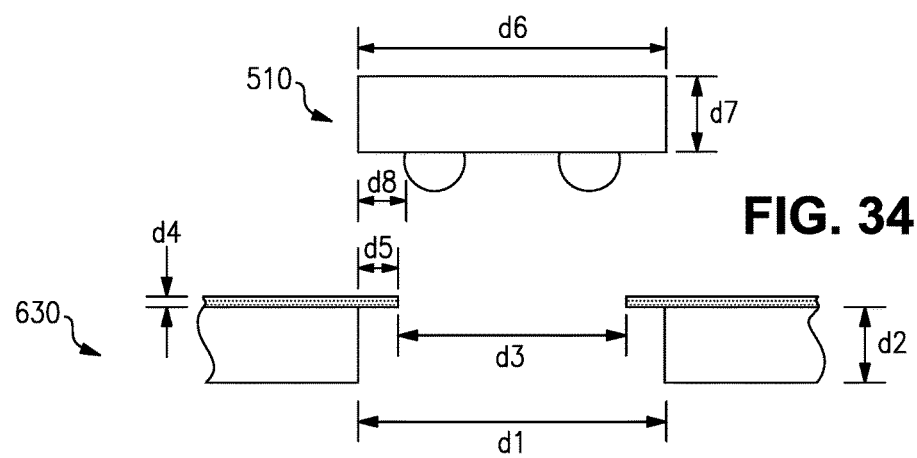
FIG. 34 shows a representative packaged device in relation to a stencil opening with a two-sided tape cut to provide an overhang portion.
Figure 35:
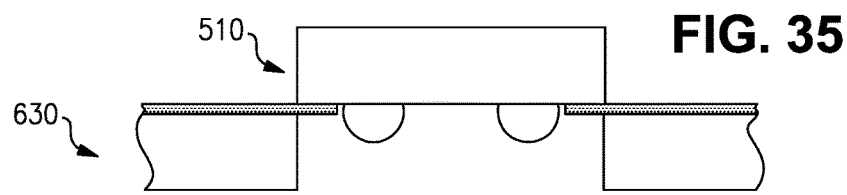
FIG. 35 shows the packaged device mounted on the stencil/two-sided tape assembly, such that one or more underside protrusions such as a ball grid array can be accommodated by the stencil opening.

FIG. 34 shows a representative packaged device 510 in relation to a stencil opening with a two-sided tape cut to provide an overhang portion. Various dimensions associated with the packaged device 510, the stencil opening, and the two-sided tape are indicated as shown. FIG. 35 shows the packaged device 510 mounted on the assembly 630.

In some embodiments, the cut in the two-sided tape can be dimensioned (d3) to be slightly larger than the end-to-end lateral dimension of the solder balls to allow the solder balls to fit through the two-sided tape. Further, some or all of factors such as the lateral dimension of the stencil opening (d1), the edge-to-solder ball dimension of the packaged device (d8), mass of the packaged device, the mechanical property (e.g., bending property) of the two-sided tape, and the amount of overhang (d5) can be utilized to allow the packaged device 510 to be easily mounted onto the assembly 630, and to be easily removed from the assembly 630. For example, an appropriate amount of overhang can allow the packaged device to be cushioned onto the assembly 630, and yet be sufficiently stable without having too much flex in the overhang. Such a mounting configuration can allow the packaged device to be held by the assembly 630 without too much adhesion between the packaged device and the two-sided tape. It is further noted that the foregoing configuration can allow the packaged device 510 to be removed from the assembly 630 easier, due to the appropriate adhesion between the packaged device and the two-sided tape.

While many examples are described herein in the context of PVD-related processes, it will be understood that one or more features of the present disclosure can also be implemented for other types of deposition processes, as well as for non-deposition processes utilized for manufacturing of packaged devices such as RF modules. For example, when an array of devices are to be held in a stable manner and be processed together in a system having a particular substrate holding configuration, one or more features of the present disclosure can be implemented to yield desirable results.

Figure 36:
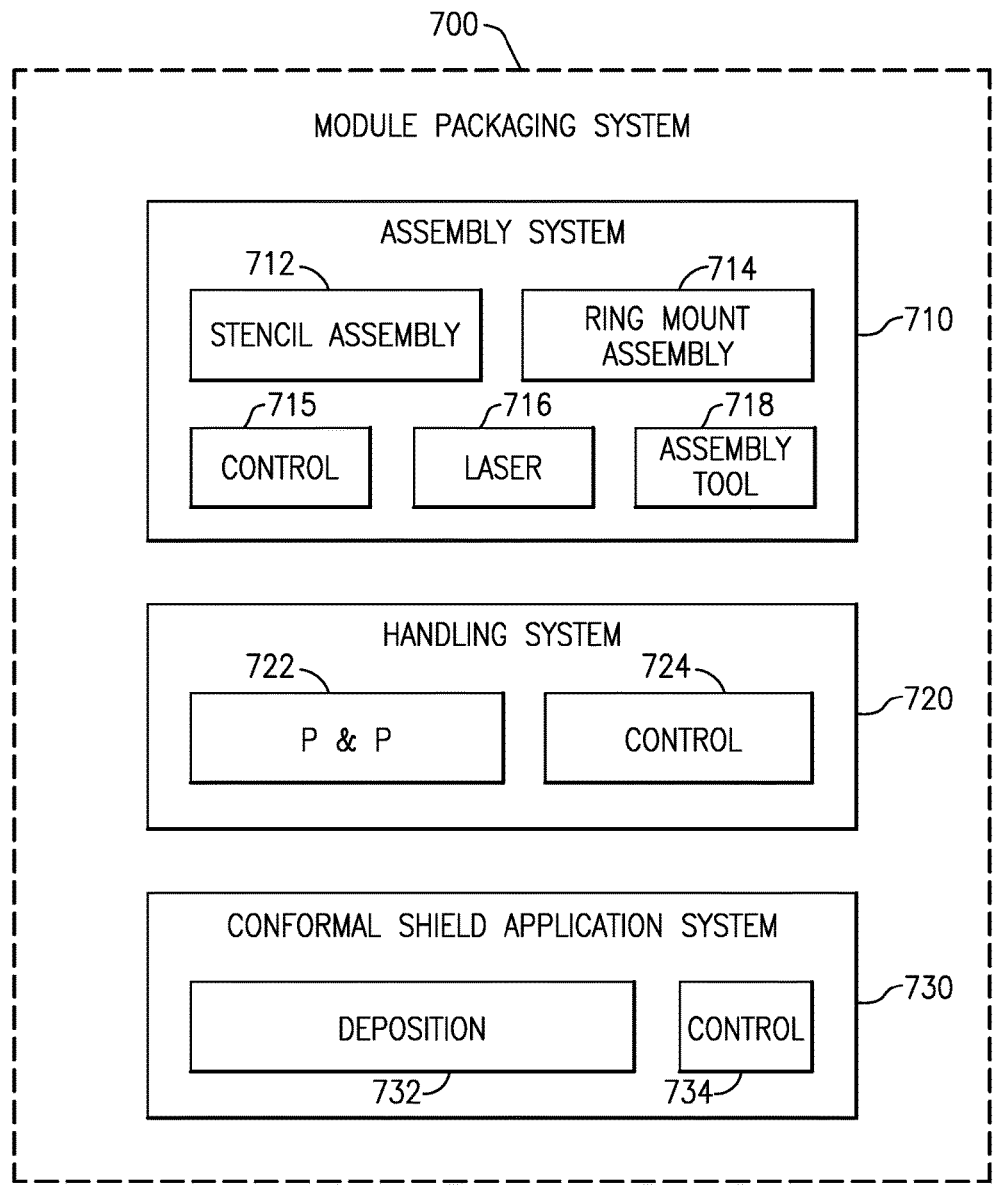
FIG. 36 shows that in some embodiments, one or more features of the present disclosure can be implemented in a module packaging system.

FIG. 36 shows that in some embodiments, one or more features of the present disclosure can be implemented in a module packaging system 700. Such a system can include some or all of an assembly system 710, a handling system 720, and a conformal shield application system 730.

In some embodiments, the assembly system 710 can include, for example, a stencil assembly component 712 configured to faciliate various process steps associated with a stencil. The assembly system 710 can further include a ring mount assembly component 714 configured to facilitate various process steps associated with, for example, a PVD ring.

The assembly system 710 can further include a laser component 716 configured to perform laser cutting operations as described herein. The assembly system 710 can further include an assembly tool component to facilitate, for example, attaching of two-sided and/or one-sided tapes to their respective parts. The assembly system 710 can further include a control component 715 configured to provide control functionality for some or all of the foregoing components.

In some embodiments, the module packaging system 700 can include a handling system 720 having, for example, a pick-and-place apparatus 722 and a control component 724 for controlling such a pick-and-place apparatus.

In some embodiments, the module packaging system 700 can further include a conformal shield application system 730. Such a conformal shield application system can include, for example, a deposition apparatus 732, and a control component 734 for controlling such a deposition apparatus. In some embodiments, the deposition apparatus 732 can be configured as a PVD apparatus.

In various examples described herein, a tape can include an adhesive member having an adhesive layer on either or both sides. Accordingly, a one-sided tape can be a one-sided adhesive member having an adhesive layer on one of the two sides, and a two-sided tape can be a two-sided adhesive member having an adhesive layer on each of the two sides. In the two-sided adhesive member, it will be understood that the two adhesive layers may or may not be similar.

In some embodiments, such an adhesive member or tape can be shaped differently, including overall rectangular and/or circular shapes. Such shapes of the adhesive member/tape can result from, for example, a larger sheet being cut to yield the shaped adhesive member/tape.

Examples of Diversity Receivers

Figure 37:
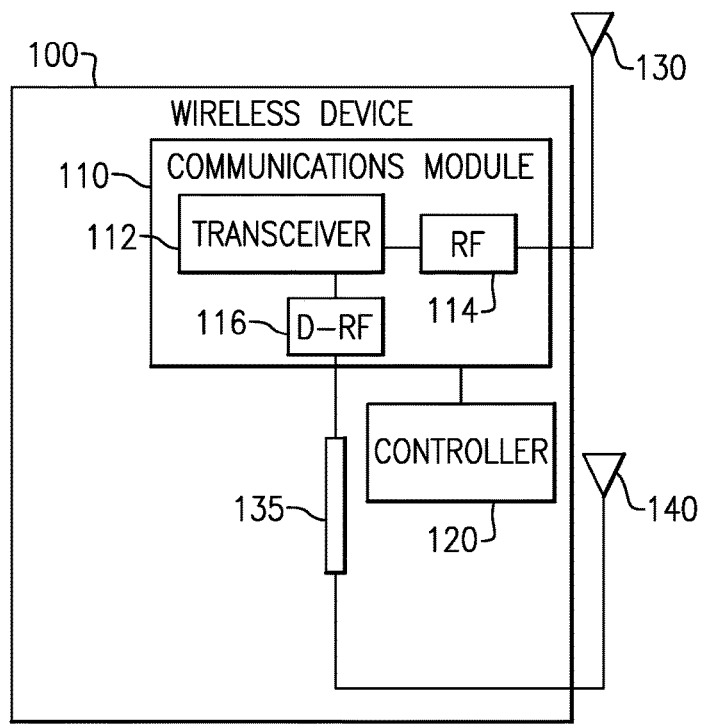
FIG. 37 shows a wireless device having a communications module coupled to a primary antenna and a diversity antenna.

FIG. 37 shows a wireless device 100 having a communications module 110 coupled to a primary antenna 130 and a diversity antenna 140. The communications module 110 (and its constituent components) may be controlled by a controller 120. The communications module 110 includes a transceiver 112 that is configured to convert between analog radio-frequency (RF) signals and digital data signals. To that end, the transceiver 112 may include a digital-to-analog converter, an analog-to-digital converter, a local oscillator for modulating or demodulating a baseband analog signal to or from a carrier frequency, a baseband processor that converts between digital samples and data bits (e.g., voice or other types of data), or other components.

The communications module 110 further includes an RF module 114 coupled between the primary antenna 130 and the transceiver 112. Because the RF module 114 may be physically close to the primary antenna 130 to reduce attenuation due to cable loss, the RF module 114 may be referred to as front-end module (FEM). The RF module 114 may perform processing on an analog signal received from the primary antenna 130 for the transceiver 112 or received from transceiver 112 for transmission via the primary antenna 130. To that end, the RF module 114 may include filters, power amplifiers, band select switches, matching circuits, and other components. Similarly, the communications module 110 includes a diversity RF module 116 coupled between the diversity antenna 140 and the transceiver 112 that performs similar processing.

When a signal is transmitted to the wireless device, the signal may be received at both the primary antenna 130 and the diversity antenna 140. The primary antenna 130 and diversity antenna 140 may be physically spaced apart such that the signal at the primary antenna 130 and diversity antenna 140 is received with different characteristics. For example, in one embodiment, the primary antenna 130 and diversity antenna 140 may receive the signal with different attenuation, noise, frequency response, or phase shift. The transceiver 112 may use both of the signals with different characteristics to determine data bits corresponding to the signal. In some implementations, the transceiver 112 selects from between the primary antenna 130 and the diversity antenna 140 based on the characteristics, such as selecting the antenna with the highest signal-to-noise ratio. In some implementations, the transceiver 112 combines the signals from the primary antenna 130 and the diversity antenna 140 to increase the signal-to-noise ratio of the combined signal. In some implementations, the transceiver 112 processes the signals to perform multiple-input/multiple-output (MIMO) communication.

Because the diversity antenna 140 is physically spaced apart from the primary antenna 130, the diversity antenna 140 is coupled to the communications module 110 by a transmission line 135, such as a cable or a printed circuit board (PCB) trace. In some implementations, the transmission line 135 is lossy and attenuates the signal received at the diversity antenna 140 before it reaches the communications module 110. Thus, in some implementations, as described below, gain is applied to the signal received at the diversity antenna 140. The gain (and other analog processing, such as filtering) may be applied by a diversity receiver module. Because such a diversity receiver module may be located physically close to the diversity antenna 140, it may be referred to a diversity receiver front-end module.

Figure 38:
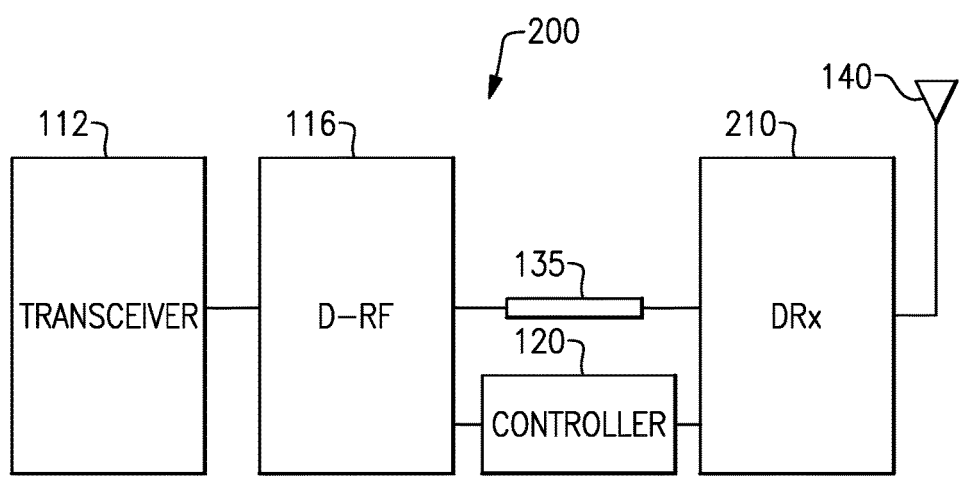
FIG. 38 shows a diversity receiver (DRx) configuration including a DRx front-end module (FEM).

FIG. 38 shows a diversity receiver (DRx) configuration 200 including a DRx front-end module (FEM) 210. The DRx configuration 200 includes a diversity antenna 140 that is configured to receive a diversity signal and provide the diversity signal to the DRx FEM 210. The DRx FEM 210 is configured to perform processing on the diversity signal received from the diversity antenna 140. For example, the DRx FEM 210 may be configured to filter the diversity signal to one or more active frequency bands, e.g., as indicated by the controller 120. As another example, the DRx FEM 210 may be configured to amplify the diversity signal. To that end, the DRx FEM 210 may include filters, low-noise amplifiers, band select switches, matching circuits, and other components.

The DRx FEM 210 transmits the processed diversity signal via a transmission line 135 to a downstream module, such as the diversity RF (D-RF) module 116, which feeds a further processed diversity signal to the transceiver 112. The diversity RF module 116 (and, in some implementations, the transceiver), is controlled by the controller 120. In some implementations, the controller 120 may be implemented within the transceiver 112.

Figure 39:
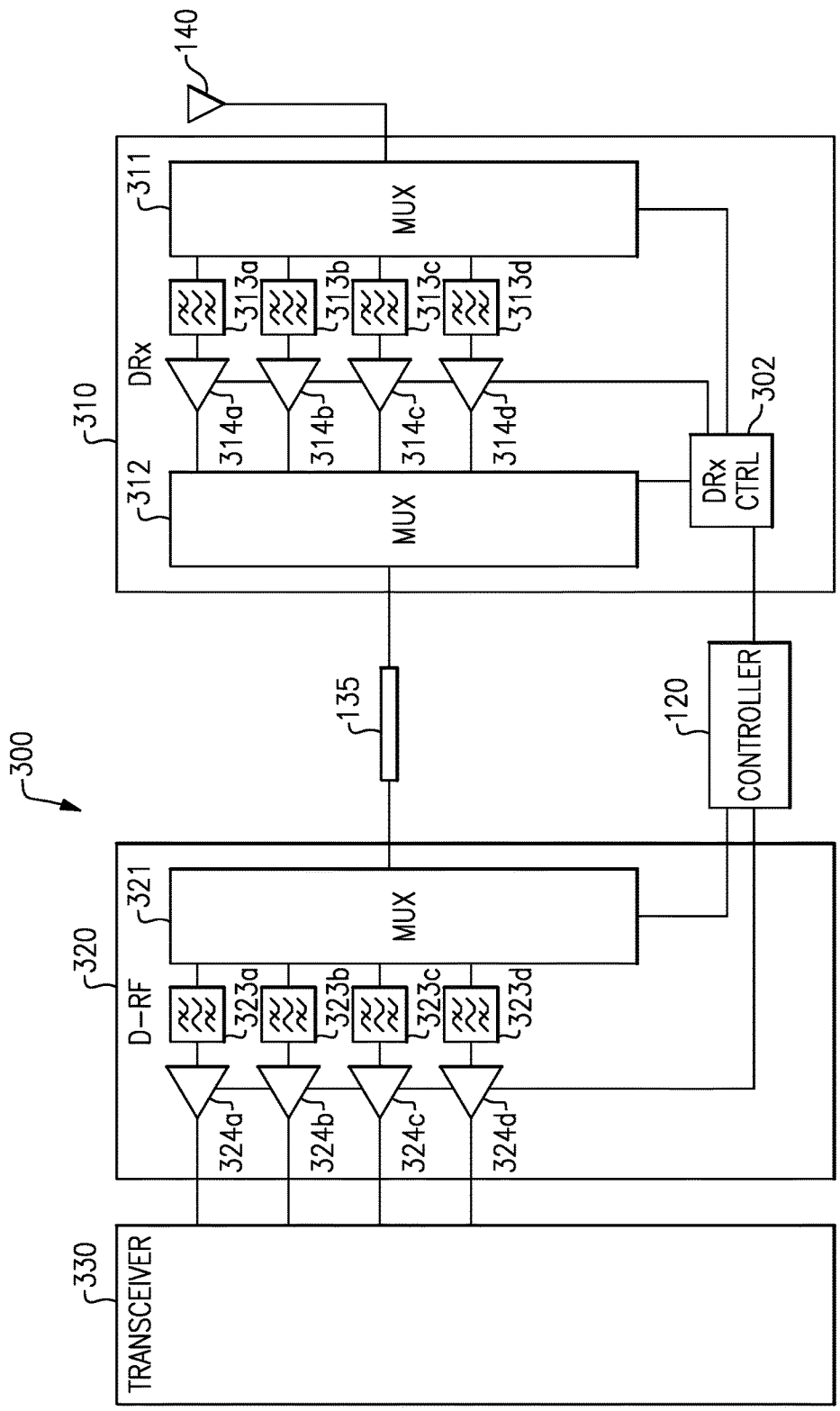
FIG. 39 shows that in some embodiments, a diversity receiver (DRx) configuration may include a DRx module with multiple paths corresponding to multiple frequency bands.

FIG. 39 shows that in some embodiments, a diversity receiver (DRx) configuration 300 may include a DRx module 310 with multiple paths corresponding to multiple frequency bands. The DRx configuration 300 includes a diversity antenna 140 configured to receive a diversity signal. In some implementations, the diversity signal may be a single-band signal including data modulated onto a single frequency band. In some implementations, the diversity signal may be a multi-band signal (also referred to as an inter-band carrier aggregation signal) including data modulated onto multiple frequency bands.

The DRx module 310 has an input that receives the diversity signal from the diversity antenna 140 and an output that provides a processed diversity signal to the transceiver 330 (via the transmission line 135 and the diversity RF module 320). The DRx module 310 input feeds into an input of first multiplexer (MUX) 311. The first multiplexer 311 includes a plurality of multiplexer outputs, each corresponding to a path between the input and the output of the DRx module 310. Each of the paths may correspond to a respective frequency band. The DRx module 310 output is provided by the output of second multiplexer 312. The second multiplexer 312 includes a plurality of multiplexer inputs, each corresponding to one of the paths between the input and the output of the DRx module 310.

The frequency bands may be cellular frequency bands, such as UMTS (Universal Mobile Telecommunications System) frequency bands. For example, a first frequency band may be UMTS downlink or "Rx" Band 2, between 1930 megahertz (MHZ) and 1990 MHz, and a second frequency band may be UMTS downlink or "Rx" Band 5, between 869 MHz and 894 MHz. Other downlink frequency bands may be used, such as those described below in Table 1 or other non-UMTS frequency bands.

In some implementations, the DRx module 310 includes a DRx controller 302 that receives signals from the controller 120 (also referred to as a communications controller) and, based on the received signals, selectively activates one or more of the plurality of paths between the input and the output. In some implementations, the DRx module 310 does not include a DRx controller 302 and the controller 120 selectively activates the one or more of the plurality of paths directly.

As noted herein, in some implementations, the diversity signal is a single-band signal. Thus, in some implementations, the first multiplexer 311 is a single-pole/multiple-throw (SPMT) switch that routes the diversity signal to one of the plurality of paths corresponding to the frequency band of the single-band signal based on a signal received from the DRx controller 302. The DRx controller 302 may generate the signal based on a band select signal received by the DRx controller 302 from the communications controller 120. Similarly, in some implementations, the second multiplexer 312 is a SPMT switch that routes the signal from the one of the plurality of paths corresponding to the frequency band of the single-band signal based on a signal received from the DRx controller 302.

As noted herein, in some implementations, the diversity signal is a multi-band signal. Thus, in some implementations, the first multiplexer 311 is a signal splitter that routes the diversity signal to two or more of the plurality of paths corresponding to the two or more frequency bands of the multi-band signal based on a splitter control signal received from the DRx controller 302. The function of the signal splitter may be implemented as a SPMT switch, a diplexer filter, or some combination of these. Similarly, in some implementations, the second multiplexer 312 is a signal combiner that combines the signals from the two or more of the plurality of paths corresponding to the two or more frequency bands of the multi-band signal based on a combiner control signal received from the DRx controller 302. The function of the signal combiner may be implemented as a SPMT switch, a diplexer filter, or some combination of these. The DRx controller 302 may generate the splitter control signal and the combiner control signal based on a band select signal received by the DRx controller 302 from the communications controller 120.

Thus, in some implementations, the DRx controller 302 is configured to selectively activate one or more of the plurality of paths based on a band select signal received by the DRx controller 302 (e.g., from the communications controller 120). In some implementations, the DRx controller 302 is configured to selectively activate one or more of the plurality of paths by transmitting a splitter control signal to a signal splitter and a combiner control signal to a signal combiner.

The DRx module 310 includes a plurality of bandpass filters 313a-313d. Each one of the bandpass filters 313a-313d is disposed along a corresponding one of the plurality of paths and configured to filter a signal received at the bandpass filter to the respective frequency band of the one of the plurality of paths. In some implementations, the bandpass filters 313a-313d are further configured to filter a signal received at the bandpass filter to a downlink frequency sub-band of the respective frequency band of the one of the plurality of paths. The DRx module 310 includes a plurality of amplifiers 314a-314d. Each one of the amplifiers 314a-314d is disposed along a corresponding one of the plurality of paths and configured to amplify a signal received at the amplifier.

In some implementations, the amplifiers 314a-314d are narrowband amplifiers configured to amplify a signal within the respective frequency band of the path in which the amplifier is disposed. In some implementations, the amplifiers 314a-314d are controllable by the DRx controller 302. For example, in some implementations, each of the amplifiers 314a-314d includes an enable/disable input and is enabled (or disabled) based on an amplifier enable signal received and the enable/disable input. The amplifier enable signal may be transmitted by the DRx controller 302. Thus, in some implementations, the DRx controller 302 is configured to selectively activate one or more of the plurality of paths by transmitting an amplifier enable signal to one or more of the amplifiers 314a-314d respectively disposed along the one or more of the plurality of paths. In such implementations, rather than being controlled by the DRx controller 302, the first multiplexer 311 may be a signal splitter that routes the diversity signal to each of the plurality of paths and the second multiplexer 312 may be a signal combiner that combines the signals from each of the plurality of paths. However, in implementations in which the DRx controller 302 controls the first multiplexer 311 and second multiplexer 312, the DRX controller 302 may also enable (or disable) particular amplifiers 314a-314d, e.g., to save battery.

In some implementations, the amplifiers 314a-314d are variable-gain amplifiers (VGAs). Thus, in some implementations, the DRx module 310 includes a plurality of variable-gain amplifiers (VGAs), each one of the VGAs disposed along a corresponding one of the plurality of paths and configured to amplify a signal received at the VGA with a gain controlled by an amplifier control signal received from the DRx controller 302.

The gain of a VGA may be bypassable, step-variable, continuously-variable. In some implementations, at least one of the VGAs includes a fixed-gain amplifier and a bypass switch controllable by the amplifier control signal. The bypass switch may (in a first position) close a line between an input of the fixed-gain amplifier to an output of fixed-gain amplifier, allowing a signal to bypass the fixed-gain amplifier. The bypass switch may (in a second position) open the line between the input and the output, passing a signal through the fixed-gain amplifier. In some implementations, when the bypass switch is in the first position, the fixed-gain amplifier is disabled or otherwise reconfigured to accommodate the bypass mode.

In some implementations, at least one of the VGAs includes a step-variable gain amplifier configured to amplify the signal received at the VGA with a gain of one of plurality of configured amounts indicated by the amplifier control signal. In some implementations, at least one of the VGAs includes a continuously-variable gain amplifier configured to amplify a signal received at the VGA with a gain proportional to the amplifier control signal.

In some implementations, the amplifiers 314a-314d are variable-current amplifiers (VCAs). The current drawn by a VCA may be bypassable, step-variable, continuously-variable. In some implementations, at least one of the VCAs includes a fixed-current amplifier and a bypass switch controllable by the amplifier control signal. The bypass switch may (in a first position) close a line between an input of the fixed-current amplifier to an output of fixed-current amplifier, allowing a signal to bypass the fixed-current amplifier. The bypass switch may (in a second position) open the line between the input and the output, passing a signal through the fixed-current amplifier. In some implementations, when the bypass switch is in the first position, the fixed-current amplifier is disabled or otherwise reconfigured to accommodate the bypass mode.

In some implementations, at least one of the VCAs includes a step-variable current amplifier configured to amplify the signal received at the VCA by drawing a current of one of plurality of configured amounts indicated by the amplifier control signal. In some implementations, at least one of the VCAs includes a continuously-variable current amplifier configured to amplify a signal received at the VCA by drawing a current proportional to the amplifier control signal.

In some implementations, the amplifiers 314a-314d are fixed-gain, fixed-current amplifiers. In some implementations, the amplifiers 314a-314d are fixed-gain, variable-current amplifiers. In some implementations, the amplifiers 314a-314d are variable-gain, fixed-current amplifiers. In some implementations, the amplifiers 314a-314d are variable-gain, variable-current amplifiers.

In some implementations, the DRx controller 302 generates the amplifier control signal(s) based on a quality of service metric of an input signal received at the input. In some implementations, the DRx controller 302 generates the amplifier control signal(s) based on a signal received from the communications controller 120, which may, in turn, be based on a quality of service (QoS) metric of the received signal. The QoS metric of the received signal may be based, at least in part, on the diversity signal received on the diversity antenna 140 (e.g., an input signal received at the input). The QoS metric of the received signal may be further based on a signal received on a primary antenna. In some implementations, the DRx controller 302 generates the amplifier control signal(s) based on a QoS metric of the diversity signal without receiving a signal from the communications controller 120.

In some implementations, the QoS metric includes a signal strength. As another example, the QoS metric may include a bit error rate, a data throughput, a transmission delay, or any other QoS metric.

As noted herein, the DRx module 310 has an input that receives the diversity signal from the diversity antenna 140 and an output that provides a processed diversity signal to the transceiver 330 (via the transmission line 135 and the diversity RF module 320). The diversity RF module 320 receives the processed diversity signal via the transmission line 135 and performs further processing. In particular, the processed diversity signal is split or routed by a diversity RF multiplexer 321 to one or more paths on which the split or routed signal is filtered by corresponding bandpass filters 323a-323d and amplified by corresponding amplifiers 324a-324d. The output of each of the amplifiers 324a-324d is provided to the transceiver 330.

The diversity RF multiplexer 321 may be controlled by the controller 120 (either directly or via or an on-chip diversity RF controller) to selectively activate one or more of the paths. Similarly, the amplifiers 324a-324d may be controlled by the controller 120. For example, in some implementations, each of the amplifiers 324a-324d includes an enable/disable input and is enabled (or disabled) based on an amplifier enable signal. In some implementations, the amplifiers 324a-324d are variable-gain amplifiers (VGAs) that amplify a signal received at the VGA with a gain controlled by an amplifier control signal received from the controller 120 (or an on-chip diversity RF controller controlled by the controller 120). In some implementations, the amplifiers 324a-324d are variable-current amplifiers (VCAs).

With the DRx module 310 added to the receiver chain already including the diversity RF module 320, the number of bandpass filters in the DRx configuration 300 is doubled. Thus, in some implementations, bandpass filters 323a-323d are not included in the diversity RF module 320. Rather, the bandpass filters 313a-313d of the DRx module 310 are used to reduce the strength of out-of-band blockers. Further, the automatic gain control (AGC) table of the diversity RF module 320 may be shifted to reduce the amount of gain provided by the amplifiers 324a-324d of the diversity RF module 320 by the amount of the gain provided by the amplifiers 314a-314d of the DRx module 310.

For example, if the DRx module gain is 15 dB and the receiver sensitivity is −100 dBm, the diversity RF module 320 will see −85 dBm of sensitivity. If the closed-loop AGC of the diversity RF module 320 is active, its gain will drop by 15 dB automatically. However, both signal components and out-of-band blockers are received amplified by 15 dB. Thus, the 15 dB gain drop of the diversity RF module 320 may also be accompanied by a 15 dB increase in its linearity. In particular, the amplifiers 324a-324d of the diversity RF module 320 may be designed such that the linearity of the amplifiers increases with reduced gain (or increased current).

In some implementations, the controller 120 controls the gain (and/or current) of the amplifiers 314a-314d of the DRx module 310 and the amplifiers 324a-324d of the diversity RF module 320. As in the example herein, the controller 120 may reduce an amount of gain provided by the amplifiers 324a-324d of the diversity RF module 320 in response to increasing an amount of gain provided by the amplifiers 314a-314d of the DRx module 310. Thus, in some implementations, the controller 120 is configured to generate a downstream amplifier control signal (for the amplifiers 324a-324d of the diversity RF module 320) based on the amplifier control signal (for the amplifiers 314a-314d of the DRx module 310) to control a gain of one or more downstream amplifiers 324a-324d coupled to the output (of the DRx module 310) via the transmission line 135. In some implementations, the controller 120 also controls the gain of other components of the wireless device, such as amplifiers in the front-end module (FEM), based on the amplifier control signal.

As noted herein, in some implementations, the bandpass filters 323a-323d are not included. Thus, in some implementations, at least one of the downstream amplifiers 324a-324d are coupled to the output (of the DRx module 310) via the transmission line 135 without passing through a downstream bandpass filter.

Figure 40:
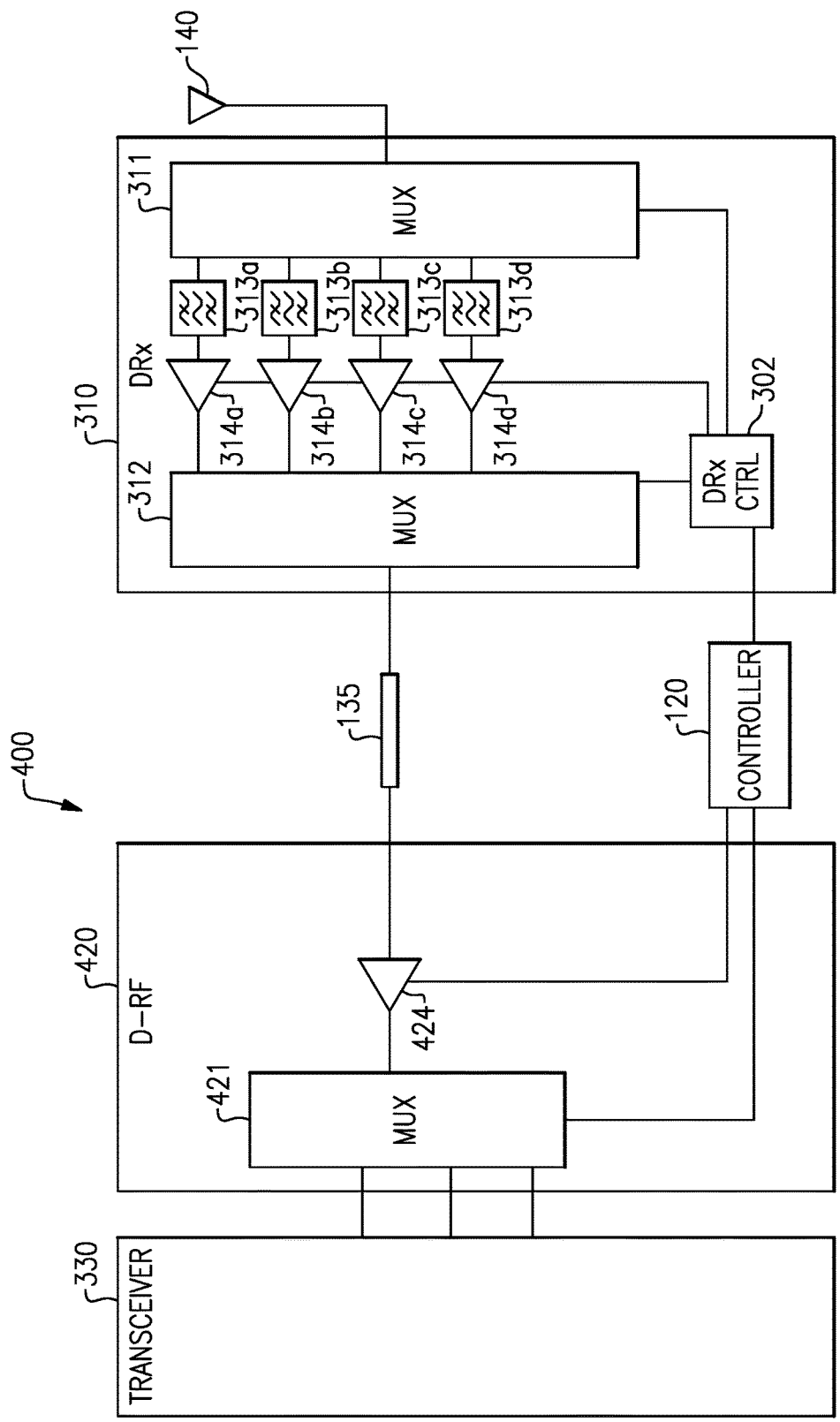
FIG. 40 shows that in some embodiments, a diversity receiver configuration may include a diversity RF module with fewer amplifiers than a diversity receiver (DRx) module.

FIG. 40 shows that in some embodiments, a diversity receiver configuration 400 may include a diversity RF module 420 with fewer amplifiers than a diversity receiver (DRx) module 310. The diversity receiver configuration 400 includes a diversity antenna 140 and a DRx module 310 as described herein with respect to FIG. 39. The output of the DRx module 310 is passed, via a transmission line 135, to a diversity RF module 420 which differs from the diversity RF module 320 of FIG. 39 in that the diversity RF module 420 of FIG. 40 includes fewer amplifiers than the DRx module 310.

As mentioned herein, in some implementations, the diversity RF module 420 does not include bandpass filters. Thus, in some implementations, the one or more amplifiers 424 of the diversity RF module 420 need not be band-specific. In particular, the diversity RF module 420 may include one or more paths, each including an amplifier 424, that are not mapped 1-to-1 with the paths DRx module 310. Such a mapping of paths (or corresponding amplifiers) may be stored in the controller 120.

Accordingly, whereas the DRx module 310 includes a number of paths, each corresponding to a frequency band, the diversity RF module 420 may include one or more paths that do not correspond to a single frequency band.

In some implementations (as shown in FIG. 40), the diversity RF module 420 includes a single wide-band or tunable amplifier 424 that amplifies the signal received from the transmission line 135 and outputs an amplified signal to a multiplexer 421. The multiplexer 421 includes a plurality of multiplexer outputs, each corresponding to a respective frequency band. In some implementations, the diversity RF module 420 does not include any amplifiers.

In some implementations, the diversity signal is a single-band signal. Thus, in some implementations, the multiplexer 421 is a SPMT switch that routes the diversity signal to one of the plurality of outputs corresponding to the frequency band of the single-band signal based on a signal received from the controller 120. In some implementations, the diversity signal is a multi-band signal. Thus, in some implementations, the multiplexer 421 is a signal splitter that routes the diversity signal to two or more of the plurality of outputs corresponding to the two or more frequency bands of the multi-band signal based on a splitter control signal received from the controller 120. In some implementations, diversity RF module 420 may be combined with the transceiver 330 as a single module.

In some implementations, the diversity RF module 420 includes multiple amplifiers, each corresponding to a set of frequency bands. The signal from the transmission line 135 may be fed into a band splitter that outputs high frequencies along a first path to a high-frequency amplifier and outputs low frequencies along a second path to a low-frequency amplifier. The output of each of the amplifiers may be provided to the multiplexer 421 which is configured to route the signal to the corresponding inputs of the transceiver 330.

Figure 41:
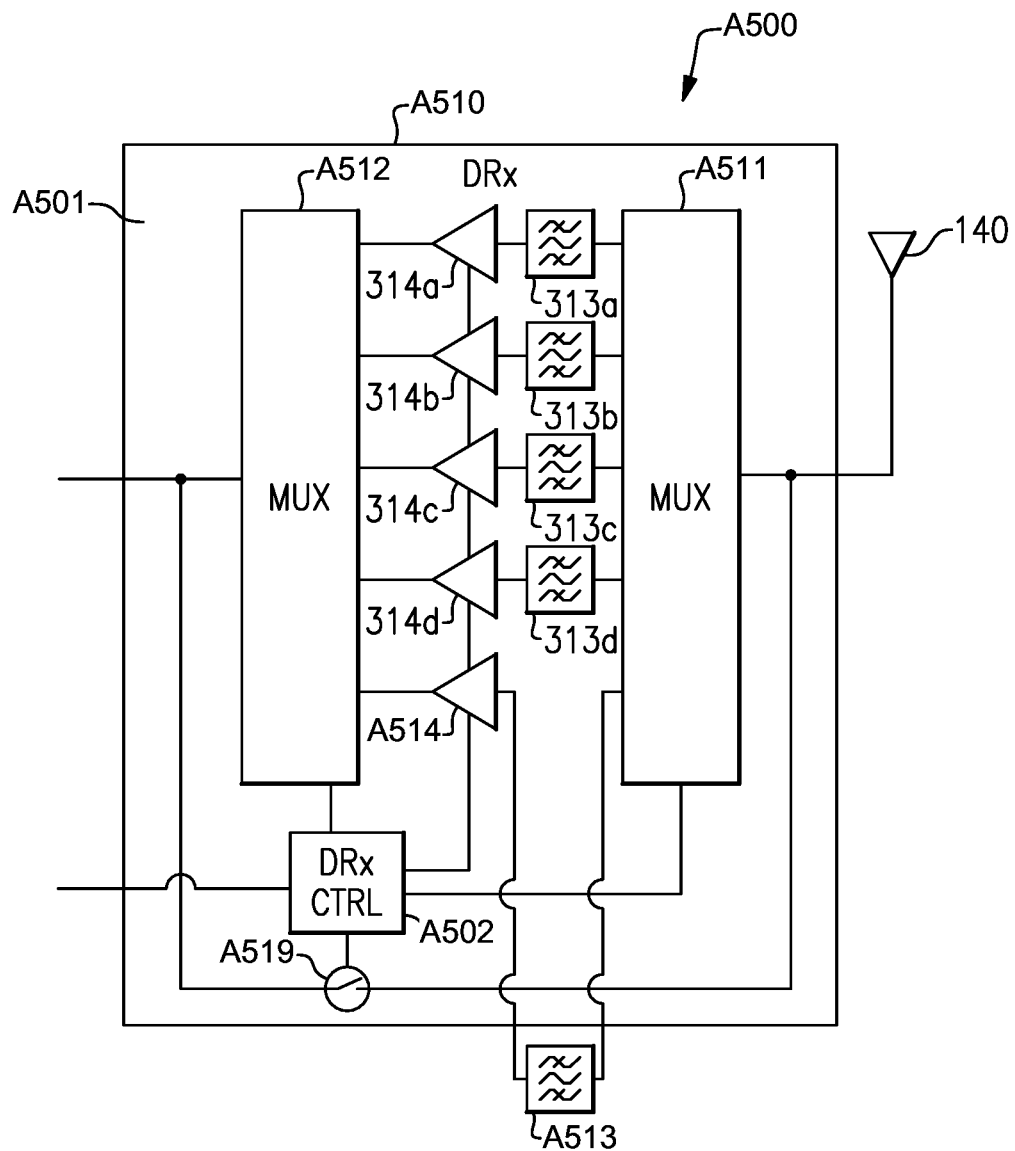
FIG. 41 shows that in some embodiments, a diversity receiver configuration may include a DRx module coupled to an off-module filter.

FIG. 41 shows that in some embodiments, a diversity receiver configuration A500 may include a DRx module A510 coupled to an off-module filter A513. The DRx module A510 may include a packaging substrate A501 configured to receive a plurality of components and a receiving system implemented on the packaging substrate A501. The DRx module A510 may include one or more signal paths that are routed off the DRx module A510 and made available to a system integrator, designer, or manufacturer to support a filter for any desired band.

The DRx module A510 includes a number of paths between the input and the output of the DRx module A510. The DRx module A510 includes a bypass path between the input and the output activated by a bypass switch A519 controlled by the DRx controller A502. Although FIG. 41 illustrates a single bypass switch A519, in some implementations, the bypass switch A519 may include multiple switches (e.g., a first switch disposed physically close to the input and a second switch disposed physically close to the output). As shown in FIG. 41, the bypass path does not include a filter or an amplifier.

The DRx module A510 includes a number of multiplexer paths including a first multiplexer A511 and a second multiplexer A512. The multiplexer paths include a number of on-module paths that include the first multiplexer A511, a bandpass filter 313a-313d implemented on the packaging substrate A501, an amplifier 314a-314d implemented on the packaging substrate A501, and the second multiplexer A512. The multiplexer paths include one or more off-module paths that include the first multiplexer A511, a bandpass filter A513 implemented off the packaging substrate A501, an amplifier A514, and the second multiplexer A512. The amplifier A514 may be a wide-band amplifier implemented on the packaging substrate A501 or may also be implemented off the packaging substrate A501. As described herein, the amplifiers 314a-314d, A514 may be variable-gain amplifiers and/or variable-current amplifiers.

The DRx controller A502 is configured to selectively activate one or more of the plurality of paths between the input and the output. In some implementations, the DRx controller A502 is configured to selectively activate one or more of the plurality of paths based on a band select signal received by the DRx controller A502 (e.g., from a communications controller). The DRx controller A502 may selectively activate the paths by, for example, opening or closing the bypass switch A519, enabling or disabling the amplifiers 314a-314d, A514, controlling the multiplexers A511, A512, or through other mechanisms. For example, the DRx controller A502 may open or close switches along the paths (e.g., between the filters 313a-313d, A513 and the amplifiers 314a-314d, A514) or by setting the gain of the amplifiers 314a-314d, A514 to substantially zero.

Example A: Variable-Gain Amplifiers

As described herein, amplifiers for processing received signals can be variable-gain amplifiers (VGAs). Thus, in some implementations, a DRx module can include a plurality of variable-gain amplifiers (VGAs), with each one of the VGAs being disposed along a corresponding one of the plurality of paths and configured to amplify a signal received at the VGA with a gain controlled by an amplifier control signal received from a DRx controller.

Figure 42:
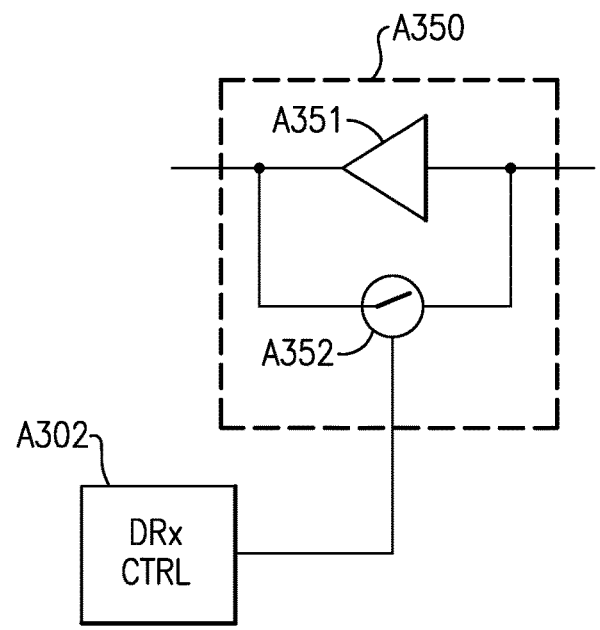
FIG. 42 shows that in some embodiments, gain of a variable-gain amplifier may be bypassable.

In some embodiments, the gain of a VGA may be bypassable, step-variable, continuously-variable. FIG. 42 shows that in some embodiments, a variable-gain amplifier A350 may be bypassable. The VGA A350 includes a fixed-gain amplifier A351 and a bypass switch A352 controllable by an amplifier control signal produced by a DRx controller A302. The bypass switch A352 may (in a first position) close a line from an input of the fixed-gain amplifier A351 to an output of the fixed-gain amplifier, allowing a signal to bypass the fixed-gain amplifier A351. The bypass switch A352 may (in a second position) open the line between the input of the fixed-gain amplifier A351 and the output of the fixed-gain amplifier A351, passing a signal through the fixed-gain amplifier A351. In some implementations, when the bypass switch is in the first position, the fixed-gain amplifier is disabled or otherwise reconfigured to accommodate the bypass mode. Referring to the example of FIG. 39, in some implementations, at least one of the VGAs 314a-314d can include a fixed-gain amplifier and a bypass switch controllable by the amplifier control signal.

Figure 43:
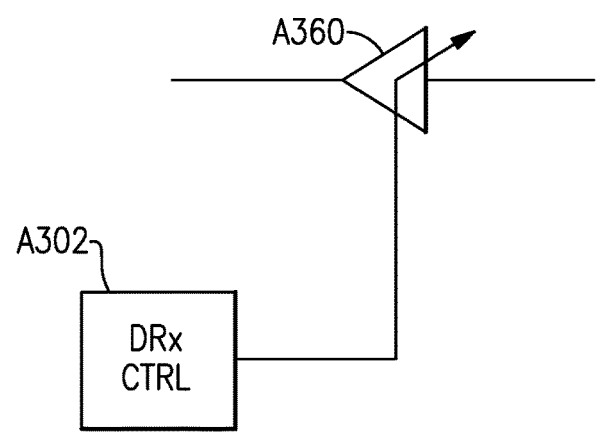
FIG. 43 shows that in some embodiments, gain of a variable-gain amplifier may be step-variable or continuously-variable.

FIG. 43 shows that in some embodiments, the gain of a variable-gain amplifier A360 may be step-variable or continuously-variable. In some implementations, the VGA A360 is step-variable and, in response to a digital amplifier control signal produced by the DRx controller A302, amplifies the signal received at the input of the VGA A360 with a gain of one of a plurality of configured amounts indicated by the digital signal. In some implementations, the VGA A360 is continuously-variable and, in response to an analog amplifier control signal produced by the DRx controller A302, amplifies the signal received at the input of the VGA A360 with a gain proportional to characteristic (e.g., a voltage or duty cycle) of the analog signal. Referring to the example of FIG. 39, in some implementations, at least one of the VGAs 314a-314d can include a step-variable gain amplifier configured to amplify the signal received at the VGA with a gain of one of plurality of configured amounts indicated by the amplifier control signal. In some implementations, at least one of the VGAs 314a-314d of FIG. 39 can include a continuously-variable gain amplifier configured to amplify a signal received at the VGA with a gain proportional to the amplifier control signal.

In some implementations, the amplifiers 314a-314d of FIG. 39 can be variable-current amplifiers (VCAs). The current drawn by a VCA may be bypassable, step-variable, continuously-variable. In some implementations, at least one of the VCAs includes a fixed-current amplifier and a bypass switch controllable by the amplifier control signal. The bypass switch may (in a first position) close a line between an input of the fixed-current amplifier to an output of fixed-current amplifier, allowing a signal to bypass the fixed-current amplifier. The bypass switch may (in a second position) open the line between the input and the output, passing a signal through the fixed-current amplifier. In some implementations, when the bypass switch is in the first position, the fixed-current amplifier is disabled or otherwise reconfigured to accommodate the bypass mode.

In some implementations, at least one of the VCAs includes a step-variable current amplifier configured to amplify the signal received at the VCA by drawing a current of one of plurality of configured amounts indicated by the amplifier control signal. In some implementations, at least one of the VCAs includes a continuously-variable current amplifier configured to amplify a signal received at the VCA by drawing a current proportional to the amplifier control signal.

In some implementations, the amplifiers 314a-314d of FIG. 39 can be fixed-gain, fixed-current amplifiers. In some implementations, the amplifiers 314a-314d are fixed-gain, variable-current amplifiers. In some implementations, the amplifiers 314a-314d are variable-gain, fixed-current amplifiers. In some implementations, the amplifiers 314a-314d are variable-gain, variable-current amplifiers.

In some implementations, the DRx controller 302 generates the amplifier control signal(s) based on a quality of service metric of an input signal received at the input of the first multiplexer 311. In some implementations, the DRx controller 302 generates the amplifier control signal(s) based on a signal received from the communications controller 120, which may, in turn, be based on a quality of service (QoS) metric of the received signal. The QoS metric of the received signal may be based, at least in part, on the diversity signal received on the diversity antenna 140 (e.g., an input signal received at the input). The QoS metric of the received signal may be further based on a signal received on a primary antenna. In some implementations, the DRx controller 302 generates the amplifier control signal(s) based on a QoS metric of the diversity signal without receiving a signal from the communications controller 120.

In some implementations, the QoS metric includes a signal strength. As another example, the QoS metric may include a bit error rate, a data throughput, a transmission delay, or any other QoS metric.

As noted herein, the DRx module 310 of FIG. 39 can have an input that receives the diversity signal from the diversity antenna 140 and an output that provides a processed diversity signal to the transceiver 330 (via the transmission line 135 and the diversity RF module 320). The diversity RF module 320 receives the processed diversity signal via the transmission line 135 and performs further processing. In particular, the processed diversity signal is split or routed by a diversity RF multiplexer 321 to one or more paths on which the split or routed signal is filtered by corresponding bandpass filters 323a-323d and amplified by corresponding amplifiers 324a-324d. The output of each of the amplifiers 324a-324d is provided to the transceiver 330.

The diversity RF multiplexer 321 may be controlled by the controller 120 (either directly or via or an on-chip diversity RF controller) to selectively activate one or more of the paths. Similarly, the amplifiers 324a-324d may be controlled by the controller 120. For example, in some implementations, each of the amplifiers 324a-324d includes an enable/disable input and is enabled (or disabled) based on an amplifier enable signal. In some implementations, the amplifiers 324a-324d are variable-gain amplifiers (VGAs) that amplify a signal received at the VGA with a gain controlled by an amplifier control signal received from the controller 120 (or an on-chip diversity RF controller controlled by the controller 120). In some implementations, the amplifiers 324a-324d are variable-current amplifiers (VCAs).

With the DRx module 310 added to the receiver chain already including the diversity RF module 320, the number of bandpass filters in the DRx configuration 300 is doubled. Thus, in some implementations, bandpass filters 323a-323d are not included in the diversity RF module 320. Rather, the bandpass filters 313a-313d of the DRx module 310 are used to reduce the strength of out-of-band blockers. Further, the automatic gain control (AGC) table of the diversity RF module 320 may be shifted to reduce the amount of gain provided by the amplifiers 324a-324d of the diversity RF module 320 by the amount of the gain provided by the amplifiers 314a-314d of the DRx module 310.

For example, if the DRx module gain is 15 dB and the receiver sensitivity is −100 dBm, the diversity RF module 320 will see −85 dBm of sensitivity. If the closed-loop AGC of the diversity RF module 320 is active, its gain will drop by 15 dB automatically. However, both signal components and out-of-band blockers are received amplified by 15 dB. Thus, in some implementations, the 15 dB gain drop of the diversity RF module 320 is accompanied by a 15 dB increase in its linearity. In particular, the amplifiers 324a-324d of the diversity RF module 320 may be designed such that the linearity of the amplifiers increases with reduced gain (or increased current).

In some implementations, the controller 120 controls the gain (and/or current) of the amplifiers 314a-314d of the DRx module 310 and the amplifiers 324a-324d of the diversity RF module 320. As in the example herein, the controller 120 may reduce an amount of gain provided by the amplifiers 324a-324d of the diversity RF module 320 in response to increasing an amount of gain provided by the amplifiers 314a-314d of the DRx module 310. Thus, in some implementations, the controller 120 is configured to generate a downstream amplifier control signal (for the amplifiers 324a-324d of the diversity RF module 320) based on the amplifier control signal (for the amplifiers 314a-314d of the DRx module 310) to control a gain of one or more downstream amplifiers 324a-324d coupled to the output (of the DRx module 310) via the transmission line 135. In some implementations, the controller 120 also controls the gain of other components of the wireless device, such as amplifiers in the front-end module (FEM), based on the amplifier control signal.

As noted herein, in some implementations, the bandpass filters 323a-323d are not included. Thus, in some implementations, at least one of the downstream amplifiers 324a-324d are coupled to the output (of the DRx module 310) via the transmission line 135 without passing through a downstream bandpass filter. Examples related to such implementations are described herein in reference to FIG. 40.

Figure 44:
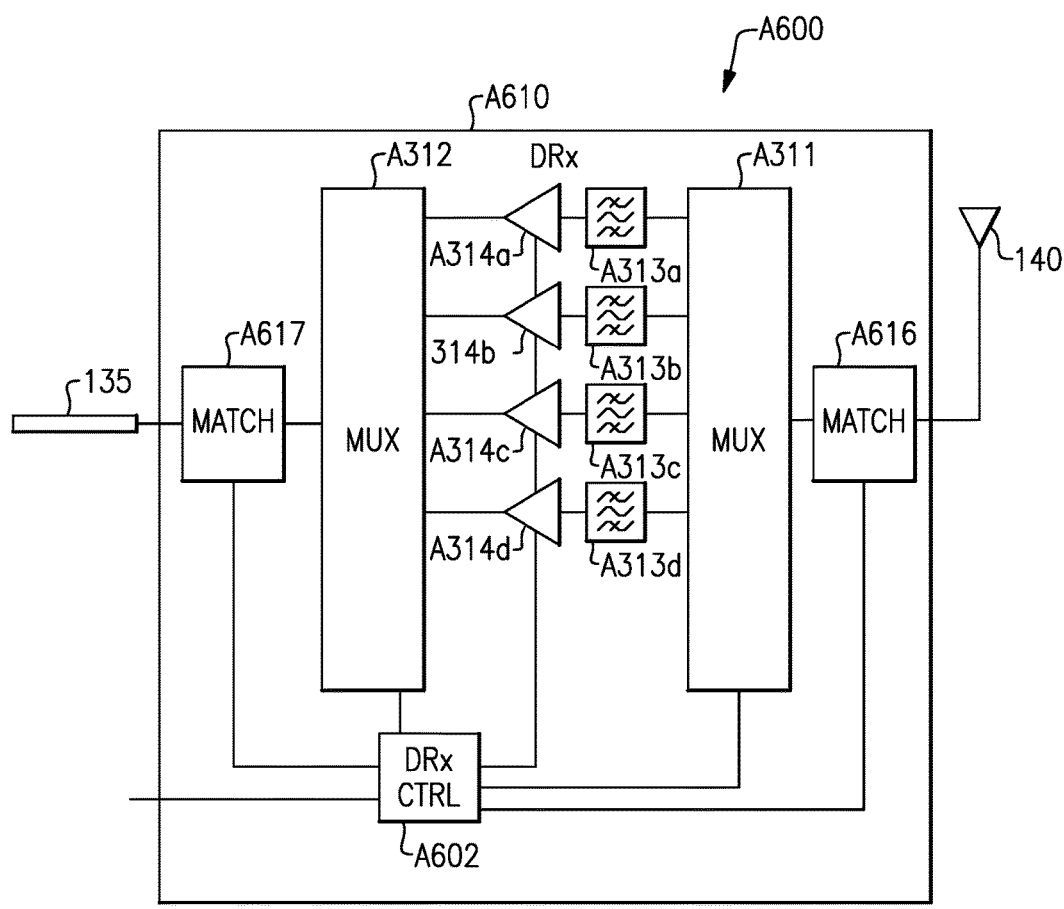
FIG. 44 shows that in some embodiments, a diversity receiver configuration may include a DRx module with tunable matching circuits.

FIG. 44 shows that in some embodiments, a diversity receiver configuration A600 may include a DRx module A610 with tunable matching circuits. In particular, the DRx module A610 may include one or more tunable matching circuits disposed at one or more of the input and the output of the DRx module A610

Multiple frequency bands received on the same diversity antenna 140 are unlikely to all see an ideal impedance match. To match each frequency band using a compact matching circuit, a tunable input matching circuit A616 may be implemented at the input of the DRx module A610 and controlled by the DRx controller A602 (e.g., based on a band select signal from a communications controller). The DRx controller A602 may tune the tunable input matching circuit A616 based on a lookup table that associates frequency bands (or sets of frequency bands) with tuning parameters. The tunable input matching circuit A616 may be a tunable T-circuit, a tunable PI-circuit, or any other tunable matching circuit. In particular, the tunable input matching circuit A616 may include one or more variable components, such as resistors, inductors, and capacitors. The variable components may be connected in parallel and/or in series and may be connected between the input of the DRx module A610 and the input of the first multiplexer A311 or may be connected between the input of the DRx module A610 and a ground voltage.

Similarly, with only one transmission line 135 (or, at least, few cables) carrying signals of many frequency bands, it is not likely that multiple frequency bands will all see an ideal impedance match. To match each frequency band using a compact matching circuit, a tunable output matching circuit A617 may be implemented at the output of the DRx module A610 and controlled by the DRx controller A602 (e.g., based on a band select signal from a communications controller). The DRx controller A602 may tune the tunable output matching circuit A618 based on a lookup table that associates frequency bands (or sets of frequency bands) with tuning parameters. The tunable output matching circuit A617 may be a tunable T-circuit, a tunable PI-circuit, or any other tunable matching circuit. In particular, the tunable output matching circuit A617 may include one or more variable components, such as resistors, inductors, and capacitors. The variable components may be connected in parallel and/or in series and may be connected between the output of the DRx module A610 and the output of the second multiplexer A312 or may be connected between the output of the DRx module A610 and a ground voltage.

Figure 45:
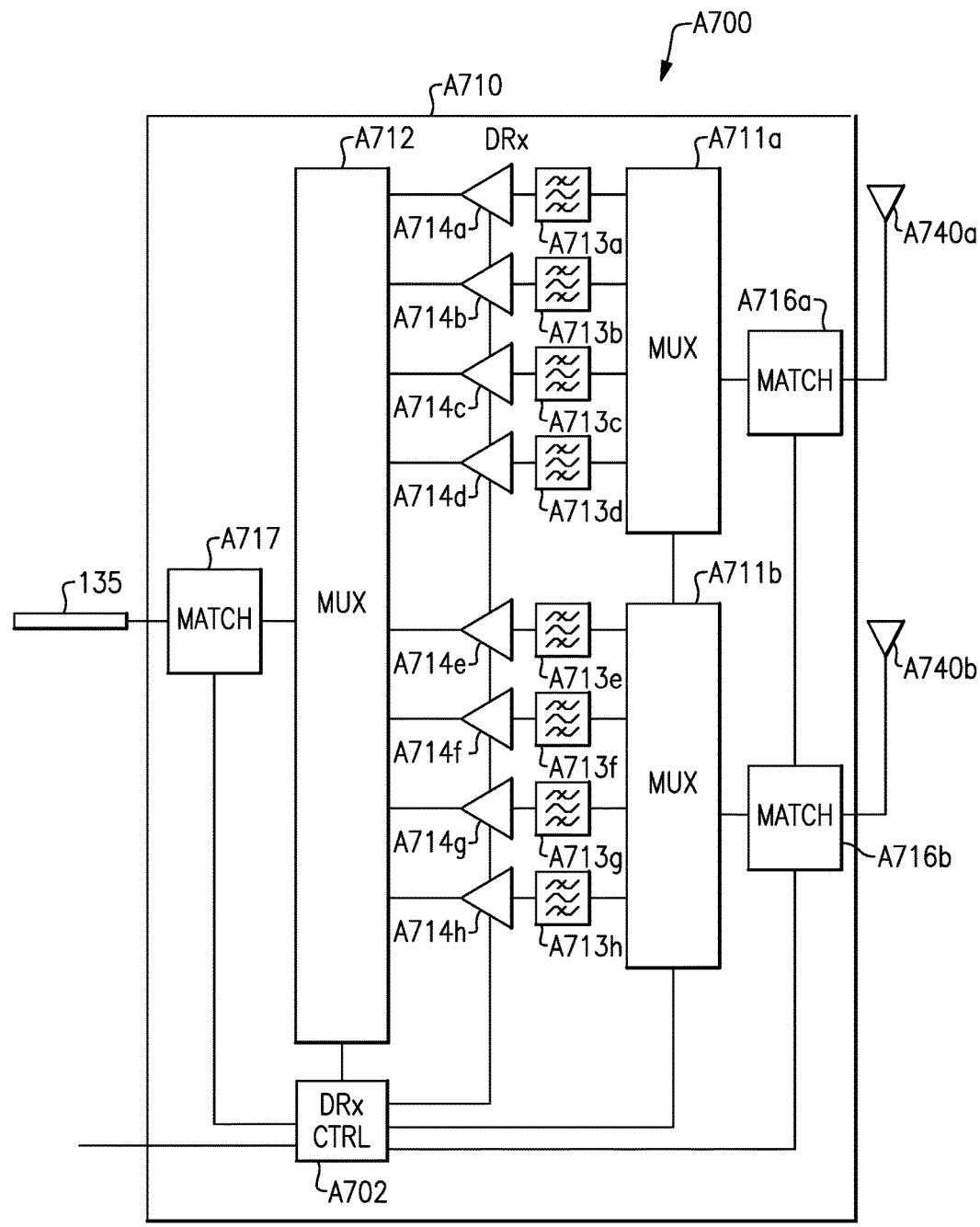
FIG. 45 shows that in some embodiments, a diversity receiver configuration may include multiple antennas.

FIG. 45 shows that in some embodiments, a diversity receiver configuration A700 may include multiple antennas. Although FIG. 45 illustrates an embodiment with two antennas A740a-A740b and one transmission line 135, aspects described herein may be implemented in embodiments with more than two antennas and/or two or more cables.

The diversity receiver configuration A700 includes a DRx module A710 coupled to a first antenna A740a and a second antenna A740b. In some implementations, the first antenna A740a is a high-band antenna configured to receive signals transmitted at higher frequency bands and the second antenna A740b is a low-band antenna configured to receive signals transmitted at lower frequency bands.

The DRx module A710 includes a first tunable input matching circuit A716a at a first input of the DRx module A710 and a second tunable input matching circuit A716b at a second input of the DRx module A710. The DRx module A710 further includes a tunable output matching circuit A717 at the output of the DRx module A710. The DRx controller A702 may tune each of the tunable matching circuits A716a-A716b, A717 based on a lookup table that associates frequency bands (or sets of frequency bands) with tuning parameters. Each of the tunable matching circuits A716a-A716b, A717 may be a tunable T-circuit, a tunable PI-circuit, or any other tunable matching circuit.

The DRx module A710 includes a number of paths between the inputs (the first input coupled to the first antenna A740a and the second input coupled to the second antenna A740b) and the output (coupled to the transmission line 135) of the DRx module A710. In some implementations, the DRx module A710 includes one or more bypass paths (not shown) between the inputs and the output activated by one or more bypass switches controlled by the DRx controller A702.

The DRx module A710 includes a number of multiplexer paths including one of a first input multiplexer A711a or a second input multiplexer A711b and including an output multiplexer A712. The multiplexer paths include a number of on-module paths (shown) that include one of the tunable input matching circuit A716a-A716b, one of the input multiplexers A711a-A711b, a bandpass filter A713a-A713h, an amplifier A714a-A714h, the output multiplexer A712, and the output matching circuit A717. The multiplexer paths may include one or more off-module paths (not shown) as described herein. As also described herein, the amplifiers A714a-A714h may be variable-gain amplifiers and/or variable-current amplifiers.

The DRx controller A702 is configured to selectively activate one or more of the plurality of paths between the input and the output. In some implementations, the DRx controller A702 is configured to selectively activate one or more of the plurality of paths based on a band select signal received by the DRx controller A702 (e.g., from a communications controller). In some implementations, the DRx controller A702 is configured to tune the tunable matching circuits A716a-A716b, A717 based on the band select signal. The DRx controller A702 may selectively activate the paths by, for example, enabling or disabling the amplifiers A714a-A714h, controlling the multiplexers A711a-A711b, A712, or through other mechanisms as described herein.

Figure 46:
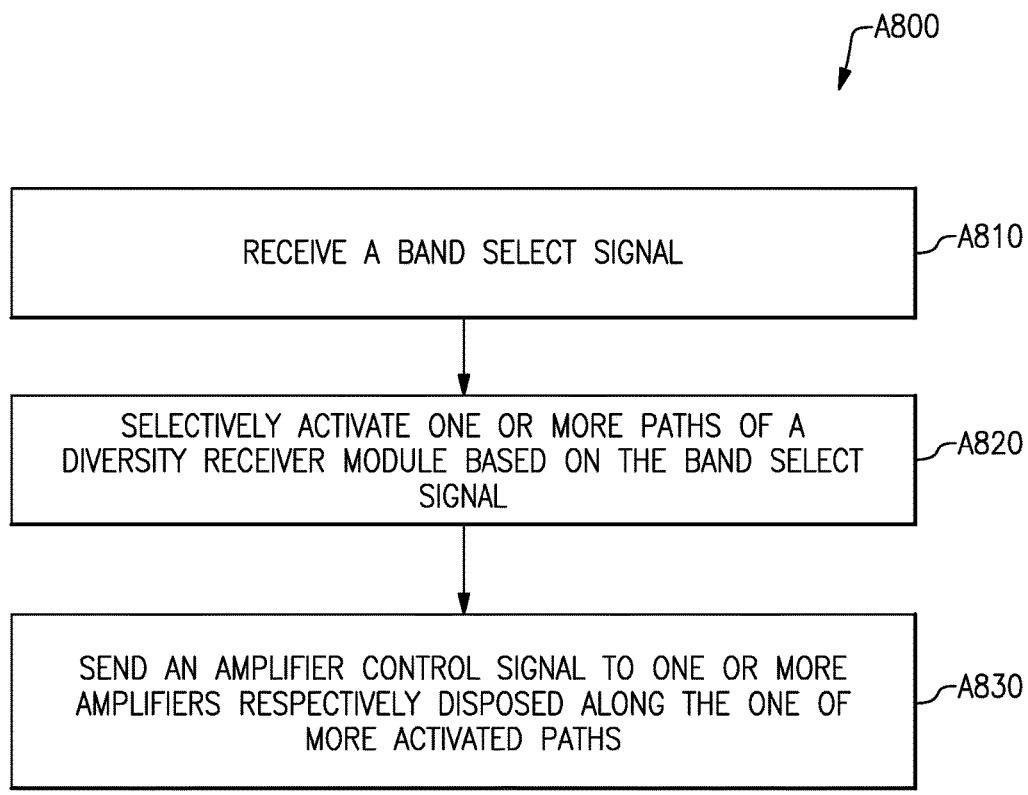
FIG. 46 shows an embodiment of a flowchart representation of a method of processing an RF signal.

FIG. 46 shows an embodiment of a flowchart representation of a method of processing an RF signal. In some implementations (and as detailed below as an example), the method A800 is performed by a controller, such as the DRx controller 302 of FIG. 39 or the communications controller 120 of FIG. 39. In some implementations, the method A800 is performed by processing logic, including hardware, firmware, software, or a combination thereof. In some implementations, the method A800 is performed by a processor executing code stored in a non-transitory computer-readable medium (e.g., a memory). Briefly, the method A800 includes receiving a band select signal and routing a received RF signal along one or more gain-controlled paths to process the received RF signal.

The method A800 begins, at block A810, with the controller receiving a band select signal. The controller may receive the band select signal from another controller or may receive the band select signal from a cellular base station or other external source. The band select signal may indicate one or more frequency bands over which a wireless device is to transmit and receive RF signals. In some implementations, the band select signal indicates a set of frequency bands for carrier aggregation communication.

In some implementations, the controller tunes one or more tunable matching circuits based on the received band select signal. For example, the controller may tune the tunable matching circuits based on a lookup table that associates frequency bands (or sets of frequency bands) indicated by the band select signal with tuning parameters.

At block A820, the controller selectively activates one or more paths of a diversity receiver (DRx) module based on the band select signal. As described herein, a DRx module may include a number of paths between one or more inputs (coupled to one or more antennas) and one or more outputs (coupled to one or more cables) of the DRx module. The paths may include bypass paths and multiplexer paths. The multiplexer paths may include on-module paths and off-module paths.

The controller may selectively activate one or more of the plurality of paths by, for example, opening or closing one or more bypass switches, enabling or disabling amplifiers disposed along the paths via an amplifier enable signal, controlling one or more multiplexers via a splitter control signal and/or a combiner control signal, or through other mechanisms. For example, the controller may open or close switches disposed along the paths or by setting the gain of the amplifiers disposed along the paths to substantially zero.

At block A830, the controller sends an amplifier control signal to one or more amplifiers respectively disposed along the one or more activated paths. The amplifier control signal controls the gain (or current) of the amplifier to which it is sent. In one embodiment, the amplifier includes a fixed-gain amplifier and a bypass switch controllable by the amplifier control signal. Thus, in one embodiment, the amplifier control signal indicates whether the bypass switch is to be open or closed.

In one embodiment, the amplifier includes a step-variable gain amplifier configured to amplify the signal received at the amplifier with a gain of one of a plurality of configured amounts indicated by the amplifier control signal. Thus, in one embodiment, the amplifier control signal indicates one of a plurality of configured amounts.

In one embodiment, the amplifier includes a continuously-variable gain amplifier configured to amplify the signal received at the amplifier with a gain proportional to the amplifier control signal. Thus, in one embodiment, the amplifier control signal indicates a proportional amount of gain.

In some implementations, the controller generates the amplifier control signal(s) based on a quality of service (QoS) metric of an input signal received at the input. In some implementations, the controller generates the amplifier control signal(s) based on a signal received from another controller, which may, in turn, be based on a QoS metric of the received signal. The QoS metric of the received signal may be based, at least in part, on the diversity signal received on the diversity antenna (e.g., an input signal received at the input). The QoS metric of the received signal may be further based on a signal received on a primary antenna. In some implementations, the controller generates the amplifier control signal(s) based on a QoS metric of the diversity signal without receiving a signal from another controller. For example, the QoS metric may include a signal strength. As another example, the QoS metric may include a bit error rate, a data throughput, a transmission delay, or any other QoS metric.

In some implementations, the controller, in block A830, also sends a downstream amplifier control signal based on the amplifier control signal to control a gain of one or more downstream amplifiers coupled to the output via one or more cables.

Among others, the foregoing Example A related to variable-gain amplifiers can be summarized as follows.

In accordance with some implementations, the present disclosure relates to a receiving system including a controller configured to selectively activate one or more of a plurality of paths between an input of a first multiplexer and an output of a second multiplexer. The receiving system further includes a plurality of bandpass filters. Each one of the plurality of bandpass filters is disposed along a corresponding one of the plurality of paths and is configured to filter a signal received at the bandpass filter to a respective band. The receiving system further includes a plurality of variable-gain amplifiers (VGAs). Each one of the plurality of VGAs is disposed along a corresponding one of the plurality of paths and is configured to amplifer a signal received at the VGA with a gain controlled by an amplifier control signal received from the controller.

In some embodiments, the controller can be configured to selectively activate the one or more of the plurality of paths based on a band select signal received by the controller. In some embodiments, the controller can be configured to selectively activate the one or more of the plurality of paths by transmitting a splitter control signal to the first multiplexer and a combiner control signal to the second multiplexer. In some embodiments, the controller can be configured to selectively activate the one or more of the plurality of paths by transmitting an amplifier enable signal to one or more of the plurality of VGAs respectively disposed along the one or more of the plurality of paths.

In some embodiments, at least one of the VGAs can include a fixed-gain amplifier and a bypass switch controllable by the amplifier control signal. In some embodiments, at least one of the VGAs can include a step-variable gain amplifier configured to amplify the signal received at the VGA with a gain of one of a plurality of configured amounts indicated by the amplifier control signal or a continuously-variable gain amplifier configured to amplify the signal received at the VGA with a gain proportional to the amplifier control signal. In some embodiments, at least one of the VGAs can include a variable-current amplifier configured to amplify the signal received at the amplifier by drawing an amount of current controlled by the amplifier control signal.

In some embodiments, the amplifier control signal is based on a quality of service metric of an input signal received at the input of the first multiplexer.

In some embodiments, at least one of the VGAs can include a low-noise amplifier.

In some embodiments, the receiving system can further include one or more tunable matching circuits disposed at one or more of the input and the output.

In some embodiments, the receiving system can further include a transmission line coupled to the output of the second multiplexer and coupled to a downstream module including one or more downstream amplifiers. In some embodiments, the controller can be further configured to generate a downstream amplifier control signal based on the amplifier control signal to control a gain of the one or more downstream amplifiers. In some embodiments, at least one of the downstream amplifiers can be coupled to the transmission line without passing through a downstream bandpass filter. In some embodiments, a number of the one or more downstream amplifiers can be less than a number of the VGAs.

In some implementations, the present disclosure relates to a radio-frequency (RF) module that includes a packaging substrate configured to receive a plurality of components. The RF module further includes a receiving system implemented on the packaging substrate. The receiving system includes a controller configured to selectively activate one or more of a plurality of paths between an input of a first multiplexer and an output of a second multiplexer (e.g., an input of the RF module and an output of the RF module). The receiving system further includes a plurality of bandpass filters. Each one of the bandpass filters is disposed along a corresponding one of the plurality of paths and is configured to filter a signal received at the bandpass filter to a respective frequency band. The receiving system further includes a plurality of variable-gain amplifiers (VGAs). Each one of the plurality of VGAs is disposed along a corresponding one of the plurality of paths and is configured to amplify a signal received at the VGA with a gain controlled by an amplifier control signal received from the controller.

In some embodiments, the RF module can be a diversity receiver front-end module (FEM).

In some embodiments, the plurality of paths includes an off-module path. The off-module path can include an off-module bandpass filter and one of the plurality of VGAs.

According to some teachings, the present disclosure relates to a wireless device that includes a first antenna configured to receive a first radio-frequency (RF) signal. The wireless device further includes a first front-end module (FEM) in communication with the first antenna. The first FEM including a packaging substrate configured to receive a plurality of components. The first FEM further includes a receiving system implemented on the packaging substrate. The receiving system includes a controller configured to selectively activate one or more of a plurality of paths between an input of a first multiplexer and an output of a second multiplexer. The receiving system further includes a plurality of bandpass filters. Each one of the plurality of bandpass filters is disposed along a corresponding one of the plurality of paths and is configured to filter a signal received at the bandpass filter to a respective frequency band. The receiving system further includes a plurality of variable-gain amplifiers (VGAs). Each one of the plurality of VGAs is disposed along a corresponding one of the plurality of paths and is configured to amplify a signal received at the VGA with a gain controlled by an amplifier control signal received from the controller. The wireless device further includes a communications module configured to receive a processed version of the first RF signal from the output via a cable and generate data bits based on the processed version of the first RF signal.

In some embodiments, the wireless device further includes a second antenna configured to receive a second radio-frequency (RF) signal and a second FEM in communication with the second antenna. The communications module can be configured to receive a processed version of the second RF signal from an output of the second FEM and generate the data bits based on the processed version of the second RF signal.

In some embodiment, the wireless device includes a communications controller configured to control the first FEM and a gain of one or more downstream amplifiers of the communications module.

Example B: Phase-Shifting Components

Figure 47:
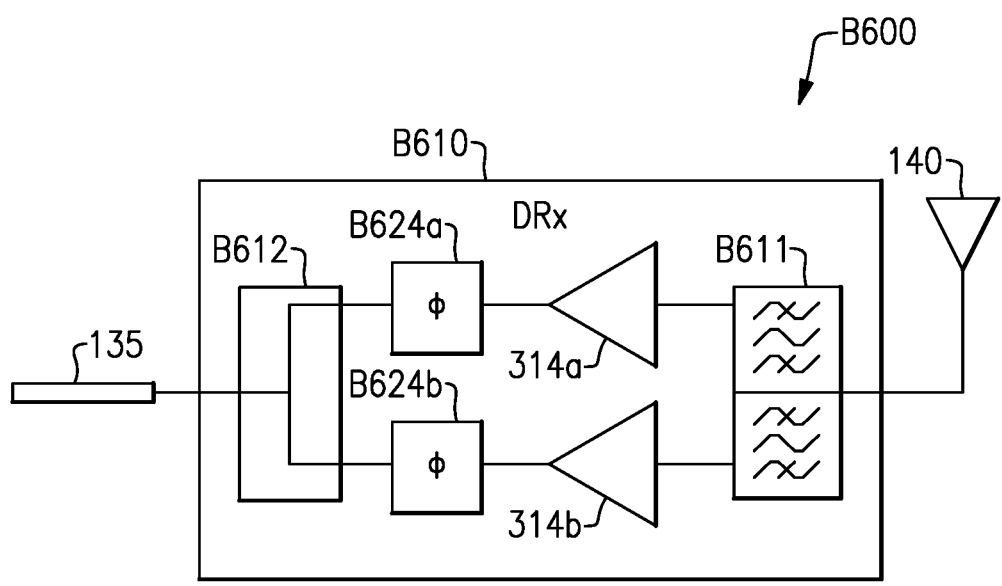
FIG. 47 shows that in some embodiments, a diversity receiver configuration may include a DRx module with one or more phase matching components.

FIG. 47 shows that in some embodiments, a diversity receiver configuration B600 may include a DRx module B610 with one or more phase matching components B624a-B624b. The DRx module B610 includes two paths from an input of the DRx module B610, coupled to an antenna 140, and an output of the DRx module B610, coupled to a transmission line 135.

In the DRx module B610 of FIG. 47, the signal splitter and bandpass filters are implemented as a diplexer B611. The diplexer B611 includes an input coupled to the antenna 140, a first output coupled to a first amplifier 314a, and a second output coupled to a second amplifier 314b. At the first output, the diplexer B611 outputs a signal received at the input (e.g., from the antenna 140) filtered to a first frequency band. At the second output, the diplexer B611 outputs the signal received at the input filtered to a second frequency band. In some implementations, the diplexer B611 may be replaced with a triplexer, a quadplexer, or any other multiplexer configured to split an input signal received at the input of the DRx module B610 into a plurality of signals at a respective plurality of frequency bands propagated along a plurality of paths.

As described herein, each one of the amplifiers 314a-314b is disposed along a corresponding one of the paths and is configured to amplify a signal received at the amplifier. The output of the amplifiers 314a-314b are fed through a corresponding phase-shift component B624a-B624b before being combined by a signal combiner B612.

The signal combiner B612 includes a first input coupled to the first phase shift component B624a, a second input coupled to second phase shift component B624b, and an output coupled to the output of the DRx module B610. The signal at the output of the signal combiner is a sum of the signals at the first input and the second input. Thus, the signal combiner is configured to combine signals propagated along the plurality of paths.

When a signal is received by the antenna 140, the signal is filtered by the diplexer B611 to a first frequency band and propagated along the first path through the first amplifier 314a. The filtered and amplified signal is phase-shifted by the first phase-shift component B624a and fed to the first input of the signal combiner B612. In some implementations, the signal combiner B612 or the second amplifier 314b do not prevent the signal from continuing through the signal combiner B612 along the second path in a reverse direction. Thus, the signal propagates through the second phase-shift component B624b and through the second amplifier 314b, where it reflects off the diplexer B611. The reflected signal propagates through the second amplifier 314b and the second phase-shift component B624b to reach the second input of the signal combiner B612.

When the initial signal (at the first input of the signal combiner B612) and the reflected signal (at the second input of the signal combiner B612) are out-of-phase, the summation performed by the signal combiner B612 results in a weakening of the signal at the output of the signal combiner B612. Similarly, when the initial signal and the reflected signal are in-phase, the summation performed by the signal combiner B612 results in a strengthening of the signal at the output of the signal combiner B612. Thus, in some implementations, the second phase-shift component B624b is configured to phase-shift the signal (at least in the first frequency band) such that the initial signal and the reflected signal are at least partially in-phase. In particular, the second phase-shift component B624b is configured to phase-shift the signal (at least in the first frequency band) such that the amplitude of the sum of initial signal and the reflected signal is greater than the amplitude of the initial signal.

For example, the second phase-shift component B624b may be configured to phase-shift a signal passing through the second phase-shift component B624b by −½ times the phase-shift introduced by reverse propagation through the second amplifier 314b, reflection off the diplexer B611, and forward propagation through the second amplifier 314b. As another example, the second phase-shift component B624b may be configured to phase-shift a signal passing through the second phase-shift component B624b by half of the difference between 360 degrees and the phase-shift introduced by reverse propagation through the second amplifier 314b, reflection off the diplexer B611, and forward propagation through the second amplifier 314b. In general, the second phase-shift component B624b may be configured to phase-shift a signal passing through the second phase-shift component B624b such that the initial signal and the reflected signal have a phase difference of an integer multiple (including zero) of 360 degrees.

As an example, the initial signal may be at 0 degrees (or any other reference phase), and the reverse propagation through the second amplifier 314b, reflection off the diplexer B611, and forward propagation through the second amplifier 314b may introduce a phase shift of 140 degrees. Thus, in some implementations, the second phase-shift component B624b is configured to phase-shift a signal passing through the second phase-shift component B624b by −70 degrees. Thus, the initial signal is phase-shifted to −70 degrees by the second phase-shift component B624b, to 70 degrees by reverse propagation through the second amplifier 314b, reflection off the diplexer B611, and forward propagation through the second amplifier 314b, and back to 0 degrees by the second-phase shift component B624b.

In some implementations, the second phase-shift component B624b is configured to phase-shift a signal passing through the second phase-shift component B624b by 110 degrees. Thus, the initial signal is phase-shifted to 110 degrees by the second phase-shift component B624b, to 250 degrees by reverse propagation through the second amplifier 314b, reflection off the diplexer B611, and forward propagation through the second amplifier 314b, and to 360 degrees by the second-phase shift component B624b.

At the same time, the signal received by the antenna 140 is filtered by the diplexer B611 to a second frequency band and propagated along the second path through the second amplifier 314b. The filtered and amplified signal is phase-shifted by the second phase-shift component B624b and fed to the second input of the signal combiner B612. In some implementations, the signal combiner B612 or the first amplifier 314a do not prevent the signal from continuing through the signal combiner B612 along the first path in a reverse direction. Thus, the signal propagates through the first phase-shift component B624a and through the second amplifier 314a, where it reflects off the diplexer B611. The reflected signal propagates through the first amplifier 314a and the first phase-shift component B624a to reach the first input of the signal combiner B612.

When the initial signal (at the second input of the signal combiner B612) and the reflected signal (at the first input of the signal combiner B612) are out-of-phase, the summation performed by the signal combiner B612 results in a weakening of the signal at the output of the signal combiner B612 and when the initial signal and the reflected signal are in-phase, the summation performed by the signal combiner B612 results in a strengthening of the signal at the output of the signal combiner B612. Thus, in some implementations, the first phase-shift component B624a is configured to phase-shift the signal (at least in the second frequency band) such that the initial signal and the reflected signal are at least partially in-phase.

For example, the first phase-shift component B624a may be configured to phase-shift a signal passing through the first phase-shift component B624a by −½ times the phase-shift introduced by reverse propagation through the first amplifier 314a, reflection off the diplexer B611, and forward propagation through the first amplifier 314a. As another example, the first phase-shift component B624a may be configured to phase-shift a signal passing through the first phase-shift component B624a by half of the difference between 360 degrees and the phase-shift introduced by reverse propagation through the first amplifier 314a, reflection off the diplexer B611, and forward propagation through the first amplifier 314a. In general, the first phase-shift component B624a may be configured to phase-shift a signal passing through the first phase-shift component B624a such that the initial signal and the reflected signal have a phase difference of an integer multiple (including zero) of 360 degrees.

The phase-shift components B624a-B624b may be implemented as passive circuits. In particular, the phase-shift components B624a-B624b may be implemented as LC circuits and include one or more passive components, such as inductors and/or capacitors. The passive components may be connected in parallel and/or in series and may be connected between the outputs of the amplifiers 314a-314b and the inputs of the signal combiner B612 or may be connected between the outputs of the amplifiers 314a-314b and a ground voltage. In some implementations, the phase-shift components B624a-B624b are integrated into the same die as the amplifiers 314a-314b or on the same package.

In some implementations (e.g., as shown in FIG. 47), the phase-shift components B624a-B624b are disposed along the paths after the amplifiers 314a-314b. Thus, any signal attenuation caused by the phase-shift components B624a-B624b does not affect the performance of the module B610, e.g., the signal-to-noise ratio of the output signal. However, in some implementations, the phase-shift components B624a-B624b are disposed along the paths before the amplifiers 314a-314b. For example, the phase-shift components B624a-B624b may be integrated into an impedance matching component disposed between the diplexer B611 and the amplifiers 314a-314b.

Figure 48:
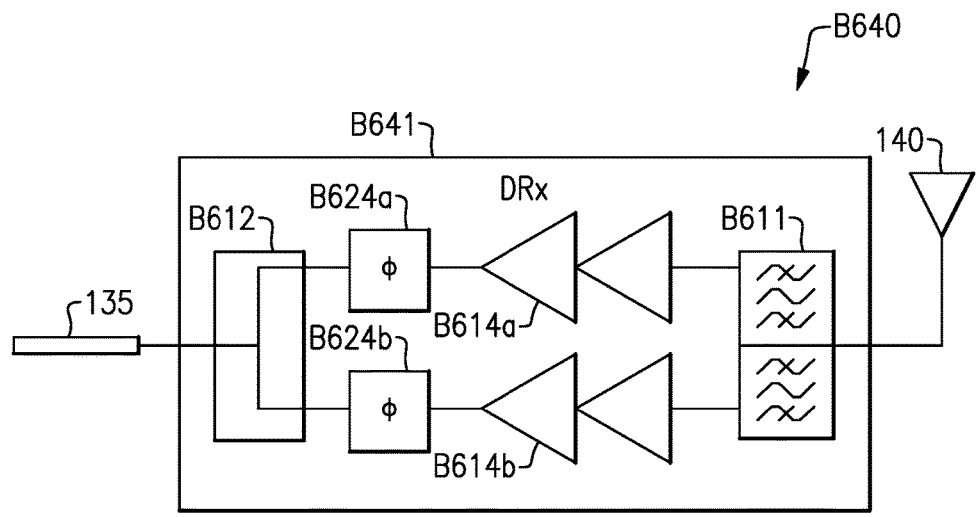
FIG. 48 shows that in some embodiments, a diversity receiver configuration may include a DRx module with one or more phase matching components and dual-stage amplifiers.

FIG. 48 shows that in some embodiments, a diversity receiver configuration B640 may include a DRx module B641 with one or more phase matching components B624a-B624b and dual-stage amplifiers B614a-B614b. The DRx module B641 of FIG. 48 is substantially similar to the DRx module B610 of FIG. 47, except that the amplifiers 314a-314b of the DRx module B610 of FIG. 47 are replaced with dual-stage amplifiers B614a-B614b in the DRx module B641 of FIG. 48.

Figure 49:
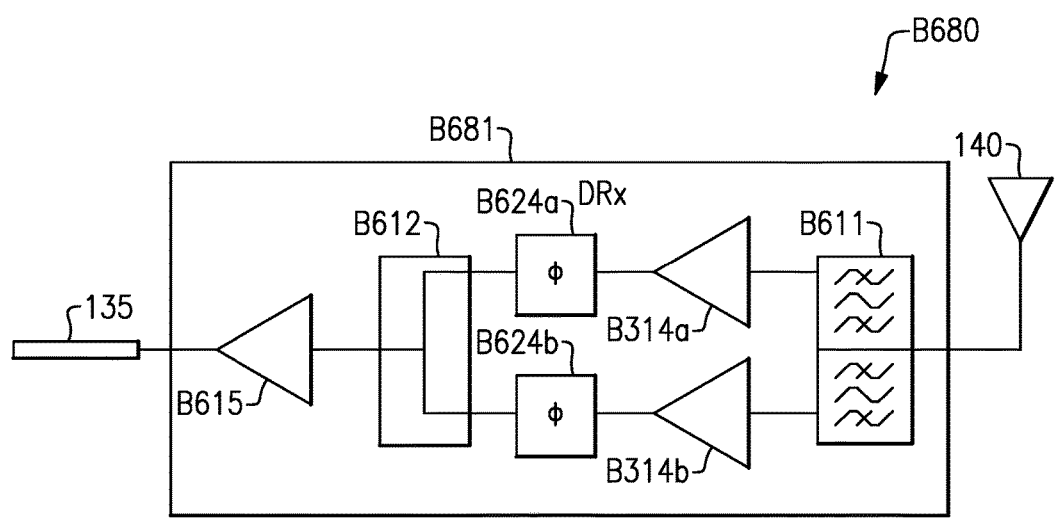
FIG. 49 shows that in some embodiments, a diversity receiver configuration may include a DRx module with one or more phase matching components and a post-combiner amplifier.

FIG. 49 shows that in some embodiments, a diversity receiver configuration B680 may include a DRx module B681 with one or more phase matching components B624a-B624b and a post-combiner amplifier B615. The DRx module B681 of FIG. 49 is substantially similar to the DRx module B610 of FIG. 47, except that the DRx module B681 of FIG. 49 includes a post-combiner amplifier B615 disposed between the output of the signal combiner B612 and the output of the DRx module B681. Like the amplifiers 314a-314b, the post-combiner amplifier B615 may be a variable-gain amplifier (VGA) and/or a variable-current amplifier controlled by a DRx controller (not shown).

Figure 50:
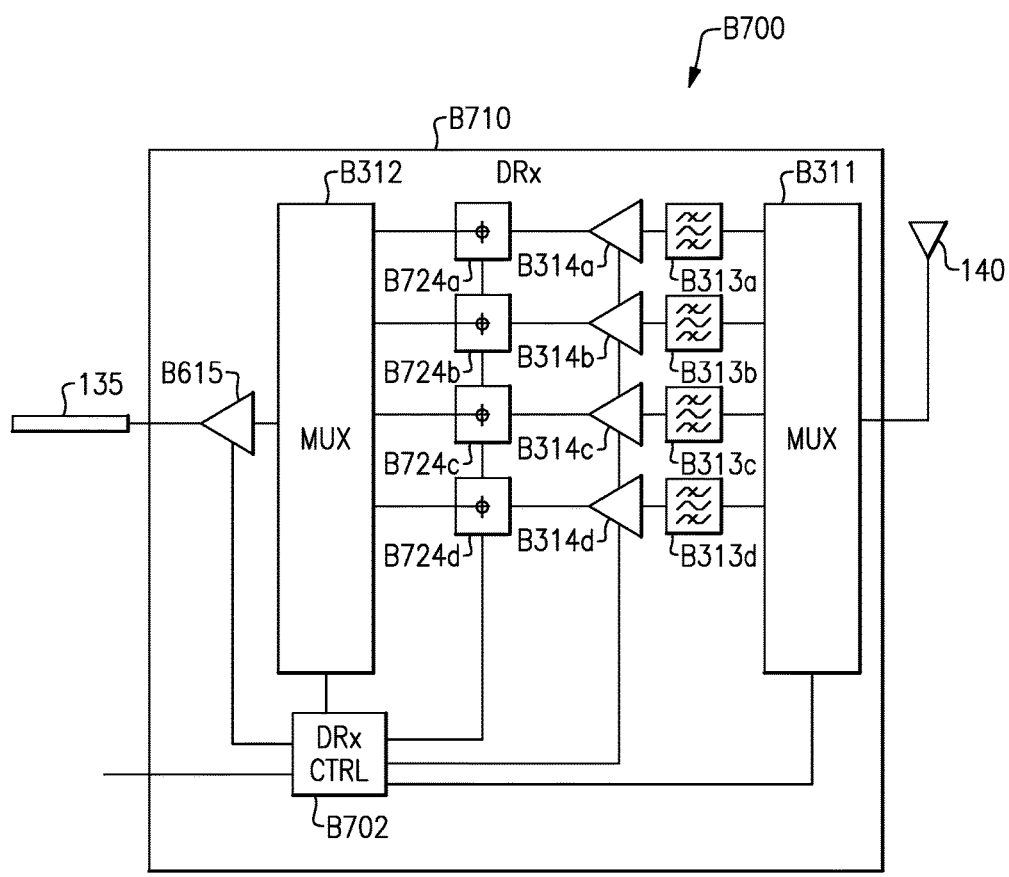
FIG. 50 shows that in some embodiments, a diversity receiver configuration may include a DRx module with tunable phase-shift components.

FIG. 50 shows that in some embodiments, a diversity receiver configuration B700 may include a DRx module B710 with tunable phase-shift components B724a-B724d. Each of the tunable phase-shift components B724a-B724d may be configured to phase-shift a signal passing through the tunable phase-shift component an amount controlled by a phase-shift tuning signal received from a DRx controller B702.

The diversity receiver configuration B700 includes a DRx module B710 having an input coupled to an antenna 140 and an output coupled to a transmission line 135. The DRx module B710 includes a number of paths between the input and the output of the DRx module B710. In some implementations, the DRx module B710 includes one or more bypass paths (not shown) between the inputs and the output activated by one or more bypass switches controlled by the DRx controller B702.

The DRx module B710 includes a number of multiplexer paths including an input multiplexer B311 and an output multiplexer B312. The multiplexer paths include a number of on-module paths (shown) that include the input multiplexer B311, a bandpass filter B313a-B313d, an amplifier B314a-B314d, a tunable phase-shift component B724a-B724d, the output multiplexer B312, and a post-combiner amplifier B615. The multiplexer paths may include one or more off-module paths (not shown) as described herein. As also described herein, the amplifiers B314a-B314d (including the post-gain amplifier B615) may be variable-gain amplifiers and/or variable-current amplifiers.

The tunable phase-shift components B724a-B724d may include one or more variable components, such as inductors and capacitors. The variable components may be connected in parallel and/or in series and may be connected between the outputs of the amplifiers B314a-B314d and the inputs of the output multiplexer B312 or may be connected between the outputs of the amplifiers B314a-B314d and a ground voltage.

The DRx controller B702 is configured to selectively activate one or more of the plurality of paths between the input and the output. In some implementations, the DRx controller B702 is configured to selectively activate one or more of the plurality of paths based on a band select signal received by the DRx controller B702 (e.g., from a communications controller). The DRx controller B702 may selectively activate the paths by, for example, enabling or disabling the amplifiers B314a-B314d, controlling the multiplexers B311, B312, or through other mechanisms as described herein.

In some implementations, the DRx controller B702 is configured to tune the tunable phase-shift components B724a-B724d. In some implementations, the DRx controller B702 tunes the tunable phase-shift components B724a-B724d based on the band select signal. For example, the DRx controller B702 may tune the tunable phase-shift components B724a-B724d based on a lookup table that associates frequency bands (or sets of frequency bands) indicated by the band select signal with tuning parameters. Accordingly, in response to a band select signal, the DRx controller B702 may transmit a phase-shift tuning signal to the tunable phase-shift component B724a-B724d of each active path to tune the tunable phase-shift component (or the variable components thereof) according to the tuning parameters.

The DRx controller B702 may be configured to tune the tunable phase-shift components B724a-B724d such that out-of-band reflected signals are in-phase at the output multiplexer B312 with out-of-band initial signals. For example, if the band select signal indicates that the first path (through the first amplifier B314a) corresponding to a first frequency band, the second path (through the second amplifier B314b) corresponding to a second frequency band, and the third path (through the third amplifier B314c) are to be activated, the DRx controller B702 may tune the first tunable phase-shift component B724a such that (1) for a signal propagating along the second path (at the second frequency band), the initial signal is in-phase with a reflected signal that reverse propagates along the first path, reflects off the bandpass filter B313a, and forward propagates through the first path and (2) for a signal propagating along the third path (at the third frequency band), the initial signal is in-phase with a reflected signal that reverse propagates along the first path, reflects off the bandpass filter B313a, and forward propagates through the first path.

The DRx controller B702 may tune the first tunable phase-shift component B724a such that the second frequency band is phase-shifted a different amount than the third frequency band. For example, if the signal at the second frequency band is phase-shifted by 140 degrees and the third frequency band is phase-shifted by 130 degrees by reverse propagation through the first amplifier B314a, reflection off the bandpass filter B313a, and forward propagation through the first amplifier B314b, the DRx controller B702 may tune the first tunable phase-shift component B724a to phase-shift the second frequency band by −70 degrees (or 110 degrees) and phase-shift the third frequency band by −65 degrees (or 115 degrees).

The DRx controller B702 may similarly tune the second phase-shift component B724b and third phase-shift component B724c.

As another example, if the band select signal indicates that the first path, the second path, and the fourth path (through the fourth amplifier B314d) are to be activated, the DRx controller B702 may tune the first tunable phase-shift component B724a such that (1) for a signal propagating along the second path (at the second frequency band), the initial signal is in-phase with a reflected signal that reverse propagates along the first path, reflects off the bandpass filter B313a, and forward propagates through the first path and (2) for a signal propagating along the fourth path (at the fourth frequency band), the initial signal is in-phase with a reflected signal that reverse propagates along the first path, reflects off the bandpass filter B313a, and forward propagates through the first path.

The DRx controller B702 may tune the variable components of the tunable phase-shift components B724a-B724d to have different values for different sets of frequency bands.

In some implementations, the tunable phase-shift components B724a-B724d are replaced with fixed phase-shift components that are not tunable or controlled by the DRx controller B702. Each one of the phase-shift components disposed along a corresponding one of the paths corresponding to one frequency band may be configured to phase-shift each of the other frequency bands such that an initial signal along a corresponding other path is in-phase with a reflected signal that reverse propagates along the one of the paths, reflects off the corresponding bandpass filter, and forward propagates through the one of the paths.

For example, the third phase-shift component B724c may be fixed and configured to (1) phase-shift the first frequency band such that an initial signal at the first frequency (propagating along the first path) is in-phase with a reflected signal that reverse propagates along the third path, reflects off the third bandpass filter B313c, and forward propagates through the third path, (2) phase-shift the second frequency band such that an initial signal at the second frequency (propagating along the second path) is in-phase with a reflected signal that reverse propagates along the third path, reflects off the third bandpass filter B313c, and forward propagates through the third path, and (3) phase-shift the fourth frequency band such that an initial signal at the fourth frequency (propagating along the fourth path) is in-phase with a reflected signal that reverse propagates along the third path, reflects off the third bandpass filter B313c, and forward propagates through the third path. The other phase-shift components may be similarly fixed and configured.

Thus, the DRx module B710 includes a DRx controller B702 configured to selectively one or more of a plurality of paths between an input of the DRx module B710 and an output of the DRx module B710. The DRx module B710 further includes plurality of amplifiers B314a-B314d, each one of the plurality of amplifiers B314a-B314d disposed along a corresponding one of the plurality of paths and configured to amplify a signal received at the amplifier. The DRx module further includes a plurality of phase-shift components B724a-B724d, each one of the plurality of phase-shift components B724a-B724d disposed along a corresponding one of the plurality of paths and configured to phase-shift a signal passing through the phase-shift component.

In some implementations, the first phase-shift component B724a is disposed along a first path corresponding to a first frequency band (e.g., the frequency band of the first bandpass filter B313a) and is configured to phase-shift a second frequency band (e.g., the frequency band of the second bandpass filter B313b) of a signal passing through the first phase-shift component B724a such that an initial signal propagated along a second path corresponding to the second frequency band and a reflected signal propagated along the first path are at least partially in-phase.

In some implementations, the first phase-shift component B724a is further configured to phase-shift a third frequency band (e.g., the frequency band of the third bandpass filter B313c) of a signal passing through the first phase-shift component B724a such that an initial signal propagated along a third path corresponding to the third frequency band and a reflected signal propagated along the first path are at least partially in-phase.

Similarly, in some implementations, the second phase-shift component B724b disposed along the second path is configured to phase-shift the first frequency band of a signal passing through the second phase-shift component B724b such that an initial signal propagated along the first path and a reflected signal propagated along the second path are at least partially in-phase.

Figure 53:
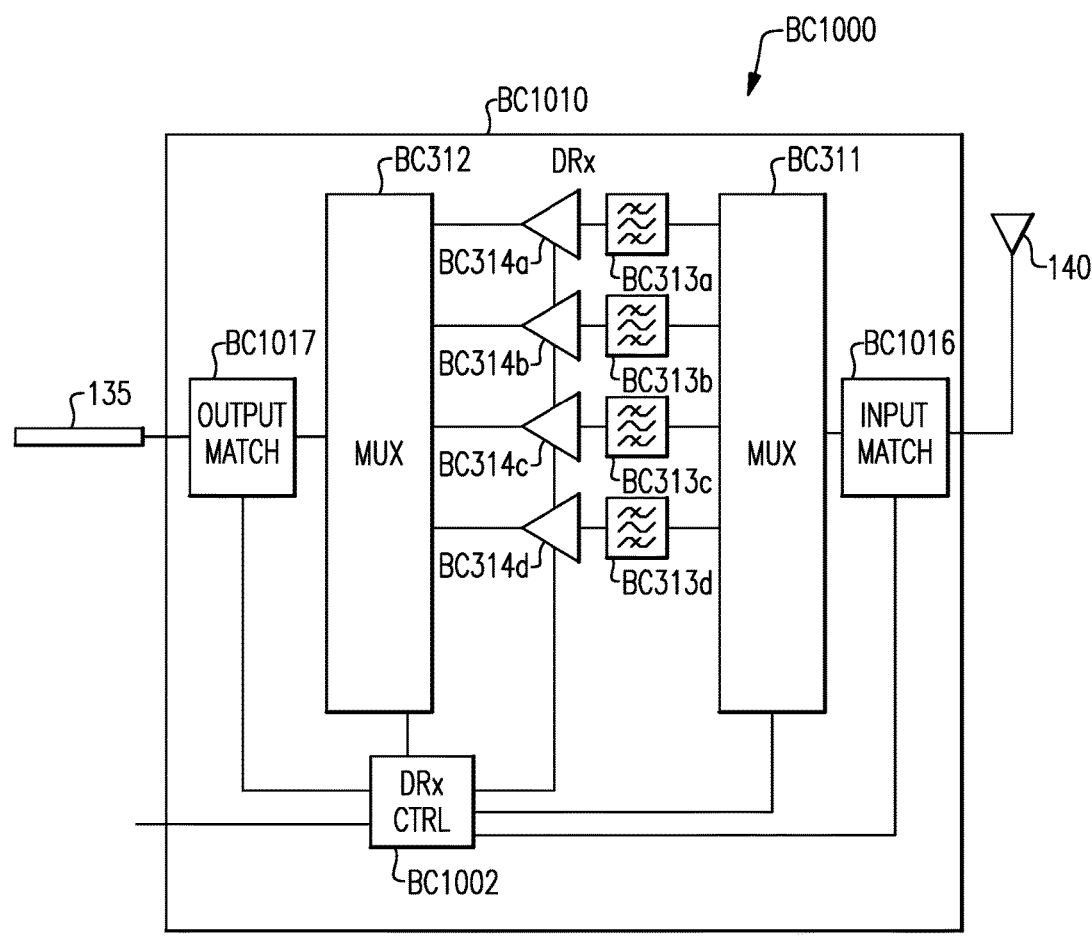
FIG. 53 shows that in some embodiments, a diversity receiver configuration may include a DRx module with tunable impedance matching components disposed at the input and output.

FIG. 53 shows that in some embodiments, a diversity receiver configuration BC1000 may include a DRx module BC1010 with tunable impedance matching components disposed at the input and output. The DRx module BC1010 may include one or more tunable impedance matching components disposed at one or more of the input and the output of the DRx module BC1010. In particular, the DRx module BC1010 may include an input tunable impedance matching component BC1016 disposed at the input of the DRx module BC1010, an output tunable impedance matching component BC1017 disposed at the output of the DRx module BC1010, or both.

Multiple frequency bands received on the same diversity antenna 140 are unlikely to all see an ideal impedance match. To match each frequency band using a compact matching circuit, a tunable input impedance matching component BC1016 may be implemented at the input of the DRx module BC1010 and controlled by the DRx controller BC1002 (e.g., based on a band select signal from a communications controller). For example, the DRx controller BC1002 may tune the tunable input impedance matching component BC1016 based on a lookup table that associates frequency bands (or sets of frequency bands) indicated by the band select signal with tuning parameters. Accordingly, in response to a band select signal, the DRx controller BC1002 may transmit an input impedance tuning signal to the tunable input impedance matching component BC1016 to tune the tunable input impedance matching component (or the variable components thereof) according to the tuning parameters.

The tunable input impedance matching component BC1016 may be a tunable T-circuit, a tunable PI-circuit, or any other tunable matching circuit. In particular, the tunable input impedance matching component BC1016 may include one or more variable components, such as resistors, inductors, and capacitors. The variable components may be connected in parallel and/or in series and may be connected between the input of the DRx module BC1010 and the input of the first multiplexer BC311 or may be connected between the input of the DRx module BC1010 and a ground voltage.

Similarly, with only one transmission line 135 (or, at least, few transmission lines) carrying signals of many frequency bands, it is not likely that multiple frequency bands will all see an ideal impedance match. To match each frequency band using a compact matching circuit, a tunable output impedance matching component BC1017 may be implemented at the output of the DRx module BC1010 and controlled by the DRx controller BC1002 (e.g., based on a band select signal from a communications controller). For example, the DRx controller BC1002 may tune the tunable output impedance matching component BC1017 based on a lookup table that associates frequency bands (or sets of frequency bands) indicated by the band select signal with tuning parameters. Accordingly, in response to a band select signal, the DRx controller BC1002 may transmit an output impedance tuning signal to the tunable output impedance matching component BC1017 to tune the tunable output impedance matching component (or the variable components thereof) according to the tuning parameters.

The tunable output impedance matching component BC1017 may be a tunable T-circuit, a tunable PI-circuit, or any other tunable matching circuit. In particular, the tunable output impedance matching component BC1017 may include one or more variable components, such as resistors, inductors, and capacitors. The variable components may be connected in parallel and/or in series and may be connected between the output of the second multiplexer BC312 and the output of the DRx module BC1010 or may be connected between the output of the second multiplexer BC312 and a ground voltage.

Figure 54:
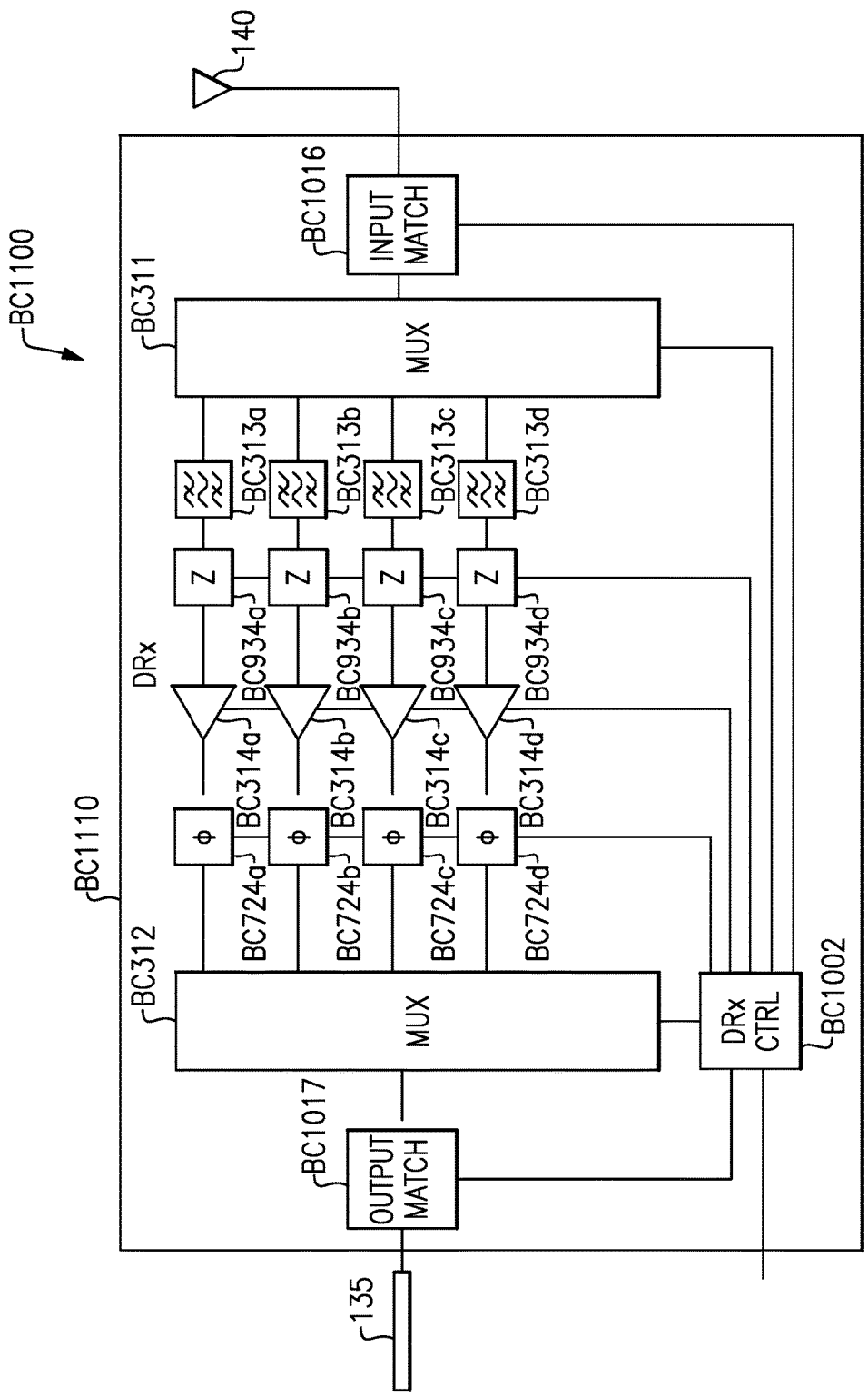
FIG. 54 shows that in some embodiments, a diversity receiver configuration may include a DRx module with multiple tunable components.

FIG. 54 shows that in some embodiments, a diversity receiver configuration BC1100 may include a DRx module BC1110 with multiple tunable components. The diversity receiver configuration BC1100 includes a DRx module BC1110 having an input coupled to an antenna 140 and an output coupled to a transmission line 135. The DRx module BC1110 includes a number of paths between the input and the output of the DRx module BC1110. In some implementations, the DRx module BC1110 includes one or more bypass paths (not shown) between the inputs and the output activated by one or more bypass switches controlled by the DRx controller BC1102.

The DRx module BC1110 includes a number of multiplexer paths including an input multiplexer BC311 and an output multiplexer BC312. The multiplexer paths include a number of on-module paths (shown) that include a tunable input impedance matching component BC1016, the input multiplexer BC311, a bandpass filter BC313a-BC313d, a tunable impedance matching component BC934a-BC934d, an amplifier BC314a-BC314d, a tunable phase-shift component BC724a-BC724d, the output multiplexer BC312, and a tunable output impedance matching component BC1017. The multiplexer paths may include one or more off-module paths (not shown) as described herein. As also described herein, the amplifiers BC314a-BC314d may be variable-gain amplifiers and/or variable-current amplifiers.

The DRx controller BC1102 is configured to selectively activate one or more of the plurality of paths between the input and the output. In some implementations, the DRx controller BC1102 is configured to selectively activate one or more of the plurality of paths based on a band select signal received by the DRx controller BC1102 (e.g., from a communications controller). The DRx controller BC902 may selectively activate the paths by, for example, enabling or disabling the amplifiers BC314a-BC314d, controlling the multiplexers BC311, BC312, or through other mechanisms as described herein. In some implementations, the DRx controller BC1102 is configured to send an amplifier control signal to one or more amplifiers BC314a-BC314d respectively disposed along the one or more activated paths. The amplifier control signal controls the gain (or current) of the amplifier to which it is sent.

The DRx controller BC1102 is configured to tune one or more of the tunable input impedance matching component BC1016, the tunable impedance matching components BC934a-BC934d, the tunable phase-shift components BC724a-BC724d, and the tunable output impedance matching component BC1017. For example, the DRx controller BC1102 may tune the tunable components based on a lookup table that associates frequency bands (or sets of frequency bands) indicated by the band select signal with tuning parameters. Accordingly, in response to a band select signal, the DRx controller BC1101 may transmit a tuning signal to the tunable components (of active paths) to tune the tunable components (or the variable components thereof) according to the tuning parameters. In some implementations, the DRx controller BC1102 tunes the tunable components based, at least in part, on the amplifier control signals transmitted to control the gain and/or current of the amplifiers BC314a-BC314d. In various implementations, one or more of the tunable components may be replaced by fixed components that are not controlled by the DRx controller BC1102.

It is to be appreciated that the tuning of one of the tunable components may affect the tuning of other tunable components. Thus, the tuning parameters in a lookup table for a first tunable component may be based on the tuning parameters for a second tunable component. For example, the tuning parameters for the tunable phase-shift components BC724a-BC724d may be based on the tuning parameters for the tunable impedance matching components BC934a-BC934d. As another example, the tuning parameters for the tunable impedance matching components BC934a-BC934d may be based on the tuning parameters for the tunable input impedance matching component BC1016.

Figure 55:
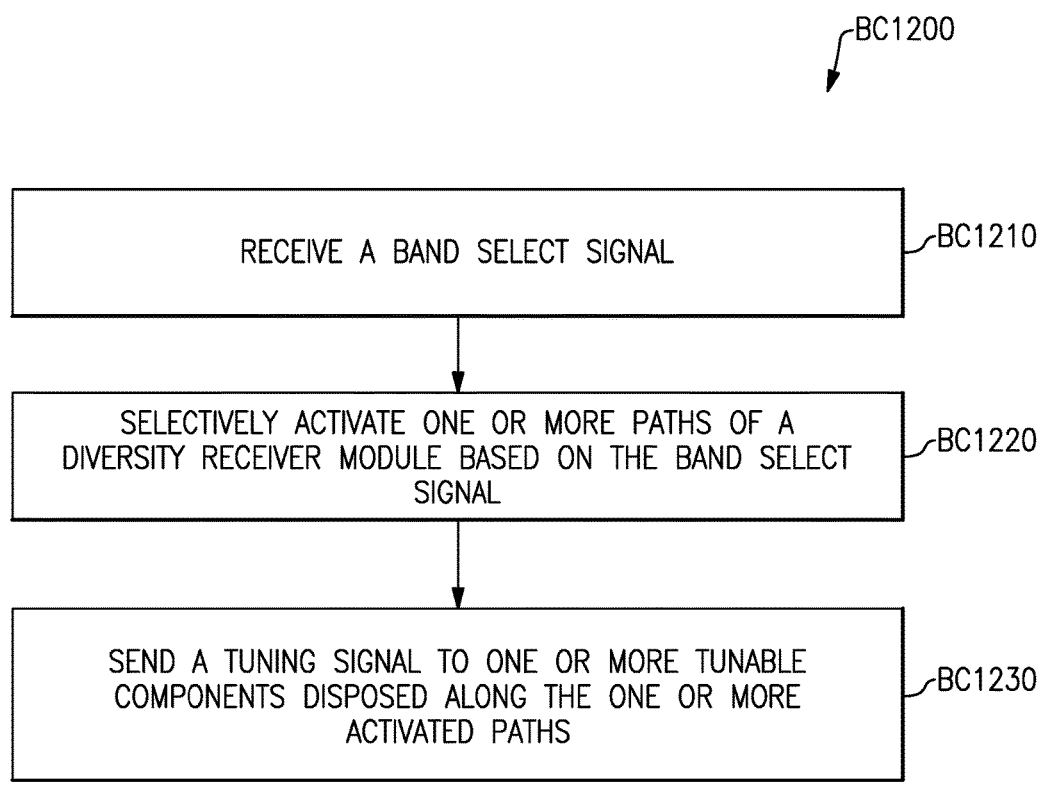
FIG. 55 shows an embodiment of a flowchart representation of a method of processing an RF signal.

FIG. 55 shows an embodiment of a flowchart representation of a method of processing an RF signal. In some implementations (and as detailed below as an example), the method BC1200 is performed by a controller, such as the DRx controller BC1102 of FIG. 54. In some implementations, the method BC1200 is performed by processing logic, including hardware, firmware, software, or a combination thereof. In some implementations, the method BC1200 is performed by a processor executing code stored in a non-transitory computer-readable medium (e.g., a memory). Briefly, the method BC1200 includes receiving a band select signal and routing a received RF signal along one or more tuned paths to process the received RF signal.

The method BC1200 begins, at block BC1210, with the controller receiving a band select signal. The controller may receive the band select signal from another controller or may receive the band select signal from a cellular base station or other external source. The band select signal may indicate one or more frequency bands over which a wireless device is to transmit and receive RF signals. In some implementations, the band select signal indicates a set of frequency bands for carrier aggregation communication.

At block BC1220, the controller selectively activates one or more paths of a diversity receiver (DRx) module based on the band select signal. As described herein, a DRx module may include a number of paths between one or more inputs (coupled to one or more antennas) and one or more outputs (coupled to one or more transmission lines) of the DRx module. The paths may include bypass paths and multiplexer paths. The multiplexer paths may include on-module paths and off-module paths.

The controller may selectively activate one or more of the plurality of paths by, for example, opening or closing one or more bypass switches, enabling or disabling amplifiers disposed along the paths via an amplifier enable signal, controlling one or more multiplexers via a splitter control signal and/or a combiner control signal, or through other mechanisms. For example, the controller may open or close switches disposed along the paths or set the gain of the amplifiers disposed along the paths to substantially zero.

At block BC1230, the controller sends a tuning signal to one or more tunable components disposed along the one or more activated paths. The tunable components may include one or more of a tunable impedance matching component disposed at the input of the DRx module, a plurality of tunable impedance matching components respectively disposed along the plurality of paths, a plurality of tunable phase-shift components respectively disposed along the plurality of paths, or a tunable output impedance matching component disposed at the output of the DRx module.

The controller may tune the tunable components based on a lookup table that associates frequency bands (or sets of frequency bands) indicated by the band select signal with tuning parameters. Accordingly, in response to a band select signal, the DRx controller may transmit a tuning signal to the tunable components (of active paths) to tune the tunable components (or the variable components thereof) according to the tuning parameters. In some implementations, the controller tunes the tunable components based, at least in part, on amplifier control signals transmitted to control the gain and/or current of one or more amplifiers respectively disposed along the one or more activated paths.

Among others, the foregoing Example B related to phase-shifting components can be summarized as follows.

In accordance with some implementations, the present disclosure relates to a receiving system including a controller configured to selectively activate one or more of a plurality of paths between an input of the receiving system and an output of the receiving system. The receiving system further includes a plurality of amplifiers. Each one of the plurality of amplifiers is disposed along a corresponding one of the plurality of paths and is configured to amplify a signal received at the amplifier. The receiving system further includes a plurality of phase-shift components. Each one of the plurality of phase-shift components is disposed along a corresponding one of the plurality of paths and is configured to phase-shift a signal passing through the phase-shift component.

In some embodiments, a first phase-shift component of the plurality of phase-shift components disposed along a first path of the plurality of paths corresponding to a first frequency band can be configured to phase-shift a second frequency band of a signal passing through the first phase-shift component such that a second initial signal propagated along a second path of the plurality of paths corresponding to the second frequency band and a second reflected signal propagated along the first path are at least partially in-phase.

In some embodiments, a second phase-shift component of the plurality of phase-shift components disposed along the second path can be configured to phase-shift the first frequency band of a signal passing through the second phase-shift component such that a first initial signal propagated along the first path and a first reflected signal propagated along the second path are at least partially in-phase.

In some embodiments, the first phase-shift component can be further configured to phase-shift a third frequency band of a signal passing through the first phase-shift component such that a third initial signal propagated along a third path of the plurality of paths corresponding to the third frequency band and a third reflected signal propagated along the first path are at least partially in-phase.

In some embodiments, the first phase-shift component can be configured to phase-shift the second frequency band of a signal passing through the first phase-shift component such that the second initial signal and the second reflected signal have a phase difference of an integer multiple of 360 degrees.

In some embodiments, the receiving system can further include a multiplexer configured to split an input signal received at the input into a plurality of signals at a respective plurality of frequency bands propagated along the plurality of paths. In some embodiment, the receiving system can further include a signal combiner configured to combine signals propagating along the plurality of paths. In some embodiments, the receiving system can further include a post-combiner amplifier disposed between the signal combiner and the output, the post-combiner amplifier configured to amplify a signal received at the post-combiner amplifier. In some embodiments, each one of the plurality of phase-shift components can be disposed between the signal combiner and a respective one of the plurality of amplifiers. In some embodiments, at least one of the plurality of amplifiers can include a dual-stage amplifier.

In some embodiments, at least one of the plurality of phase-shift components can be a passive circuit. In some embodiments, at least one of the plurality of phase-shift components can be an LC circuit.

In some embodiments, at least one of the plurality of phase-shift components can include a tunable phase-shift component configured to phase-shift a signal passing through the tunable phase-shift component an amount controlled by a phase-shift tuning signal received from the controller.

In some embodiments, the receiving system can further include a plurality of impedance matching components, each one of the impedance matching components disposed along a corresponding one of the plurality of paths and configured to decrease at least one of an out-of-band noise figure or an out-of-band gain of the corresponding one of the plurality of paths.

In some implementations, the present disclosure relates to a radio-frequency (RF) module that includes a packaging substrate configured to receive a plurality of components. The RF module further includes a receiving system implemented on the packaging substrate. The receiving system includes a controller configured to selectively activate one or more of a plurality of paths between an input of the receiving system and an output of the receiving system. The receiving system further includes a plurality of amplifiers. Each one of the plurality of amplifiers is disposed along a corresponding one of the plurality of paths and is configured to amplify a signal received at the amplifier. The receiving system further includes a plurality of phase-shift components. Each one of the plurality of phase-shift components is disposed along a corresponding one of the plurality of paths and is configured to phase-shift a signal passing through the phase-shift component.

In some embodiments, the RF module can be a diversity receiver front-end module (FEM).

In some embodiments, a first phase-shift component of the plurality of phase-shift components disposed along a first path of the plurality of paths corresponding to a first frequency band is configured to phase-shift the second frequency band of a signal passing through the first phase-shift component such that a second initial signal propagated along a second path of the plurality of paths corresponding to the second frequency band and a second reflected signal propagated along the first path are at least partially in-phase.

According to some teachings, the present disclosure relates to a wireless device that includes a first antenna configured to receive a first radio-frequency (RF) signal. The wireless device further includes a first front-end module (FEM) in communication with the first antenna. The first FEM including a packaging substrate configured to receive a plurality of components. The first FEM further includes a receiving system implemented on the packaging substrate. The receiving system includes a controller configured to selectively activate one or more of a plurality of paths between an input of the receiving system and an output of the receiving system. The receiving system further includes a plurality of amplifiers. Each one of the plurality of amplifiers is disposed along a corresponding one of the plurality of paths and is configured to amplify a signal received at the amplifier. The receiving system further includes a plurality of phase-shift components. Each one of the plurality of phase-shift components is disposed along a corresponding one of the plurality of paths and is configured to phase-shift a signal passing through the phase-shift component. The wireless device further includes a transceiver configured to receive a processed version of the first RF signal from the output via a transmission line and generate data bits based on the processed version of the first RF signal.

In some embodiments, the wireless device can further include a second antenna configured to receive a second radio-frequency (RF) signal and a second FEM in communication with the first antenna. The transceiver can be configured to receive a processed version of the second RF signal from an output of the second FEM and generate the data bits based on the processed version of the second RF signal.

In some embodiments, a first phase-shift component of the plurality of phase-shift components disposed along a first path of the plurality of paths corresponding to a first frequency band is configured to phase-shift the second frequency band of a signal passing through the first phase-shift component such that a second initial signal propagated along a second path of the plurality of paths corresponding to the second frequency band and a second reflected signal propagated along the first path are at least partially in-phase.

Example C: Impedance-Shifting Components

Figure 51:
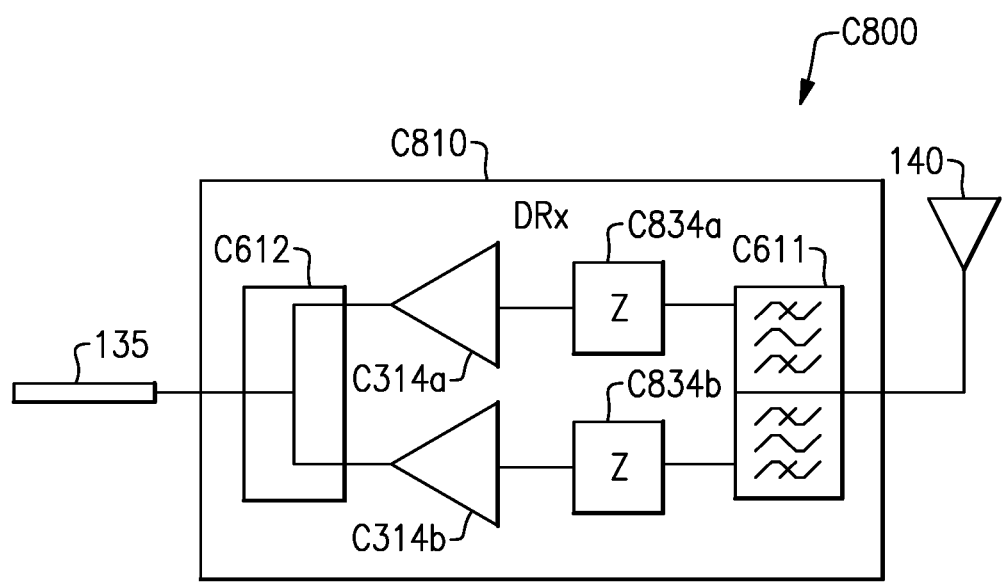
FIG. 51 shows that in some embodiments, a diversity receiver configuration may include a DRx module with one or more impedance matching components.

FIG. 51 shows that in some embodiments, a diversity receiver configuration C800 may include a DRx module C810 with one or more impedance matching components C834*a*-C834*b*. The DRx module C810 includes two paths from an input of the DRx module C810, coupled to an antenna 140, and an output of the DRx module C810, coupled to a transmission line 135.

In the DRx module C810 of FIG. 51 (as in the DRx module B610 of FIG. 47), the signal splitter and bandpass filters are implemented as a diplexer C611. The diplexer C611 includes an input coupled to the antenna, a first output coupled to a first impedance matching component C834*a*, and a second output coupled to a second impedance matching component C834*b*. At the first output, the diplexer C611 outputs a signal received at the input (e.g., from the antenna 140) filtered to a first frequency band. At the second output, the diplexer C611 outputs the signal received at the input filtered to a second frequency band.

Each of the impedance matching components C834*a*-C634*d* is disposed between the diplexer C611 and an amplifier C314*a*-C314*b*. As described herein, each one of the amplifiers C314*a*-C314*b* is disposed along a corresponding one of the paths and is configured to amplify a signal received at the amplifier. The output of the amplifiers C314*a*-C314*b* are fed to a signal combiner C612.

The signal combiner C612 includes a first input coupled to the first amplifier C314*a*, a second input coupled to second amplifier C314b, and an output coupled to the output of the DRx module C610. The signal at the output of the signal combiner is a sum of the signals at the first input and the second input.

When a signal is received by the antenna 140, the signal is filtered by the diplexer C611 to a first frequency band and propagated along the first path through the first amplifier C314a. Similarly, the signal is filtered by the diplexer C611 to a second frequency band and propagated along the second path through the second amplifier C314b.

Each of the paths may be characterized by a noise figure and a gain. The noise figure of each path is a representation of the degradation of the signal-to-noise ratio (SNR) caused by the amplifier and impedance matching component disposed along the path. In particular, the noise figure of each path is the difference in decibels (dB) between the SNR at the input of the impedance matching component C834a-C834b and the SNR at the output of the amplifier C314a-C314b. Thus, the noise figure is a measure of the difference between the noise output of the amplifier to the noise output of an "ideal" amplifier (that does not produce noise) with the same gain. Similarly, the gain for each path is a representation of the gain caused by the amplifier and the impedance matching component disposed along the path.

The noise figure and gain of each path may be different for different frequency bands. For example, the first path may have an in-band noise figure and in-band gain for the first frequency band and an out-of-band noise figure and out-of-band gain for the second frequency band. Similarly, the second path may have an in-band noise figure and in-band gain for the second frequency band and an out-of-band noise figure and out-of-band gain for the first frequency band.

The DRx module C810 may also be characterized by a noise figure and a gain which may be different for different frequency bands. In particular, the noise figure of the DRx module C810 is the difference in dB between the SNR at the input of the DRx module C810 and the SNR at the output of the DRx module C810.

The noise figure and gain of each path (at each frequency band) may depend, at least in part, on the impedance (at each frequency band) of the impedance matching component C834a-C834b. Accordingly, it may be advantageous that the impedance of the impedance matching component C834a-C834b is such that the in-band noise figure of each path is minimized and/or the in-band gain of each path is maximized. Thus, in some implementations, each of the impedance matching components C834a-C834b is configured to decrease the in-band noise figure of its respective path and/or increase the in-band gain of its respective path (as compared to a DRx module lacking such impedance matching components C834a-C834b).

Because the signal propagating along the two paths are combined by the signal combiner C612, out-of-band noise produced or amplified by an amplifier can negatively affect the combined signal. For example, out-of-band noise produced or amplified by the first amplifier C314a may increase the noise figure of the DRx module C810 at the second frequency. Accordingly, it may be advantageous that the impedance of the impedance matching component C834a-C834b is such that the out-of-band noise figure of each path is minimized and/or the out-of-band gain of each path is minimized. Thus, in some implementations, each of the impedance matching component C834a-C834b is configured to decrease the out-of-band noise figure of its respective path and/or decrease the out-of-band gain of its respective path (as compared to a DRx module lacking such impedance matching components C834a-C834b).

The impedance matching components C834a-C834b may be implemented as passive circuits. In particular, the impedance matching components C834a-C834b may be implemented as RLC circuits and include one or more passive components, such as resistors, inductors and/or capacitors. The passive components may be connected in parallel and/or in series and may be connected between the outputs of the diplexer C611 and the inputs of the amplifiers C314a-C314b or may be connected between the outputs of the diplexer C611 and a ground voltage. In some implementations, the impedance matching components C834a-C834b are integrated into the same die as the amplifiers C314a-C314b or on the same package.

As noted herein, for a particular path, it may be advantageous that the impedance of the impedance matching component C834a-C834b is such that the in-band noise figure is minimized, the in-band gain is maximized, the out-of-band noise figure is minimized, and the out-of-band gain is minimized. Designing an impedance matching component C834a-C834b to achieve all four of these goals with only two degrees of freedom (e.g., the impedance at the first frequency band and the impedance at the second frequency band) or other various constraints (e.g., component number, cost, die space) may be challenging. Accordingly, in some implementations, an in-band metric of the in-band noise figure minus the in-band gain is minimized and an out-of-band metric of the out-of-band noise figure plus the out-of-band gain is minimized. Designing an impedance matching component C834a-C834b to achieve both of these goals with various constraints may still be challenging. Thus, in some implementations, the in-band metric is minimized subject to a set of constraints and the out-of-band metric is minimized subject to the set of constraints and the additional constraint that the in-band metric not be increased by more than a threshold amount (e.g., 0.1 dB, 0.2 dB, 0.5 dB or any other value). Accordingly, the impedance matching component is configured to reduce an in-band metric of the in-band noise figure minus the in-band gain to within a threshold amount of an in-band metric minimum, e.g., the minimum possible in-band metric subject to any constraints. The impedance matching component is further configured to reduce an out-of-band metric of the out-of-band noise figure plus the out-of-band gain to an in-band-constrained out-of-band minimum, e.g., the minimum possible out-of-band metric subject to the additional constraint that the in-band metric not be increased by more than a threshold amount. In some implementations, a composite metric of the in-band metric (weighted by an in-band factor) plus the out-of-band metric (weighted by an out-of-band factor) is minimized subject to any constraints.

Thus, in some implementations, each of the impedance matching components C834a-C834b is configured to decrease the in-band metric (the in-band noise figure minus the in-band gain) of its respective path (e.g., by decreasing the in-band noise figure, increasing the in-band gain, or both). In some implementations, each of the impedance matching components C834a-C834b is further configured to decrease the out-of-band metric (the out-of-band noise figure plus the out-of-band gain) of its respective path (e.g., by decreasing the out-of-band noise figure, decreasing the out-of-band gain, or both).

In some implementations, by decreasing the out-of-band metrics, the impedance matching components C834a-C834b decreases the noise figure of the DRx module C810 at one or more of the frequency bands without substantially increasing the noise figure at other frequency bands.

Figure 52:
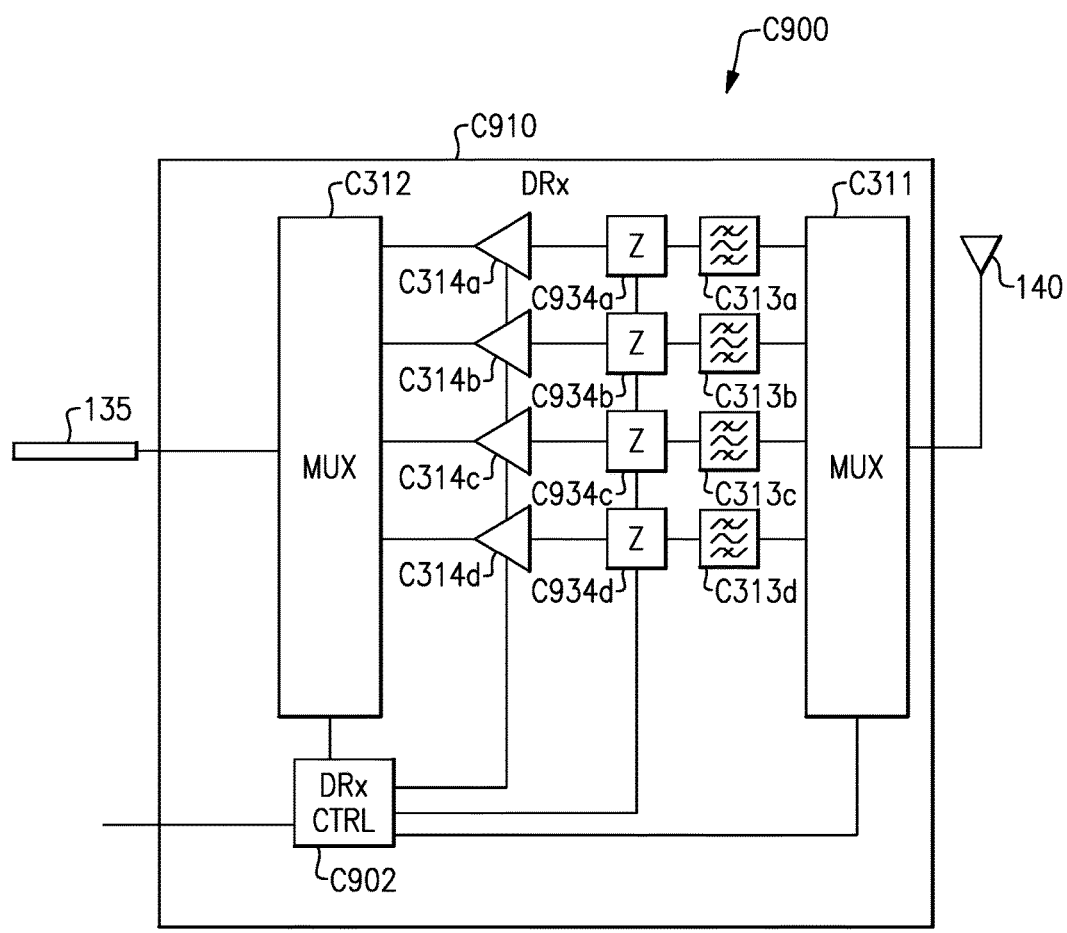
FIG. 52 shows that in some embodiments, a diversity receiver configuration may include a DRx module with tunable impedance matching components.

FIG. 52 shows that in some embodiments, a diversity receiver configuration C900 may include a DRx module C910 with tunable impedance matching components C934a-C934d. Each of the tunable impedance matching components C934a-C934d may be configured to present an impedance controlled by an impedance tuning signal received from a DRx controller C902.

The diversity receiver configuration C900 includes a DRx module C910 having an input coupled to an antenna 140 and an output coupled to a transmission line 135. The DRx module C910 includes a number of paths between the input and the output of the DRx module C910. In some implementations, the DRx module C910 includes one or more bypass paths (not shown) between the inputs and the output activated by one or more bypass switches controlled by the DRx controller C902.

The DRx module C910 includes a number of multiplexer paths including an input multiplexer C311 and an output multiplexer 312. The multiplexer paths include a number of on-module paths (shown) that include the input multiplexer C311, a bandpass filter C313a-C313d, a tunable impedance matching component C934a-C934d, an amplifier C314a-C314d, and the output multiplexer C312. The multiplexer paths may include one or more off-module paths (not shown) as described herein. As also described herein, the amplifiers C314a-C314d may be variable-gain amplifiers and/or variable-current amplifiers.

The tunable impedance matching components C934a-C934b may be a tunable T-circuit, a tunable PI-circuit, or any other tunable matching circuit. The tunable impedance matching components C934a-C934d may include one or more variable components, such as resistors, inductors, and capacitors. The variable components may be connected in parallel and/or in series and may be connected between the outputs of the input multiplexer C311 and the inputs of the amplifiers C314a-C314d or may be connected between the outputs of the input multiplexer C311 and a ground voltage.

The DRx controller C902 is configured to selectively activate one or more of the plurality of paths between the input and the output. In some implementations, the DRx controller C902 is configured to selectively activate one or more of the plurality of paths based on a band select signal received by the DRx controller C902 (e.g., from a communications controller). The DRx controller C902 may selectively activate the paths by, for example, enabling or disabling the amplifiers C314a-C314d, controlling the multiplexers C311, C312, or through other mechanisms as described herein.

In some implementations, the DRx controller C902 is configured to tune the tunable impedance matching components C934a-C934d. In some implementations, the DRx controller C702 tunes the tunable impedance matching components C934a-C934d based on the band select signal. For example, the DRx controller C902 may tune the tunable impedance matching components C934a-C934d based on a lookup table that associates frequency bands (or sets of frequency bands) indicated by the band select signal with tuning parameters. Accordingly, in response to a band select signal, the DRx controller C902 may transmit a impedance tuning signal to the tunable impedance matching component C934a-C934d of each active path to tune the tunable impedance matching component (or the variable components thereof) according to the tuning parameters.

In some implementations, the DRx controller C902 tunes the tunable impedance matching components C934a-C934d based, at least in part, on the amplifier control signals transmitted to control the gain and/or current of the amplifiers C314a-C314d.

In some implementations, the DRx controller C902 is configured to tune the tunable impedance matching components C934a-C934d of each active path such that the in-band noise figure is minimized (or reduced), the in-band gain is maximized (or increased), the out-of-band noise figure for each other active path is minimized (or reduced), and/or the out-of-band gain for each other active path is minimized (or reduced).

In some implementations, the DRx controller C902 is configured to tune the tunable impedance matching components C934a-C934d of each active path such that the in-band metric (the in-band noise figure minus the in-band gain) is minimized (or reduced) and the out-of-band metric (the out-of-band noise figure plus the out-of-band gain) for each other active path is minimized (or reduced).

In some implementations, the DRx controller C902 is configured to tune the tunable impedance matching components C934a-C934d of each active path such that in-band metric is minimized (or reduced) subject to a set of constraints and the out-of-band metric for each of the other active paths is minimized (or reduced) subject to the set of constraints and the additional constraints that the in-band metric not be increased by more than a threshold amount (e.g., 0.1 dB, 0.2 dB, 0.5 dB or any other value).

Thus, in some implementations, the DRx controller C902 is configured to tune the tunable impedance matching components C934a-C934d of each active path such that the tunable impedance matching component reduces an in-band metric of the in-band noise figure minus the in-band gain to within a threshold amount of an in-band metric minimum, e.g., the minimum possible in-band metric subject to any constraints. The DRx controller C902 may be further configured to tune the tunable impedance matching components C934a-C934d of each active path such that the tunable impedance matching component reduce an out-of-band metric of the out-of-band noise figure plus the out-of-band gain to an in-band-constrained out-of-band minimum, e.g., the minimum possible out-of-band metric subject to the additional constraint that the in-band metric not be increased by more than a threshold amount.

In some implementations, the DRx controller C902 is configured to tune the tunable impedance matching components C934a-C934d of each active path such that a composite metric of the in-band metric (weighted by an in-band factor) plus the out-of-band metric for each of the other active paths (weighted by an out-of-band factor for each of the other active paths) is minimized (or reduced) subject to any constraints.

The DRx controller C902 may tune the variable components of the tunable impedance matching components C934a-C934d to have different values for different sets of frequency bands.

In some implementations, the tunable impedance matching components C934a-C934d are replaced with fixed impedance matching components that are not tunable or controlled by the DRx controller C902. Each one of the impedance matching components disposed along a corresponding one of the paths corresponding to one frequency band may be configured to reduce (or minimize) the in-band metric for the one frequency band and reduce (or minimize) the out-of-band metric for one or more of the other frequency bands (e.g., each of the other frequency bands).

For example, the third impedance matching component C934c may be fixed and configured to (1) reduce the in-band metric for the third frequency band, (2) reduce the out-of-band metric for the first frequency band, (3) reduce the out-of-band metric for the second frequency band, and/or (4) reduce the out-of-band metric of the fourth frequency band. The other impedance matching components may be similarly fixed and configured.

Thus, the DRx module C910 includes a DRx controller C902 configured to selectively one or more of a plurality of paths between an input of the DRx module C910 and an output of the DRx module C910. The DRx module C910 further includes plurality of amplifiers C314a-C314d, each one of the plurality of amplifiers C314a-C314d disposed along a corresponding one of the plurality of paths and configured to amplify a signal received at the amplifier. The DRx module further includes a plurality of impedance matching components C934a-C934d, each one of the plurality of phase-shift components C934a-C934d disposed along a corresponding one of the plurality of paths and configured to reduce at least one of an out-of-band noise figure or an out-of-band gain of the one of the plurality of paths.

In some implementations, the first impedance matching component C934a is disposed along a first path corresponding to a first frequency band (e.g., the frequency band of the first bandpass filter C313a) and is configured to reduce at least one of an out-of-band noise figure or an out-of-band gain for a second frequency band (e.g., the frequency band of the second bandpass filter C313b) corresponding to a second path.

In some implementations, the first impedance matching component C934a is further configured to reduce at least one of an out-of-band noise figure or an out-of-band gain for a third frequency band (e.g., the frequency band of the third bandpass filter C313c) corresponding to the third path.

Similarly, in some implementations, the second impedance matching component C934b disposed along the second path is configured to reduce at least one of an out-of-band noise figure or an out-of-band gain for the first frequency band.

FIG. 53 shows that in some embodiments, a diversity receiver configuration BC1000 may include a DRx module BC1010 with tunable impedance matching components disposed at the input and output. The DRx module BC1010 may include one or more tunable impedance matching components disposed at one or more of the input and the output of the DRx module BC1010. In particular, the DRx module BC1010 may include an input tunable impedance matching component BC1016 disposed at the input of the DRx module BC1010, an output tunable impedance matching component BC1017 disposed at the output of the DRx module BC1010, or both.

Multiple frequency bands received on the same diversity antenna 140 are unlikely to all see an ideal impedance match. To match each frequency band using a compact matching circuit, a tunable input impedance matching component BC1016 may be implemented at the input of the DRx module BC1010 and controlled by the DRx controller BC1002 (e.g., based on a band select signal from a communications controller). For example, the DRx controller BC1002 may tune the tunable input impedance matching component BC1016 based on a lookup table that associates frequency bands (or sets of frequency bands) indicated by the band select signal with tuning parameters. Accordingly, in response to a band select signal, the DRx controller BC1002 may transmit an input impedance tuning signal to the tunable input impedance matching component BC1016 to tune the tunable input impedance matching component (or the variable components thereof) according to the tuning parameters.

The tunable input impedance matching component BC1016 may be a tunable T-circuit, a tunable PI-circuit, or any other tunable matching circuit. In particular, the tunable input impedance matching component BC1016 may include one or more variable components, such as resistors, inductors, and capacitors. The variable components may be connected in parallel and/or in series and may be connected between the input of the DRx module BC1010 and the input of the first multiplexer BC311 or may be connected between the input of the DRx module BC1010 and a ground voltage.

Similarly, with only one transmission line 135 (or, at least, few transmission lines) carrying signals of many frequency bands, it is not likely that multiple frequency bands will all see an ideal impedance match. To match each frequency band using a compact matching circuit, a tunable output impedance matching component BC1017 may be implemented at the output of the DRx module BC1010 and controlled by the DRx controller BC1002 (e.g., based on a band select signal from a communications controller). For example, the DRx controller BC1002 may tune the tunable output impedance matching component BC1017 based on a lookup table that associates frequency bands (or sets of frequency bands) indicated by the band select signal with tuning parameters. Accordingly, in response to a band select signal, the DRx controller BC1002 may transmit an output impedance tuning signal to the tunable output impedance matching component BC1017 to tune the tunable output impedance matching component (or the variable components thereof) according to the tuning parameters.

The tunable output impedance matching component BC1017 may be a tunable T-circuit, a tunable PI-circuit, or any other tunable matching circuit. In particular, the tunable output impedance matching component BC1017 may include one or more variable components, such as resistors, inductors, and capacitors. The variable components may be connected in parallel and/or in series and may be connected between the output of the second multiplexer BC312 and the output of the DRx module BC1010 or may be connected between the output of the second multiplexer BC312 and a ground voltage.

FIG. 54 shows that in some embodiments, a diversity receiver configuration BC1100 may include a DRx module BC1110 with multiple tunable components. The diversity receiver configuration BC1100 includes a DRx module BC1110 having an input coupled to an antenna 140 and an output coupled to a transmission line 135. The DRx module BC1110 includes a number of paths between the input and the output of the DRx module BC1110. In some implementations, the DRx module BC1110 includes one or more bypass paths (not shown) between the inputs and the output activated by one or more bypass switches controlled by the DRx controller BC1102.

The DRx module BC1110 includes a number of multiplexer paths including an input multiplexer BC311 and an output multiplexer BC312. The multiplexer paths include a number of on-module paths (shown) that include a tunable input impedance matching component BC1016, the input multiplexer BC311, a bandpass filter BC313a-BC313d, a tunable impedance matching component BC934a-BC934d, an amplifier BC314a-BC314d, a tunable phase-shift component BC724a-BC724d, the output multiplexer BC312, and a tunable output impedance matching component BC1017. The multiplexer paths may include one or more off-module paths (not shown) as described herein. As also described herein, the amplifiers BC314*a*-BC314*d* may be variable-gain amplifiers and/or variable-current amplifiers.

The DRx controller BC1102 is configured to selectively activate one or more of the plurality of paths between the input and the output. In some implementations, the DRx controller BC1102 is configured to selectively activate one or more of the plurality of paths based on a band select signal received by the DRx controller BC1102 (e.g., from a communications controller). The DRx controller BC902 may selectively activate the paths by, for example, enabling or disabling the amplifiers BC314*a*-BC314*d*, controlling the multiplexers BC311, BC312, or through other mechanisms as described herein. In some implementations, the DRx controller BC1102 is configured to send an amplifier control signal to one or more amplifiers BC314*a*-BC314*d* respectively disposed along the one or more activated paths. The amplifier control signal controls the gain (or current) of the amplifier to which it is sent.

The DRx controller BC1102 is configured to tune one or more of the tunable input impedance matching component BC1016, the tunable impedance matching components BC934*a*-BC934*d*, the tunable phase-shift components BC724*a*-BC724*d*, and the tunable output impedance matching component BC1017. For example, the DRx controller BC1102 may tune the tunable components based on a lookup table that associates frequency bands (or sets of frequency bands) indicated by the band select signal with tuning parameters. Accordingly, in response to a band select signal, the DRx controller BC1101 may transmit a tuning signal to the tunable components (of active paths) to tune the tunable components (or the variable components thereof) according to the tuning parameters. In some implementations, the DRx controller BC1102 tunes the tunable components based, at least in part, on the amplifier control signals transmitted to control the gain and/or current of the amplifiers BC314*a*-BC314*d*. In various implementations, one or more of the tunable components may be replaced by fixed components that are not controlled by the DRx controller BC1102.

It is to be appreciated that the tuning of one of the tunable components may affect the tuning of other tunable components. Thus, the tuning parameters in a lookup table for a first tunable component may be based on the tuning parameters for a second tunable component. For example, the tuning parameters for the tunable phase-shift components BC724*a*-BC724*d* may be based on the tuning parameters for the tunable impedance matching components BC934*a*-BC934*d*. As another example, the tuning parameters for the tunable impedance matching components BC934*a*-BC934*d* may be based on the tuning parameters for the tunable input impedance matching component BC1016.

FIG. 55 shows an embodiment of a flowchart representation of a method of processing an RF signal. In some implementations (and as detailed below as an example), the method BC1200 is performed by a controller, such as the DRx controller BC1102 of FIG. 54. In some implementations, the method BC1200 is performed by processing logic, including hardware, firmware, software, or a combination thereof. In some implementations, the method BC1200 is performed by a processor executing code stored in a non-transitory computer-readable medium (e.g., a memory). Briefly, the method BC1200 includes receiving a band select signal and routing a received RF signal along one or more tuned paths to process the received RF signal.

The method BC1200 begins, at block BC1210, with the controller receiving a band select signal. The controller may receive the band select signal from another controller or may receive the band select signal from a cellular base station or other external source. The band select signal may indicate one or more frequency bands over which a wireless device is to transmit and receive RF signals. In some implementations, the band select signal indicates a set of frequency bands for carrier aggregation communication.

At block BC1220, the controller selectively activates one or more paths of a diversity receiver (DRx) module based on the band select signal. As described herein, a DRx module may include a number of paths between one or more inputs (coupled to one or more antennas) and one or more outputs (coupled to one or more transmission lines) of the DRx module. The paths may include bypass paths and multiplexer paths. The multiplexer paths may include on-module paths and off-module paths.

The controller may selectively activate one or more of the plurality of paths by, for example, opening or closing one or more bypass switches, enabling or disabling amplifiers disposed along the paths via an amplifier enable signal, controlling one or more multiplexers via a splitter control signal and/or a combiner control signal, or through other mechanisms. For example, the controller may open or close switches disposed along the paths or set the gain of the amplifiers disposed along the paths to substantially zero.

At block BC1230, the controller sends a tuning signal to one or more tunable components disposed along the one or more activated paths. The tunable components may include one or more of a tunable impedance matching component disposed at the input of the DRx module, a plurality of tunable impedance matching components respectively disposed along the plurality of paths, a plurality of tunable phase-shift components respectively disposed along the plurality of paths, or a tunable output impedance matching component disposed at the output of the DRx module.

The controller may tune the tunable components based on a lookup table that associates frequency bands (or sets of frequency bands) indicated by the band select signal with tuning parameters. Accordingly, in response to a band select signal, the DRx controller may transmit a tuning signal to the tunable components (of active paths) to tune the tunable components (or the variable components thereof) according to the tuning parameters. In some implementations, the controller tunes the tunable components based, at least in part, on amplifier control signals transmitted to control the gain and/or current of one or more amplifiers respectively disposed along the one or more activated paths.

Among others, the foregoing Example C related to impedance-shifting components can be summarized as follows.

In accordance with some implementations, the present disclosure relates to a receiving system including a controller configured to selectively activate one or more of a plurality of paths between an input of the receiving system and an output of the receiving system. The receiving system further includes a plurality of amplifiers. Each one of the plurality of amplifiers is disposed along a corresponding one of the plurality of paths and is configured to amplify a signal received at the amplifier. The receiving system further includes a plurality of impedance matching components. Each one of the plurality of impedance matching components is disposed along a corresponding one of the plurality of paths and is configured to reduce at least one of an out-of-band noise figure or an out-of-band gain of the one of the plurality of paths.

In some embodiments, a first impedance matching component of the plurality of impedance matching components disposed along a first path of the plurality of paths corresponding to a first frequency band can be configured to reduce at least one of an out-of-band noise figure or an out-of-band gain for a second frequency band corresponding to a second path of the plurality of paths.

In some embodiments, a second impedance matching component of the plurality of impedance matching components disposed along the second path can be configured to reduce at least one of an out-of-band noise figure or an out-of-band gain for the first frequency band. In some embodiments, the first impedance matching component can be further configured to reduce at least one of an out-of-band noise figure or an out-of-band gain for a third frequency band corresponding to a third path of the plurality of paths.

In some embodiments, the first impedance matching component can be further configured to reduce at least one of an in-band noise figure or increase an in-band gain for the first frequency band. In some embodiments, the first impedance matching component can be configured to reduce an in-band metric of the in-band noise figure minus the in-band gain to within a threshold amount of an in-band metric minimum. In some embodiments, the first impedance matching component can be configured to reduce an out-of-band metric of the out-of-band noise figure plus the out-of-band gain to an in-band-constrained out-of-band minimum.

In some embodiments, the receiving system can further include a multiplexer configured to split an input signal received at the input into a plurality of signals at a respective plurality of frequency bands propagated along the plurality of paths. In some embodiments, each one of the plurality of impedance matching components can be disposed between the multiplexer and a respective one of the plurality of amplifiers. In some embodiments, the receiving system can further include a signal combiner configured to combine signals propagating along the plurality of paths.

In some embodiments, at least one of the plurality of impedance components can be a passive circuit. In some embodiments, at least one of the plurality of impedance matching components can be an RLC circuit.

In some embodiments, at least one of the plurality of impedance matching components can include a tunable impedance matching component configured to present an impedance controlled by an impedance tuning signal received from the controller.

In some embodiments, a first impedance matching component disposed along a first path of the plurality of paths corresponding to a first frequency band can be further configured to phase-shift the second frequency band of a signal passing through the first impedance matching component such that an initial signal propagated along a second path of the plurality of paths corresponding to the second frequency band and a reflected signal propagated along the first path are at least partially in-phase.

In some implementations, the present disclosure relates to a radio-frequency (RF) module that includes a packaging substrate configured to receive a plurality of components. The RF module further includes a receiving system implemented on the packaging substrate. The receiving system includes a controller configured to selectively activate one or more of a plurality of paths between an input of the receiving system and an output of the receiving system. The receiving system further includes a plurality of amplifiers. Each one of the plurality of amplifiers is disposed along a corresponding one of the plurality of paths and is configured to amplify a signal received at the amplifier. The receiving system further includes a plurality of impedance matching components. Each one of the plurality of impedance matching components is disposed along a corresponding one of the plurality of paths and is configured to reduce at least one of an out-of-band noise figure or an out-of-band gain of the one of the plurality of paths. In some embodiments, the RF module can be a diversity receiver front-end module (FEM).

In some embodiments, a first impedance matching component of the plurality of impedance matching components disposed along a first path of the plurality of paths corresponding to a first frequency band can be configured to reduce at least one of an out-of-band noise figure or an out-of-band gain for a second frequency band corresponding to a second path of the plurality of paths.

According to some teachings, the present disclosure relates to a wireless device that includes a first antenna configured to receive a first radio-frequency (RF) signal. The wireless device further includes a first front-end module (FEM) in communication with the first antenna. The first FEM including a packaging substrate configured to receive a plurality of components. The first FEM further includes a receiving system implemented on the packaging substrate. The receiving system includes a controller configured to selectively activate one or more of a plurality of paths between an input of the receiving system and an output of the receiving system. The receiving system further includes a plurality of amplifiers. Each one of the plurality of amplifiers is disposed along a corresponding one of the plurality of paths and is configured to amplify a signal received at the amplifier. The receiving system further includes a plurality of impedance matching components. Each one of the plurality of impedance matching components is disposed along a corresponding one of the plurality of paths and is configured to reduce at least one of an out-of-band noise figure or an out-of-band gain of the one of the plurality of paths. The wireless device further includes a transceiver configured to receive a processed version of the first RF signal from the output via a transmission line and generate data bits based on the processed version of the first RF signal.

In some embodiments, the wireless device can further include a second antenna configured to receive a second radio-frequency (RF) signal and a second FEM in communication with the first antenna. The transceiver can be configured to receive a processed version of the second RF signal from an output of the second FEM and generate the data bits based on the processed version of the second RF signal.

In some embodiments, a first impedance matching component of the plurality of impedance matching components disposed along a first path of the plurality of paths corresponding to a first frequency band is configured to reduce at least one of an out-of-band noise figure or an out-of-band gain for a second frequency band corresponding to a second path of the plurality of paths.

Example D: Post-Amplifier Filters

Figure 56:
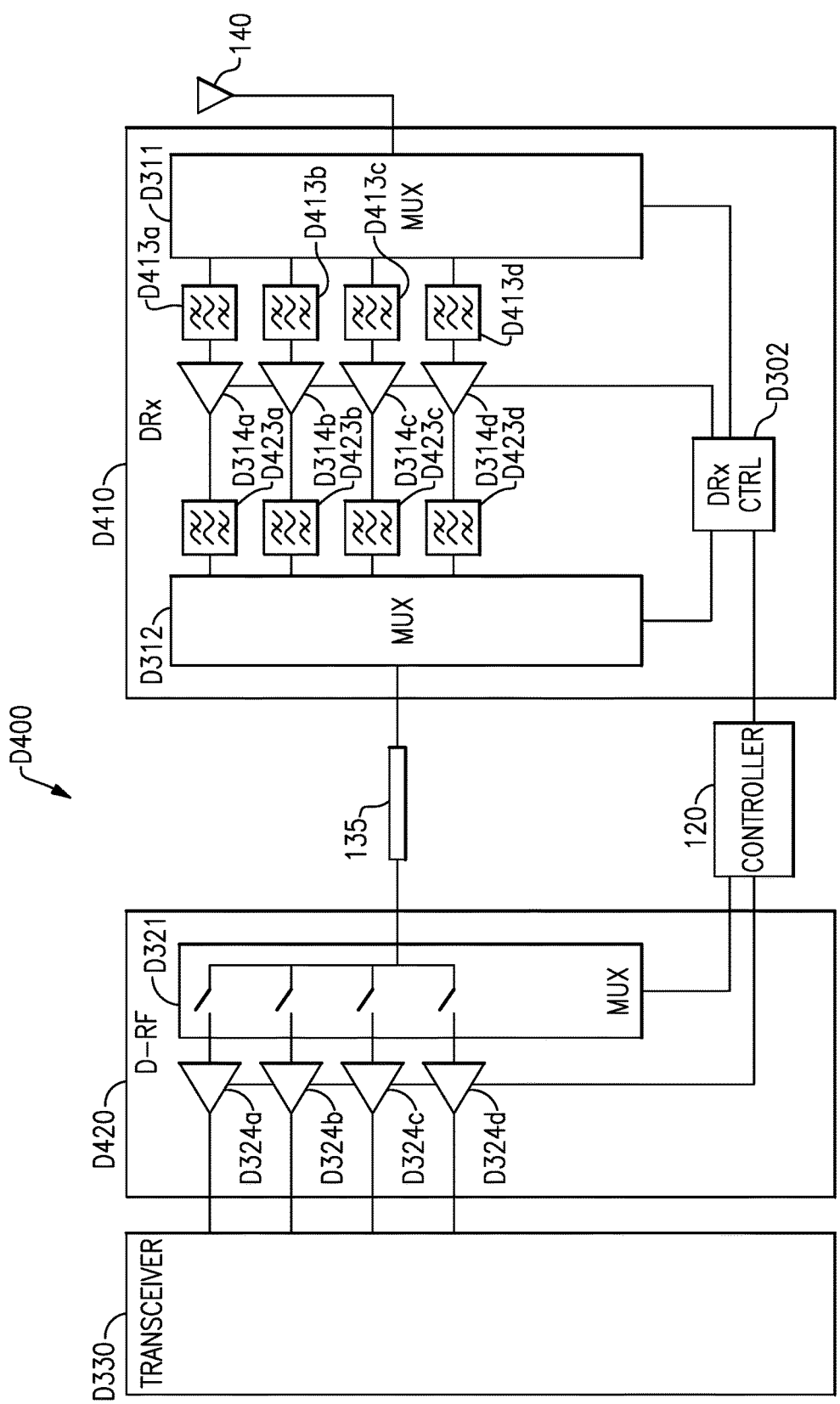
FIG. 56 shows that in some embodiments, a diversity receiver configuration may include a diversity receiver (DRx) module having a plurality of bandpass filters disposed at the outputs of a plurality of amplifiers.

FIG. 56 shows that in some embodiments, a diversity receiver configuration D400 may include a diversity receiver (DRx) module D410 having a plurality of bandpass filters D423a-D423d disposed at the outputs of a plurality of amplifiers D314a-D314d. The diversity receiver configuration D400 includes a DRx module D410 having an input coupled to an antenna 140 and an output coupled to a transmission line 135. The DRx module D410 includes a number of paths between the input and the output of the DRx module D410. Each of the paths include an input multiplexer D311, a pre-amplifier bandpass filter D413a-D413d, an amplifier D314a-D314d, a post-amplifier bandpass filter D423a-D423d, and an output multiplexer D312.

The DRx controller D302 is configured to selectively activate one or more of the plurality of paths between the input and the output. In some implementations, the DRx controller D302 is configured to selectively activate one or more of the plurality of paths based on a band select signal received by the DRx controller D302 (e.g., from a communications controller). The DRx controller D302 may selectively activate the paths by, for example, enabling or disabling the amplifiers D314a-D314d, controlling the multiplexers D311, D312, or through other mechanisms.

The output of the DRx module D410 is passed, via the transmission line 135, to a diversity RF module D420 which differs from the diversity RF module 320 of FIG. 39 in that the diversity RF module D420 of FIG. 56 does not include downstream bandpass filters. In some implementations (e.g., as shown in FIG. 56), the downstream multiplexer D321 may be implemented as a sample switch.

Including post-amplifier bandpass filters D423a-D423d within the DRx module D410 rather than the diversity RF module D420 may provide a number of advantages. For example, as described in detail below, such a configuration may improve the noise figure of the DRx module D410, simplify filter design, and/or improve path isolation.

Each of the paths of the DRx module D410 may be characterized by a noise figure. The noise figure of each path is a representation of the degradation of the signal-to-noise ratio (SNR) caused by propagation along the path. In particular, the noise figure of each path may be expressed as the difference in decibels (dB) between the SNR at the input of the pre-amplifier bandpass filter D413a-D413d and the SNR at the output of the post-amplifier bandpass filter D423a-D4234b. The noise figure of each path may be different for different frequency bands. For example, the first path may have an in-band noise figure for a first frequency band and an out-of-band noise figure for a second frequency band. Similarly, the second path may have an in-band noise figure for the second frequency band and an out-of-band noise figure for the first frequency band.

The DRx module D410 may also be characterized by a noise figure which may be different for different frequency bands. In particular, the noise figure of the DRx module D410 is the difference in dB between the SNR at the input of the DRx module D410 and the SNR at the output of the DRx module D410.

Because the signal propagating along two paths are combined by the output multiplexer D312, out-of-band noise produced or amplified by an amplifier can negatively affect the combined signal. For example, out-of-band noise produced or amplified by the first amplifier D314a may increase the noise figure of the DRx module D410 at the second frequency. Thus, the post-amplifier bandpass filter D423a disposed along the path may reduce this out-of-band noise and decrease the noise figure of the DRx module D410 at the second frequency.

In some implementations, the pre-amplifier bandpass filters D413a-D413d and post-amplifier bandpass filters D423a-D423d may be designed to be complementary, thereby simplifying filter design and/or achieving similar performance with fewer components at a decreased cost. For example, the post-amplifier bandpass filters D423a disposed along the first path may more strongly attenuate frequencies that the pre-amplifier bandpass filter D413a disposed along the first path more weakly attenuates. As an example, the pre-amplifier bandpass filter D413a may attenuate frequencies below the first frequency band more than frequencies above the first frequency band. Complimentarily, the post-amplifier bandpass filter D423a may attenuate frequencies above the first frequency band more than frequencies below the first frequency band. Thus, together, the pre-amplifier bandpass filter D413a and post-amplifier bandpass filter D423a attenuate all out-of-band frequencies using fewer components. In general, one of the bandpass filters disposed along a path can attenuate frequencies below the respective frequency band of the path more than frequencies above the respective frequency band and another of the bandpass filters disposed along path can attenuate frequencies above the respective frequency band more than frequencies below the respective frequency band. The pre-amplifier bandpass filters D413a-D413d and post-amplifier bandpass filters D423a-D423d may be complimentary in other ways. For example, the pre-amplifier bandpass filters D413a disposed along the first path may phase-shift a signal by a number of degrees and the post-amplifier bandpass filter D423a disposed along the first path may oppositely phase-shift the signal the number of degrees.

In some implementations, the post-amplifier bandpass filters D423a-D423d may improve isolation of the paths. For example, without post-amplifier bandpass filters, a signal propagating along the first path may be filtered to the first frequency by the pre-amplifier bandpass filter D413a and amplified by the amplifier D314a. The signal may leak through the output multiplexer D312 to reverse propagate along the second path and reflect off the amplifier D314b, the pre-amplifier bandpass filter D413b, or other components disposed along the second path. If this reflected signal is out-of-phase with the initial signal, this may result in a weakening of the signal when combined by the output multiplexer D312. In contrast, with post-amplifier bandpass filters, the leaked signal (primarily at the first frequency band) is attenuated by the post-amplifier bandpass filter D423b disposed along the second path and associated with the second frequency band, reducing the effect of any reflected signal.

Thus, the DRx module D410 includes a controller configured to selectively activate one or more of a plurality of paths between an input of a first multiplexer (e.g., the input multiplexer D311) and an output of a second multiplexer (e.g., the output multiplexer D312). The DRx module D410 further includes a plurality of amplifiers D314a-D314d, each one of the plurality of amplifiers D314a-D314d disposed along a corresponding one of the plurality of paths and configured to amplify a signal received at the amplifier. The DRx module D410 includes a first plurality of bandpass filters (e.g., the post-amplifier bandpass filters D423a-D423d), each one of the first plurality of bandpass filters disposed along a corresponding one of the plurality of paths at an output of a corresponding one of the plurality of amplifiers D314a-D314d and configured to filter a signal received at the bandpass filter to a respective frequency band. As shown in FIG. 56, in some implementations, the DRx module D410 further includes a second plurality of bandpass filters (e.g., the pre-amplifier bandpass filters D413a-D413d), each one of the second plurality of bandpass filters disposed along a corresponding one of the plurality of paths at an input of a corresponding one of the plurality of amplifiers D314a-D314d and configured to filter a signal received at the bandpass filter to a respective frequency band.

Figure 57:
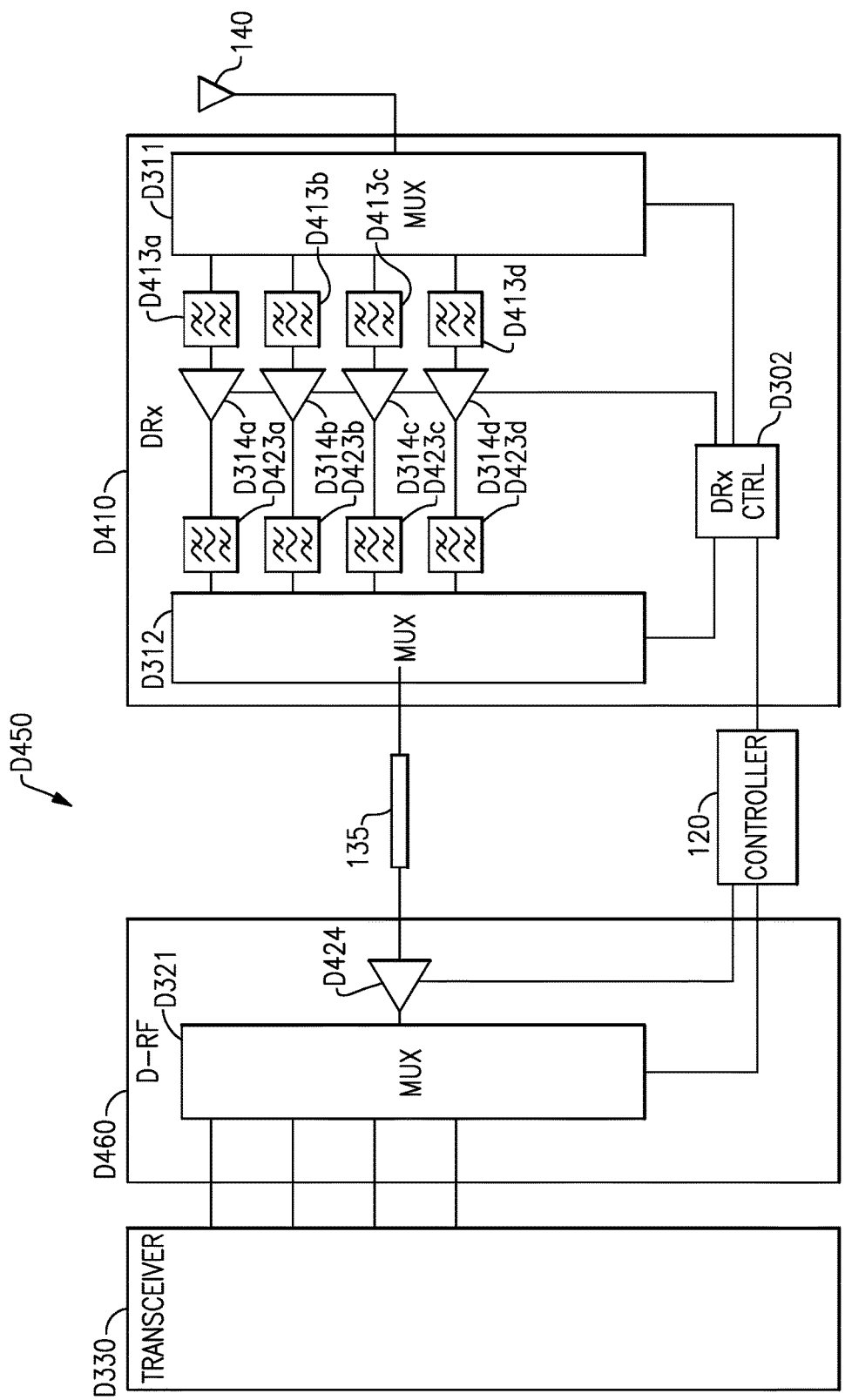
FIG. 57 shows that in some embodiments, a diversity receiver configuration may include a diversity RF module with fewer amplifiers than a diversity receiver (DRx) module.

FIG. 57 shows that in some embodiments, a diversity receiver configuration D450 may include a diversity RF module D460 with fewer amplifiers than a diversity receiver (DRx) module D410. As mentioned herein, in some implementations, a diversity RF module D460 may not include bandpass filters. Thus, in some implementations, one or more amplifiers D424 of the diversity RF module D460 need not be band-specific. In particular, the diversity RF module D460 may include one or more paths, each including an amplifier D424, that are not mapped 1-to-1 with the paths of the DRx module D410. Such a mapping of paths (or corresponding amplifiers) may be stored in the controller 120.

Accordingly, whereas the DRx module D410 includes a number of paths, each corresponding to a frequency band, the diversity RF module D460 may include one or more paths (from the input of the diversity RF module D460 to the input of the multiplexer D321) that do not correspond to a single frequency band.

In some implementations (as shown in FIG. 57), the diversity RF module D460 includes a single wide-band or tunable amplifier D424 that amplifies the signal received from the transmission line 135 and outputs an amplified signal to a multiplexer D321. The multiplexer D321 includes a plurality of multiplexer outputs, each corresponding to a respective frequency band. In some implementations, the multiplexer D321 may be implemented as a sample switch. In some implementations, the diversity RF module D460 does not include any amplifiers.

In some implementations, the diversity signal is a single-band signal. Thus, in some implementations, the multiplexer D321 is a single-pole / multiple-throw (SPMT) switch that routes the diversity signal to one of the plurality of outputs corresponding to the frequency band of the single-band signal based on a signal received from the controller 120. In some implementations, the diversity signal is a multi-band signal. Thus, in some implementations, the multiplexer D421 is a band splitter that routes the diversity signal to two or more of the plurality of outputs corresponding to the two or more frequency bands of the multi-band signal based on a splitter control signal received from the controller 120. In some implementations, diversity RF module D460 may be combined with the transceiver D330 as a single module.

In some implementations, the diversity RF module D460 includes multiple amplifiers, each corresponding to a set of frequency bands. The signal from the transmission line 135 may be fed into a band splitter that outputs high frequencies along a first path to a high-frequency amplifier and outputs low frequencies along a second path to a low-frequency amplifier. The output of each of the amplifiers may be provided to the multiplexer D321 which is configured to route the signal to the corresponding inputs of the transceiver D330.

Figure 58:
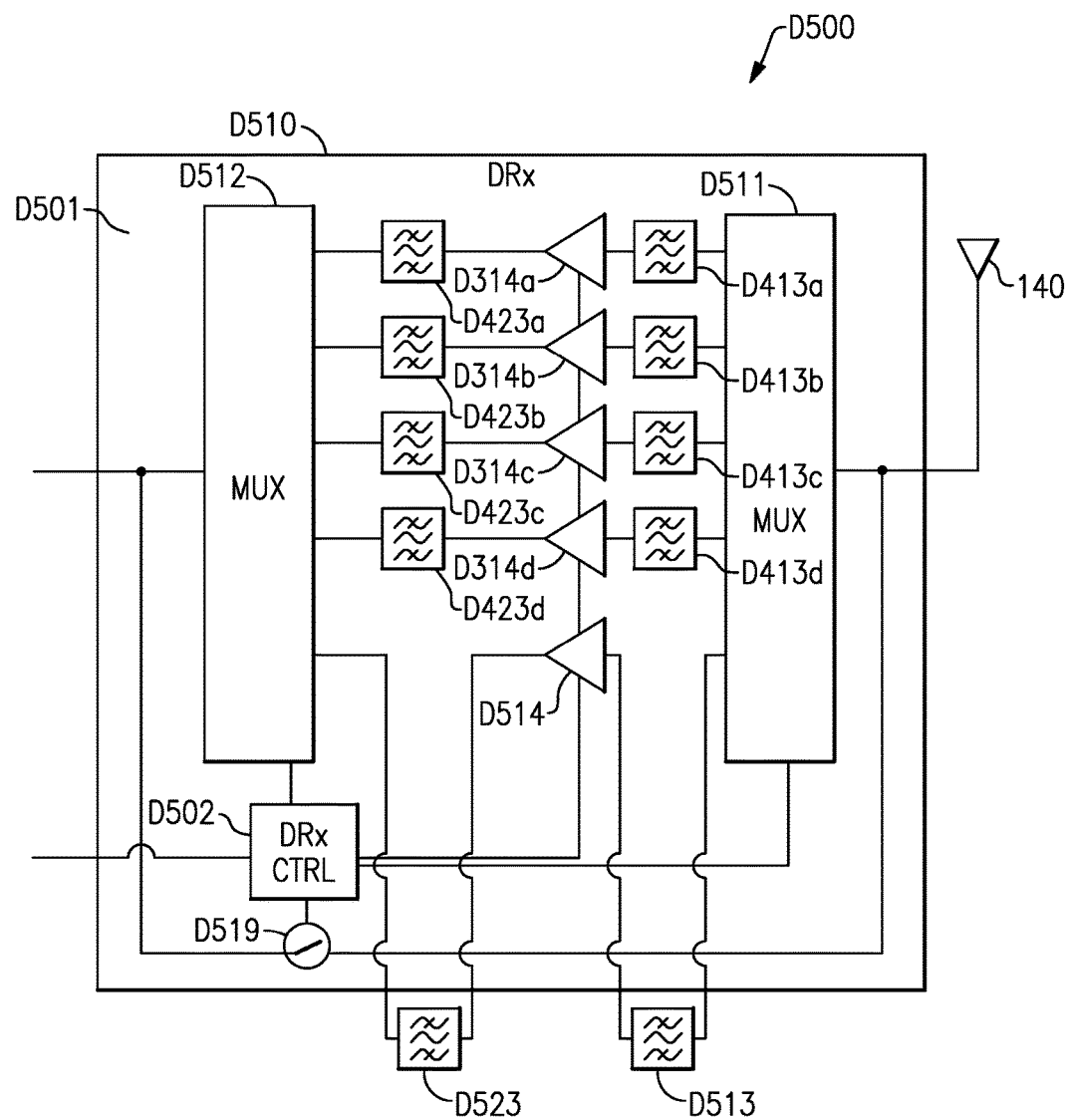
FIG. 58 shows that in some embodiments, a diversity receiver configuration may include a DRx module coupled to an off-module filter.

FIG. 58 shows that in some embodiments, a diversity receiver configuration D500 may include a DRx module D510 coupled to one or more off-module filters D513, D523. The DRx module D510 may include a packaging substrate D501 configured to receive a plurality of components and a receiving system implemented on the packaging substrate D501. The DRx module D510 may include one or more signal paths that are routed off the DRx module D510 and made available to a system integrator, designer, or manufacturer to support filters for any desired band.

The DRx module D510 includes a number of paths between the input and the output of the DRx module D510. The DRx module D510 includes a bypass path between the input and the output activated by a bypass switch D519 controlled by the DRx controller D502. Although FIG. 58 illustrates a single bypass switch D519, in some implementations, the bypass switch D519 may include multiple switches (e.g., a first switch disposed physically close to the input and a second switch disposed physically close to the output). As shown in FIG. 58, the bypass path does not include a filter or an amplifier.

The DRx module D510 includes a number of multiplexer paths including a first multiplexer D511 and a second multiplexer D512. The multiplexer paths include a number of on-module paths that include the first multiplexer D511, a pre-amplifier bandpass filter D413a-D413d implemented on the packaging substrate D501, an amplifier D314a-D314d implemented on the packaging substrate D501, a post-amplifier bandpass filter D423a-D423d implemented on the packaging substrate D501, and the second multiplexer D512. The multiplexer paths include one or more off-module paths that include the first multiplexer D511, a pre-amplifier bandpass filter D513 implemented off the packaging substrate D501, an amplifier D514, a post-amplifier bandpass filter D523 implemented off the packaging substrate D501, and the second multiplexer D512. The amplifier D514 may be a wide-band amplifier implemented on the packaging substrate D501 or may also be implemented off the packaging substrate D501. In some implementations, one or more off-module paths do not include a pre-amplifier bandpass filter D513, but do include a post-amplifier bandpass filter D523. As described herein, the amplifiers D314a-D314d, D514 may be variable-gain amplifiers and/or variable-current amplifiers.

The DRx controller D502 is configured to selectively activate one or more of the plurality of paths between the input and the output. In some implementations, the DRx controller D502 is configured to selectively activate one or more of the plurality of paths based on a band select signal received by the DRx controller D502 (e.g., from a communications controller). The DRx controller D502 may selectively activate the paths by, for example, opening or closing the bypass switch D519, enabling or disabling the amplifiers D314a-D314d, D514, controlling the multiplexers D511, D512, or through other mechanisms. For example, the DRx controller D502 may open or close switches along the paths (e.g., between the filters D313a-D313d, D513 and the amplifiers D314a-D314d, D514) or by setting the gain of the amplifiers D314a-D314d, D514 to substantially zero.

Figure 59:
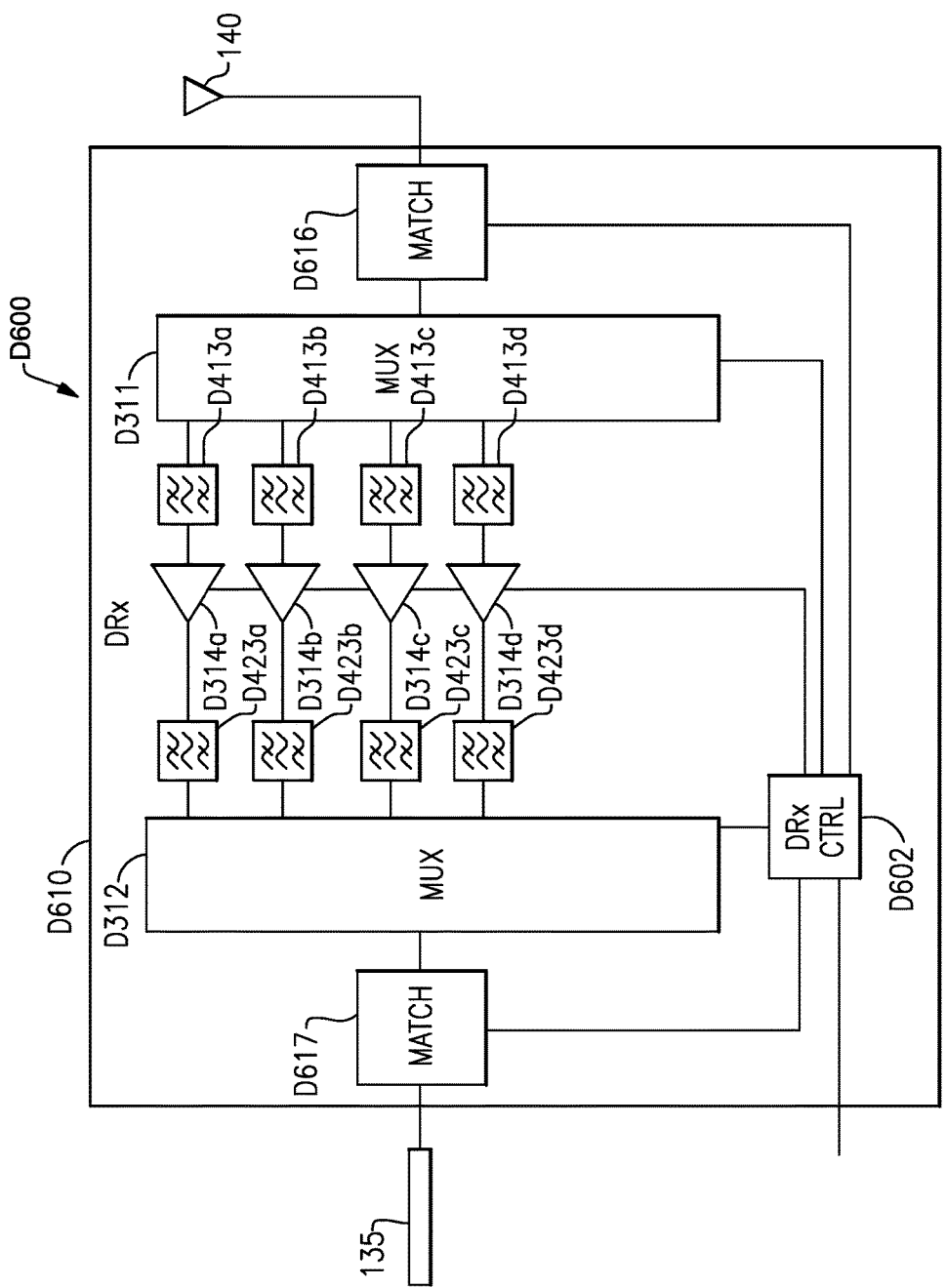
FIG. 59 shows that in some embodiments, a diversity receiver configuration may include a DRx module with tunable matching circuits.

FIG. 59 shows that in some embodiments, a diversity receiver configuration D600 may include a DRx module D610 with tunable matching circuits. In particular, the DRx module D610 may include one or more tunable matching circuits disposed at one or more of the input and the output of the DRx module D610.

Multiple frequency bands received on the same diversity antenna 140 are unlikely to all see an ideal impedance match. To match each frequency band using a compact matching circuit, a tunable input matching circuit D616 may be implemented at the input of the DRx module D610 and controlled by the DRx controller D602 (e.g., based on a band select signal from a communications controller). The DRx controller D602 may tune the tunable input matching circuit D616 based on a lookup table that associates frequency bands (or sets of frequency bands) with tuning parameters. The tunable input matching circuit D616 may be a tunable T-circuit, a tunable PI-circuit, or any other tunable matching circuit. In particular, the tunable input matching circuit D616 may include one or more variable components, such as resistors, inductors, and capacitors. The variable components may be connected in parallel and/or in series and may be connected between the input of the DRx module D610 and the input of the first multiplexer D311 or may be connected between the input of the DRx module D610 and a ground voltage.

Similarly, with only one transmission line 135 (or, at least, few cables) carrying signals of many frequency bands, it is not likely that multiple frequency bands will all see an ideal impedance match. To match each frequency band using a compact matching circuit, a tunable output matching circuit D617 may be implemented at the output of the DRx module D610 and controlled by the DRx controller D602 (e.g., based on a band select signal from a communications controller). The DRx controller D602 may tune the tunable output matching circuit D618 based on a lookup table that associates frequency bands (or sets of frequency bands) with tuning parameters. The tunable output matching circuit D617 may be a tunable T-circuit, a tunable PI-circuit, or any other tunable matching circuit. In particular, the tunable output matching circuit D617 may include one or more variable components, such as resistors, inductors, and capacitors. The variable components may be connected in parallel and/or in series and may be connected between the output of the DRx module D610 and the output of the second multiplexer D312 or may be connected between the output of the DRx module D610 and a ground voltage.

Among others, the foregoing Example D related to post-amplifier filters can be summarized as follows.

In accordance with some implementations, the present disclosure relates to a receiving system including a controller configured to selectively activate one or more of a plurality of paths between an input of a first multiplexer and an output of a second multiplexer. The receiving system can include a plurality of amplifiers. Each one of the plurality of amplifiers can be disposed along a corresponding one of the plurality of paths and can be configured to amplify a signal received at the amplifier. The receiving system can include a first plurality of bandpass filters. Each one of the first plurality of bandpass filters can be disposed along a corresponding one of the plurality of paths at an output of a corresponding one of the plurality of amplifiers and can be configured to filter a signal received at the bandpass filter to a respective frequency band.

In some embodiments, the receiving system can further include a second plurality of bandpass filters. Each one of the second plurality of bandpass filters can be disposed along a corresponding one of the plurality of paths at an input of a corresponding one of the plurality of amplifiers and can be configured to filter a signal received at the bandpass filter to a respective frequency band.

In some embodiments, one of the first plurality of bandpass filters disposed along a first path and one of the second plurality of bandpass filters disposed along the first path can be complementary. In some embodiments, one of the bandpass filters disposed along the first path can attenuate frequencies below the respective frequency band more than frequencies herein the respective frequency band and another of the bandpass filters disposed along the first path can attenuate frequencies herein the respective frequency band more than frequencies below the respective frequency band.

In some embodiments, the receiving system can further include a transmission line coupled to the output of the second multiplexer and coupled to a downstream module including a downstream multiplexer. In some embodiments, the downstream module does not include a downstream bandpass filter. In some embodiments, the downstream multiplexer includes a sample switch. In some embodiments, the downstream module can include one or more downstream amplifiers. In some embodiments, a number of the one or more downstream amplifiers can be less than a number of the plurality of amplifiers.

In some embodiments, at least one of the plurality of amplifiers can include a low-noise amplifier.

In some embodiments, the receiving system can further include one or more tunable matching circuits disposed at one or more of the input of the first multiplexer and the output of the second multiplexer.

In some embodiments, the controller can be configured to selectively activate the one or more of the plurality of paths based on a band select signal received by the controller. In some embodiments, the controller can be configured to selectively activate the one or more of the plurality of paths by transmitting a splitter control signal to the first multiplexer and a combiner control signal to the second multiplexer.

In some implementations, the present disclosure relates to a radio-frequency (RF) module that includes a packaging substrate configured to receive a plurality of components. The RF module further includes a receiving system implemented on the packaging substrate. The receiving system includes a controller configured to selectively activate one or more of a plurality of paths between an input of a first multiplexer and an output of a second multiplexer. The receiving system further includes a plurality of amplifiers. Each one of the plurality of amplifiers can be disposed along a corresponding one of the plurality of paths and can be configured to amplify a signal received at the amplifier. The receiving system further includes a first plurality of bandpass filters. Each one of the first plurality of bandpass filters can be disposed along a corresponding one of the plurality of paths at an output of a corresponding one of the plurality of amplifiers and can be configured to filter a signal received at the bandpass filter to a respective frequency band.

In some embodiments, the RF module can be a diversity receiver front-end module (FEM).

In some embodiments, the receiving system can further include a second plurality of bandpass filters. Each one of the second plurality of bandpass filters can be disposed along a corresponding one of the plurality of paths at an input of a corresponding one of the plurality of amplifiers and can be configured to filter a signal received at the bandpass filter to a respective frequency band.

In some embodiments, the plurality of paths can include an off-module path including an off-module bandpass filter and one of the plurality of amplifiers.

According to some teachings, the present disclosure relates to a wireless device that includes a first antenna configured to receive a first radio-frequency (RF) signal. The wireless device further includes a first front-end module (FEM) in communication with the first antenna. The first FEM including a packaging substrate configured to receive a plurality of components. The first FEM further includes a receiving system implemented on the packaging substrate. The receiving system includes a controller configured to selectively activate one or more of a plurality of paths between an input of a first multiplexer and an output of a second multiplexer. The receiving system further includes a plurality of amplifiers. Each one of the plurality of amplifiers can be disposed along a corresponding one of the plurality of paths and can be configured to amplify a signal received at the amplifier. The receiving system further includes a first plurality of bandpass filters. Each one of the first plurality of bandpass filters can be disposed along a corresponding one of the plurality of paths at an output of a corresponding one of the plurality of amplifiers and can be configured to filter a signal received at the bandpass filter to a respective frequency band. The wireless device further includes a communications module configured to receive a processed version of the first RF signal from the output via a transmission line and generate data bits based on the processed version of the first RF signal.

In some embodiments, the wireless device further includes a second antenna configured to receive a second radio-frequency (RF) signal and a second FEM in communication with the second antenna. The communications module can be configured to receive a processed version of the second RF signal from an output of the second FEM and generate the data bits based on the processed version of the second RF signal.

In some embodiments, the receiving system further includes a second plurality of bandpass filters. Each one of the second plurality of bandpass filters can be disposed along a corresponding one of the plurality of paths at an input of a corresponding one of the plurality of amplifiers and can be configured to filter a signal received at the bandpass filter to a respective frequency band.

Example E: Switching Network

Figure 60:
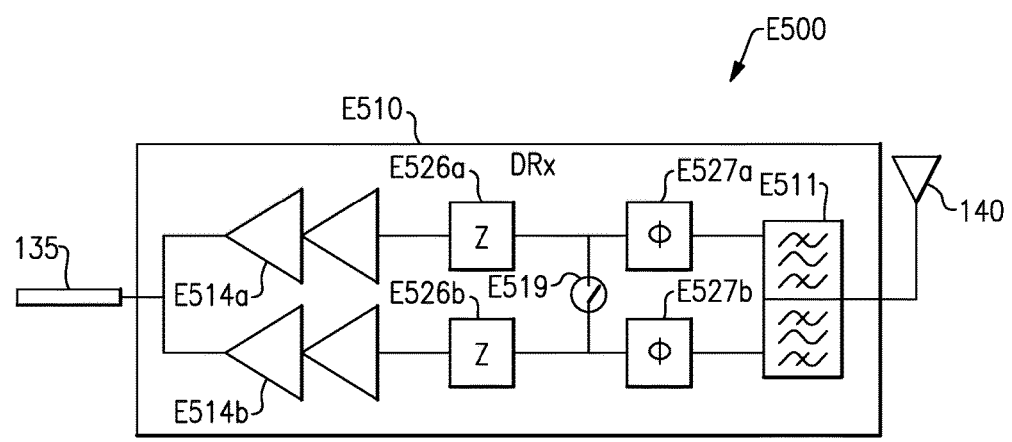
FIG. 60 shows that in some embodiments, a diversity receiver configuration may include a DRx module with a single-pole/single-throw switch.

FIG. 60 shows that in some embodiments, a diversity receiver configuration E500 may include a DRx module E510 with a single-pole/single-throw switch E519. The DRx module E510 includes two paths from an input of the DRx module E510, coupled to an antenna 140, and an output of the DRx module E510, coupled to a transmission line 135. The DRx module E510 includes a plurality of amplifiers E514a-E514b, each one of the plurality of amplifiers E514a-E514b disposed along a corresponding one of the plurality of paths and configured to amplify a signal received at the amplifier. In some implementations, as shown in FIG. 60, at least one of the plurality of amplifiers includes a dual-stage amplifier.

In the DRx module E510 of FIG. 60, the signal splitter and bandpass filters are implemented as a diplexer E511. The diplexer E511 includes an input coupled to the antenna 140, a first output coupled to a phase-shift component E527a disposed along a first path, and a second output coupled to a second phase-shift component E527b disposed along a second path. At the first output, the diplexer E511 outputs a signal received at the input (e.g., from the antenna 140) filtered to a first frequency band. At the second output, the diplexer E511 outputs the signal received at the input filtered to a second frequency band. In some implementations, the diplexer E511 may be replaced with a triplexer, a quadplexer, or any other multiplexer configured to split an input signal received at the input of the DRx module E510 into a plurality of signals at a respective plurality of frequency bands propagated along a plurality of paths.

In some implementations, an output multiplexer or other signal combiner disposed at the output of a DRx module, such as the second multiplexer 312 of FIG. 39, may degrade the performance of the DRx module when receiving a single-band signal. For example, the output multiplexer may attenuate or introduce noise to the single-band signal. In some implementations, when multiple amplifiers, such as the amplifiers 314a-314d of FIG. 39, are enabled at the same time to support a multi-band signal, each amplifier may each introduce not only in-band noise, but out-of-band noise for each of the other multiple bands.

The DRx module E510 of FIG. 60 addresses some of these challenges. The DRx module E510 includes a single-pole/single-throw (SPST) switch E519 coupling the first path to the second path. To operate in a single-band mode for the first frequency band, the switch E519 is placed in an open position, the first amplifier E514a is enabled, and the second amplifier E514b is disabled. Thus, the single-band signal at the first frequency band propagates along the first path from the antenna 140 to the transmission line 135 without switching loss. Similarly, to operate in a single-band mode for the second frequency band, the switch E519 is placed in an open position, the first amplifier E514a is disabled, and the second amplifier E514b is enabled. Thus, the single-band signal at the second frequency band propagates along the second path from the antenna 140 to the transmission line 135 without switching loss.

To operate in a multi-band mode for the first frequency band and the second frequency band, the switch E519 is placed in a closed position, the first amplifier E514a is enabled, and the second amplifier E514b is disabled. Thus, the first frequency band portion of the multi-band signal propagates along the first path through a first phase-shift component E527a, a first impedance matching component E526a, and the first amplifier E514a. The first frequency band portion is prevented from traversing the switch E519 and reverse propagating along the second path by the second phase-shift component E527b. In particular, the second phase-shift component E527a is configured to phase-shift the first frequency band portion of a signal passing through the second phase-shift component E527b so as to maximize (or at least increase) the impedance at the first frequency band.

The second frequency band portion of the multi-band signal propagates along the second path through a second phase-shift component E527b, traverses the switch E519, and propagates along the first path through the first impedance matching component E526a and the first amplifier E314a. The second frequency band portion is prevented from reverse propagating along the first path by the first phase-shift component E527a. In particular, the first phase-shift component E527a is configured to phase-shift the second frequency band portion of a signal passing through the first phase-shift component E527a so as to maximize (or at least increase) the impedance at the second frequency band.

Each of the paths may be characterized by a noise figure and a gain. The noise figure of each path is a representation of the degradation of the signal-to-noise ratio (SNR) caused by the amplifier and impedance matching component E526a-E526b disposed along the path. In particular, the noise figure of each path is the difference in decibels (dB) between the SNR at the input of the impedance matching component E526a-E526b and the SNR at the output of the amplifier E314a-E314b. Thus, the noise figure is a measure of the difference between the noise output of the amplifier to the noise output of an "ideal" amplifier (that does not produce noise) with the same gain.

The noise figure of each path may be different for different frequency bands. For example, the first path may have a first noise figure for the first frequency band and a second noise figure for the second frequency band. The noise figure and gain of each path (at each frequency band) may depend, at least in part, on the impedance (at each frequency band) of the impedance matching component E526a-E526b. Accordingly, it may be advantageous that the impedance of the impedance matching component E526a-E526b is such that the noise figure of each path is minimized (or reduced).

In some implementations, the second impedance matching component E526b presents an impedance that minimizes (or decreases) the noise figure for the second frequency band. In some implementations, the first impedance matching component E526a minimizes (or decreases) the noise figure for the first frequency band. As the second frequency band portion of a multi-band signal may be partially propagated along the first part, in some implementations, the first impedance matching component E526a minimizes (or decreases) a metric including the noise figure for the first band and the noise figure for the second band.

The impedance matching components E526a-E526b may be implemented as passive circuits. In particular, the impedance matching components E526a-E526b may be implemented as RLC circuits and include one or more passive components, such as resistors, inductors and/or capacitors. The passive components may be connected in parallel and/or in series and may be connected between the outputs of the phase-shift components E527a-E527b and the inputs of the amplifiers E514a-E415b or may be connected between the outputs of the phase-shift components E527a-E527b and a ground voltage.

Similarly, the phase-shift components E527a-E527b may be implemented as passive circuits. In particular, the phase-shift components E527a-E527b may be implemented as LC circuits and include one or more passive components, such as inductors and/or capacitors. The passive components may be connected in parallel and/or in series and may be connected between the outputs of the diplexer E511 and the inputs of the impedance matching components E526a-E526b or may be connected between the outputs of the diplexer E511 and a ground voltage.

Figure 61:
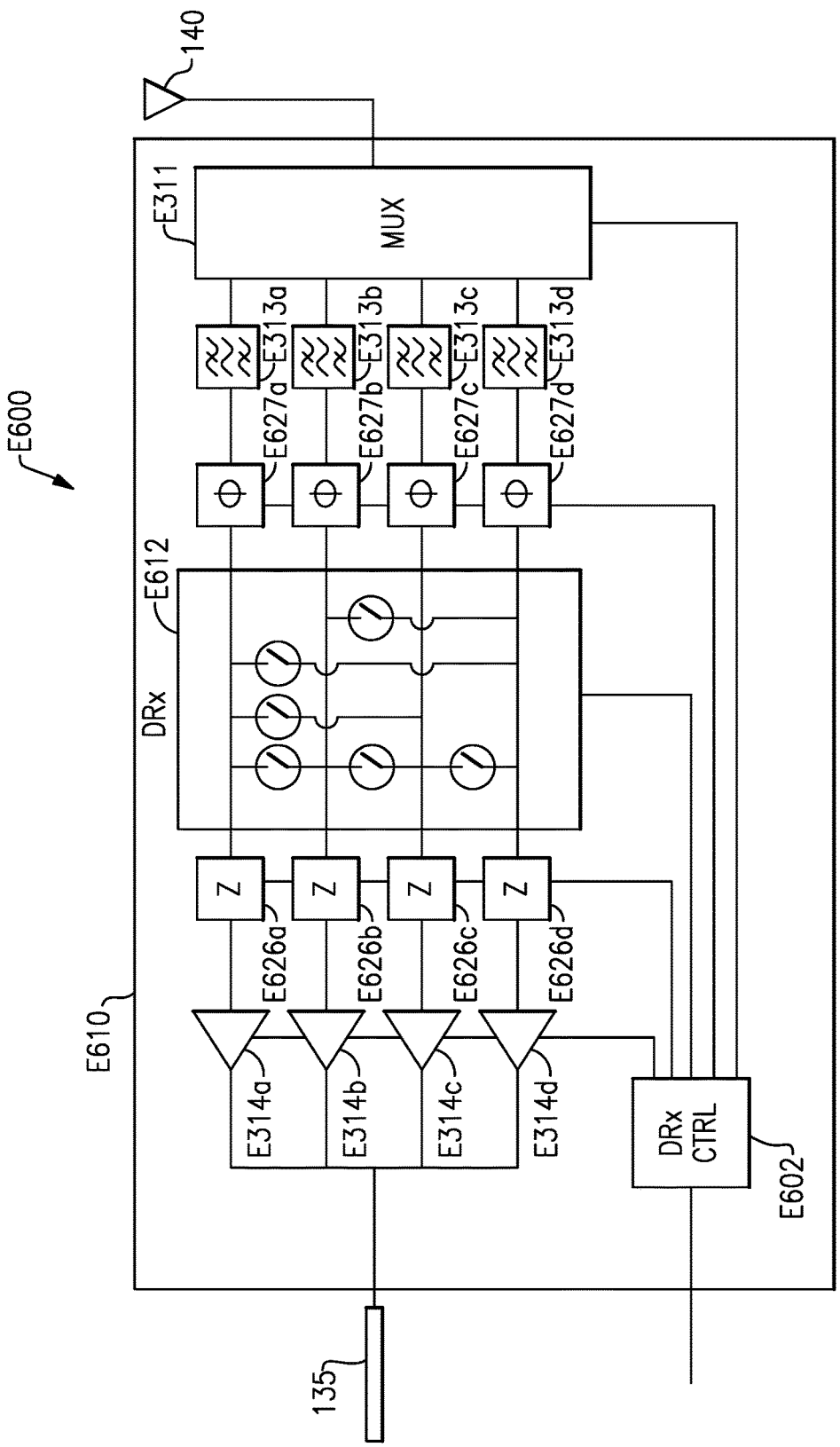
FIG. 61 shows that in some embodiments, a diversity receiver configuration may include a DRx module with tunable phase-shift components.

FIG. 61 shows that in some embodiments, a diversity receiver configuration E600 may include a DRx module E610 with tunable phase-shift components E627a-E627d. Each of the tunable phase-shift components E627a-E627d may be configured to phase-shift a signal passing through the tunable phase-shift component an amount controlled by a phase-shift tuning signal received from the controller.

The diversity receiver configuration E600 includes a DRx module E610 having an input coupled to an antenna 140 and an output coupled to a transmission line 135. The DRx module E610 includes a number of paths between the input and the output of the DRx module E610. Each of the paths includes a multiplexer E311, a bandpass filter E313a-E313d, a tunable phase-shift component E627a-E627d, a switching network E612, a tunable impedance matching component E626a-E626d, and an amplifier E314a-E314d. As described herein, the amplifiers E314a-E314d may be variable-gain amplifiers and/or variable-current amplifiers.

The tunable phase-shift components E627a-E627d may include one or more variable components, such as inductors and capacitors. The variable components may be connected in parallel and/or in series and may be connected between the outputs of the multiplexer E311 and the inputs of the switching network E612 or may be connected between the outputs of the multiplexer and a ground voltage.

The tunable impedance matching components E626a-E626d may be a tunable T-circuit, a tunable PI-circuit, or any other tunable matching circuit. The tunable impedance matching components E626a-E626d may include one or more variable components, such as resistors, inductors, and capacitors. The variable components may be connected in parallel and/or in series and may be connected between the outputs of the switching network E612 and the inputs of the amplifiers E314a-E314d or may be connected between the outputs of the switching network E612 and a ground voltage.

The DRx controller E602 is configured to selectively activate one or more of the plurality of paths between the input and the output. In some implementations, the DRx controller E602 is configured to selectively activate one or more of the plurality of paths based on a band select signal received by the DRx controller E602 (e.g., from a communications controller). The DRx controller E602 may selectively activate the paths by, for example, enabling or disabling the amplifiers E314a-E314d, controlling the multiplexer E311 and/or the switching network E612, or through other mechanisms.

In some implementations, the DRx controller E602 controls the switching network E612 based on the band select signal. The switching network includes a plurality of SPST switches, each switch coupling two of the plurality of paths. The DRx controller E602 may send a switching signal (or multiple switching signals) to the switching network to open or close the plurality of SPST switches. For example, if the band select signal indicates that an input signal includes a first frequency band and a second frequency band, the DRx controller E602 may close a switch between the first path and the second path. If the band select signal indicates that an input signal includes a second frequency band and a fourth frequency band, the DRx controller E602 may close a switch between the second path and the fourth path. If the band select signal indicates that an input signal includes the first frequency band, the second frequency band, and the fourth frequency band, the DRx controller E602 may close the both of the switches (and/or close the switch between the first path and the second path and a switch between first path and the fourth path). If the band select signal indicates that an input signal includes the second frequency band, the third frequency band, and the fourth frequency, the DRx controller E602 may close a switch between the second path and the third path and a switch between the third path and the fourth path (and/or close the switch between the second path and the third path and a switch between the second path and the fourth path).

In some implementations, the DRx controller E602 is configured to tune the tunable phase-shift components E627a-E627d. In some implementations, the DRx controller E602 tunes the tunable phase-shift components E627a-E627d based on the band select signal. For example, the DRx controller E602 may tune the tunable phase-shift components E627a-E627d based on a lookup table that associates frequency bands (or sets of frequency bands) indicated by the band select signal with tuning parameters. Accordingly, in response to a band select signal, the DRx controller E602 may transmit a phase-shift tuning signal to the tunable phase-shift component E627a-E627d of each active path to tune the tunable phase-shift component (or the variable components thereof) according to the tuning parameters.

The DRx controller E602 may be configured to tune the tunable phase-shift components E627a-E627d of each active path so as to maximize (or at least increase) the impedance at frequency bands corresponding to the other active paths. Thus, if the first path and the third path are active, the DRx controller E602 may tune the first phase-shift component E627a so as to maximize (or at least increase) the impedance at the third frequency band, whereas, if the first path and the fourth path are active, the DRx controller E602 may tune the first phase-shift component E627a so as to maximize (or at least increase) the impedance at the fourth frequency band.

In some implementations, the DRx controller E602 is configured to tune the tunable impedance matching components E626a-E626d. In some implementations, the DRx controller E602 tunes the tunable impedance matching components E626a-E626d based on the band select signal. For example, the DRx controller E602 may tune the tunable impedance matching components E626a-E626d based on a lookup table that associates frequency bands (or sets of frequency bands) indicated by the band select signal with tuning parameters. Accordingly, in response to a band select signal, the DRx controller E602 may transmit an impedance tuning signal to the tunable impedance matching component E626a-E626d of the path having an active amplifier according to the tuning parameters.

In some implementations, the DRx controller E602 tunes the tunable impedance matching components E626a-E626d of the path having an active amplifier to minimize (or reduce) a metric including the noise figure for the corresponding frequency band of each active path.

In various implementations, one or more of the tunable phase-shift components E627a-E627d or tunable impedance matching components E626a-E626d may be replaced by fixed components that are not controlled by the DRx controller E602.

Figure 62:
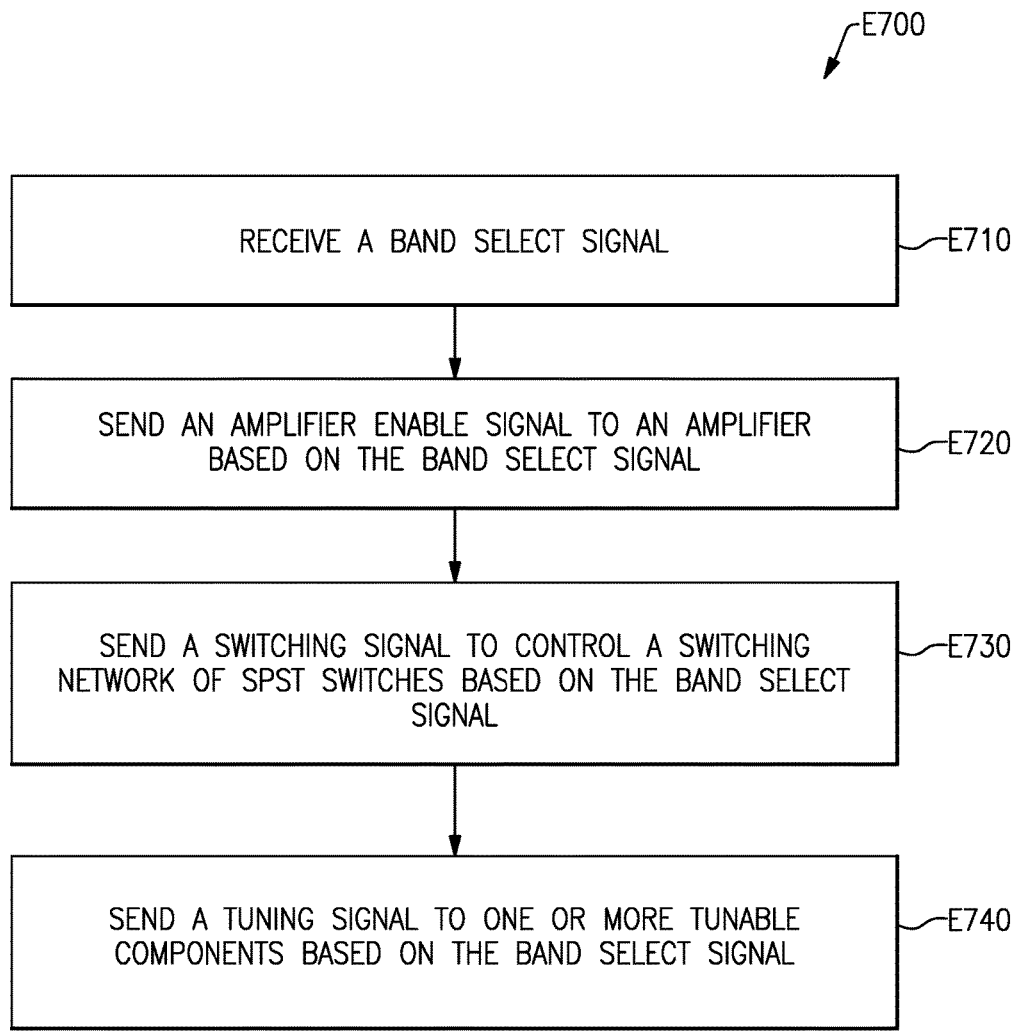
FIG. 62 shows an embodiment of a flowchart representation of a method of processing an RF signal.

FIG. 62 shows an embodiment of a flowchart representation of a method E700 of processing an RF signal. In some implementations (and as detailed below as an example), the method E700 is performed by a controller, such as the DRx controller E602 of FIG. 61. In some implementations, the method E700 is performed by processing logic, including hardware, firmware, software, or a combination thereof. In some implementations, the method E700 is performed by a processor executing code stored in a non-transitory computer-readable medium (e.g., a memory). Briefly, the method E700 includes receiving a band select signal and routing a received RF signal along one or more paths to process the received RF signal.

The method E700 begins, at block E710, with the controller receiving a band select signal. The controller may receive the band select signal from another controller or may receive the band select signal from a cellular base station or other external source. The band select signal may indicate one or more frequency bands over which a wireless device is to transmit and receive RF signals. In some implementations, the band select signal indicates a set of frequency bands for carrier aggregation communication.

At block E720, the controller sends an amplifier enable signal to an amplifier of a DRx module based on the band select signal. In some implementations, the band select signal indicates a single frequency band and the controller sends an amplifier enable signal to enable an amplifier disposed along a path corresponding to the single frequency band. The controller may send an amplifier enable signal to disable the other amplifiers disposed along other paths corresponding to other frequency bands. In some implementations, the band select signal indicates multiple frequency bands and the controller sends an amplifier enable signal to enable an amplifier disposed along one of the paths corresponding to one of the multiple frequency bands. The controller may send an amplifier enable signal to disable the other amplifiers. In some implementations, the controller enables the amplifier disposed along the path corresponding to the lowest frequency band.

At block E730, the controller sends a switching signal to control a switching network of single-pole/single-throw (SPST) switches based on the band select signal. The switching network includes a plurality of SPST switches coupling the plurality of paths corresponding to a plurality of frequency bands. In some implementations, the band select signal indicates a single frequency band and the controller sends a switching signal that opens all of the SPST switches. In some implementations, the band select signal indicates multiple frequency bands and the controller sends a switching signal to close one or more of the SPST switches so as to couple the paths corresponding to the multiple frequency bands.

At block E740, the controller sends a tuning signal to one or more tunable components based on the band select signal. The tunable components may include one or more of a plurality of tunable phase-shift components or a plurality of tunable impedance matching components. The controller may tune the tunable components based on a lookup table that associates frequency bands (or sets of frequency bands) indicated by the band select signal with tuning parameters. Accordingly, in response to a band select signal, the DRx controller may transmit a tuning signal to the tunable components (of active paths) to tune the tunable components (or the variable components thereof) according to the tuning parameters.

Among others, the foregoing Example E related to switching network can be summarized as follows.

In accordance with some implementations, the present disclosure relates to a receiving system comprising a plurality of amplifiers. Each one of the plurality of amplifiers is disposed along a corresponding one of a plurality of paths between an input of the receiving system and an output of the receiving system and is configured to amplify a signal received at the amplifier. The receive system further includes a switching network including one or more single-pole/single-throw switches. Each one of the switches couples two of the plurality of paths. The receiving system further includes a controller configured to receive a band select signal and, based on the band select signal, enable one of the plurality of amplifiers and control the switching network.

In some embodiments, the controller can be configured to, in response to receiving a band select signal indicating a single frequency band, enable one of the plurality of amplifiers corresponding the single frequency band and control the switching network to open all of the one or more switches.

In some embodiments, the controller can be configured to, in response to receiving a band select signal indicating multiple frequency bands, enable one of the plurality of amplifiers corresponding to one of the multiple frequency bands and control the switching network to close at least one of the one or more switches between paths corresponding to the multiple frequency bands.

In some embodiments, the receiving system can further include a plurality of phase-shift components. Each one of the plurality of phase-shift components can be disposed along a corresponding one of the plurality of paths and can be configured to phase-shift a signal passing through the phase-shift component to increase the impedance for the frequency band corresponding to another one of the plurality of paths. In some embodiments, each one of the plurality of phase-shift components can be disposed between the switching network and the input. In some embodiments, at least one of the plurality of phase-shift components can include a tunable phase-shift component configured to phase-shift a signal passing through the tunable phase-shift component an amount controlled by a phase-shift tuning signal received from the controller. In some embodiments, the controller can be configured to generate the phase-shift tuning signal based on the band select signal.

In some embodiments, the receiving system can further include a plurality of impedance matching components. Each one of the plurality of impedance matching components can be disposed along a corresponding one of the plurality of paths and can be configured to decrease a noise figure of the one of the plurality of paths. In some embodiments, each one of the plurality of impedance matching components can be disposed between the switching network and a corresponding one of the plurality of amplifiers. In some embodiments, at least one of the plurality of impedance matching components can include a tunable impedance matching component configured to present an impedance controlled by a impedance tuning signal received from the controller. In some embodiments, the controller can be configured to generate the impedance tuning signal based on the band select signal.

In some embodiments, the receiving system can further include a multiplexer configured to split an input signal received at the input into a plurality of signals at a respective plurality of frequency bands propagated along the plurality of paths.

In some embodiments, at least one of the plurality of amplifiers can include a dual-stage amplifier.

In some embodiment, the controller can be configured to enable one of the plurality of amplifiers and to disable the others of the plurality of amplifiers.

In some implementations, the present disclosure relates to a radio-frequency (RF) module that includes a packaging substrate configured to receive a plurality of components. The RF module further includes a receiving system implemented on the packaging substrate. The receiving system includes a plurality of amplifiers. Each one of the plurality of amplifiers is disposed along a corresponding one of a plurality of paths between an input of the receiving system and an output of the receiving system and is configured to amplify a signal received at the amplifier. The receiving system further includes a switching network including one or more single-pole/single-throw switches. Each one of the switches couples two of the plurality of paths. The receiving system further includes a controller configured to receive a band select signal and, based on the band select signal, enable one of the plurality of amplifiers and control the switching network.

In some embodiments, the RF module can be a diversity receiver front-end module (FEM).

In some embodiments, the receiving system can further include a plurality of phase-shift components. Each one of the plurality of phase-shift components can be disposed along a corresponding one of the plurality of paths and can be configured to phase-shift a signal passing through the phase-shift component to increase the impedance for the frequency band corresponding to another one of the plurality of paths.

According to some teachings, the present disclosure relates to a wireless device that includes a first antenna configured to receive a first radio-frequency (RF) signal. The wireless device further includes a first front-end module (FEM) in communication with the first antenna. The first FEM including a packaging substrate configured to receive a plurality of components. The first FEM further includes a receiving system implemented on the packaging substrate. The receiving system includes a plurality of amplifiers. Each one of the plurality of amplifiers is disposed along a corresponding one of a plurality of paths between an input of the receiving system and an output of the receiving system and is configured to amplify a signal received at the amplifier. The receiving system further includes a switching network including one or more single-pole/single-throw switches. Each one of the switches couples two of the plurality of paths. The receiving system further includes a controller configured to receive a band select signal and, based on the band select signal, enable one of the plurality of amplifiers and control the switching network. The wireless device further includes a transceiver configured to receive a processed version of the first RF signal from the output via a cable and generate data bits based on the processed version of the first RF signal.

In some implementations, the wireless device can further include a second antenna configured to receive a second radio-frequency (RF) signal and a second FEM in communication with the first antenna. The transceiver can be configured to receive a processed version of the second RF signal from an output of the second FEM and generate the data bits based on the processed version of the second RF signal.

In some implementations, the receiving system can further include a plurality of phase-shift components. Each one of the plurality of phase-shift components can be disposed along a corresponding one of the plurality of paths and can be configured to phase-shift a signal passing through the phase-shift component to increase the impedance for the frequency band corresponding to another one of the plurality of paths.

Example F: Flexible Band Routing

Figure 63:
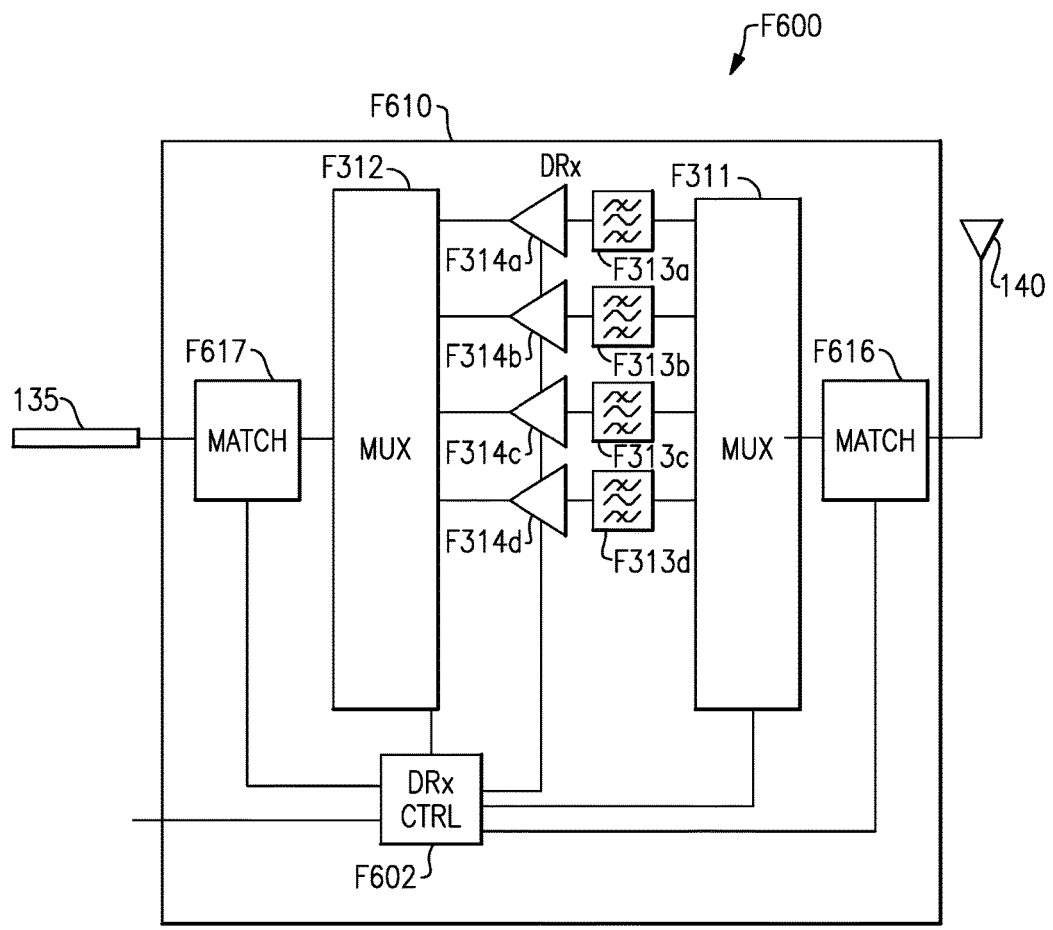
FIG. 63 shows that in some embodiments, a diversity receiver configuration may include a DRx module with tunable matching circuits.

FIG. 63 shows that in some embodiments, a diversity receiver configuration F600 may include a DRx module F610 with tunable matching circuits. In particular, the DRx module F610 may include one or more tunable matching circuits disposed at one or more of the input and the output of the DRx module F610.

Multiple frequency bands received on the same diversity antenna 140 are unlikely to all see an ideal impedance match. To match each frequency band using a compact matching circuit, a tunable input matching circuit F616 may be implemented at the input of the DRx module F610 and controlled by the DRx controller F602 (e.g., based on a band select signal from a communications controller). The DRx controller F602 may tune the tunable input matching circuit F616 based on a lookup table that associates frequency bands (or sets of frequency bands) with tuning parameters. The tunable input matching circuit F616 may be a tunable T-circuit, a tunable PI-circuit, or any other tunable matching circuit. In particular, the tunable input matching circuit F616 may include one or more variable components, such as resistors, inductors, and capacitors. The variable components may be connected in parallel and/or in series and may be connected between the input of the DRx module F610 and the input of the first multiplexer F311 or may be connected between the input of the DRx module F610 and a ground voltage.

Similarly, with only one transmission line 135 (or, at least, few cables) carrying signals of many frequency bands, it is not likely that multiple frequency bands will all see an ideal impedance match. To match each frequency band using a compact matching circuit, a tunable output matching circuit F617 may be implemented at the output of the DRx module F610 and controlled by the DRx controller F602 (e.g., based on a band select signal from a communications controller). The DRx controller F602 may tune the tunable output matching circuit F618 based on a lookup table that associates frequency bands (or sets of frequency bands) with tuning parameters. The tunable output matching circuit F617 may be a tunable T-circuit, a tunable PI-circuit, or any other tunable matching circuit. In particular, the tunable output matching circuit F617 may include one or more variable components, such as resistors, inductors, and capacitors. The variable components may be connected in parallel and/or in series and may be connected between the output of the DRx module F610 and the output of the second multiplexer F312 or may be connected between the output of the DRx module F610 and a ground voltage.

Figure 64:
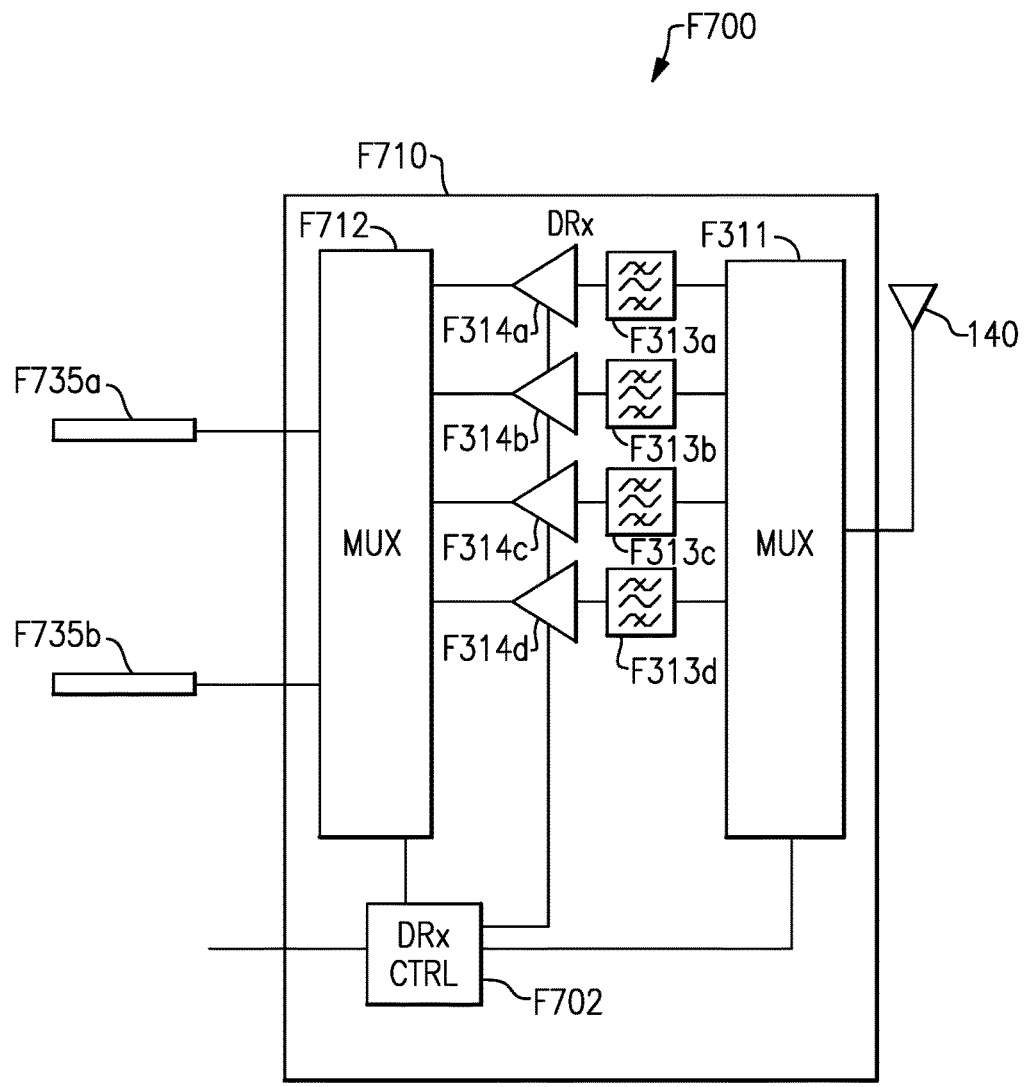
FIG. 64 shows that in some embodiments, a diversity receiver configuration may include multiple transmission lines.

FIG. 64 shows that in some embodiments, a diversity receiver configuration F700 may include multiple transmission lines. Although FIG. 64 illustrates an embodiment with two transmission lines F735a-F735b and one antenna 140, aspects described herein may be implemented in embodiments with more than two transmission lines and/or (as described further below) two or more antennas.

The diversity receiver configuration F700 includes a DRx module F710 coupled to an antenna 140. The DRx module F710 includes a number of paths between an input of the DRx module F710 (e.g., the input coupled to the antenna 140a) and an output of the DRx module (e.g., the first output coupled to the first transmission line F735a or the second output coupled to the second transmission line F735b). In some implementations, the DRx module F710 includes one or more bypass paths (not shown) between the input and the outputs activated by one or more bypass switches controlled by the DRx controller F702.

The DRx module F710 includes a number of multiplexer paths including an input multiplexer F311 and an output multiplexer F712. The multiplexer paths include a number of on-module paths (shown) that include the input multiplexer F311, a bandpass filter F313a-F313d, an amplifier F314a-F314d, and the output multiplexer F712. The multiplexer paths may include one or more off-module paths (not shown) as described herein. As also described herein, the amplifiers F314a-F314d may be variable-gain amplifiers and/or variable-current amplifiers.

The DRx controller F702 is configured to selectively activate one or more of the plurality of paths. In some implementations, the DRx controller F702 is configured to selectively activate one or more of the plurality of paths based on a band select signal received by the DRx controller F702 (e.g., from a communications controller). The DRx controller F702 may selectively activate the paths by, for example, enabling or disabling the amplifiers F314a-F314d, controlling the multiplexers F311, F712, or through other mechanisms as described herein.

To better utilize the multiple transmission lines F735a-F735b, the DRx controller F702 can, based on the band select signal, control the output multiplexer F712 to route each of the signals propagating along the paths to a selected one of the transmission lines F735a-F735b (or output multiplexer outputs corresponding to the transmission lines F735a-F735b).

In some implementations, if the band select signal indicates that the received signal includes a single frequency band, the DRx controller F702 can control the output multiplexer F712 to route the signal propagating on the corresponding path to a default transmission line. The default transmission line can be the same for all paths (and corresponding frequency bands), such as when one of the transmission lines F735a-F735b is shorter, introduces less noise, or is otherwise preferred. The default transmission line can be different for different paths. For example, paths corresponding to low frequency bands can be routed to the first transmission line F735b and paths corresponding to high frequency bands can be routed to the second transmission line F735b.

Thus, in response to a band select signal indicating that one or more RF signals received at the input multiplexer F311 includes a single frequency band, the DRx controller F702 can be configured to control the second multiplexer F712 to route an amplified RF signal received at an output multiplexer input corresponding to the single frequency band to a default output multiplexer output. As noted herein, the default output multiplexer output can be different for different single frequency bands or the same for all frequency bands.

In some implementations, if the band select signal indicates that the received signal includes two frequency bands, the DRx controller F702 can control the output multiplexer F712 to route a signal propagating along a path corresponding to the first frequency band to the first transmission line F735a and route the signal propagating along a path corresponding to the second frequency band to the second transmission line F735b. Thus, even if both of the two frequency bands are high frequency bands (or low frequency bands), the signals propagating along the corresponding paths may be routed to different transmission lines. Similarly, in the case of three or more transmission lines, each of three or more frequency bands can be routed to different transmission lines.

Thus, in response to a band select signal indicating that one or more RF signals received at the input multiplexer F311 includes a first frequency band and a second frequency band, the DRX controller F702 can be configured to control the second multiplexer F712 to route an amplified RF signal received at an output multiplexer input corresponding to the first frequency band to a first output multiplexer output and to route an amplified RF signal received at an output multiplexer input corresponding to the second frequency band to a second output multiplexer output. As noted herein, both the first frequency band and the second frequency band can be high frequency band or low frequency bands.

In some implementations, if the band select signal indicates that the received signal includes three frequency bands, the DRx controller F702 can control the output multiplexer F712 to combine two of the signals propagating along two paths corresponding to two of the frequency bands and route the combined signal along one of the transmission lines and to route the signal propagating along the path corresponding to the third frequency band along the other of the transmission lines. In some implementations, the DRx controller F702 controls the output multiplexer F712 to combine the two of the three frequency bands that are closest together (e.g., both low frequency bands or both high frequency bands). Such implementations may simplify impedance matching at the output of the DRx module F710 or the input of the downstream module. In some implementations, the DRx controller F702 controls the output multiplexer F712 to combine the two of the three frequency bands that are furthest apart. Such implementations may simplify separation of the frequency bands at the downstream module.

Thus, in response to a band select signal indicating that one or more RF signals received at the input multiplexer F311 includes a first frequency band a second frequency band, and a third frequency band, the DRx controller F702 can be configured to control the second multiplexer F712 (a) to combine an amplified RF signal received at an output multiplexer input corresponding to the first frequency band and an amplified RF signal received at an output multiplexer input corresponding to the second frequency band to generate a combined signal, (b) to route the combined signal to a first output multiplexer output, and (c) to route an amplified RF signal received at an output multiplexer input corresponding to the third frequency band to a second output multiplexer output. As noted herein, the first frequency band and the second frequency band may be those of the three frequency bands that are closest together or furthest apart.

In some implementations, if the band select signal indicates that the received signal includes four frequency bands, the DRx controller F702 can control the output multiplexer F712 to combine two of the signals propagating along two paths corresponding to two of the frequency bands and route the first combined signal along one of the transmission lines and route two of the signals propagating along two paths corresponding to the other two of the frequency bands and route the second combined signal along the other of the transmission lines. In some implementations, the DRx controller F702 can control the output multiplexer F712 to combine three of the signals propagating along three paths corresponding to three of the frequency bands and route the combined signal along one of the transmission lines and route the signal propagating along the path corresponding to the fourth frequency band along the other of the transmission lines. Such an implementation may be beneficial when three of the frequency bands are close together (e.g., all low frequency bands) and the fourth frequency band is far apart (e.g., a high frequency band).

In general, if the band select signal indicates that the received signal includes more frequency bands than there are transmission lines, the DRx controller F702 can control the output multiplexer F712 to combine two or more of the signals propagating along two or more paths corresponding to two or more of the frequency bands and route the combined signal to one of the transmission lines. The DRx controller F702 can control the output multiplexer F712 to combine frequency bands that are closest together or furthest apart.

Thus, a signal propagating along one of the paths may be routed by the output multiplexer F712 to a different one of the transmission lines depending on other signals that are propagating along other path. As an example, a signal propagating along a third path passing through the third amplifier F314c may be routed to the second transmission line F735b when the third path is the only active path and routed to the first transmission line F735a when the fourth path (passing through the fourth amplifier F314d) is also active (and routed to the second transmission line 735b).

Thus, the DRx controller F702 can be configured to, in response to a first band select signal, control the output multiplexer F712 to route an amplified RF signal received at an output multiplexer input to a first output multiplexer output and, in response to a second band select signal, control the output multiplexer to route an amplified RF signal received at the output multiplexer input to a second output multiplexer output.

Thus, the DRx module F710 constitutes a receiving system including a plurality of amplifiers F314a-F314d, each one of the plurality of amplifiers F314a-F314d disposed along a corresponding one of a plurality of paths between an input of the receiving system (e.g., the input of the DRx module F710 coupled to the antenna 140 and/or additional inputs of the DRx module F710 coupled to other antennas) and an output of the receiving system (e.g., the outputs of the DRx module F710 coupled to the transmission lines F735a-F735b and/or additional outputs of the DRx module F710 coupled to other transmission lines). Each of the amplifiers F314a-F314d are configured to amplify an RF signal received at the amplifier F314a-F314d.

The DRx module F710 further includes an input multiplexer F311 configured to receive one or more RF signals at one or more input multiplexer inputs and to output each of the one or more RF signals to one or more of a plurality of input multiplexer outputs to propagate along a respective one or more of the plurality of paths. In some implementations, the DRx module F710 receives a single RF signal at a single input multiplexer input and is controlled by the DRx controller F702 to output the single RF signal to one or more of the input multiplexer outputs corresponding to each frequency band indicated in a band select signal. In some implementations, the DRx module F710 receives multiple RF signals (each corresponding to a different set of one or more frequency bands indicated in a band select signal) at multiple input multiplexer inputs and is controlled by the DRx controller F702 to output each of the multiple RF signals to one or more of the input multiplexer outputs corresponding to the set of one or more frequency bands of the respective RF signal. Thus, in general, the input multiplexer F311 receives one or more RF signals, each corresponding to one or more frequency bands, and is controlled by the DRx controller to route each RF signal along the one or more paths corresponding to the one or more frequency bands of the RF signal.

The DRx module F710 further includes an output multiplexer F712 configured to receive one or more amplified RF signals propagating along the respective one or more of the plurality of paths at one or more respective output multiplexer inputs and to output each of the one or more amplified RF signals to a selected one of a plurality of output multiplexer outputs (each respectively coupled to one of a plurality of output transmission lines F735a-F735b).

The DRx module F710 further includes a DRx controller F702 configured to receive a band select signal and, based on the band select signal, control the input multiplexer and the output multiplexer. As described herein, the DRx controller F702 controls the input multiplexer to route each of one or more RF signals corresponding to one or more frequency bands along the one or more paths corresponding to the one or more frequency bands of the RF signal. As also described herein, the DRx controller F702 controls the output multiplexer to route each of one or more amplified RF signals propagating along one or more paths to a selected one of a plurality of output multiplexer outputs in order to better utilize the transmission lines F735a-F735b coupled to the DRx module F710.

In some implementations, if the band select signal indicates that the received signal includes multiple frequency bands, the DRx controller F702 can control the output multiplexer F712 to combine all of the signals propagating along paths corresponding to multiple frequency bands and route the combined signal to one of the transmission lines. Such implementations may be used when other transmission lines are unusable (e.g., damaged or not present in a particular wireless communication configuration) and be implemented in response to a controller signal received by the DRx controller F702 (e.g., from a communications controller) that one of the transmission lines is unusable.

Thus, in response to a band select signal indicating that one or more RF signals received at the input multiplexer F311 includes multiple frequency bands and in response to a controller signal indicating that a transmission line is unusable, the DRx controller F702 can be configured to control the output multiplexer F712 to combine multiple amplified RF signals received at multiple output multiplexer inputs corresponding to the multiple frequency bands to generate a combined signal and to route the combined signal to a output multiplexer output.

Figure 65:
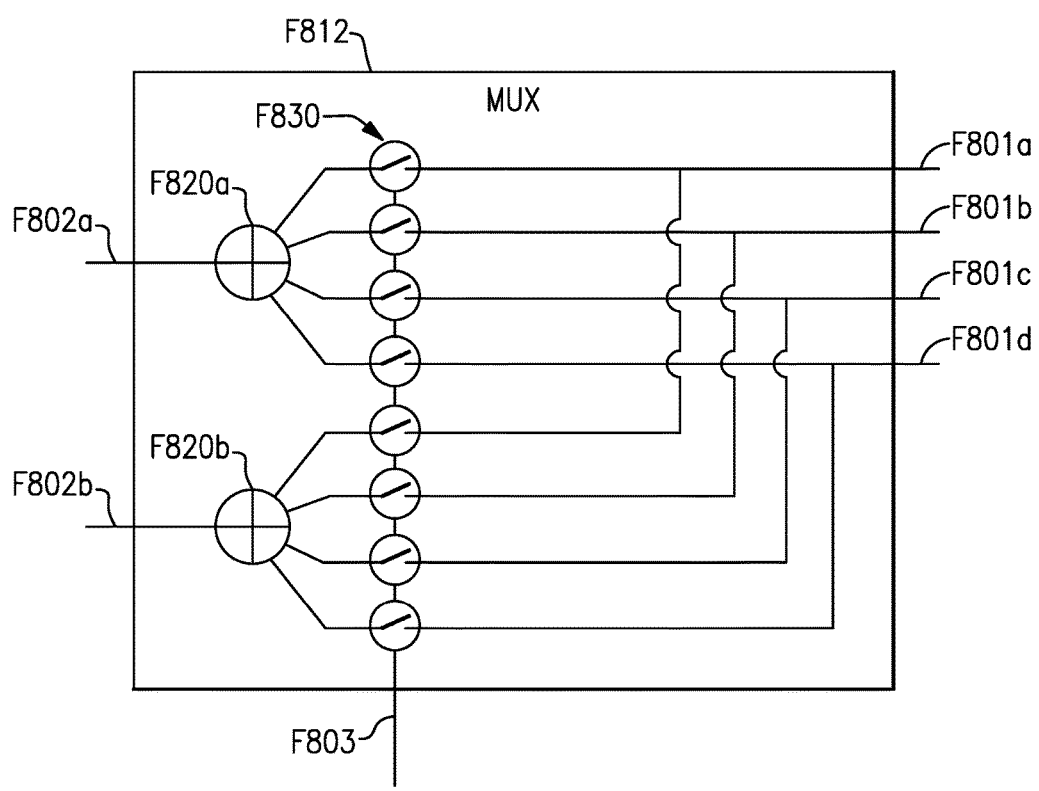
FIG. 65 shows an embodiment of an output multiplexer that may be used for dynamic routing.

FIG. 65 shows an embodiment of an output multiplexer F812 that may be used for dynamic routing. The output multiplexer F812 includes a plurality of inputs F801a-F801d that may be respectively coupled to amplifiers disposed along a plurality of paths corresponding to a plurality of frequency bands. The output multiplexer F812 includes a plurality of outputs F802a-F802b that may be respectively coupled to a plurality of transmission lines. Each of the outputs F802a-F802b is coupled to an output of a respective combiner F820a-F820b. Each of the inputs F801a-F801d is coupled, via one of a set of single-pole/single-throw (SPST)

switches F830 to an input of each of the combiners F820a-F820b. The switches F830 are controllable via a control bus F803 that may be coupled to a DRx controller.

Figure 66:
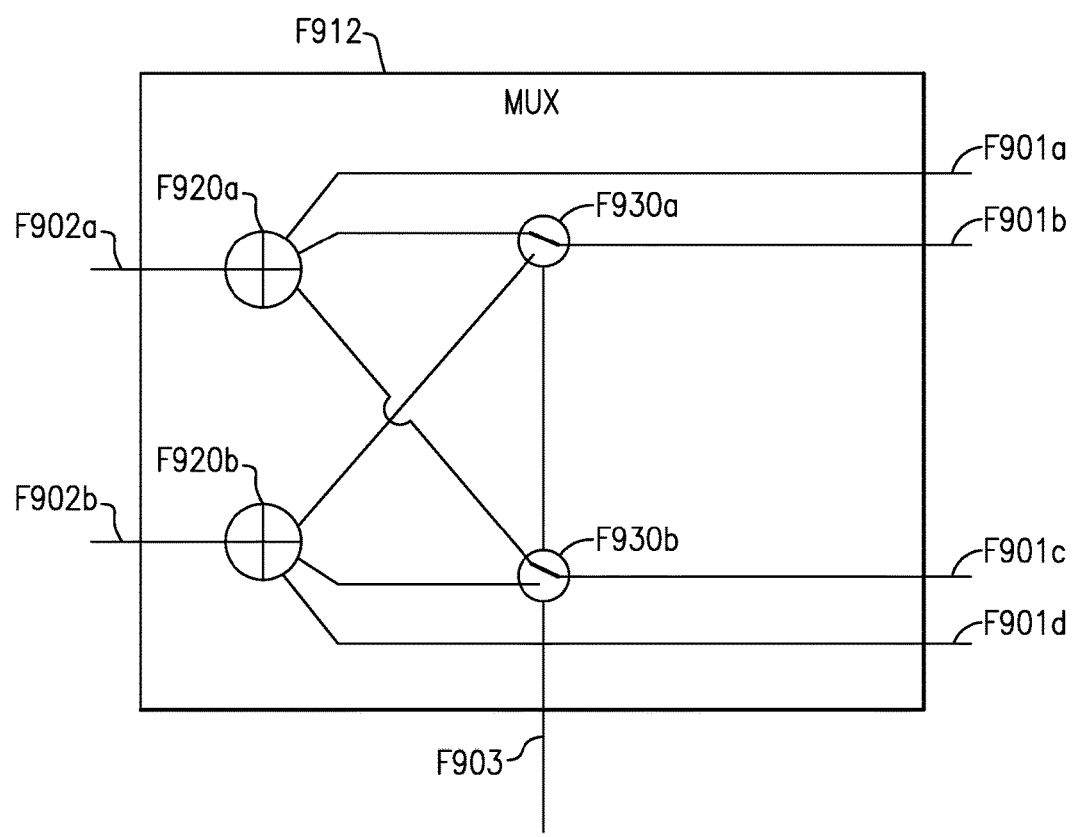
FIG. 66 shows another embodiment of an output multiplexer that may be used for dynamic routing.

FIG. 66 shows another embodiment of an output multiplexer F912 that may be used for dynamic routing. The output multiplexer F912 includes a plurality of inputs F901a-F901d that may be respectively coupled to amplifiers disposed along a plurality of paths corresponding to a plurality of frequency bands. The output multiplexer F912 includes a plurality of outputs F902a-F902b that may be respectively coupled to a plurality of transmission lines. Each of the outputs F902a-F902b is coupled to an output of a respective combiner F920a-F920b. The first input F901a is coupled to an input of the first combiner F920a and the fourth input F901d is coupled to an input of the second combiner F920d. The second input F901b is coupled to a first single-pole/multiple-throw (SPMT) switch F930a having outputs coupled to each of the combiners F920a-F920b. Similarly, the third input F901c is coupled to second SPMT switch F930b having outputs coupled to each of the combiners F920a-F920b. The switches F930a-F930b are controllable via a control bus F903 that may be coupled to a DRx controller.

Unlike the output multiplexer 812 of FIG. 44, the output multiplexer 912 of FIG. 45 does not allow each input 901a-901d to be routed to any of the outputs 902a-902b. Rather, the first input 901a is fixedly routed to the first output 902a and the fourth input 902d is fixedly routed to the second output 902b. Such an implementation may reduce the size of the control bus 903 or simplify the control logic of the DRx controller attached to the control bus 903.

Both the output multiplexer F812 of FIG. 65 and the output multiplexer F912 of FIG. 66 include a first combiner F820a, F920a coupled to a first output multiplexer output F802a, F902a and a second combiner F820b, F920b coupled to a second output multiplexer output F802b, F902b. Further, both the output multiplexer F812 of FIG. 65 and the output multiplexer F912 of FIG. 66 include an output multiplexer input F801b, F901b coupled to both the first combiner F820a, F920a and the second combiner F820b, F920b via one or more switches (controlled by the DRx controller). In the output multiplexer F812 of FIG. 65, the output multiplexer input F801b is coupled to the first combiner F820a and the second combiner F820b via two SPST switches. In the output multiplexer F912 of FIG. 66, the output multiplexer input F901b is coupled to the first combiner F920a and the second combiner F820b via a single SPMT switch.

Figure 67:
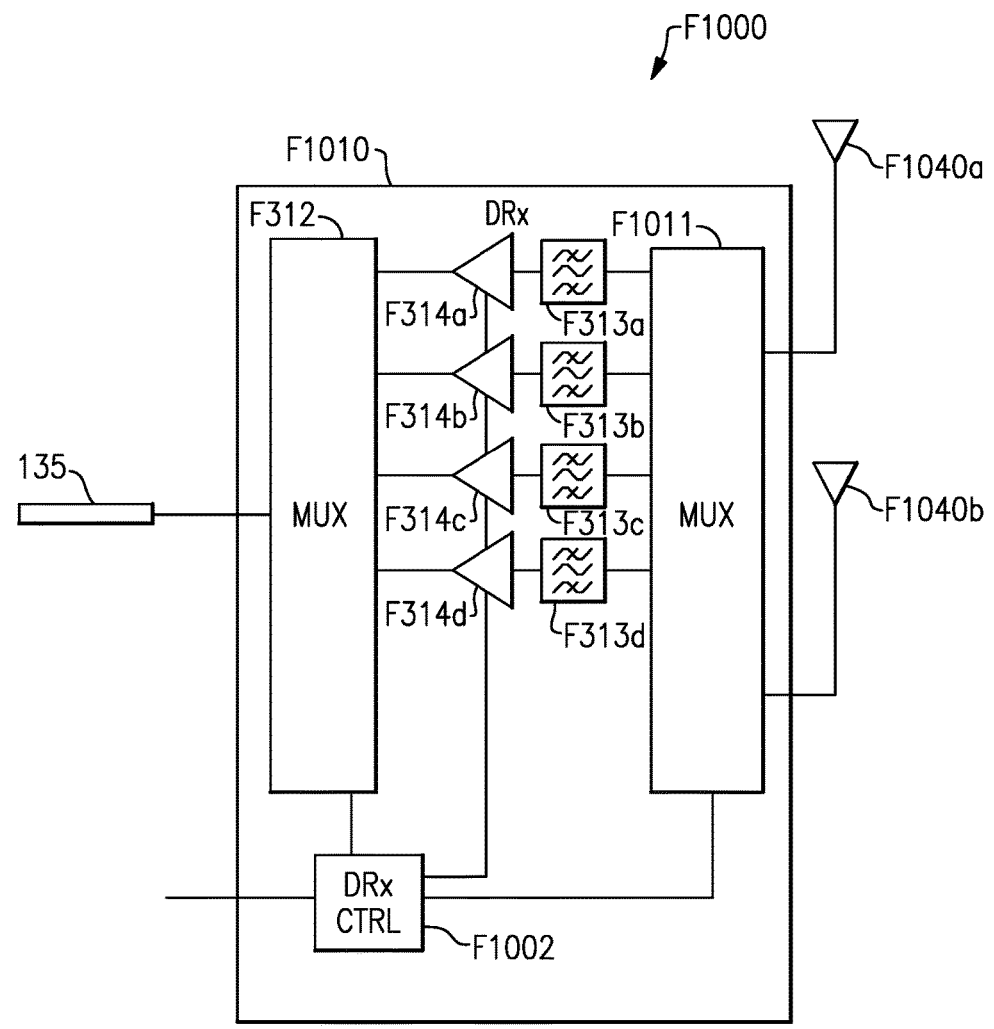
FIG. 67 shows that in some embodiments, a diversity receiver configuration may include multiple antennas.

FIG. 67 shows that in some embodiments, a diversity receiver configuration F1000 may include multiple antennas F1040a-F1040b. Although FIG. 67 illustrates an embodiment with one transmission line 135 and two antennas F1040a-F1040b, aspects described herein may be implemented in embodiments with two or more transmission lines and/or more than two antennas.

The diversity receiver configuration F1000 includes a DRx module F1010 coupled to a first antenna F1040a and a second antenna F1040b. The DRx module F1010 includes a number of paths between an input of the DRx module F1010 (e.g., the first input coupled to the first antenna F1040a or the second input coupled to the second antenna F1040b) and an output of the DRx module (e.g., the output coupled to the transmission line 135). In some implementations, the DRx module F1010 includes one or more bypass paths (not shown) between the inputs and the output activated by one or more bypass switches controlled by the DRx controller F1002.

The DRx module F1010 includes a number of multiplexer paths including an input multiplexer F1011 and an output multiplexer F312. The multiplexer paths include a number of on-module paths (shown) that include the input multiplexer F1011, a bandpass filter F313a-F313d, an amplifier F314a-F314d, and the output multiplexer F312. The multiplexer paths may include one or more off-module paths (not shown) as described herein. As also described herein, the amplifiers F314a-F314d may be variable-gain amplifiers and/or variable-current amplifiers.

The DRx controller F1002 is configured to selectively activate one or more of the plurality of paths. In some implementations, the DRx controller F1002 is configured to selectively activate one or more of the plurality of paths based on a band select signal received by the DRx controller F1002 (e.g., from a communications controller). The DRx controller F1002 may selectively activate the paths by, for example, enabling or disabling the amplifiers F314a-F314d, controlling the multiplexers F1011, F312, or through other mechanisms as described herein.

In various diversity receiver configurations, the antennas F1040a-F1040b may support various frequency bands. For example, in one implementation, a diversity receiver configuration could include a first antenna F1040a that supports low frequency bands and mid frequency bands and a second antenna F1040b that supports high frequency bands. Another diversity receiver configuration could include a first antenna F1040a that supports low frequency bands and a second antenna F1040b that supports mid frequency bands and high frequency bands. Yet another diversity receiver configuration could include only a first wideband antenna F1040a that supports low frequency bands, mid frequency bands, and high frequency bands and may lack a second antenna F1040b.

The same DRx module F1010 can be used for all of these diversity receiver configurations through control of the input multiplexer F1011 by the DRx controller F1002 based on an antenna configuration signal (e.g., received from a communications controller or stored in and read from a permanent memory or other hardwired configuration).

In some implementations, when the antenna configuration signal indicates that the diversity receiver configuration F1000 includes only a single antenna F1040a, the DRx controller F1002 can control the input multiplexer to route the signal received at the single antenna F1040a to all of the paths (or all of the active paths as indicated by a band select signal).

Thus, in response to an antenna configuration signal indicating that that the diversity receiver configuration includes a single antenna, the DRx controller F1002 can be configured to control the input multiplexer to route an RF signal received at a single input multiplexer input to all of the plurality of input multiplexer outputs or to all of the plurality of input multiplexer outputs associated with the one or more frequency bands of the RF signal.

In some implementations, when the antenna configuration signal indicates that the diversity receiver configuration F1000 includes a first antenna F1040a that supports low frequency bands and a second antenna F1040b that supports mid frequency bands and high frequency bands, the DRx controller F1002 can control the input multiplexer F1011 to route the signal received at the first antenna F1040a to the first path (including the first amplifier F314a) and to route the signal received at the second antenna F1040b to the second path (including the second amplifier F314b), the third path (including the third amplifier F314c), and the fourth path (including the fourth amplifier F314d), or at least those of the paths that are active as indicated by a band select signal.

In some implementations, when the antenna configuration signal indicates that the diversity receiver configuration F1000 includes a first antenna F1040a that supports low frequency bands and lower mid frequency bands and a second antenna F1040b that supports higher mid frequency bands and high frequency bands, the DRx controller F1002 can control the input multiplexer F1011 to route the signal received at the first antenna F1040a to the first path and the second path and to route the signal received at the second antenna F1040b to the third path and the fourth path, or at least those of the paths that are active as indicated by a band select signal.

In some implementations, when the antenna configuration signal indicates that the diversity receiver configuration F1000 includes a first antenna F1040a that supports low frequency bands and mid frequency bands and a second antenna F1040b that supports high frequency bands, the DRx controller F1002 can control the input multiplexer F1011 to route the signal received at the first antenna F1040a to the first path, the second path, and the third path, and to route the signal received at the second antenna F1040b to the fourth path, or at least those of the paths that are active as indicated by a band select signal.

Thus, the signal propagating along a particular path (e.g., the third path) may be routed by the input multiplexer F1011 from different ones of the input multiplexer inputs (coupled to one of the antennas F1040a-F1040b) depending on the diversity receiver configuration (as indicated by the antenna configuration signal).

Thus, the DRx controller F1002 can be configured to, in response to a first antenna configuration signal, control the input multiplexer F1011 to route an RF signal received at a first input multiplexer input to an input multiplexer output and, in response to a second antenna configuration signal, control the input multiplexer F1011 to route an RF signal received at a second input multiplexer input to the input multiplexer output.

In general, the DRx controller F1002 can be configured to control the input multiplexer F1011 so as to route received signals, each including one or more frequency bands, along the paths corresponding to the one or more frequency bands. In some implementations, the input multiplexer F1011 can further act as a band splitter that outputs each of one or more frequency bands along the paths corresponding to the one or more frequency bands. As an example, the input multiplexer F1011 and bandpass filters F313a-F313d constitute such a band splitter. In other implementations (as described further below), the bandpass filters F313a-F313d and input multiplexer F1011 can be integrated in other ways to form a band splitter.

Figure 68:
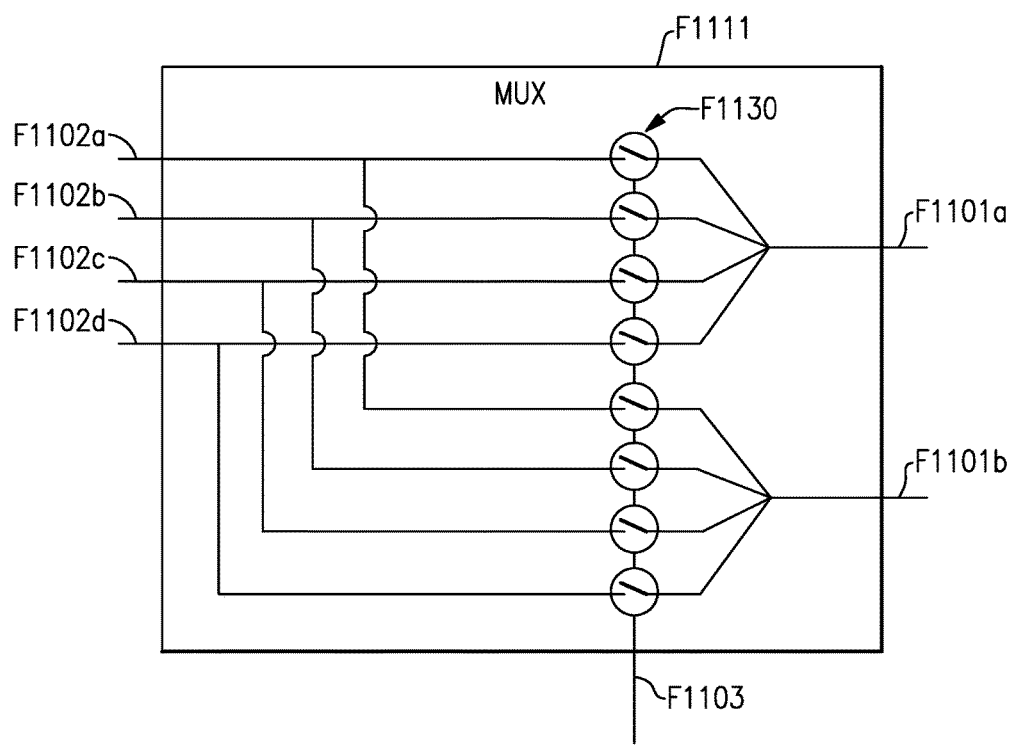
FIG. 68 shows an embodiment of an input multiplexer that may be used for dynamic routing.

FIG. 68 shows an embodiment of an input multiplexer F1111 that may be used for dynamic routing. The input multiplexer F1111 includes a plurality of inputs F1101a-F1101b that may be respectively coupled to one or more antennas. The input multiplexer F1111 includes a plurality of outputs F1102a-F1102d that may be respectively coupled to the amplifiers disposed along a plurality of paths corresponding to a plurality of frequency bands (e.g., via bandpass filters). Each of the inputs F1101a-F1101b is coupled, via one of a set of single-pole/single-throw (SPST) switches F1130, to each of the outputs F1102a-F1102d. The switches F1130 are controllable via a control bus F1103 that may be coupled to a DRx controller.

Figure 69:
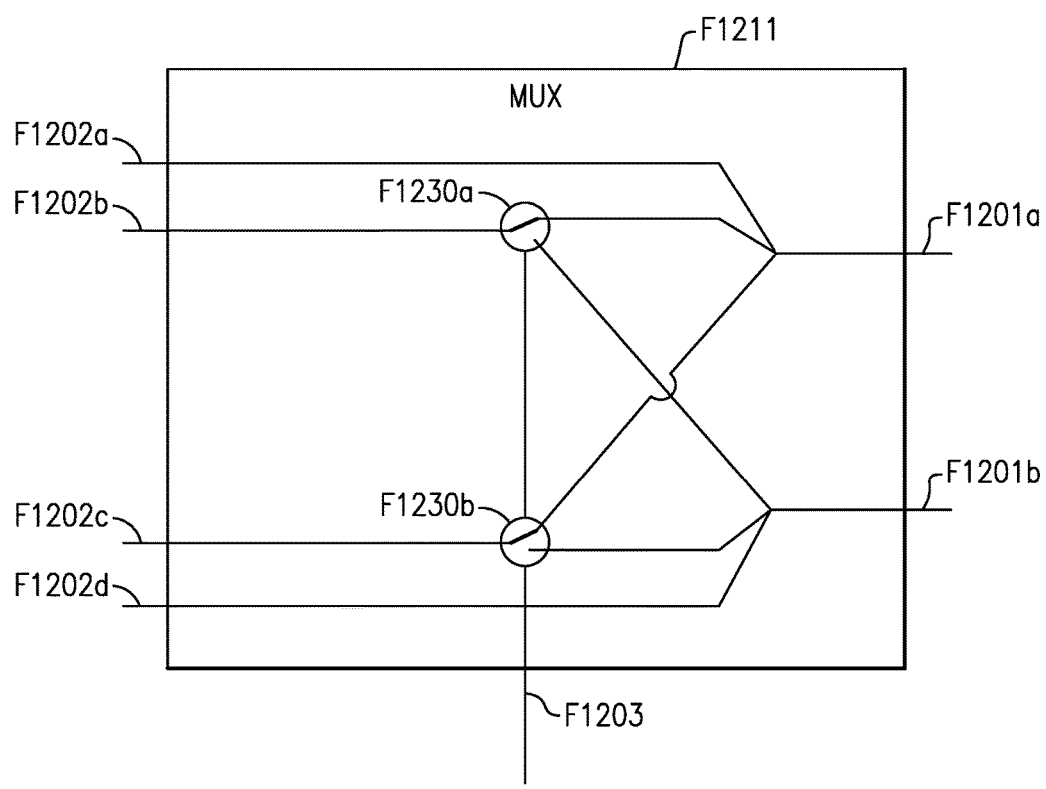
FIG. 69 shows another embodiment of an input multiplexer that may be used for dynamic routing.

FIG. 69 shows another embodiment of an input multiplexer F1211 that may be used for dynamic routing. The input multiplexer F1211 includes a plurality of inputs F1201a-F1201b that may be respectively coupled to one or more antennas. The input multiplexer F1211 includes a plurality of outputs F1202a-F1202d that may be respectively coupled to the amplifiers disposed along a plurality of paths corresponding to a plurality of frequency bands (e.g., via bandpass filters). The first input F1201a is coupled to the first output F1202a, a first multiple-pole/single-throw (MPST) switch F1230a, and a second MPST switch F1230b. The second input F1201b is coupled to the first MPST switch F1230a, the second MPST switch F1230b, and the fourth output F1202d. The switches F1230a-F1230b are controllable via a control bus F1203 that may be coupled to a DRx controller.

Unlike the input multiplexer F1111 of FIG. 68, the output multiplexer F1211 of FIG. 69 does not allow each input F1201a-F1201b to be routed to any of the outputs F1202a-F1202d. Rather, the first input F1201a is fixedly routed to the first output F1202a and the second input F1201b is fixedly routed to the fourth output F1202d. Such an implementation may reduce the size of the control bus F903 or simplify the control logic of the DRx controller attached to the control bus F903. Nevertheless, based on the antenna configuration signal, the DRx controller can control the switches F1230a-F1230b to route the signal from either of the inputs F1201a-F1201b to the second output F1202b and/or the third output F1202c.

Both the input multiplexer F1111 of FIG. 68 and the input multiplexer F1211 of FIG. 69 operate as multi-pole/multi-throw (MPMT) switches. In some implementations, the input multiplexers F1111, F1211 include filters or match components to reduce insertion loss. Such filters or match components can be co-designed with other components of a DRx module (e.g., bandpass filters F313a-F313d of FIG. 67). For example, the input multiplexer and bandpass filters can be integrated as a single part to reduce the number of total components. As another example, the input multiplexer can be designed for a particular output impedance (e.g., one that is not 50 Ohms) and the bandpass filters can be designed to match this impedance.

Figure 70:
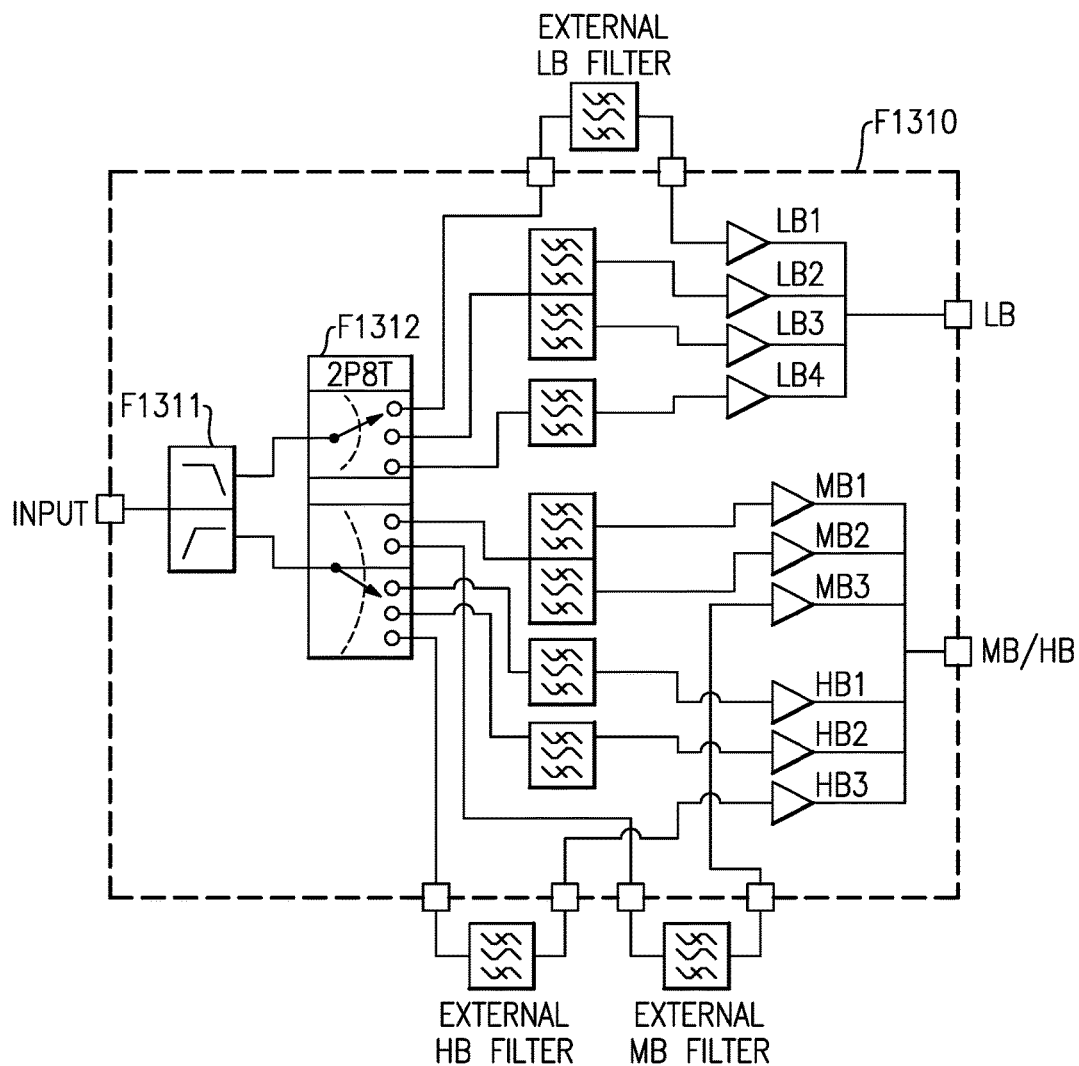
FIGS. 70-75 show various implementations of a DRx module with dynamic input routing and/or output routing.

FIG. 70-75 show various implementations of a DRx module with dynamic input routing and/or output routing. FIG. 70 shows that, in some embodiments, a DRx module F1310 can include a single input and two outputs. The DRx module F1310 includes, as a band splitter, a high-low diplexer F1311 that splits an input signal into low frequency bands and mid and high frequency bands, a two-pole/eight-throw switch F1312 (implemented as a first single-pole/three-throw switch and a second single-pole/five-throw switch), and various filters and band-split diplexers. As described herein, the high-low diplexer F1311 and the various filters and band-split diplexers can be co-designed.

Figure 71:
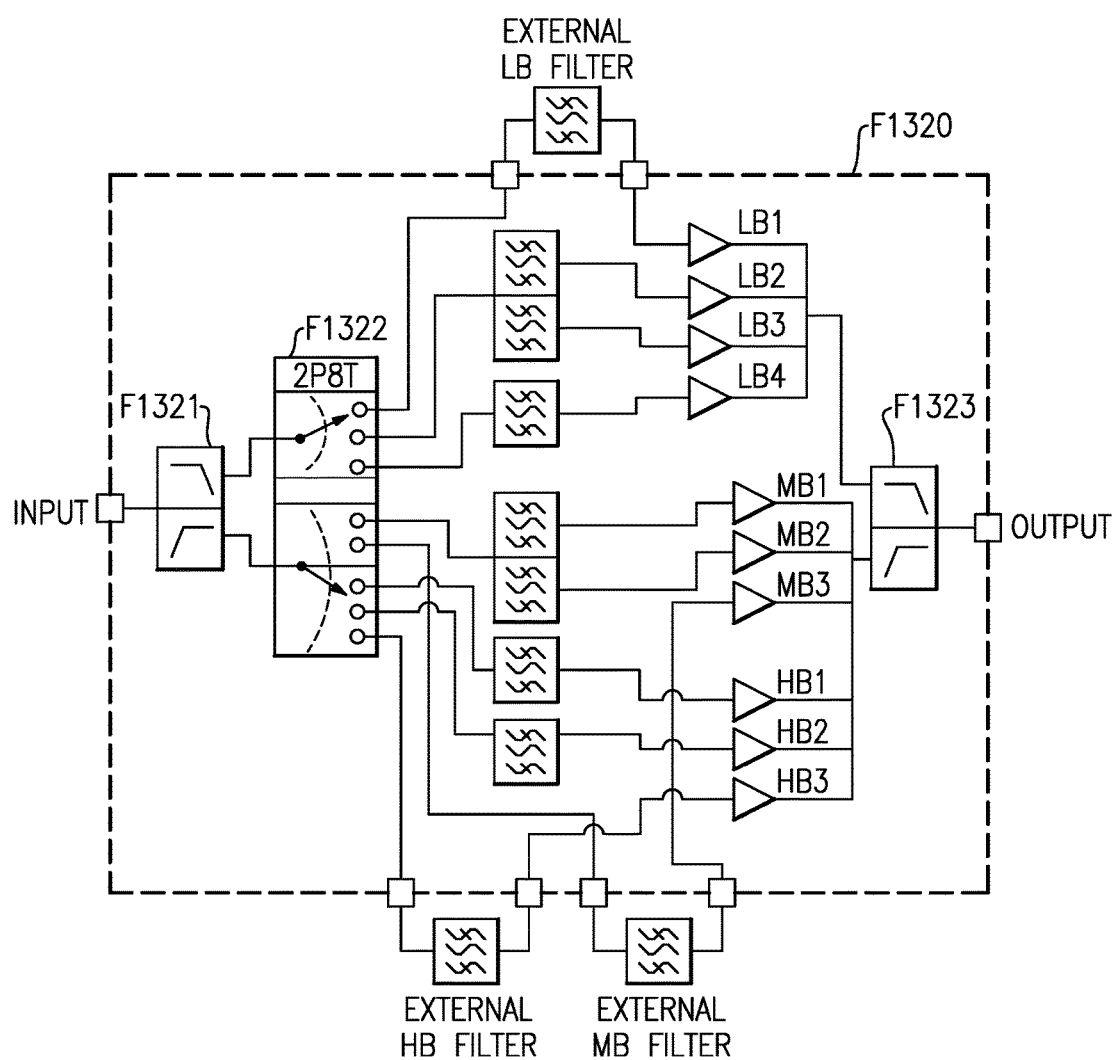

FIG. 71 shows that, in some embodiments, a DRx module F1320 can include a single input and a single output. The DRx module F1320 includes, as a band splitter, a high-low diplexer F1321 that splits an input signal into low frequency bands and mid and high frequency bands, a two-pole/eight-throw switch F1322 (implemented as a first single-pole/three-throw switch and a second single-pole/five-throw switch), and various filters and band-split diplexers. As described herein, the high-low diplexer F1321 and the various filters and band-split diplexers can be co-designed. The DRx module F1320 includes, as an output multiplexer, a high-low combiner F1323 that filters and combines the signals received at two inputs and outputs the combined signal.

Figure 72:
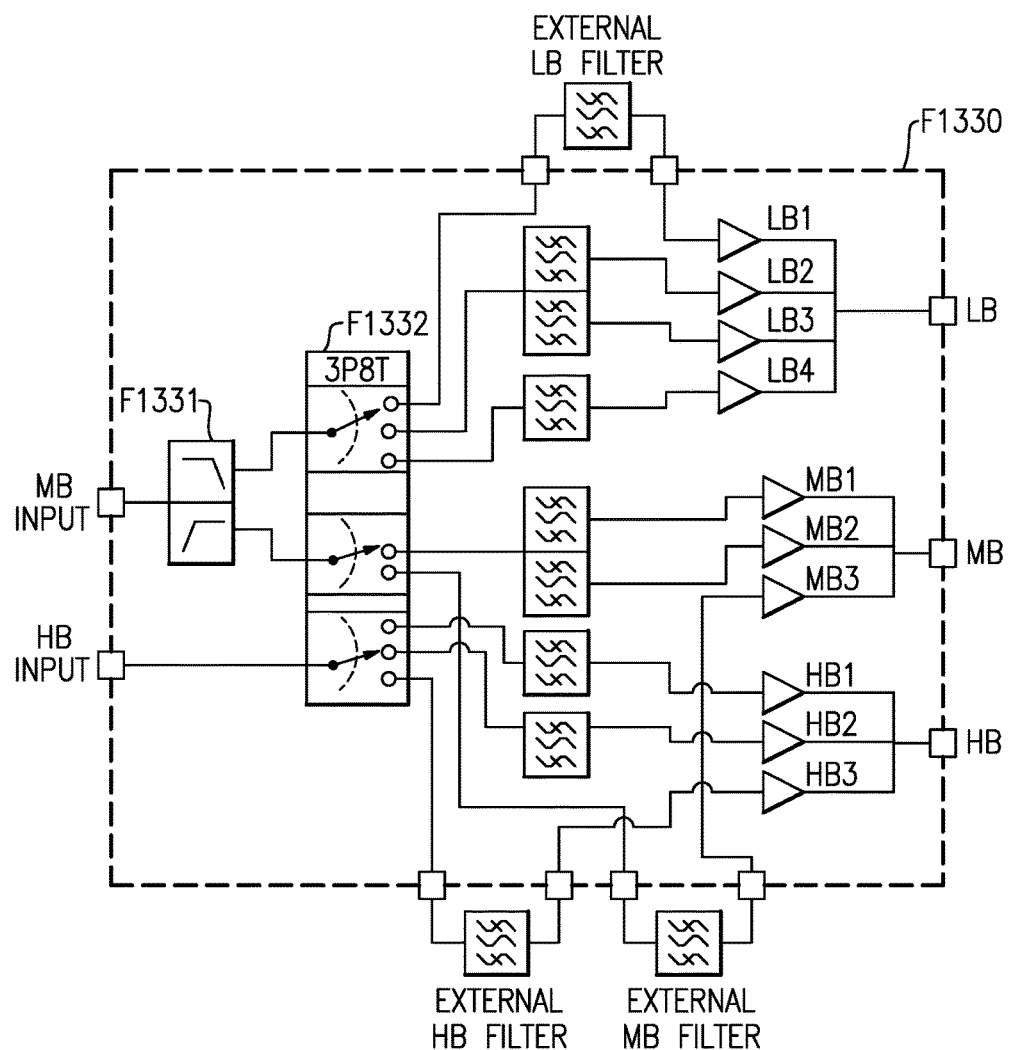

FIG. 72 shows that, in some embodiments, a DRx module F1330 can include two inputs and three outputs. The DRx module F1330 includes, as a band splitter, a high-low diplexer F1331 that splits an input signal into low frequency bands and mid and high frequency bands, a three-pole/eight-throw switch F1332 (implemented as a first single-pole/three-throw switch and a second single-pole/two-throw switch and a third single-pole/three-throw switch), and various filters and band-split diplexers. As described herein, the high-low diplexer F1331 and the various filters and band-split diplexers can be co-designed.

Figure 73:
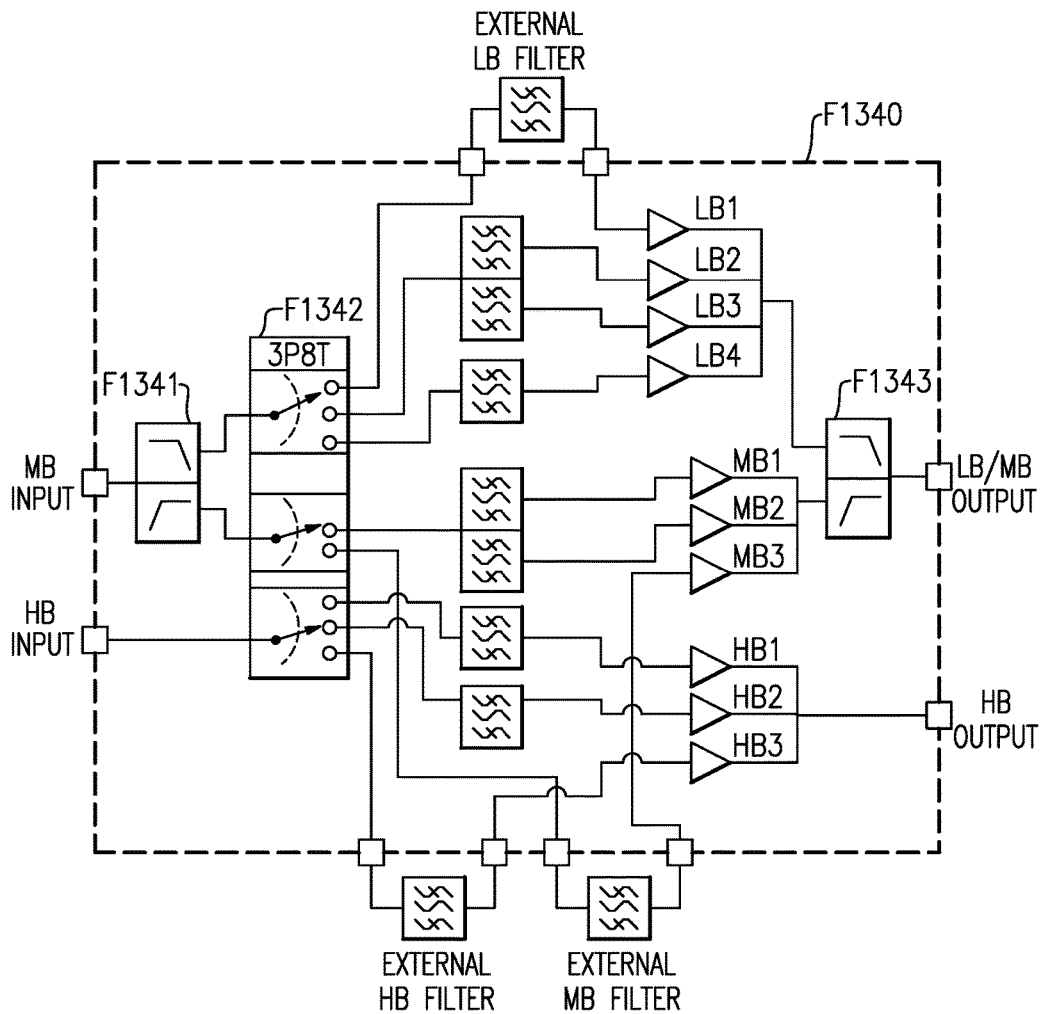

FIG. 73 shows that, in some embodiments, a DRx module F1340 can include two inputs and two outputs. The DRx module F1340 includes, as a band splitter, a high-low diplexer F1341 that splits an input signal into low frequency bands and mid and high frequency bands, a three-pole/eight-throw switch F1342 (implemented as a first single-pole/three-throw switch and a second single-pole/two-throw switch and a third single-pole/three-throw switch), and various filters and band-split diplexers. As described herein, the high-low diplexer F1341 and the various filters and band-split diplexers can be co-designed. The DRx module F1340 includes, as part of an output multiplexer, a high-low combiner F1343 that filters and combines the signals received at two inputs and outputs the combined signal.

Figure 74:
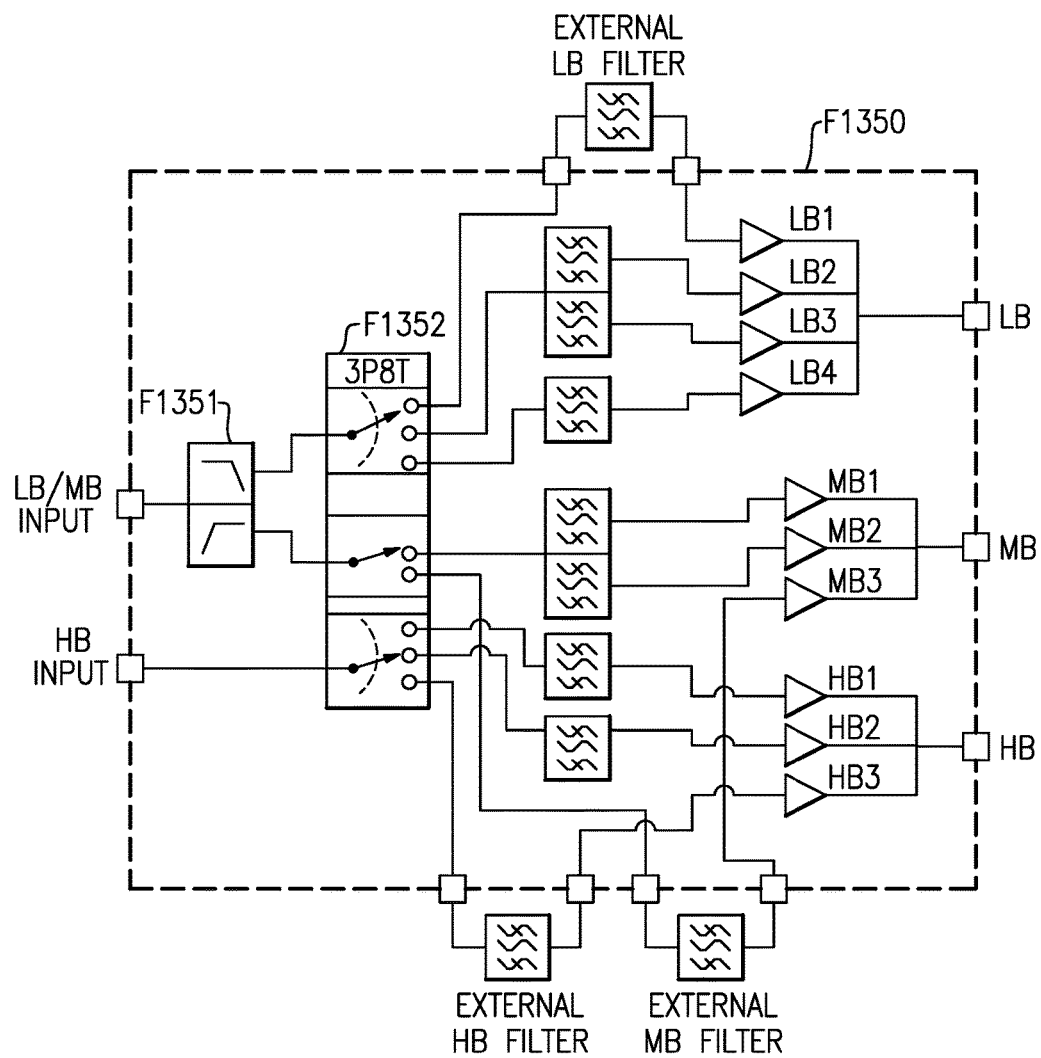

FIG. 74 shows that, in some embodiments, a DRx module F1350 can include a multi-pole/multi-throw switch F1352. The DRx module F1340 includes, as a band splitter, a high-low diplexer F1351 that splits an input signal into low frequency bands and mid and high frequency bands, a three-pole/eight-throw switch F1352, and various filters and band-split diplexers. As described herein, the high-low diplexer F1341 and the various filters and band-split diplexers can be co-designed. The three-pole/eight-throw switch F1352 is implemented as a first single-pole/three-throw switch and a second two-pole/five-throw switch for routing a signal received on the first pole to one of the five throws and for routing a signal received on the second pole to one of three of the throws.

Figure 75:
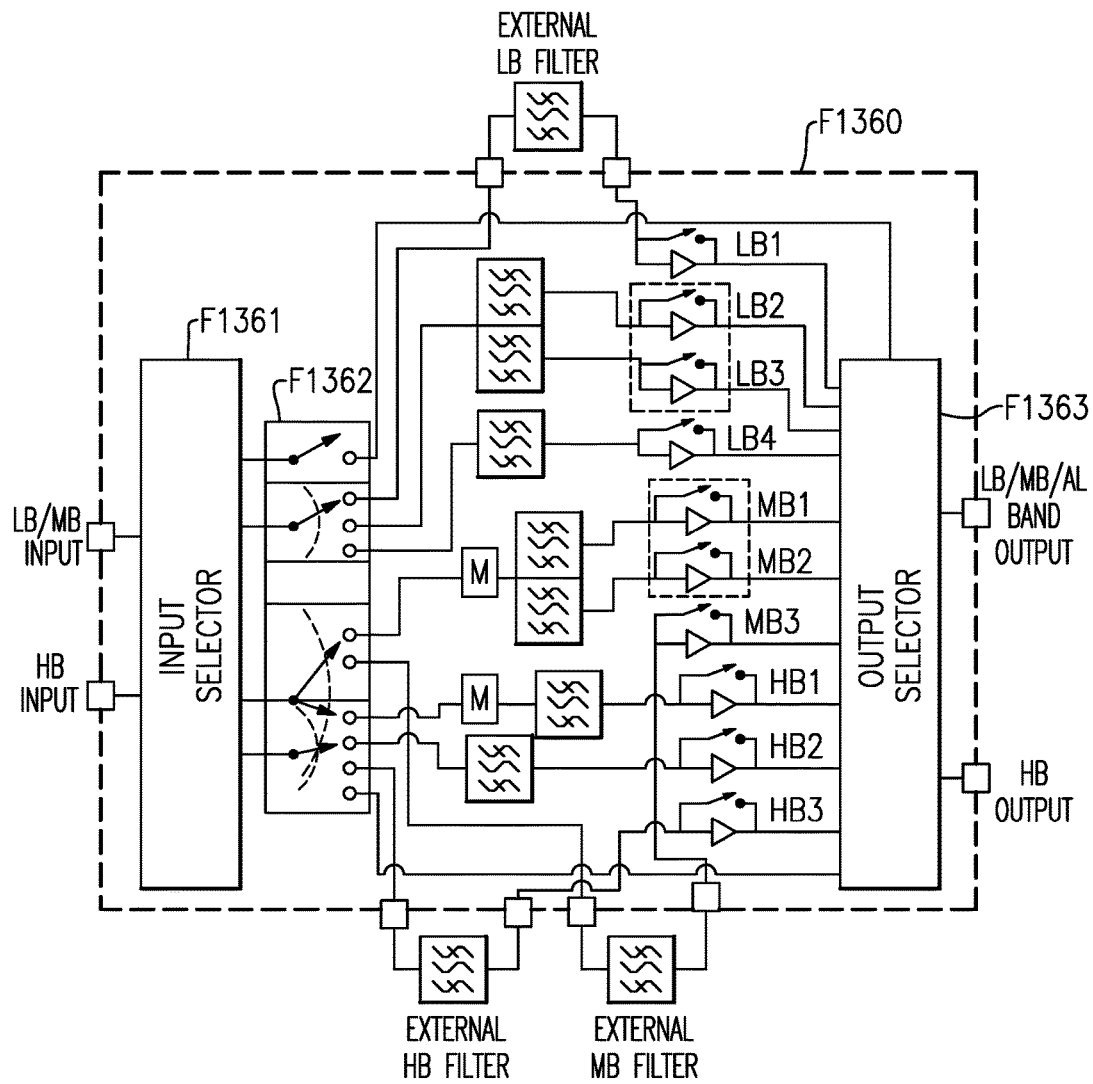

FIG. 75 shows that, in some embodiments, a DRx module F1360 can include an input selector F1361 and a multi-pole/multi-throw switch F1362. The DRx module F1360 includes, as a band splitter, an input selector F1361 (which operates as a two-pole/four-throw switch and may be implemented as shown in FIG. 68 and FIG. 69), a four-pole/ten-throw switch F1362, and various filters, matching components, and band-split diplexers. As described herein, the input selector F1361, switch F1362 and the various filters, matching components, and band-split diplexers can be co-designed. The input selector F1361 and switch F1362, taken together, operate as a two-pole/ten-throw switch. The DRx module F1360 includes, as an output multiplexer, an output selector F1363 that can route the inputs to a selected one of the outputs (which may include combining signals). The output selector F1363 can be implemented using the aspects illustrated in FIG. 65 and FIG. 66.

Figure 76:
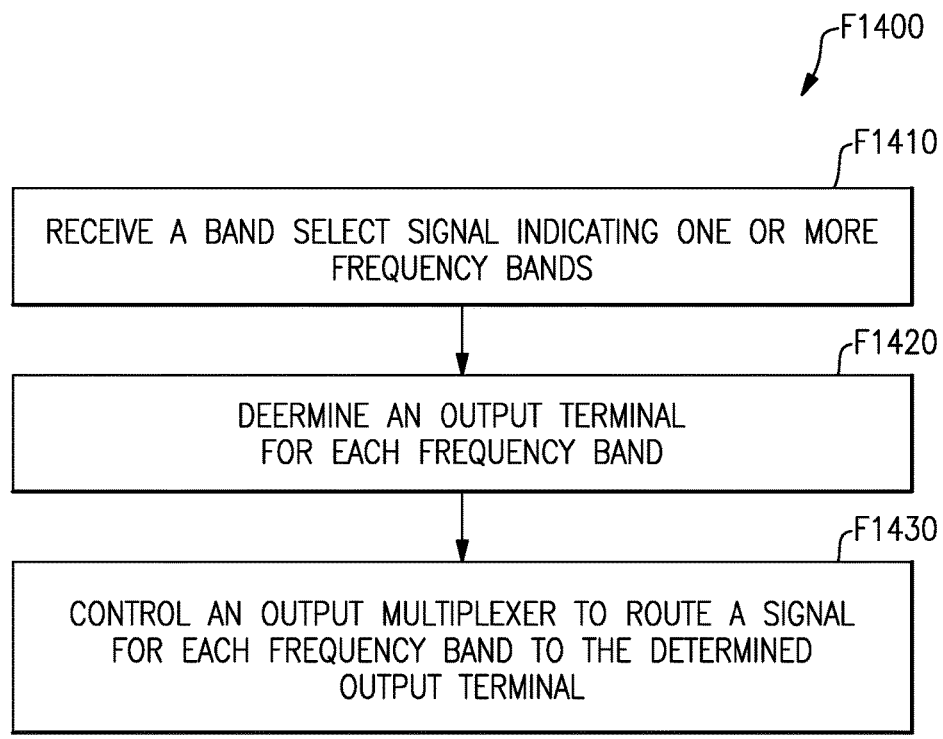
FIG. 76 shows an embodiment of a flowchart representation of a method of processing an RF signal.

FIG. 76 shows an embodiment of a flowchart representation of a method of processing an RF signal. In some implementations (and as detailed below as an example), the method F1400 is performed by a controller, such as the DRx controller F702 of FIG. 64 or the communications controller 120 of FIG. 39. In some implementations, the method F1400 is performed by processing logic, including hardware, firmware, software, or a combination thereof. In some implementations, the method F1400 is performed by a processor executing code stored in a non-transitory computer-readable medium (e.g., a memory). Briefly, the method F1400 includes receiving a band select signal and routing a received RF signal along one or more paths to selected outputs to process the received RF signal.

The method F1400 begins, at block F1410, with the controller receiving a band select signal. The controller may receive the band select signal from another controller or may receive the band select signal from a cellular base station or other external source. The band select signal may indicate one or more frequency bands over which a wireless device is to transmit and receive RF signals. In some implementations, the band select signal indicates a set of frequency bands for carrier aggregation communication.

At block F1420, the controller determines an output terminal for each frequency band indicated by the band select signal. In some implementations, the band select signal indicates a single frequency band and the controller determines a default output terminal for the single frequency band. In some implementations, the band select signal indicates two frequency bands and the controller determines a different output terminal for each of the two frequency bands. In some implementations, the band select signal indicates more frequency bands than there are usable output terminals and the controller determines to combine two or more of the frequency bands (and, thus, determines the same output terminal for two or more frequency bands). The controller can determine to combine the closest frequency bands or those furthest apart.

At block F1430, the controller controls an output multiplexer to route a signal for each frequency band to the determined output terminal. The controller can control the output multiplexer by opening or closing one or more SPST switches, determining a state of one or more SPMT switches, by sending an output multiplexer control signal, or by other mechanisms.

Among others, the foregoing Example F related to flexible band routing can be summarized as follows.

In accordance with some implementations, the present disclosure relates to a receiving system including a plurality of amplifiers. Each one of the plurality of amplifiers is disposed along a corresponding one of a plurality of paths between an input of the receiving system and an output of the receiving system and configured to amplify a radio-frequency (RF) signal received at the amplifier. The receiving system further includes an input multiplexer configured to receive one or more RF signals at one or more input multiplexer inputs and to output each of the one or more RF signals to one or more of a plurality of input multiplexer outputs to propagate along a respective one or more of the plurality of paths. The receiving system further includes an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs. The receiving system further includes a controller configured to receive a band select signal and, based on the band select signal, control the input multiplexer and the output multiplexer.

In some embodiments, in response to a band select signal indicating that the one or more RF signals includes a single frequency band, the controller can be configured to control the output multiplexer to route an amplified RF signal received at an output multiplexer input corresponding to the single frequency band to a default output multiplexer output.

In some embodiments, the default output multiplexer output is different for different single frequency bands.

In some embodiments, in response to a band select signal indicating that the one or more RF signals includes a first frequency band and a second frequency band, the controller can be configured to control the output multiplexer to route an amplified RF signal received at an output multiplexer input corresponding to the first frequency band to a first output multiplexer output and to route an amplified RF signal received at an output multiplexer input corresponding to the second frequency band to a second output multiplexer output. In some embodiments, both the first frequency band and the second frequency band can be high frequency bands or low frequency bands.

In some embodiments, in response to a band select signal indicating that the one or more RF signals includes a first frequency band, a second frequency band, and a third frequency band, the controller can be configured to control the output multiplexer to combine an amplified RF signal received at an output multiplexer input corresponding to the first frequency band and an amplified RF signal received at an output multiplexer input corresponding to the second frequency band to generate a combined signal, to route the combined signal to a first output multiplexer output, and to route an amplified RF signal received at an output multiplexer input corresponding to the third frequency band to a second output multiplexer output. In some embodiments, the first frequency band and second frequency band can be those of the first frequency band, second frequency band, and third frequency band that are closest together. In some embodiments, the first frequency band and second frequency band can be those of the first frequency band, second frequency band, and third frequency band that are furthest apart.

In some embodiments, in response to a band select signal indicating that the one or more RF signals includes multiple frequency bands and in response to a controller signal indicating that a transmission line is unusable, the controller can be configured to control the output multiplexer to combine multiple amplified RF signals received at multiple output multiplexer input corresponding to the multiple frequency bands to generate a combined signal and to route the combined signal to a output multiplexer output.

In some embodiments, the controller can be configured to, in response to a first band select signal, control the output multiplexer to route an amplified RF signal received at an output multiplexer input to a first output multiplexer output and, in response to a second band select signal, control the output multiplexer to route an amplified RF signal received at the output multiplexer input to a second output multiplexer output.

In some embodiments, the output multiplexer can include a first combiner coupled to a first output multiplexer output and a second combiner coupled to a second output multiplexer output. In some embodiments, an output multiplexer input can be coupled to the first combiner and the second combiner via one or more switches. In some embodiments, the controller can control the output multiplexer by controlling the one or more switches. In some embodiments, the one or more switches can include two single-pole/single-throw (SPST) switches. In some embodiments, the one or more switches can include a single single-pole/multiple-throw (SPMT) switch. In some embodiments, the receiving system further includes a plurality of transmission lines respectively coupled to the plurality of output multiplexer outputs.

In some implementations, the present disclosure relates to a radio-frequency (RF) module that includes a packaging substrate configured to receive a plurality of components. The RF module further includes a receiving system implemented on the packaging substrate. The receiving system includes a plurality of amplifiers. Each one of the plurality of amplifiers is disposed along a corresponding one of a plurality of paths between an input of the receiving system and an output of the receiving system and configured to amplify a radio-frequency (RF) signal received at the amplifier. The receiving system includes an input multiplexer configured to receive one or more RF signals at one or more input multiplexer inputs and to output each of the one or more RF signals to a selected one or more of a plurality of input multiplexer outputs to propagate along a respective one or more of the plurality of paths. The receiving system includes an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs. The receiving system includes a controller configured to receive a band select signal and, based on the band select signal, control the input multiplexer and the output multiplexer.

In some embodiments, the RF module can be a diversity receiver front-end module (FEM).

According to some teachings, the present disclosure relates to a wireless device that includes a first antenna configured to receive a first radio-frequency (RF) signal. The wireless device further includes a first front-end module (FEM) in communication with the first antenna. The first FEM including a packaging substrate configured to receive a plurality of components. The first FEM further includes a receiving system implemented on the packaging substrate. The receiving system includes a plurality of amplifiers. Each one of the plurality of amplifiers is disposed along a corresponding one of a plurality of paths between an input of the receiving system and an output of the receiving system and configured to amplify a radio-frequency (RF) signal received at the amplifier. The receiving system includes an input multiplexer configured to receive one or more RF signals at one or more input multiplexer inputs and to output each of the one or more RF signals to a selected one or more of a plurality of input multiplexer outputs to propagate along a respective one or more of the plurality of paths. The receiving system includes an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs. The receiving system includes a controller configured to receive a band select signal and, based on the band select signal, control the input multiplexer and the output multiplexer. The wireless device further includes a communications module configured to receive a processed version of the first RF signal from the output via a plurality of transmission lines respectively coupled to the plurality of output multiplexer outputs and to generate data bits based on the processed version of the first RF signal.

In some embodiments, the wireless device further includes a second antenna configured to receive a second radio-frequency (RF) signal and a second FEM in communication with the second antenna. The communications module can be configured to receive a processed version of the second RF signal from an output of the second FEM and generate the data bits based on the processed version of the second RF signal.

Examples of Combinations of Features

Figure 77A:
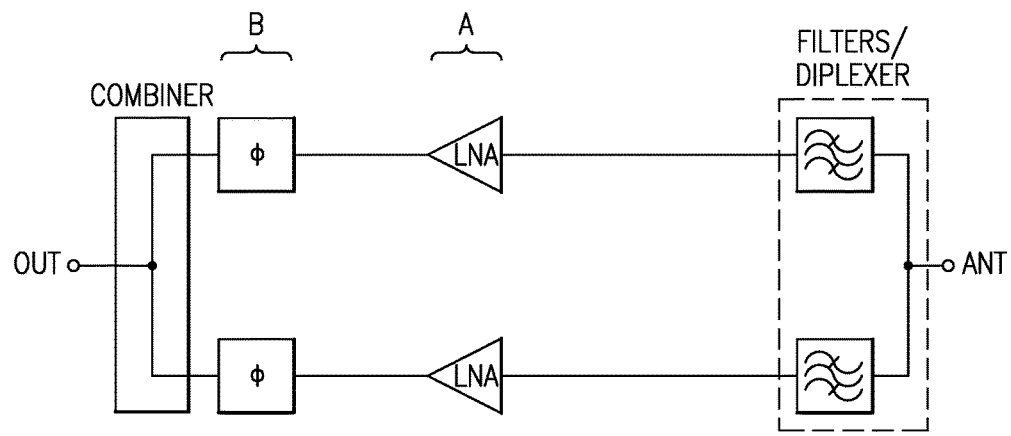
FIGS. 77A and 77B show that in some embodiments, a diversity receiver configuration may include one or more features of Example A as described herein and one or more features of Example B as described herein.
Figure 77B:
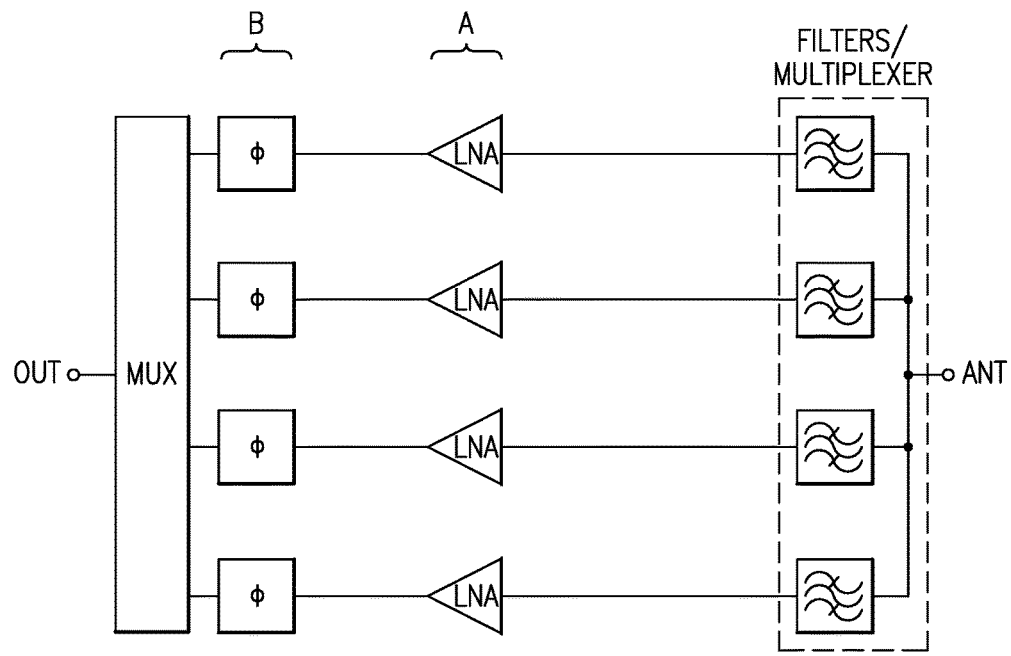

FIGS. 77A and 77B show that in some embodiments, a diversity receiver configuration may include one or more features of Example A as described herein and one or more features of Example B as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136.

In some embodiments, the foregoing combination of features can provide some or all advantages and/or functionalities associated with each Example, all of the Examples in the combination, or any combination thereof.

Figure 78A:
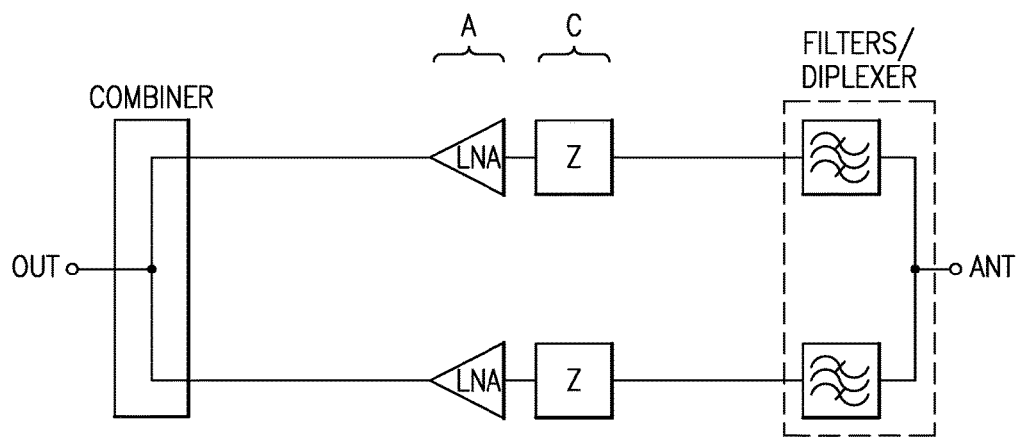
FIGS. 78A and 78B show that in some embodiments, a diversity receiver configuration may include one or more features of Example A as described herein and one or more features of Example C as described herein.
Figure 78B:
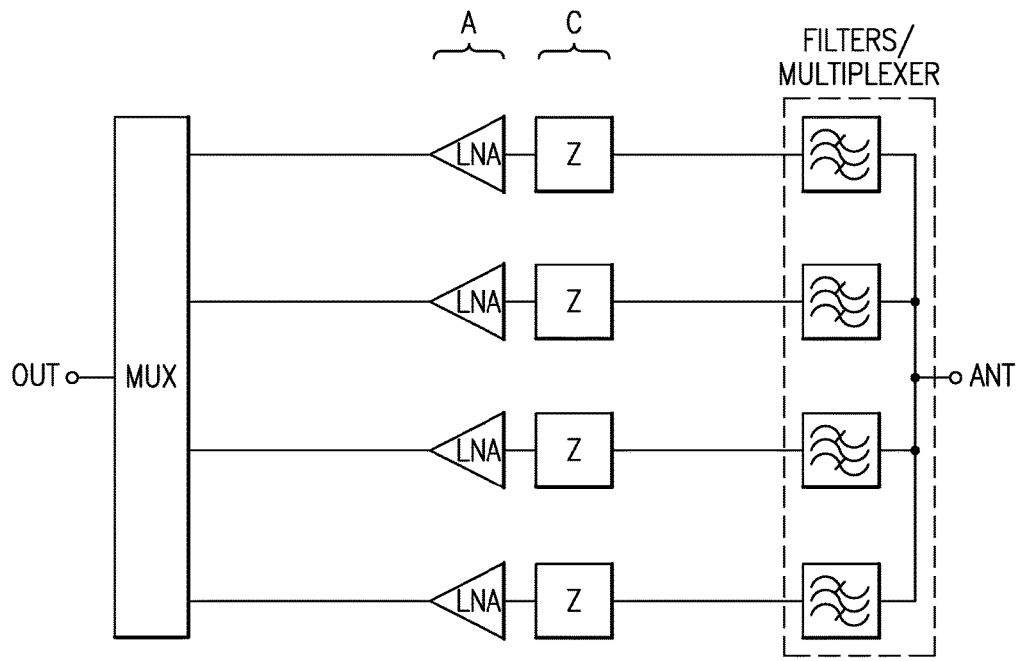

FIGS. 78A and 78B show that in some embodiments, a diversity receiver configuration may include one or more features of Example A as described herein and one or more features of Example C as described herein. Additional details related to Example A are described herein in reference to various figures, including FIGS. 37-41, 42-46 and 134-136. Additional details related to Example C are described herein in reference to various figures, including FIGS. 37-41, 51, 52, 53-55 and 134-136.

In some embodiments, the foregoing combination of features can provide some or all advantages and/or functionalities associated with each Example, all of the Examples in the combination, or any combination thereof.

Figure 79A:
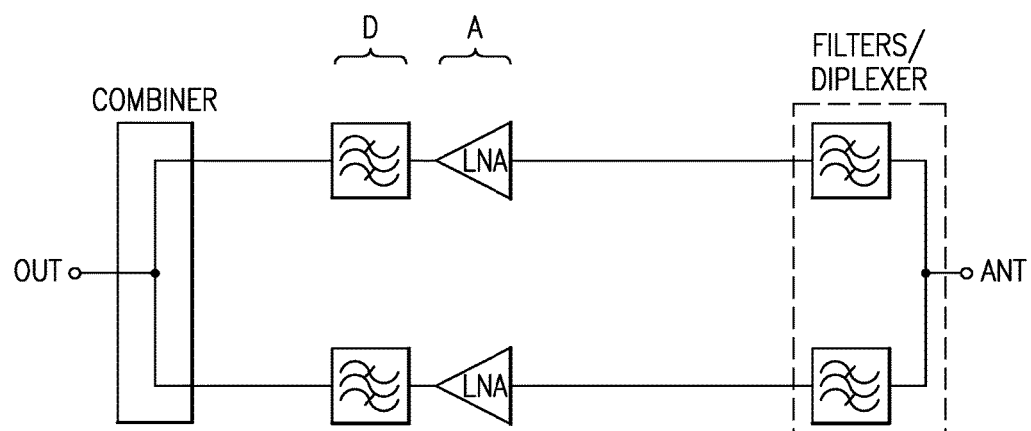
FIGS. 79A and 79B show that in some embodiments, a diversity receiver configuration may include one or more features of Example A as described herein and one or more features of Example D as described herein.
Figure 79B:
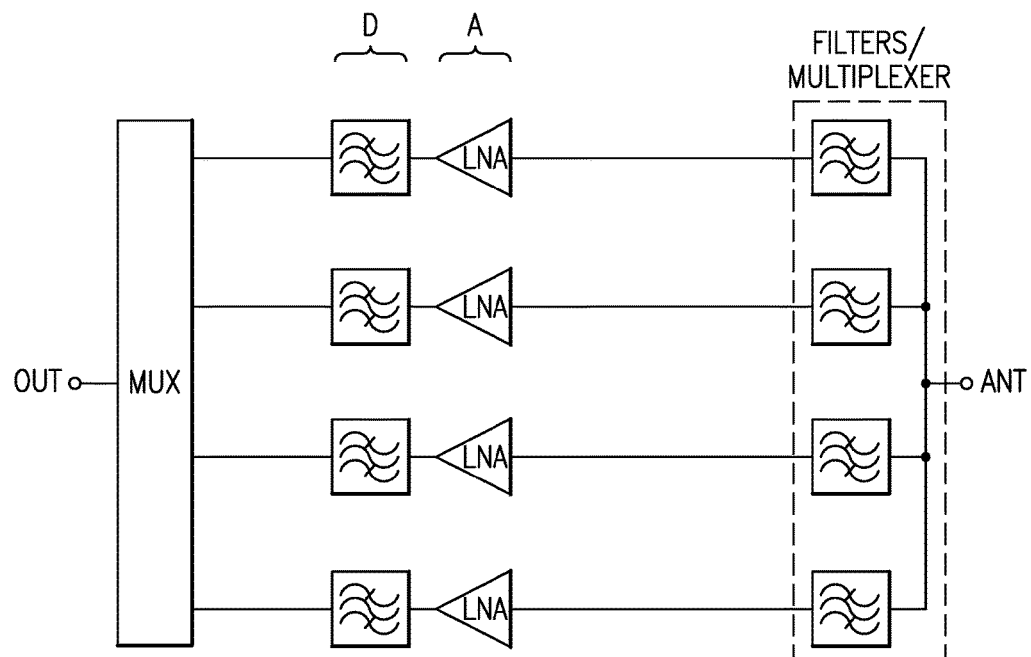

FIGS. 79A and 79B show that in some embodiments, a diversity receiver configuration may include one or more features of Example A as described herein and one or more features of Example D as described herein. Additional details related to Example A are described herein in reference to various figures, including FIGS. 37-41, 42-46 and 134-136. Additional details related to Example D are described herein in reference to various figures, including FIGS. 37-41, 56-59 and 134-136.

In some embodiments, the foregoing combination of features can provide some or all advantages and/or functionalities associated with each Example, all of the Examples in the combination, or any combination thereof.

Figure 80A:
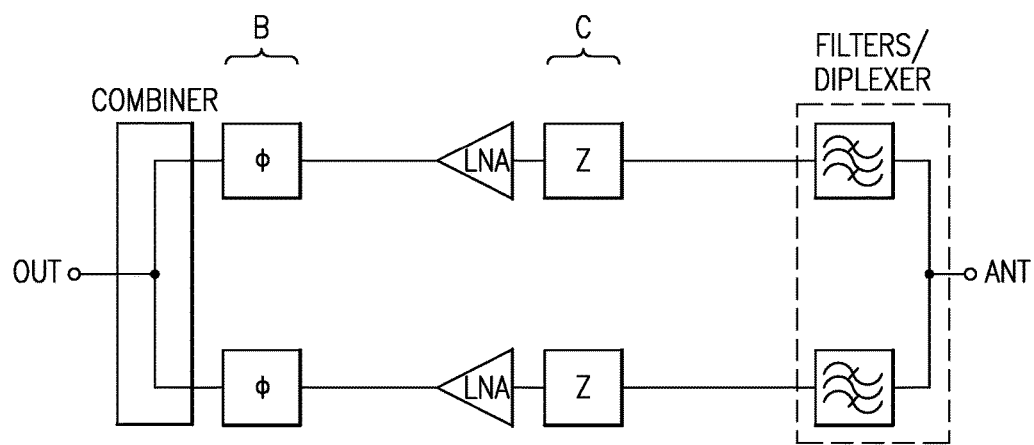
FIGS. 80A and 80B show that in some embodiments, a diversity receiver configuration may include one or more features of Example B as described herein and one or more features of Example C as described herein.
Figure 80B:
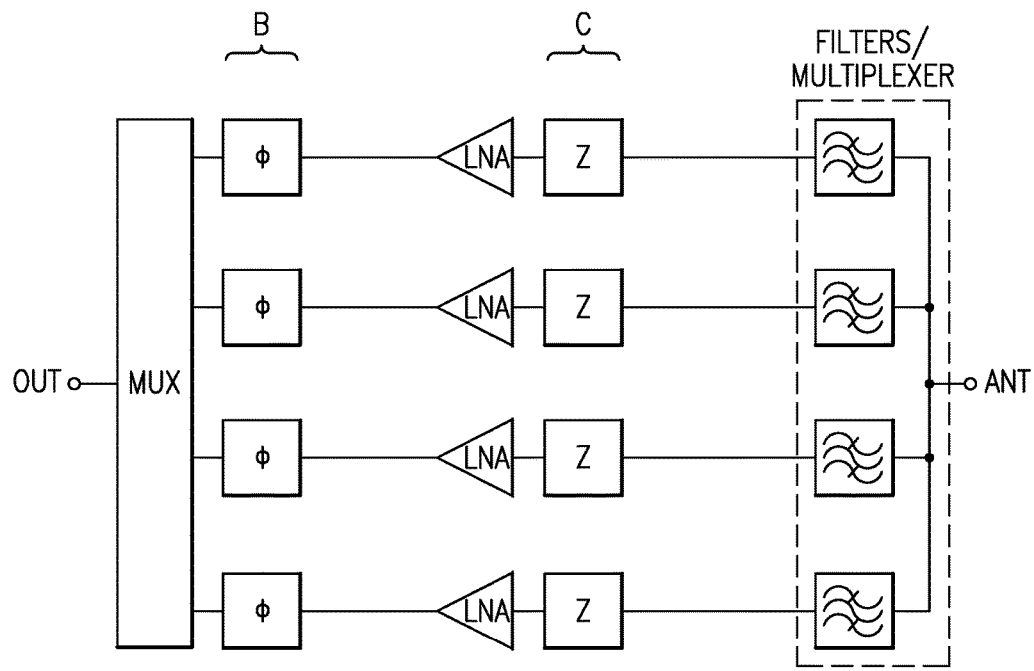

FIGS. 80A and 80B show that in some embodiments, a diversity receiver configuration may include one or more features of Example B as described herein and one or more features of Example C as described herein. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136.

In some embodiments, the foregoing combination of features can provide some or all advantages and/or functionalities associated with each Example, all of the Examples in the combination, or any combination thereof.

Figure 81A:
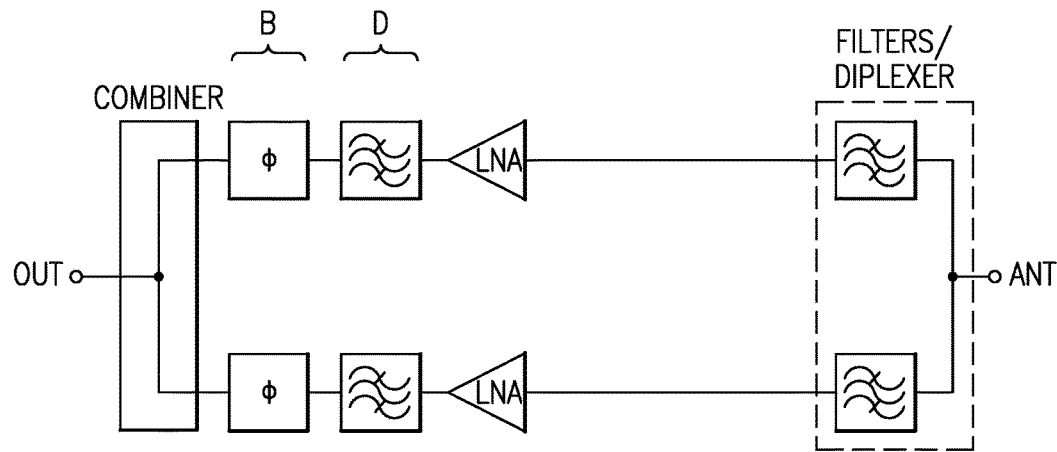
FIGS. 81A and 81B show that in some embodiments, a diversity receiver configuration may include one or more features of Example B as described herein and one or more features of Example D as described herein.
Figure 81B:
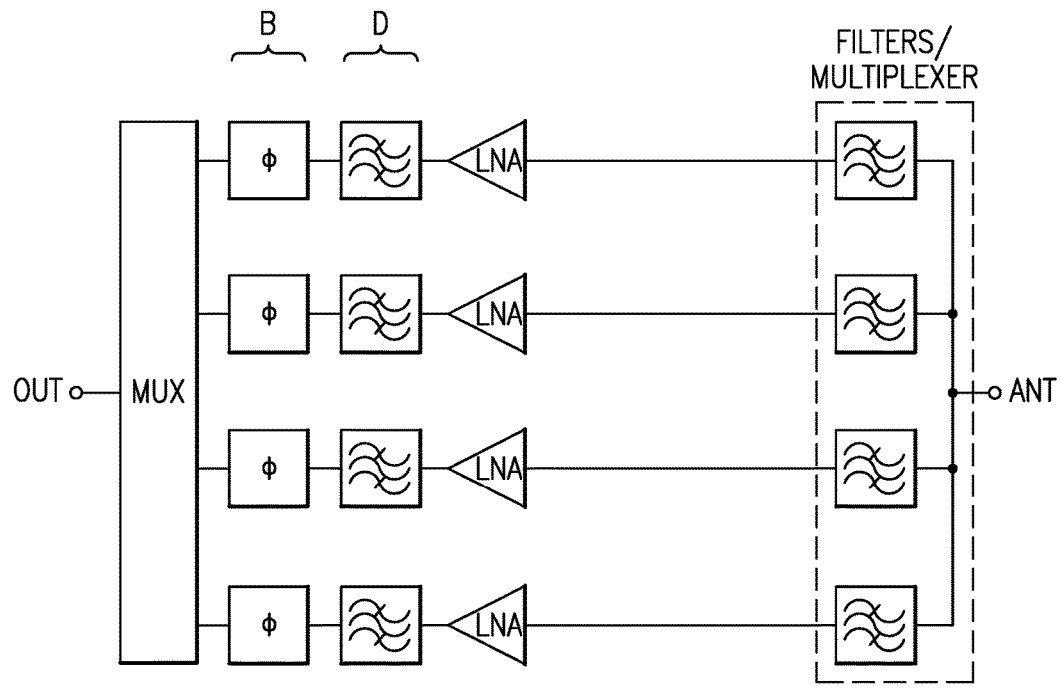

FIGS. 81A and 81B show that in some embodiments, a diversity receiver configuration may include one or more features of Example B as described herein and one or more features of Example D as described herein. Additional details related to Example B are described herein in reference to various figures, including FIGS. 37-41, 47-50, 53-55 and 134-136. Additional details related to Example D are described herein in reference to various figures, including FIGS. 37-41, 56-59 and 134-136.

In some embodiments, the foregoing combination of features can provide some or all advantages and/or functionalities associated with each Example, all of the Examples in the combination, or any combination thereof.

Figure 82A:
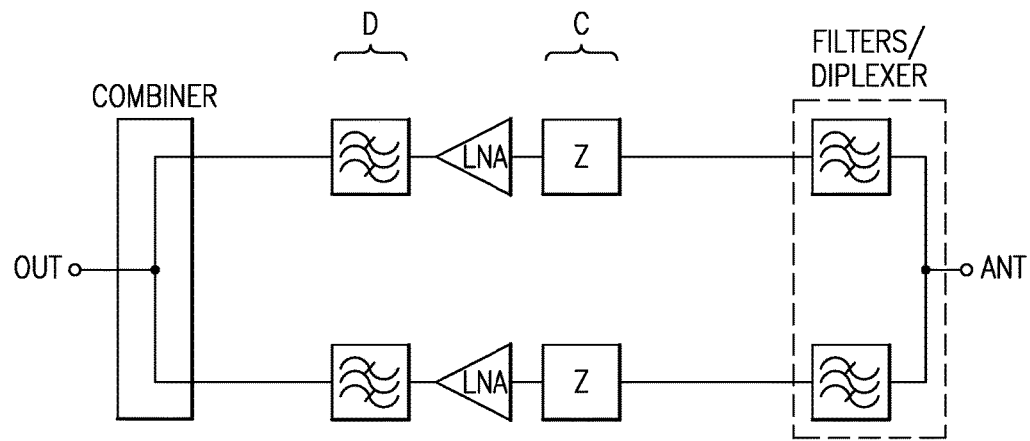
FIGS. 82A and 82B show that in some embodiments, a diversity receiver configuration may include one or more features of Example C as described herein and one or more features of Example D as described herein.
Figure 82B:
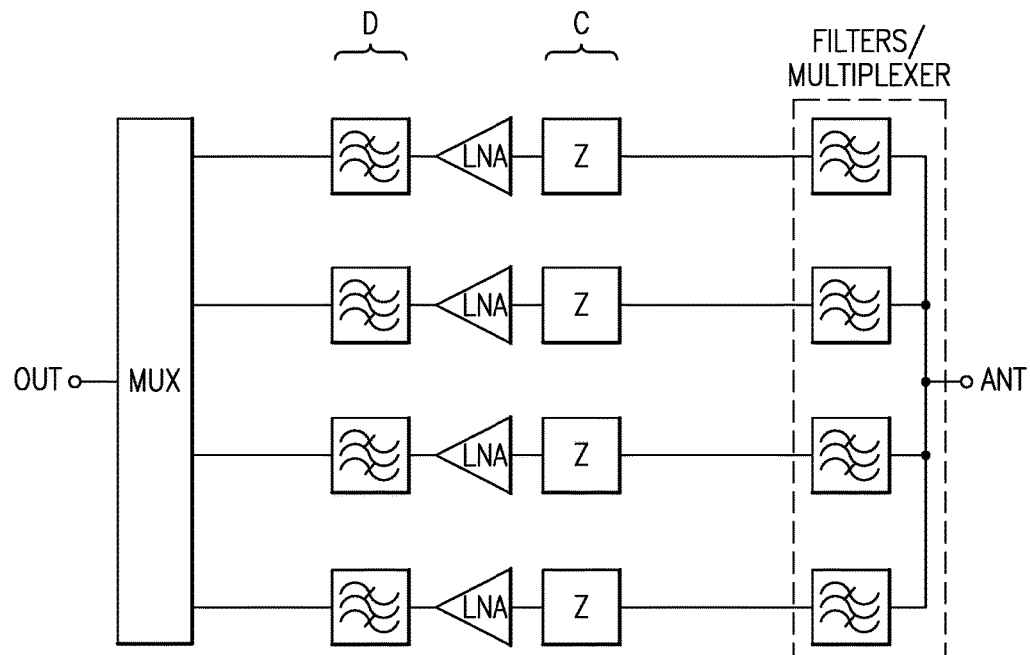

FIGS. 82A and 82B show that in some embodiments, a diversity receiver configuration may include one or more features of Example C as described herein and one or more features of Example D as described herein. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136.

In some embodiments, the foregoing combination of features can provide some or all advantages and/or functionalities associated with each Example, all of the Examples in the combination, or any combination thereof.

Figure 83A:
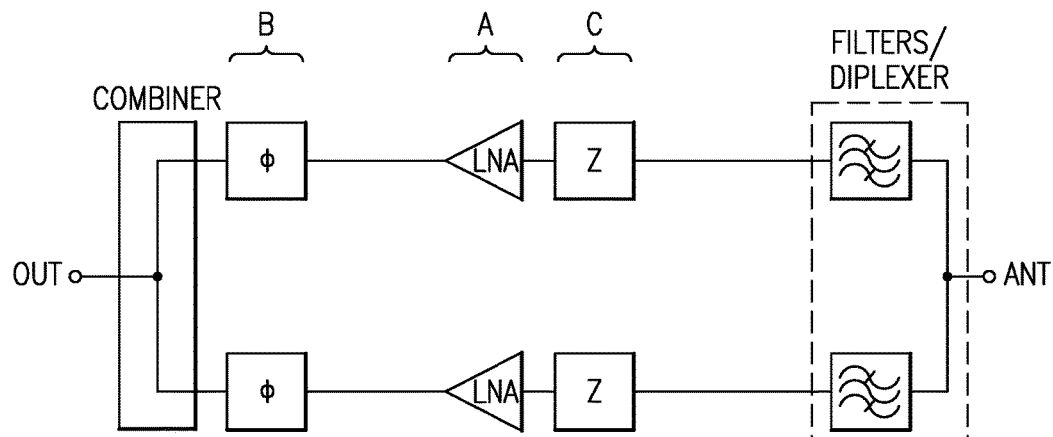
FIGS. 83A and 83B show that in some embodiments, a diversity receiver configuration may include one or more features of Example A as described herein, one or more features of Example B as described herein, and one or more features of Example C as described herein.
Figure 83B:
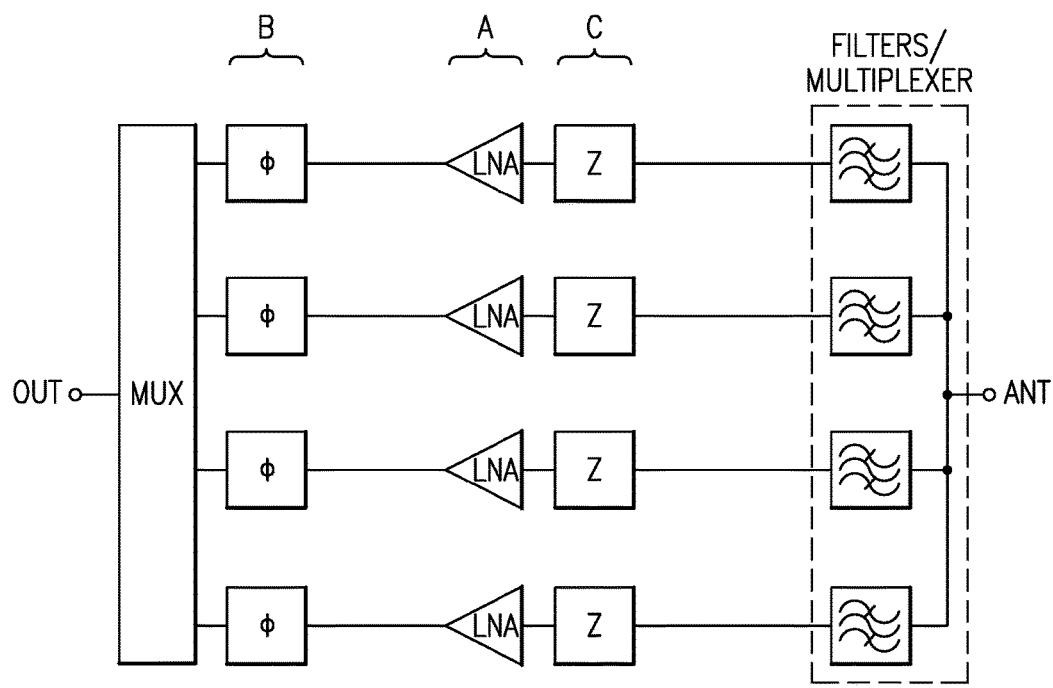

FIGS. 83A and 83B show that in some embodiments, a diversity receiver configuration may include one or more features of Example A as described herein, one or more features of Example B as described herein, and one or more features of Example C as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136.

In some embodiments, the foregoing combination of features can provide some or all advantages and/or functionalities associated with each Example, all of the Examples in the combination, or any combination thereof.

Figure 84A:
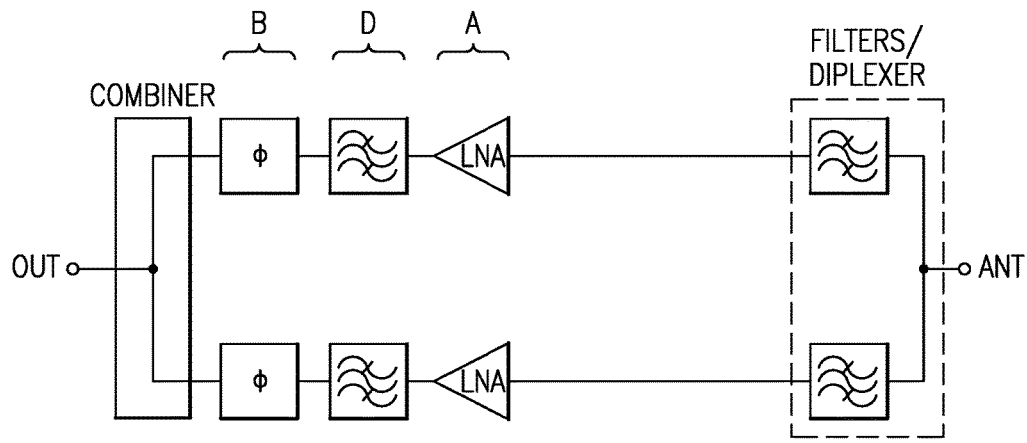
FIGS. 84A and 84B show that in some embodiments, a diversity receiver configuration may include one or more features of Example A as described herein, one or more features of Example B as described herein, and one or more features of Example D as described herein.
Figure 84B:
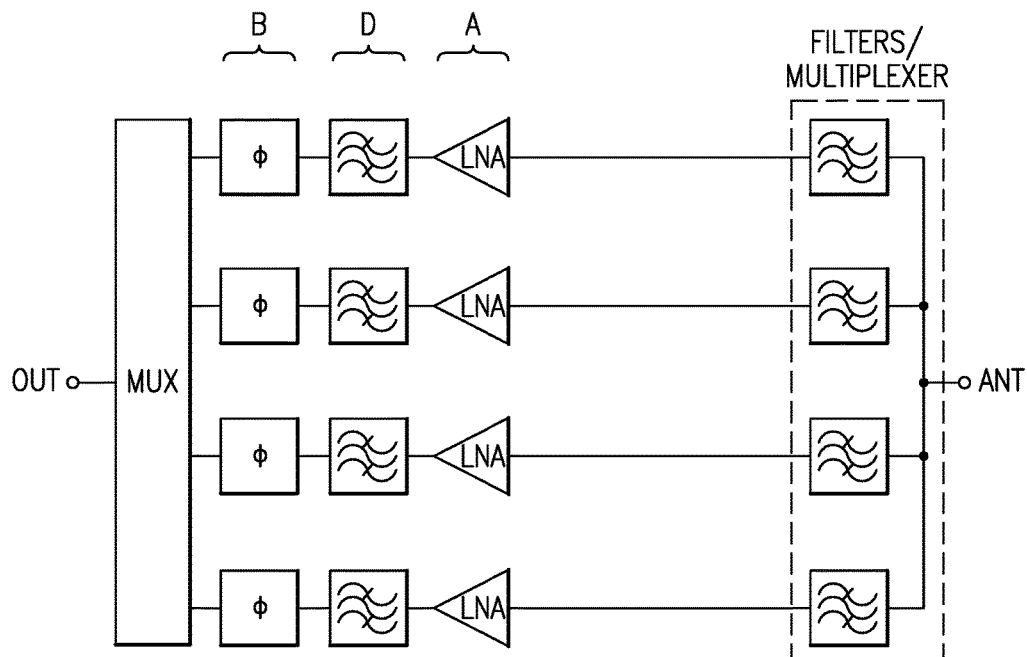

FIGS. 84A and 84B show that in some embodiments, a diversity receiver configuration may include one or more features of Example A as described herein, one or more features of Example B as described herein, and one or more features of Example D as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example D are described herein in reference to various figures, including FIGS. 37-41, 56-59 and 134-136.

In some embodiments, the foregoing combination of features can provide some or all advantages and/or functionalities associated with each Example, all of the Examples in the combination, or any combination thereof.

Figure 85A:
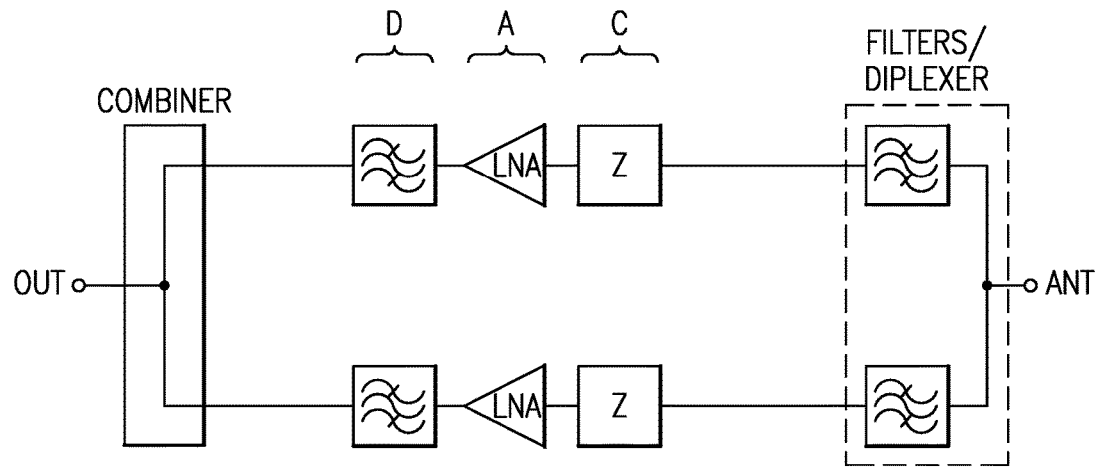
FIGS. 85A and 85B show that in some embodiments, a diversity receiver configuration may include one or more features of Example A as described herein, one or more features of Example C as described herein, and one or more features of Example D as described herein.
Figure 85B:
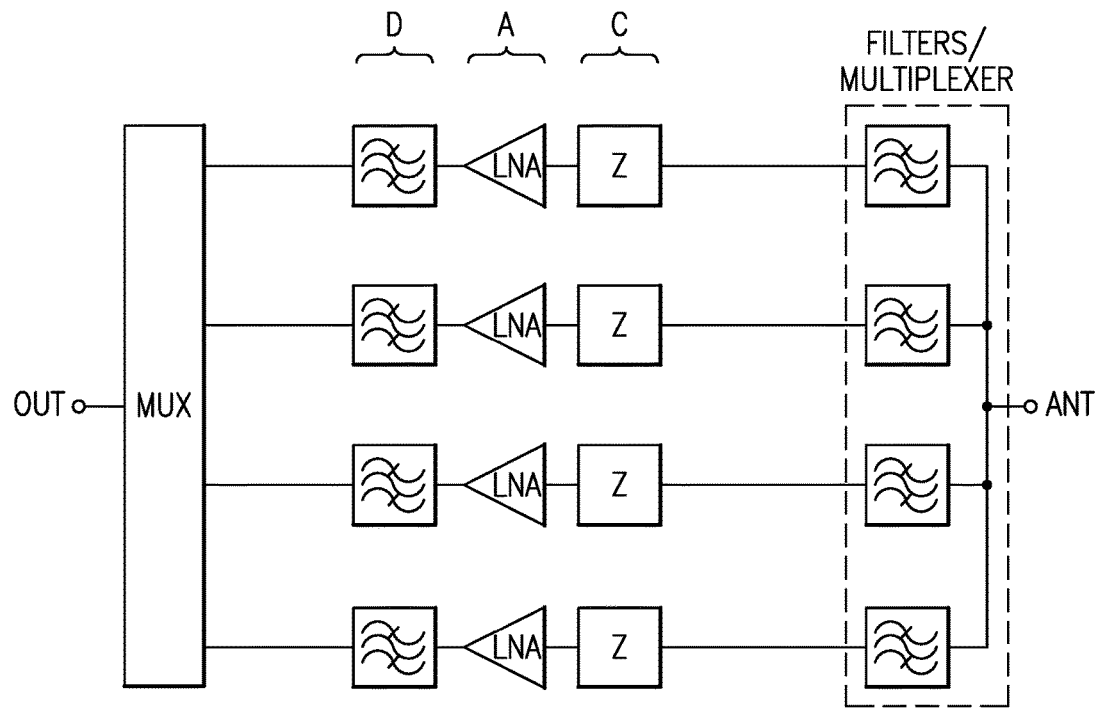

FIGS. 85A and 85B show that in some embodiments, a diversity receiver configuration may include one or more features of Example A as described herein, one or more features of Example C as described herein, and one or more features of Example D as described herein. Additional details related to Example A are described herein in reference to various figures, including FIGS. 37-41, 42-46 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136.

In some embodiments, the foregoing combination of features can provide some or all advantages and/or functionalities associated with each Example, all of the Examples in the combination, or any combination thereof.

Figure 86A:
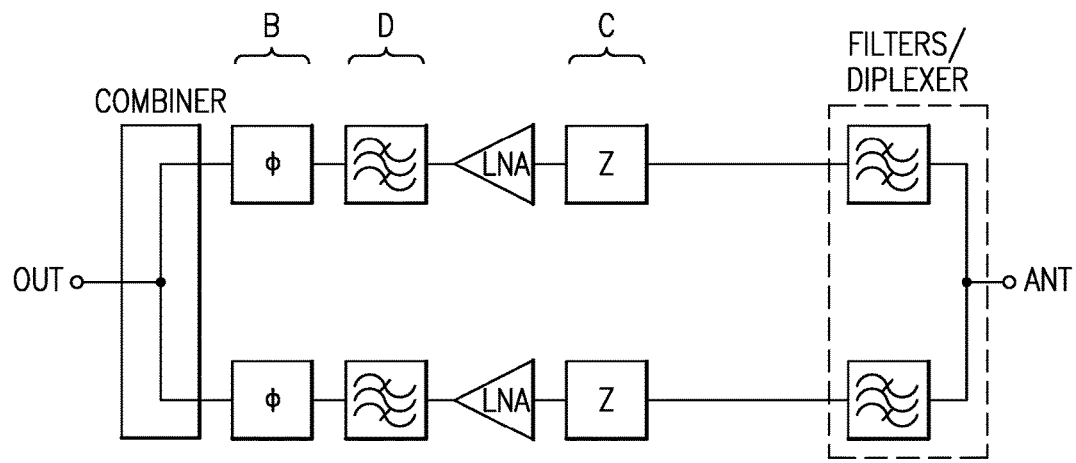
FIGS. 86A and 86B show that in some embodiments, a diversity receiver configuration may include one or more features of Example B as described herein, one or more features of Example C as described herein, and one or more features of Example D as described herein.
Figure 86B:
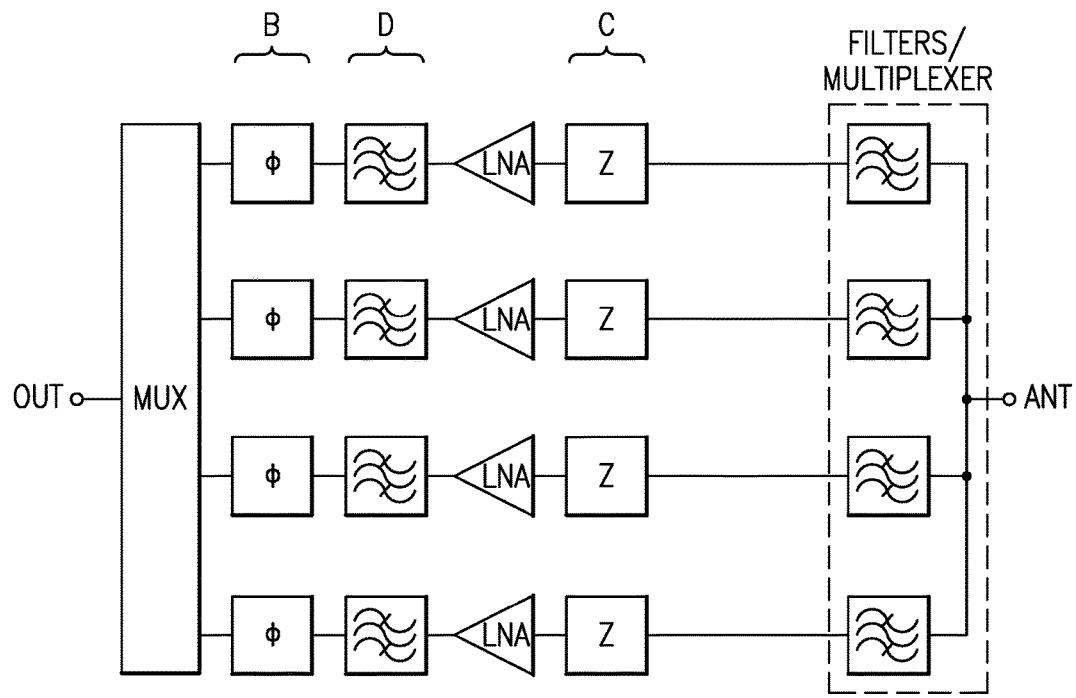

FIGS. 86A and 86B show that in some embodiments, a diversity receiver configuration may include one or more features of Example B as described herein, one or more features of Example C as described herein, and one or more features of Example D as described herein. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136.

In some embodiments, the foregoing combination of features can provide some or all advantages and/or functionalities associated with each Example, all of the Examples in the combination, or any combination thereof.

Figure 87A:
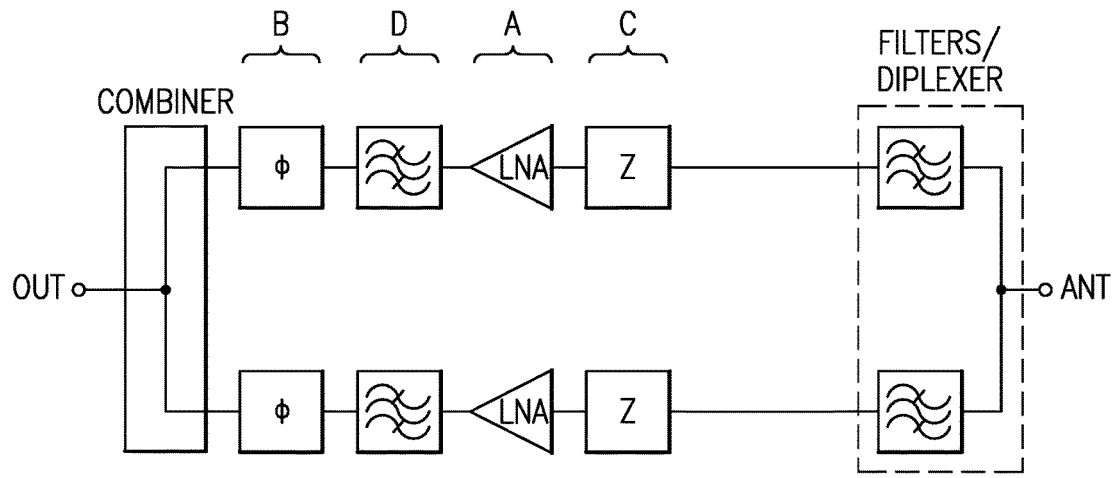
FIGS. 87A and 87B show that in some embodiments, a diversity receiver configuration may include one or more features of Example A as described herein, one or more features of Example B as described herein, one or more features of Example C as described herein, and one or more features of Example D as described herein.
Figure 87B:
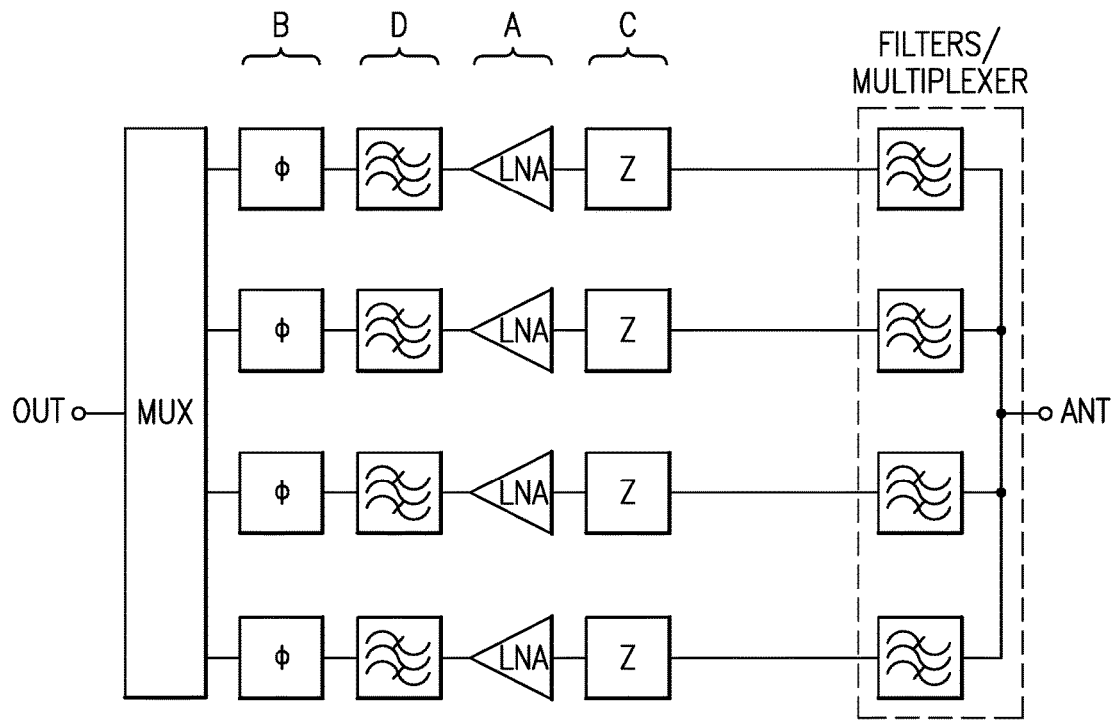

FIGS. 87A and 87B show that in some embodiments, a diversity receiver configuration may include one or more features of Example A as described herein, one or more features of Example B as described herein, one or more features of Example C as described herein, and one or more features of Example D as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136.

In some embodiments, the foregoing combination of features can provide some or all advantages and/or functionalities associated with each Example, all of the Examples in the combination, or any combination thereof.

Figure 88A:
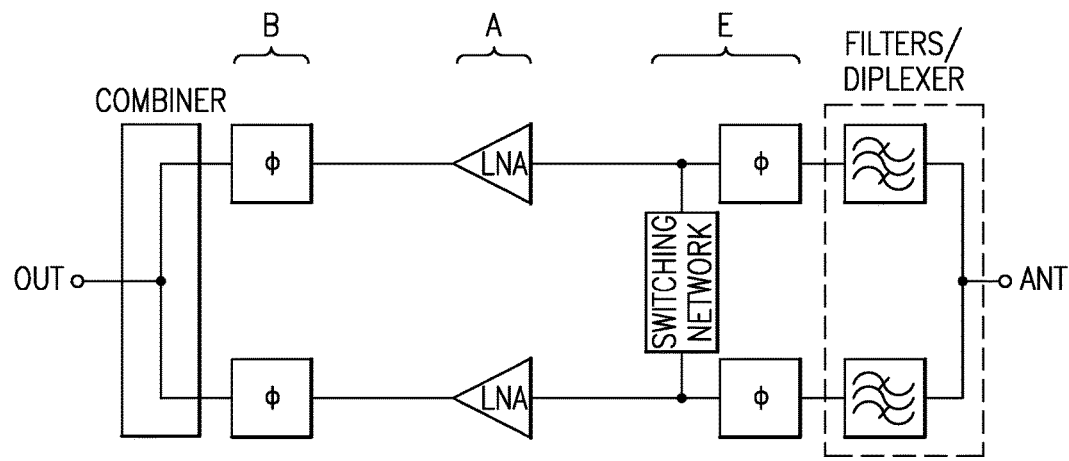
FIGS. 88A and 88B show that in some embodiments, a diversity receiver configuration may include one or more features of Example A as described herein, one or more features of Example B as described herein, and one or more features of Example E as described herein.
Figure 88B:
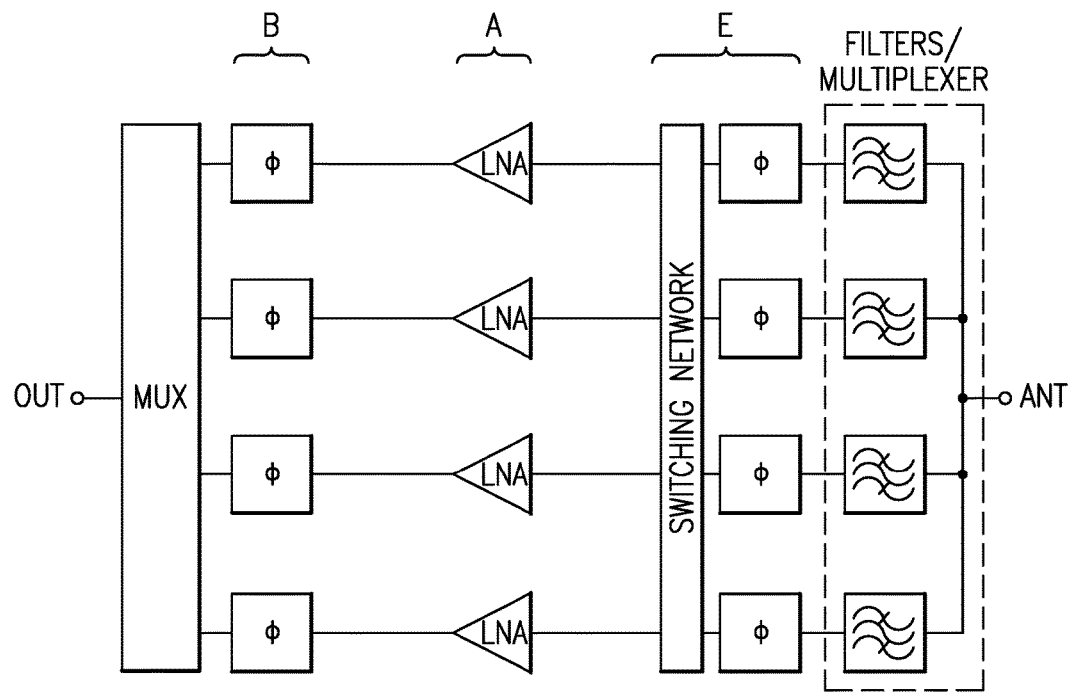

FIGS. 88A and 88B show that in some embodiments, a diversity receiver configuration may include one or more features of Example A as described herein, one or more features of Example B as described herein, and one or more features of Example E as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 89A:
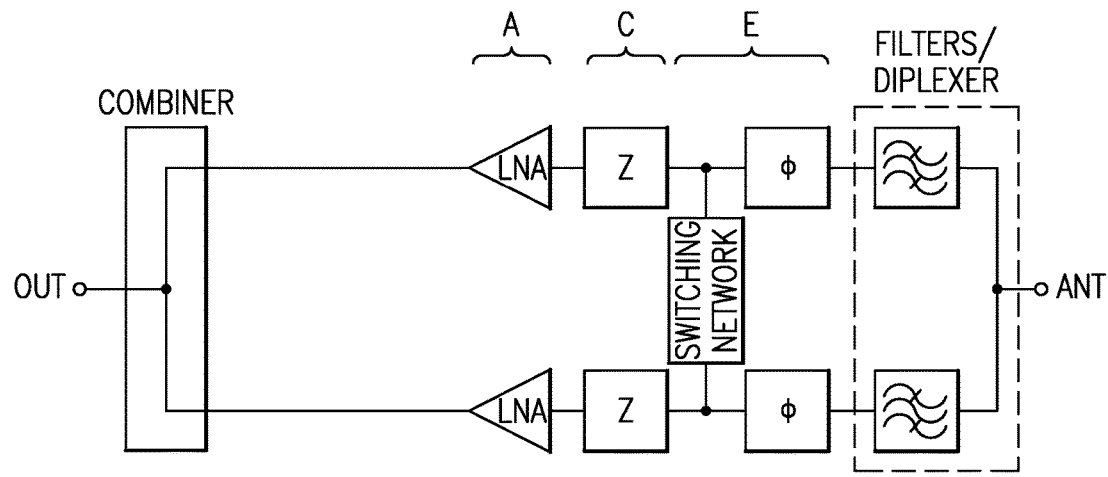
FIGS. 89A and 89B show that in some embodiments, a diversity receiver configuration may include one or more features of Example A as described herein, one or more features of Example C as described herein, and one or more features of Example E as described herein.
Figure 89B:
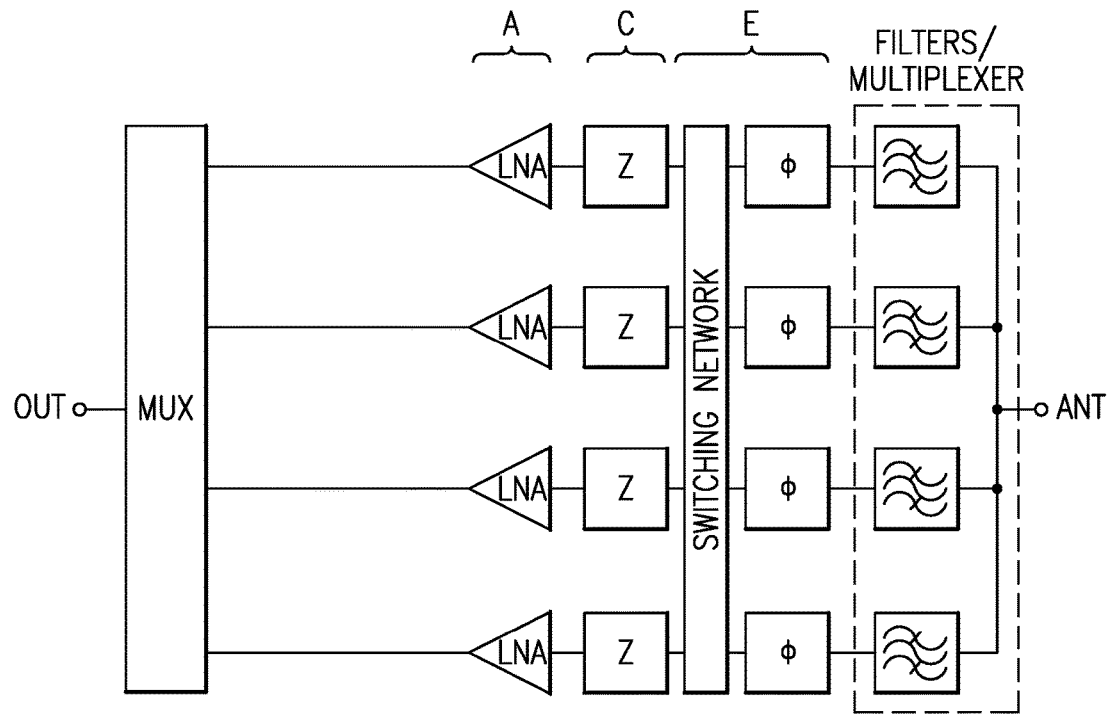

FIGS. 89A and 89B show that in some embodiments, a diversity receiver configuration may include one or more features of Example A as described herein, one or more features of Example C as described herein, and one or more features of Example E as described herein. Additional details related to Example A are described herein in reference to various figures, including FIGS. 37-41, 42-46 and 134-136. Additional details related to Example C are described herein in reference to various figures, including FIGS. 37-41, 51, 52, 53-55 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 90A:
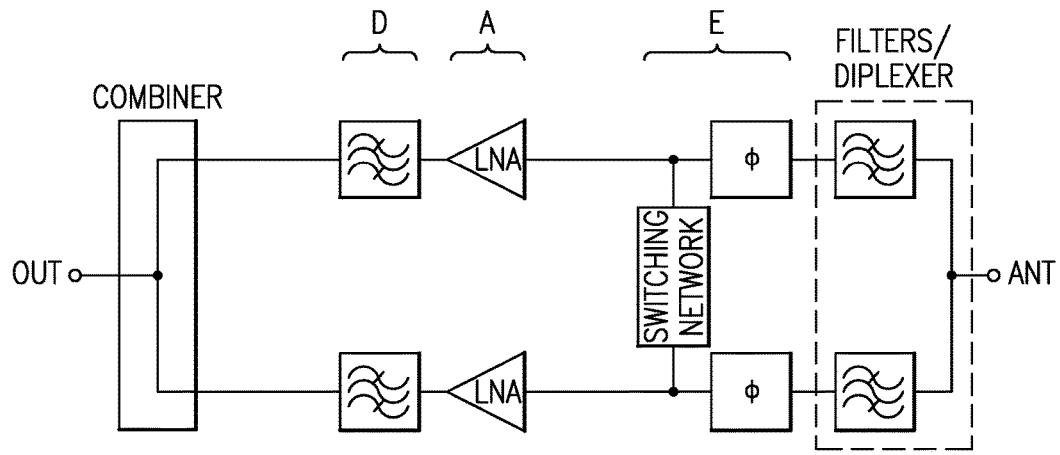
FIGS. 90A and 90B show that in some embodiments, a diversity receiver configuration may include one or more features of Example A as described herein, one or more features of Example D as described herein, and one or more features of Example E as described herein.
Figure 90B:
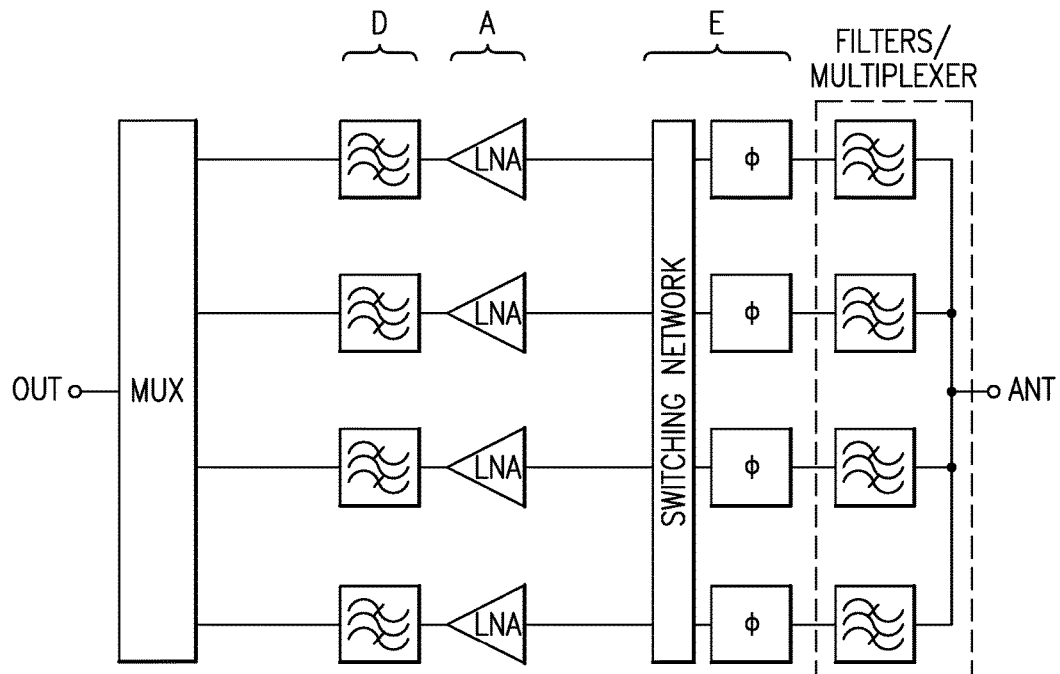

FIGS. 90A and 90B show that in some embodiments, a diversity receiver configuration may include one or more features of Example A as described herein, one or more features of Example D as described herein, and one or more features of Example E as described herein. Additional details related to Example A are described herein in reference to various figures, including FIGS. 37-41, 42-46 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 91A:
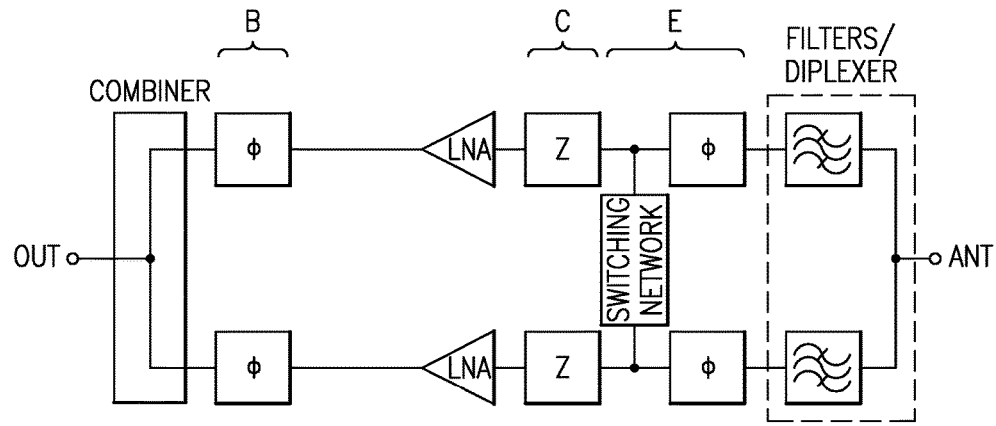
FIGS. 91A and 91B show that in some embodiments, a diversity receiver configuration may include one or more features of Example B as described herein, one or more features of Example C as described herein, and one or more features of Example E as described herein.
Figure 91B:
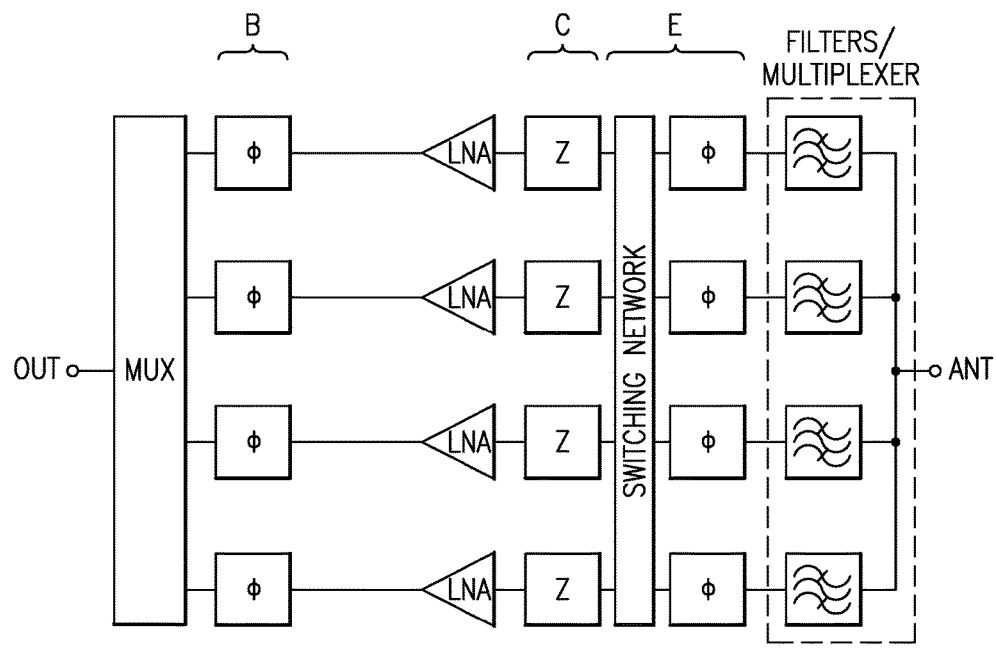

FIGS. 91A and 91B show that in some embodiments, a diversity receiver configuration may include one or more features of Example B as described herein, one or more features of Example C as described herein, and one or more features of Example E as described herein. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 92A:
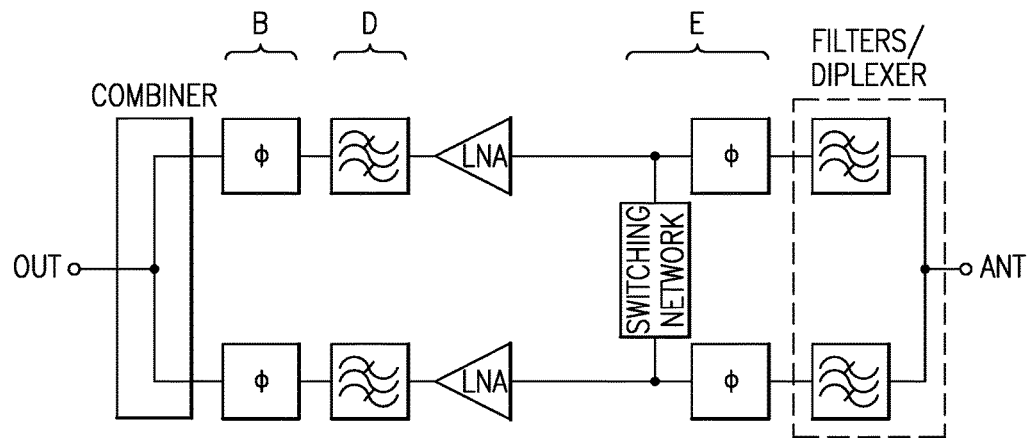
FIGS. 92A and 92B show that in some embodiments, a diversity receiver configuration may include one or more features of Example B as described herein, one or more features of Example D as described herein, and one or more features of Example E as described herein.
Figure 92B:
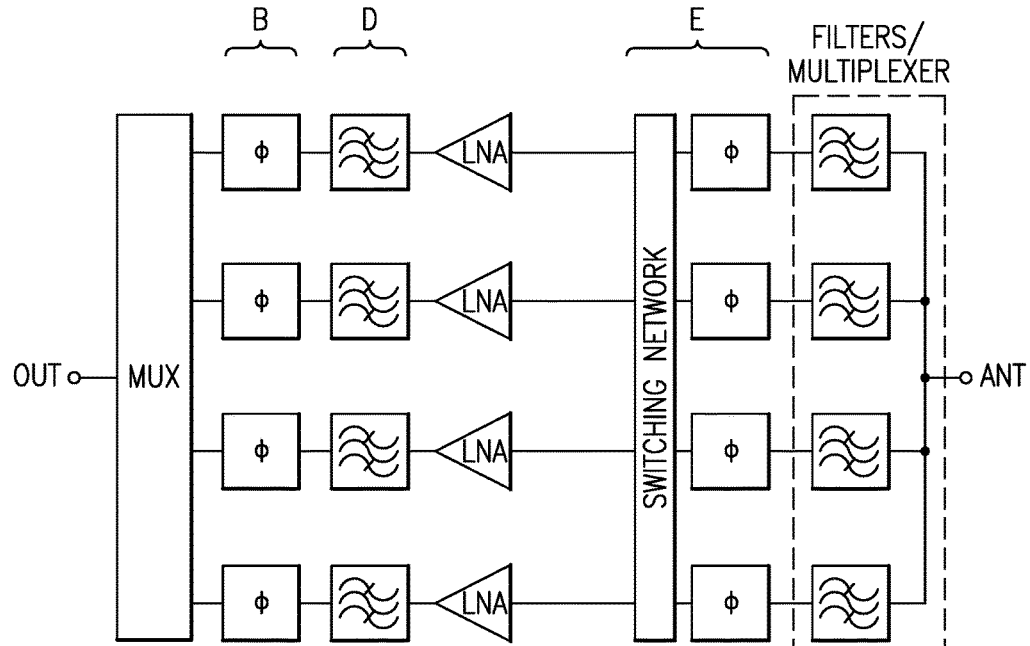

FIGS. 92A and 92B show that in some embodiments, a diversity receiver configuration may include one or more features of Example B as described herein, one or more features of Example D as described herein, and one or more features of Example E as described herein. Additional details related to Example B are described herein in reference to various figures, including FIGS. 37-41, 47-50, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 93A:
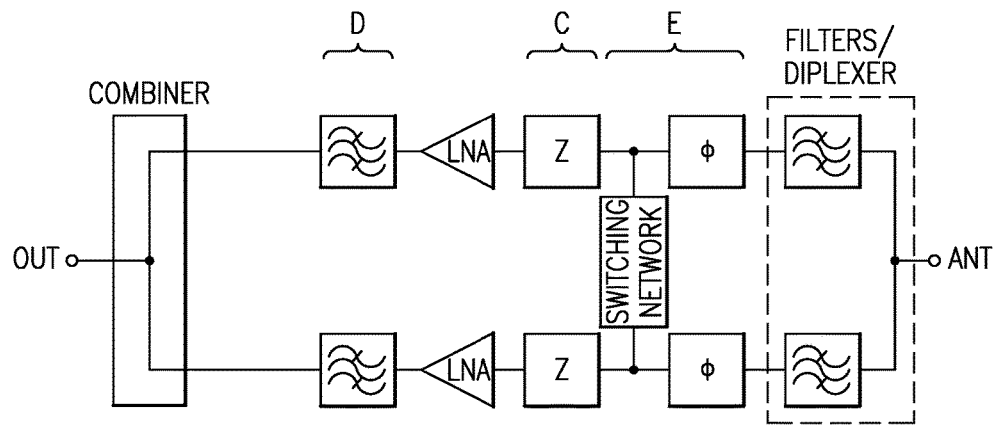
FIGS. 93A and 93B show that in some embodiments, a diversity receiver configuration may include one or more features of Example C as described herein, one or more features of Example D as described herein, and one or more features of Example E as described herein.
Figure 93B:
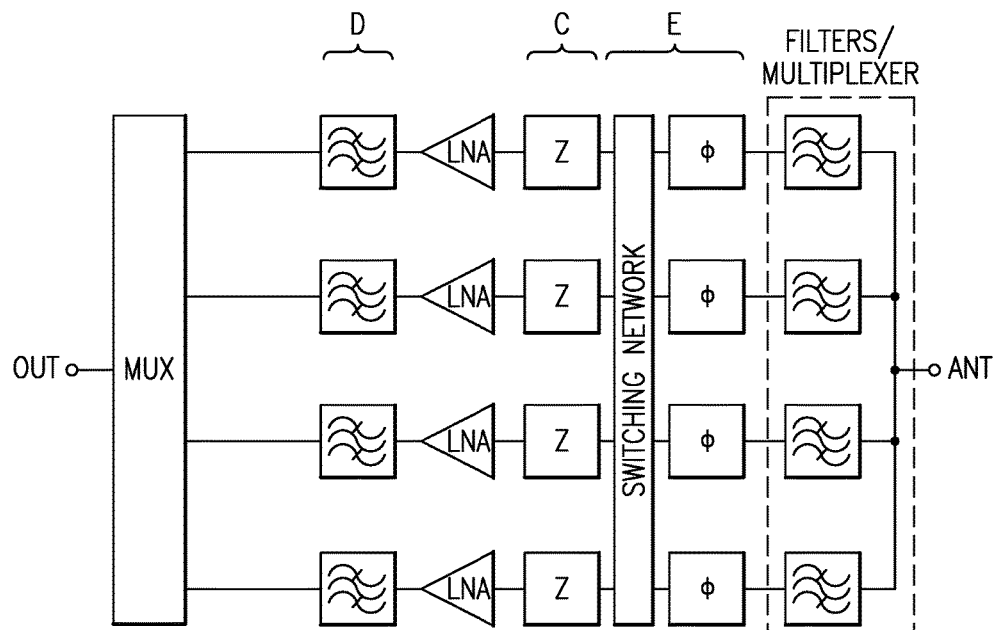

FIGS. 93A and 93B show that in some embodiments, a diversity receiver configuration may include one or more features of Example C as described herein, one or more features of Example D as described herein, and one or more features of Example E as described herein. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 94A:
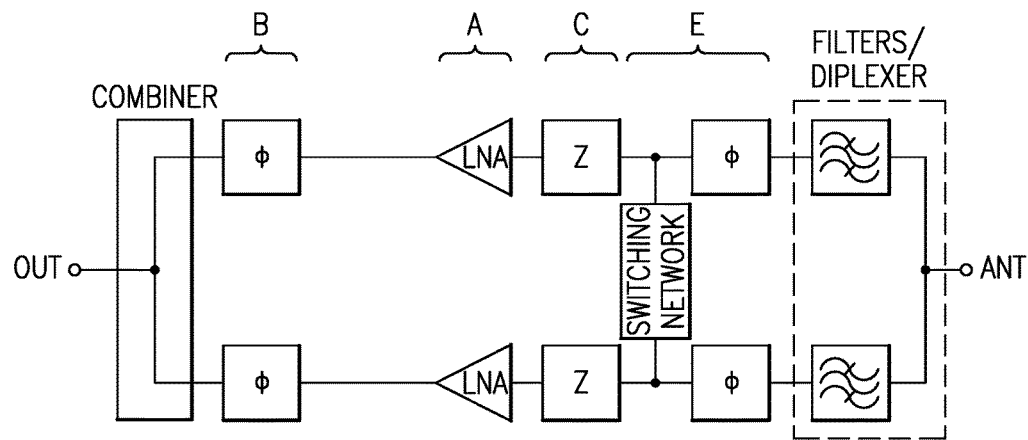
FIGS. 94A and 94B show that in some embodiments, a diversity receiver configuration may include one or more features of Example A as described herein, one or more features of Example B as described herein, one or more features of Example C as described herein, and one or more features of Example E as described herein.
Figure 94B:
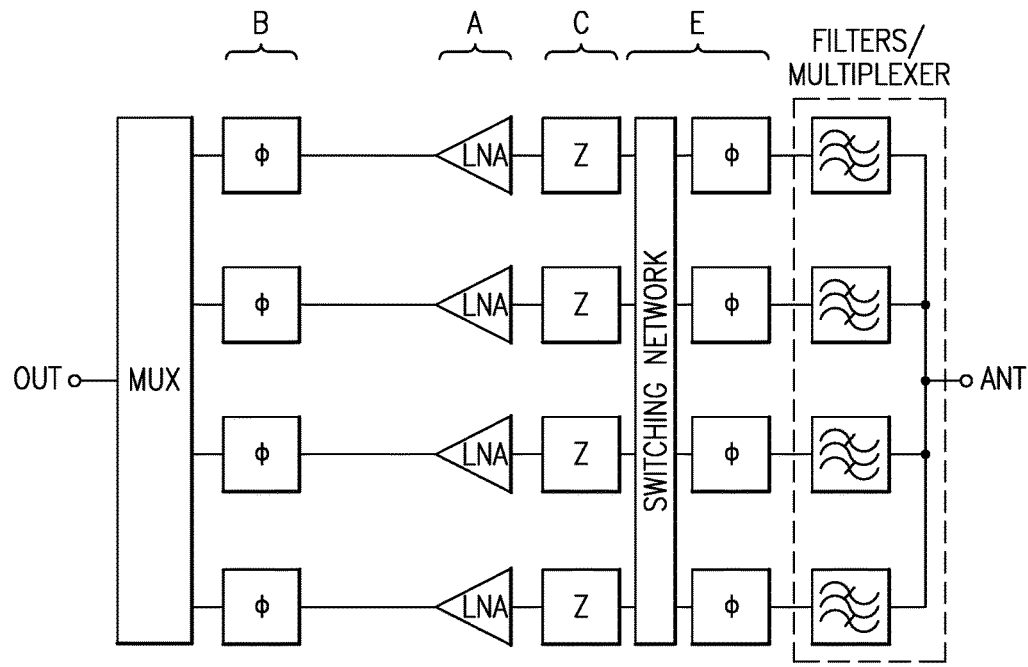

FIGS. 94A and 94B show that in some embodiments, a diversity receiver configuration may include one or more features of Example A as described herein, one or more features of Example B as described herein, one or more features of Example C as described herein, and one or more features of Example E as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 95A:
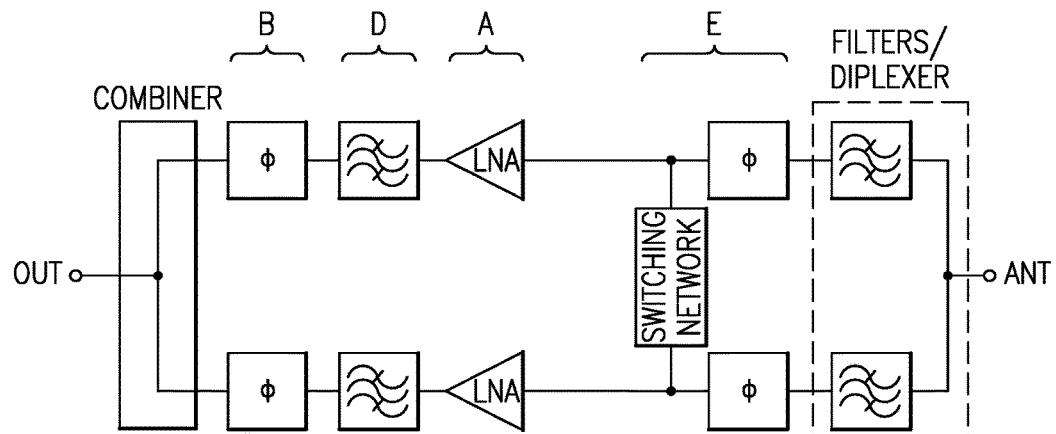
FIGS. 95A and 95B show that in some embodiments, a diversity receiver configuration may include one or more features of Example A as described herein, one or more features of Example B as described herein, one or more features of Example D as described herein, and one or more features of Example E as described herein.
Figure 95B:
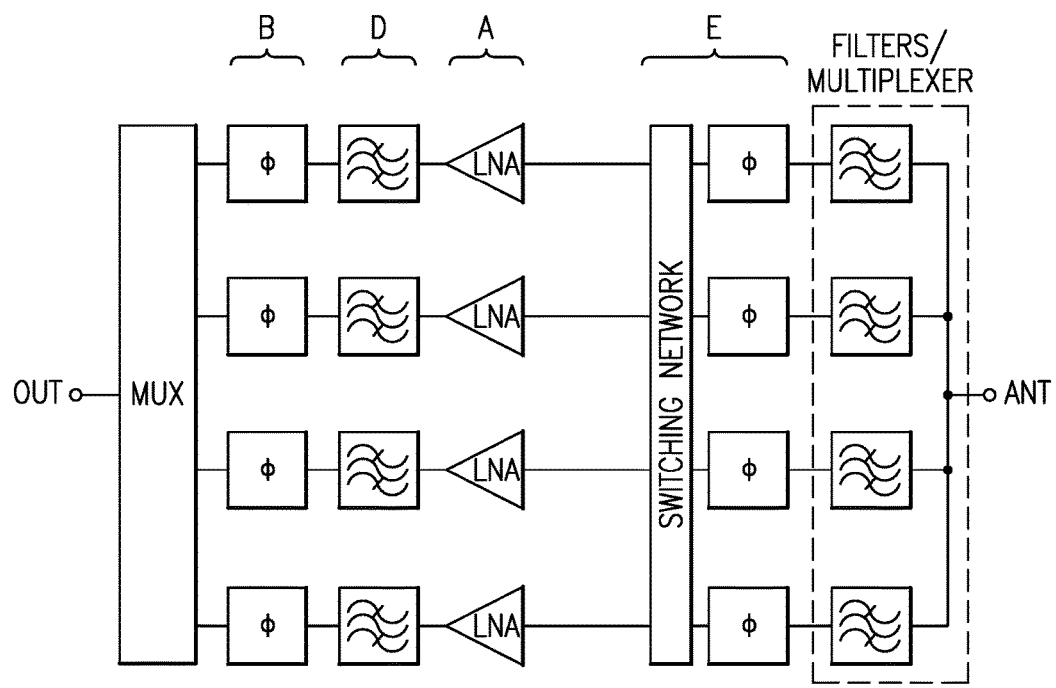

FIGS. 95A and 95B show that in some embodiments, a diversity receiver configuration may include one or more features of Example A as described herein, one or more features of Example B as described herein, one or more features of Example D as described herein, and one or more features of Example E as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 96A:
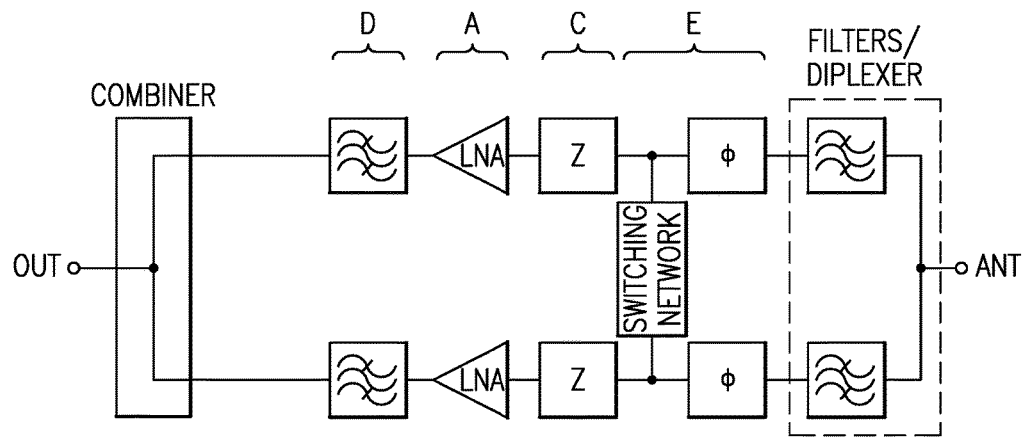
FIGS. 96A and 96B show that in some embodiments, a diversity receiver configuration may include one or more features of Example A as described herein, one or more features of Example C as described herein, one or more features of Example D as described herein, and one or more features of Example E as described herein.
Figure 96B:
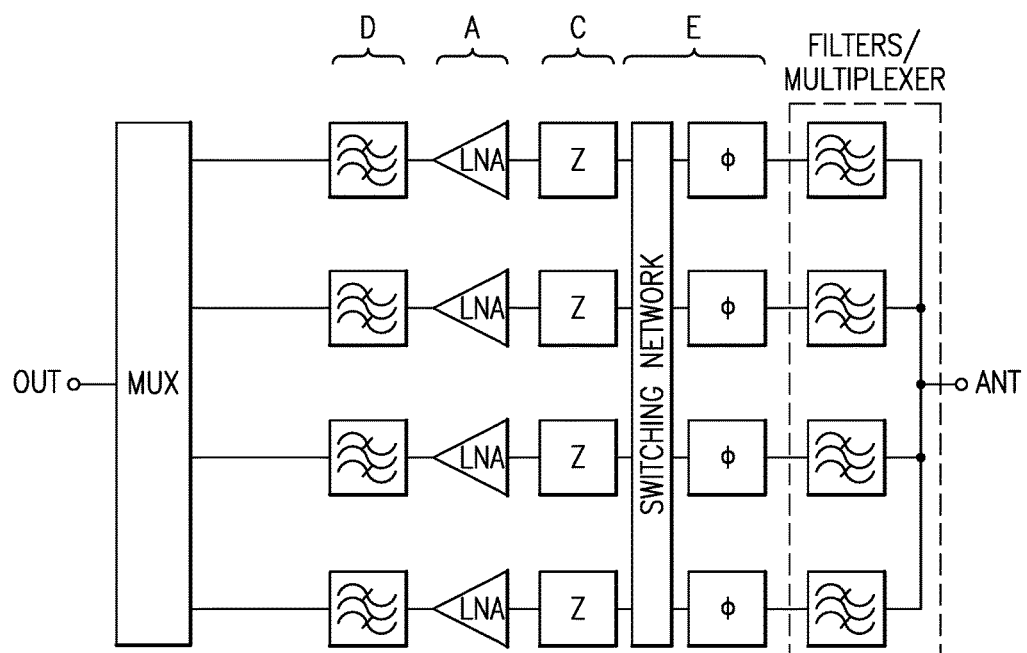

FIGS. 96A and 96B show that in some embodiments, a diversity receiver configuration may include one or more features of Example A as described herein, one or more features of Example C as described herein, one or more features of Example D as described herein, and one or more features of Example E as described herein. Additional details related to Example A are described herein in reference to various figures, including FIGS. 37-41, 42-46 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 97A:
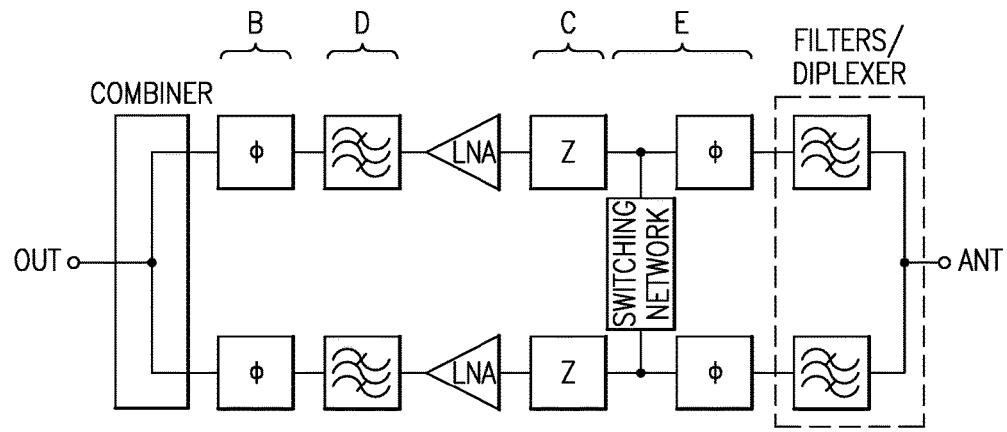
FIGS. 97A and 97B show that in some embodiments, a diversity receiver configuration may include one or more features of Example B as described herein, one or more features of Example C as described herein, one or more features of Example D as described herein, and one or more features of Example E as described herein.
Figure 97B:
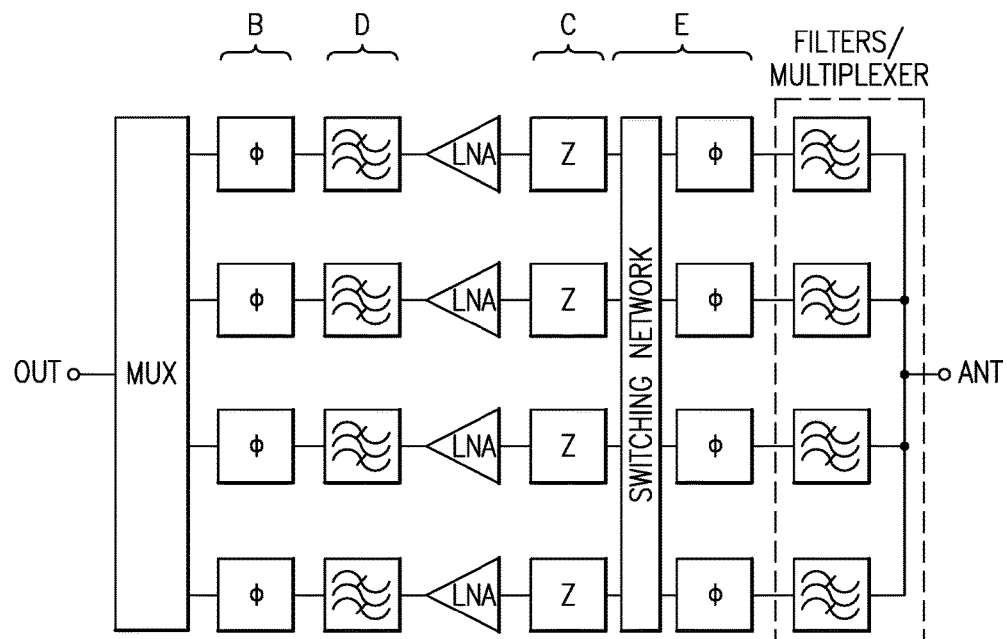

FIGS. 97A and 97B show that in some embodiments, a diversity receiver configuration may include one or more features of Example B as described herein, one or more features of Example C as described herein, one or more features of Example D as described herein, and one or more features of Example E as described herein. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 98A:
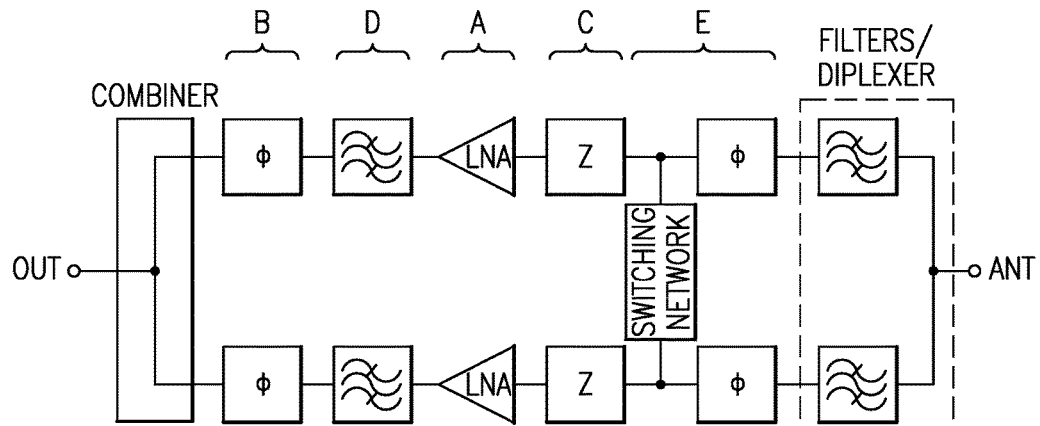
FIGS. 98A and 98B show that in some embodiments, a diversity receiver configuration may include one or more features of Example A as described herein, one or more features of Example B as described herein, one or more features of Example C as described herein, one or more features of Example D as described herein, and one or more features of Example E as described herein.
Figure 98B:
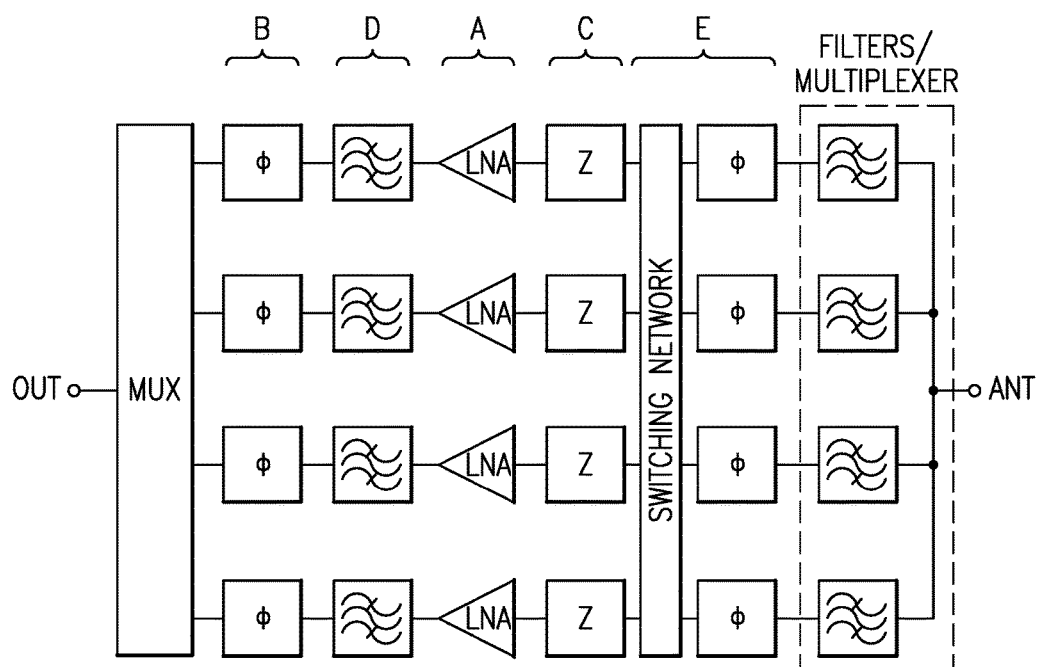

FIGS. 98A and 98B show that in some embodiments, a diversity receiver configuration may include one or more features of Example A as described herein, one or more features of Example B as described herein, one or more features of Example C as described herein, one or more features of Example D as described herein, and one or more features of Example E as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 99:
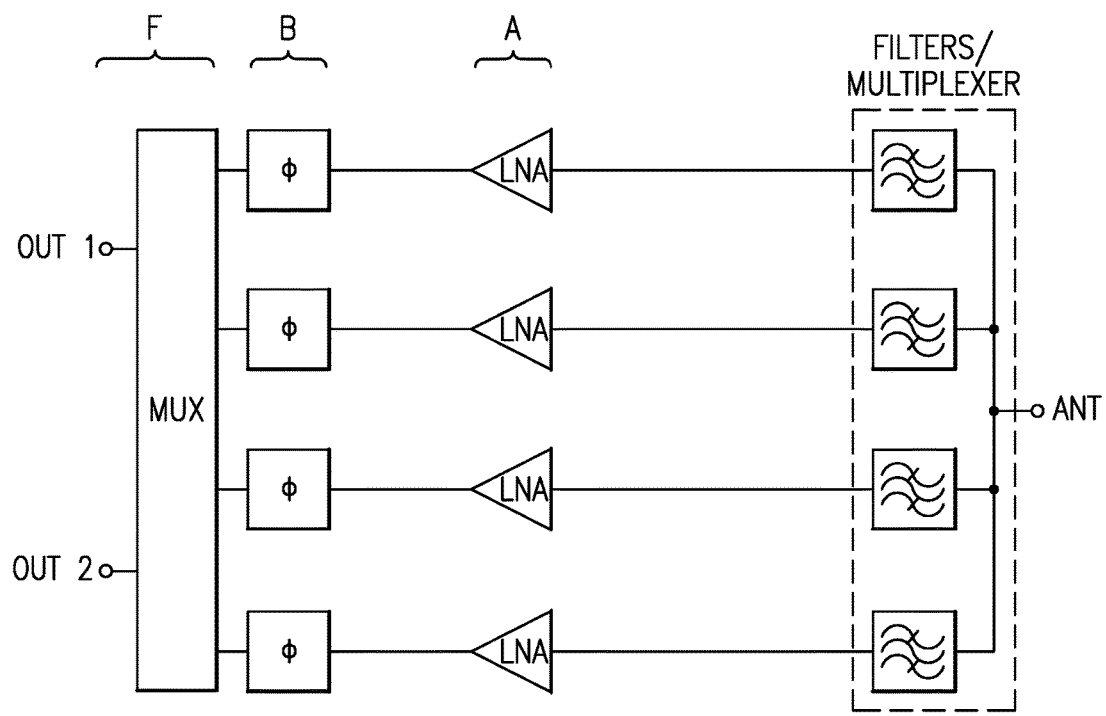
FIG. 99 shows that in some embodiments, a diversity receiver configuration may include one or more features of Example A as described herein, one or more features of Example B as described herein, and one or more features of Example F as described herein.

FIG. 99 shows that in some embodiments, a diversity receiver configuration may include one or more features of Example A as described herein, one or more features of Example B as described herein, and one or more features of Example F as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 100:
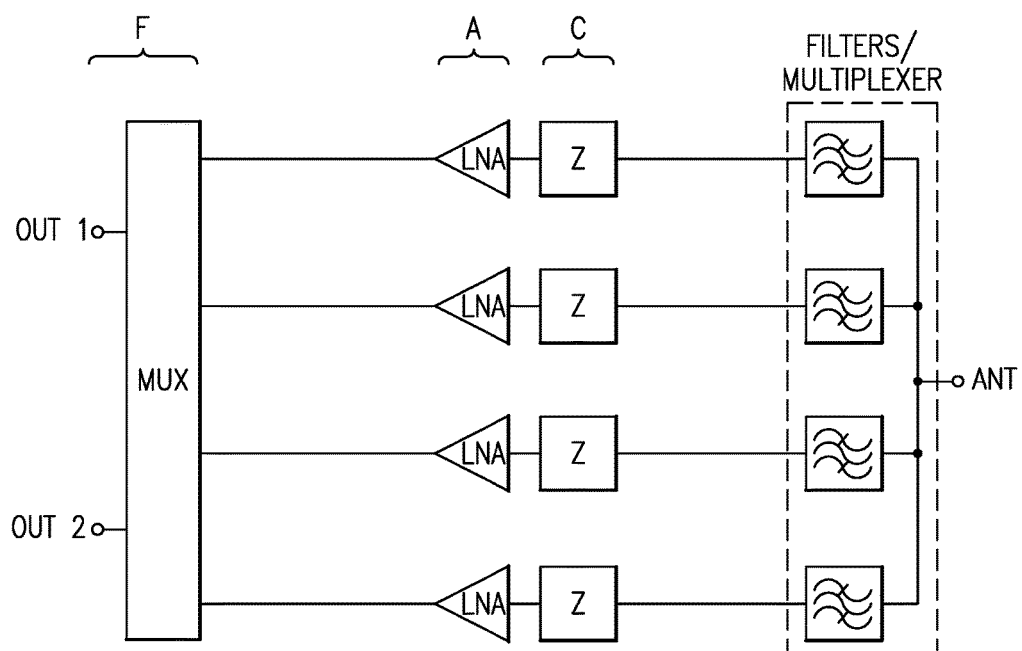
FIG. 100 shows that in some embodiments, a diversity receiver configuration may include one or more features of Example A as described herein, one or more features of Example C as described herein, and one or more features of Example F as described herein.

FIG. 100 shows that in some embodiments, a diversity receiver configuration may include one or more features of Example A as described herein, one or more features of Example C as described herein, and one or more features of Example F as described herein. Additional details related to Example A are described herein in reference to various figures, including FIGS. 37-41, 42-46 and 134-136. Additional details related to Example C are described herein in reference to various figures, including FIGS. 37-41, 51, 52, 53-55 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 101:
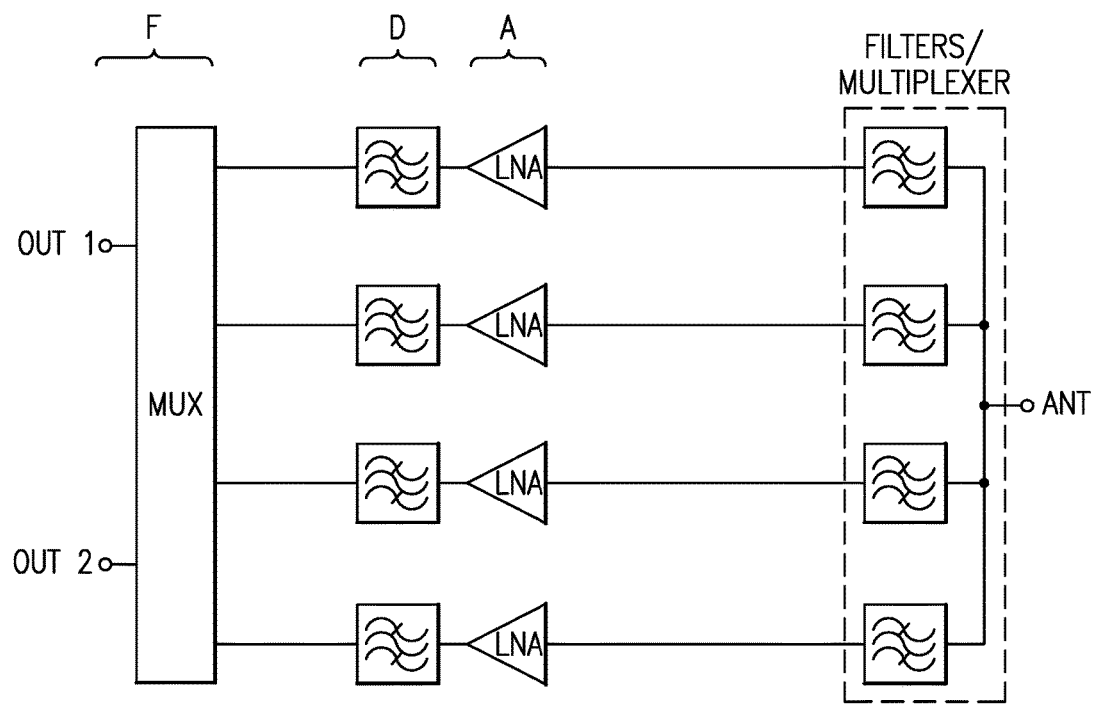
FIG. 101 shows that in some embodiments, a diversity receiver configuration may include one or more features of Example A as described herein, one or more features of Example D as described herein, and one or more features of Example F as described herein.

FIG. 101 shows that in some embodiments, a diversity receiver configuration may include one or more features of Example A as described herein, one or more features of Example D as described herein, and one or more features of Example F as described herein. Additional details related to Example A are described herein in reference to various figures, including FIGS. 37-41, 42-46 and 134-136. Additional details related to Example D are described herein in reference to various figures, including FIGS. 37-41, 56-59 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 102:
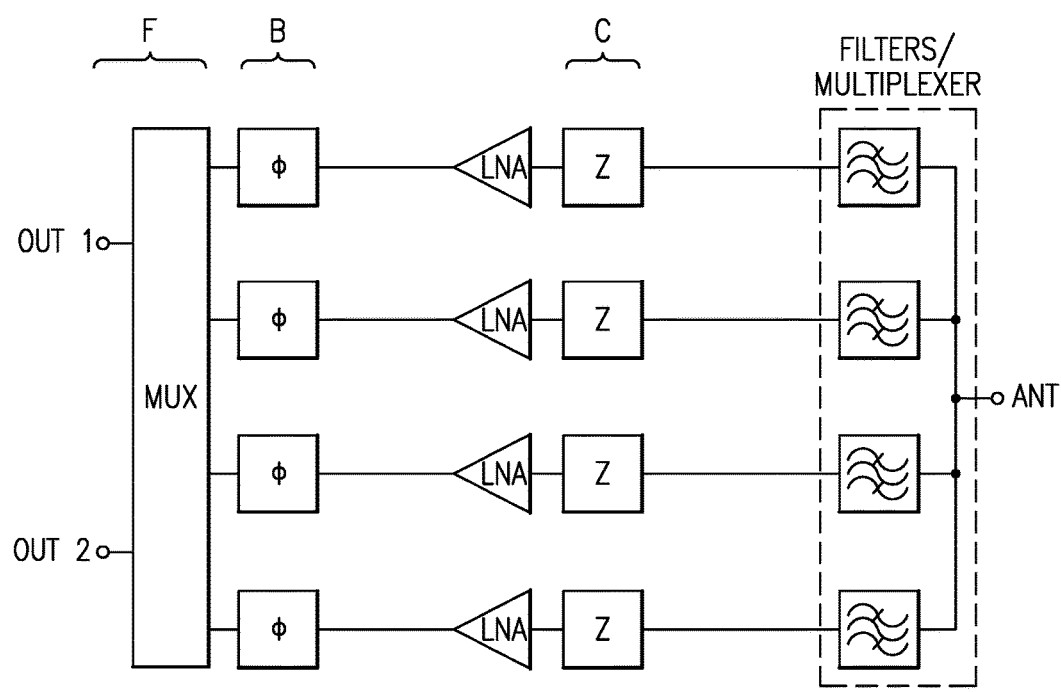
FIG. 102 shows that in some embodiments, a diversity receiver configuration may include one or more features of Example B as described herein, one or more features of Example C as described herein, and one or more features of Example F as described herein.

FIG. 102 shows that in some embodiments, a diversity receiver configuration may include one or more features of Example B as described herein, one or more features of Example C as described herein, and one or more features of Example F as described herein. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 103:
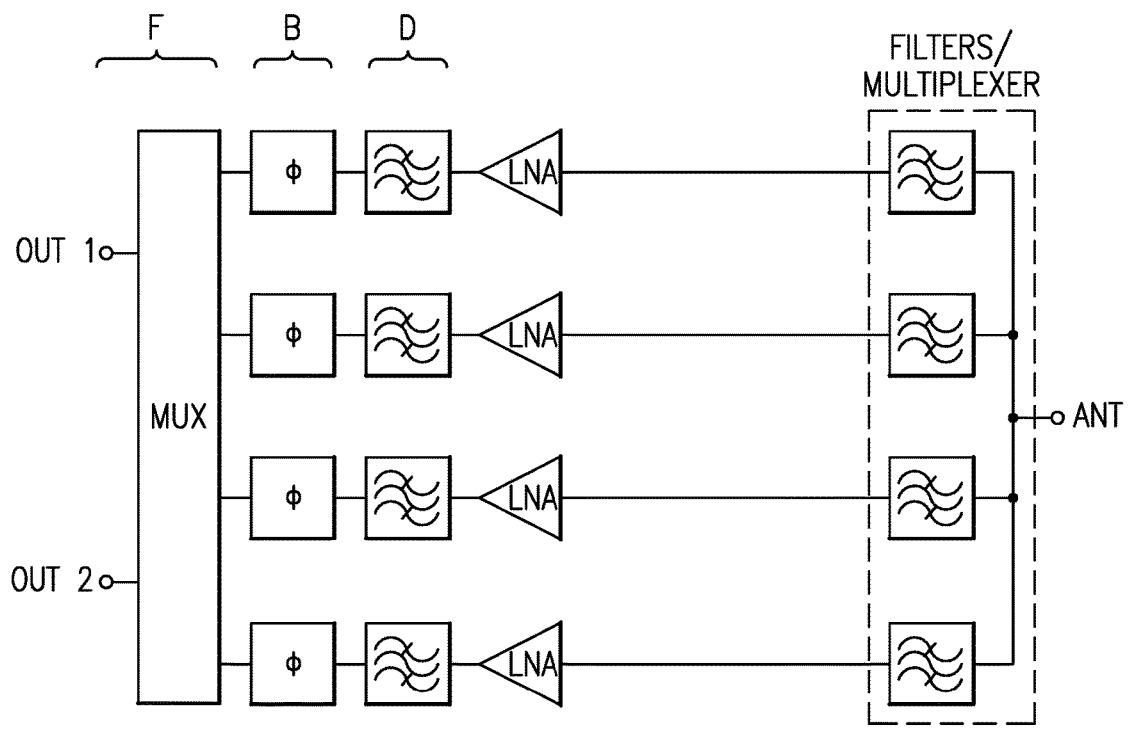
FIG. 103 shows that in some embodiments, a diversity receiver configuration may include one or more features of Example B as described herein, one or more features of Example D as described herein, and one or more features of Example F as described herein.

FIG. 103 shows that in some embodiments, a diversity receiver configuration may include one or more features of Example B as described herein, one or more features of Example D as described herein, and one or more features of Example F as described herein. Additional details related to Example B are described herein in reference to various figures, including FIGS. 37-41, 47-50, 53-55 and 134-136. Additional details related to Example D are described herein in reference to various figures, including FIGS. 37-41, 56-59 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 104:
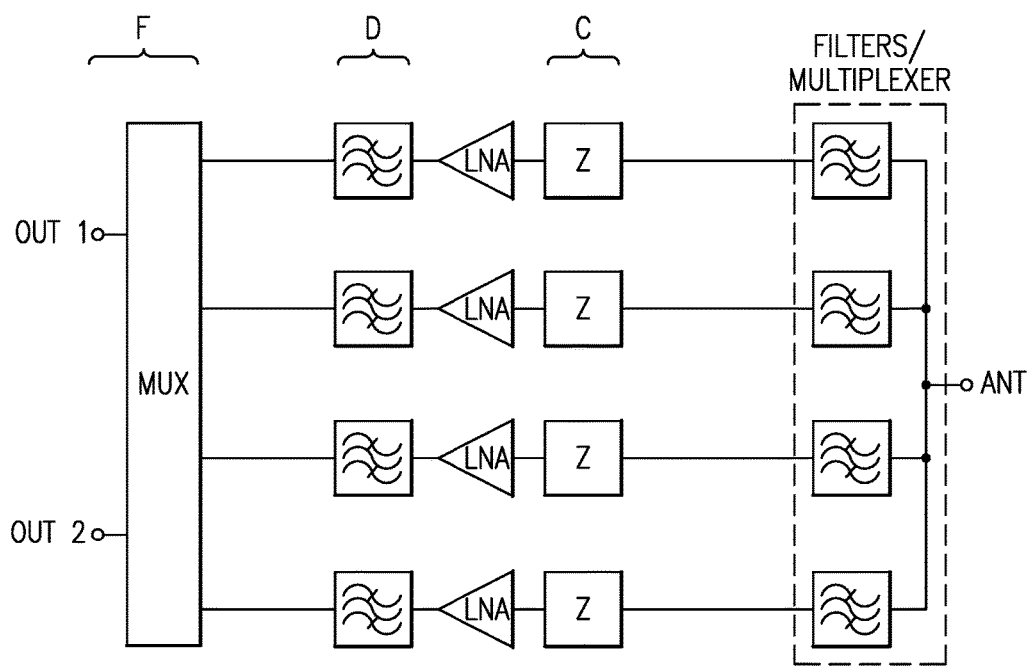
FIG. 104 shows that in some embodiments, a diversity receiver configuration may include one or more features of Example C as described herein, one or more features of Example D as described herein, and one or more features of Example F as described herein.

FIG. 104 shows that in some embodiments, a diversity receiver configuration may include one or more features of Example C as described herein, one or more features of Example D as described herein, and one or more features of Example F as described herein. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 105:
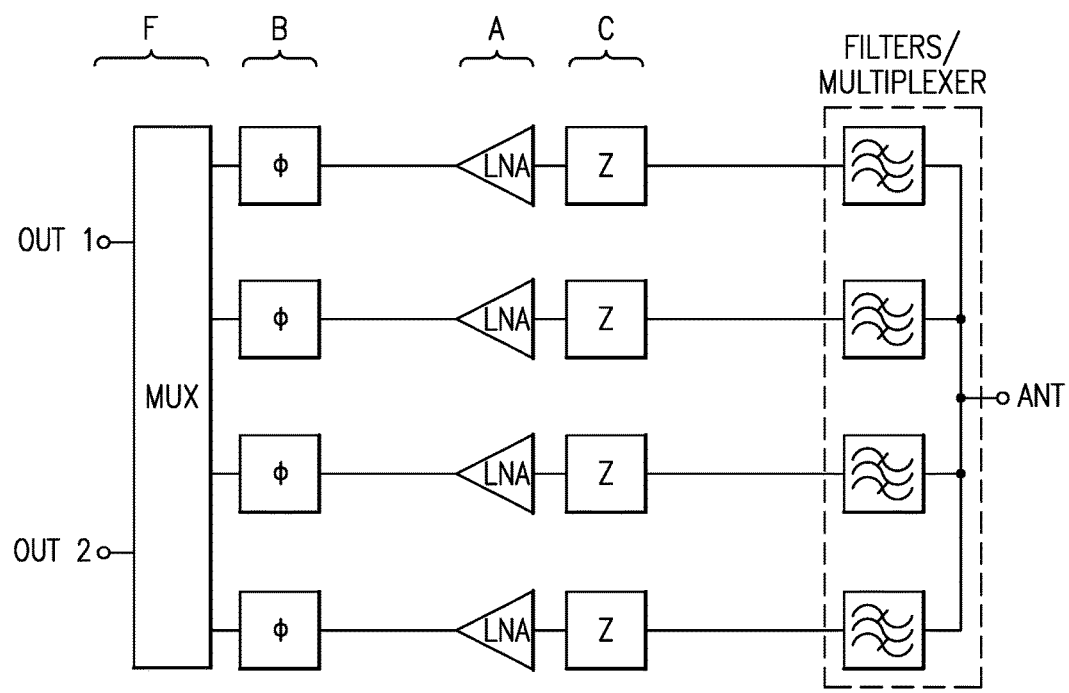
FIG. 105 shows that in some embodiments, a diversity receiver configuration may include one or more features of Example A as described herein, one or more features of Example B as described herein, one or more features of Example C as described herein, and one or more features of Example F as described herein.

FIG. 105 shows that in some embodiments, a diversity receiver configuration may include one or more features of Example A as described herein, one or more features of Example B as described herein, one or more features of Example C as described herein, and one or more features of Example F as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 106:
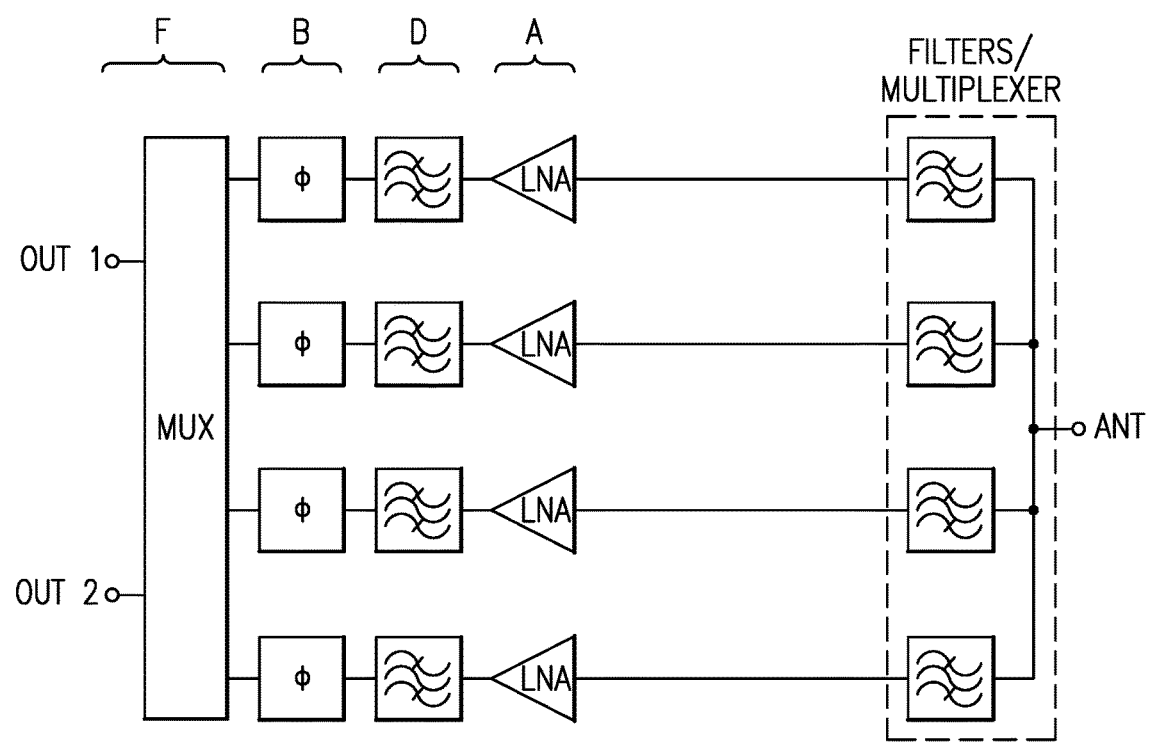
FIG. 106 shows that in some embodiments, a diversity receiver configuration may include one or more features of Example A as described herein, one or more features of Example B as described herein, one or more features of Example D as described herein, and one or more features of Example F as described herein.

FIG. 106 shows that in some embodiments, a diversity receiver configuration may include one or more features of Example A as described herein, one or more features of Example B as described herein, one or more features of Example D as described herein, and one or more features of Example F as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example D are described herein in reference to various figures, including FIGS. 37-41, 56-59 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 107:
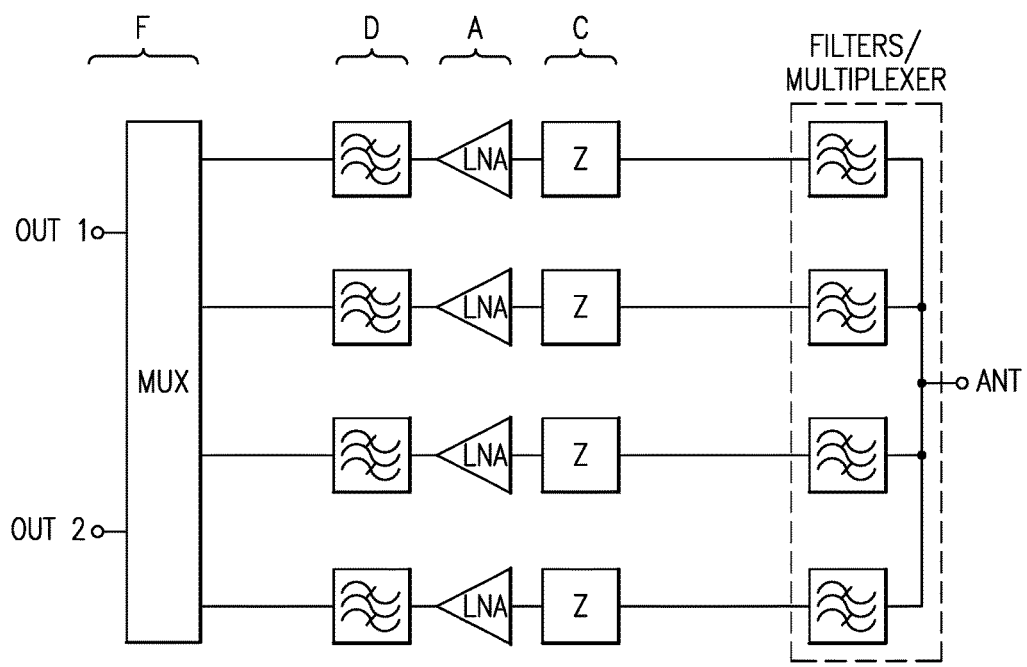
FIG. 107 shows that in some embodiments, a diversity receiver configuration may include one or more features of Example A as described herein, one or more features of Example C as described herein, one or more features of Example D as described herein, and one or more features of Example F as described herein.

FIG. 107 shows that in some embodiments, a diversity receiver configuration may include one or more features of Example A as described herein, one or more features of Example C as described herein, one or more features of Example D as described herein, and one or more features of Example F as described herein. Additional details related to Example A are described herein in reference to various figures, including FIGS. 37-41, 42-46 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 108:
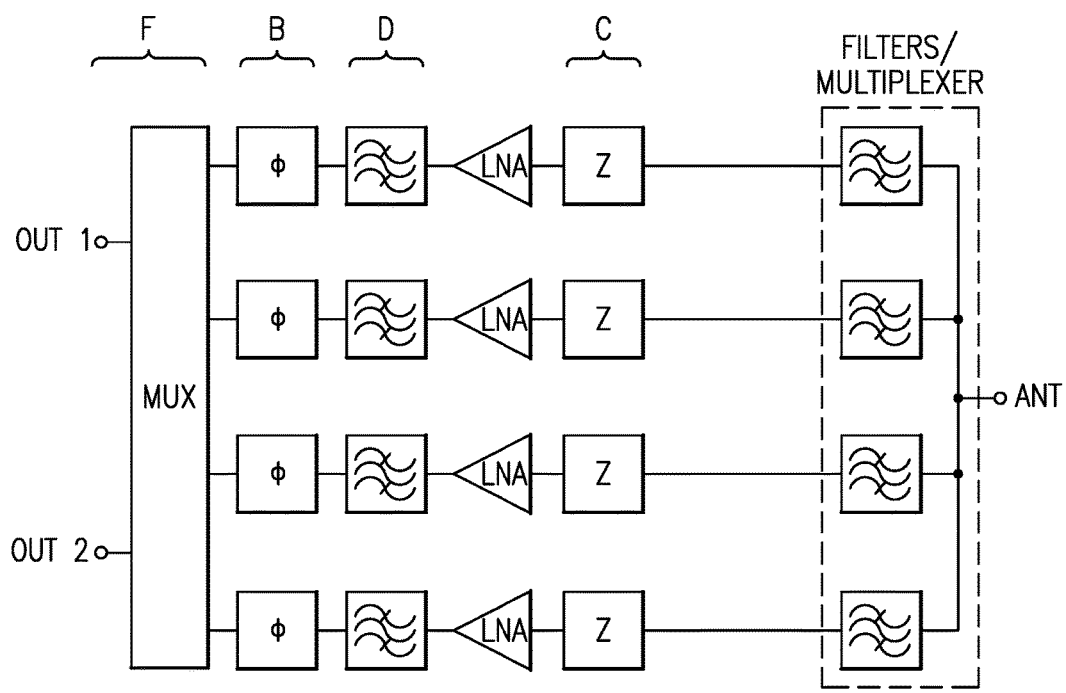
FIG. 108 shows that in some embodiments, a diversity receiver configuration may include one or more features of Example B as described herein, one or more features of Example C as described herein, one or more features of Example D as described herein, and one or more features of Example F as described herein.

FIG. 108 shows that in some embodiments, a diversity receiver configuration may include one or more features of Example B as described herein, one or more features of Example C as described herein, one or more features of Example D as described herein, and one or more features of Example F as described herein. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 109:
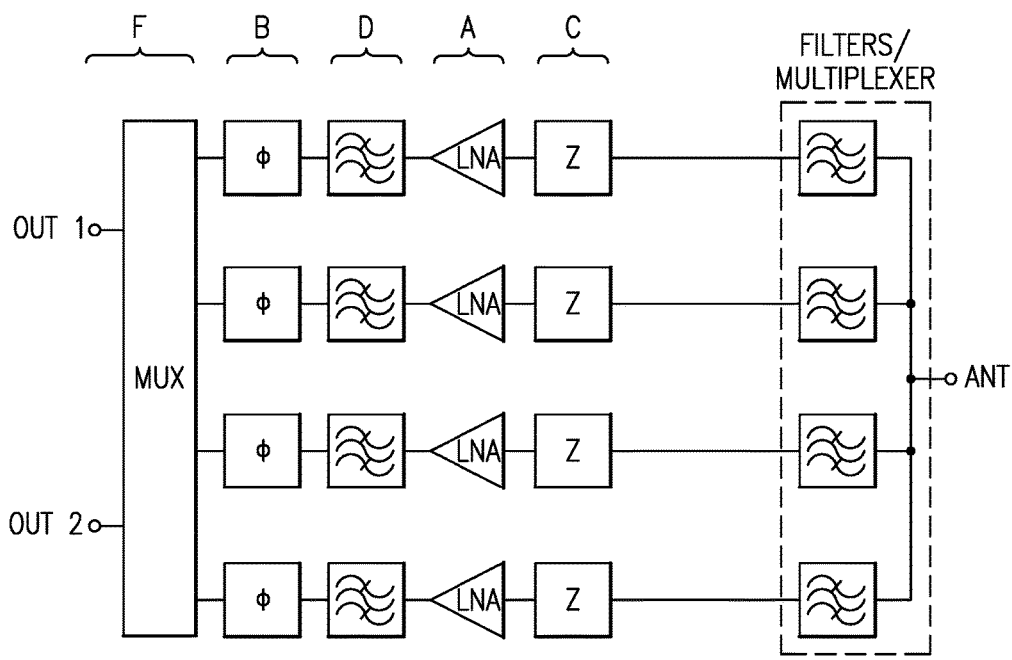
FIG. 109 shows that in some embodiments, a diversity receiver configuration may include one or more features of Example A as described herein, one or more features of Example B as described herein, one or more features of Example C as described herein, one or more features of Example D as described herein, and one or more features of Example F as described herein.

FIG. 109 shows that in some embodiments, a diversity receiver configuration may include one or more features of Example A as described herein, one or more features of Example B as described herein, one or more features of Example C as described herein, one or more features of Example D as described herein, and one or more features of Example F as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 110:
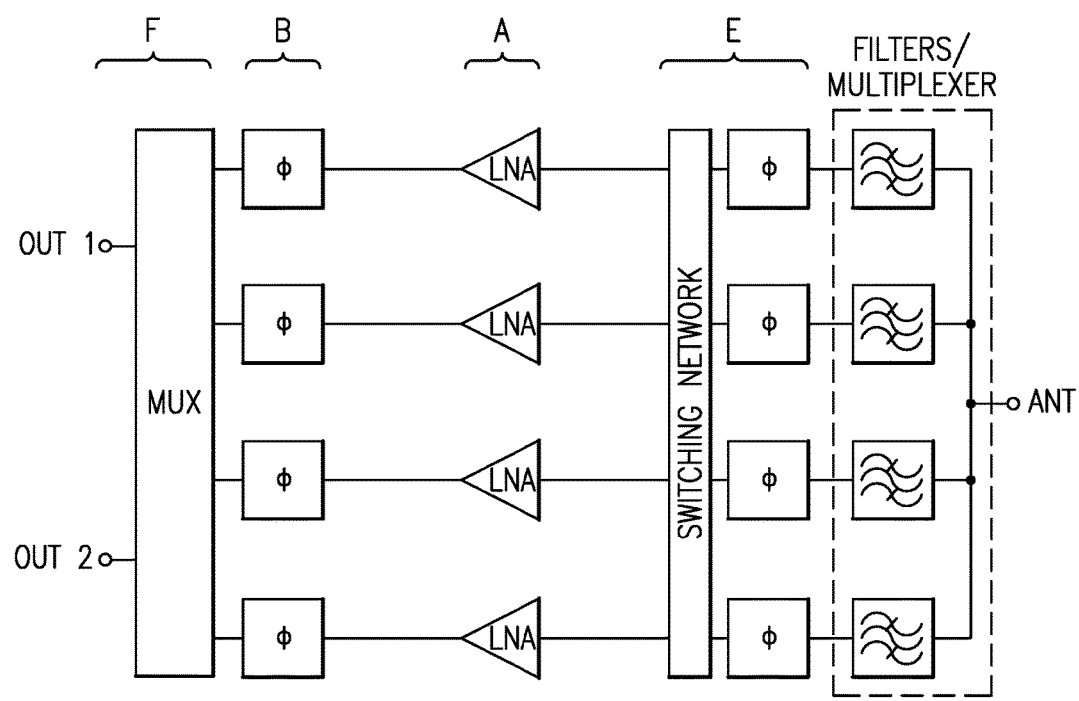
FIG. 110 shows that in some embodiments, a diversity receiver configuration may include one or more features of Example A as described herein, one or more features of Example B as described herein, one or more features of Example E as described herein, and one or more features of Example F as described herein.

FIG. 110 shows that in some embodiments, a diversity receiver configuration may include one or more features of Example A as described herein, one or more features of Example B as described herein, one or more features of Example E as described herein, and one or more features of Example F as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 111:
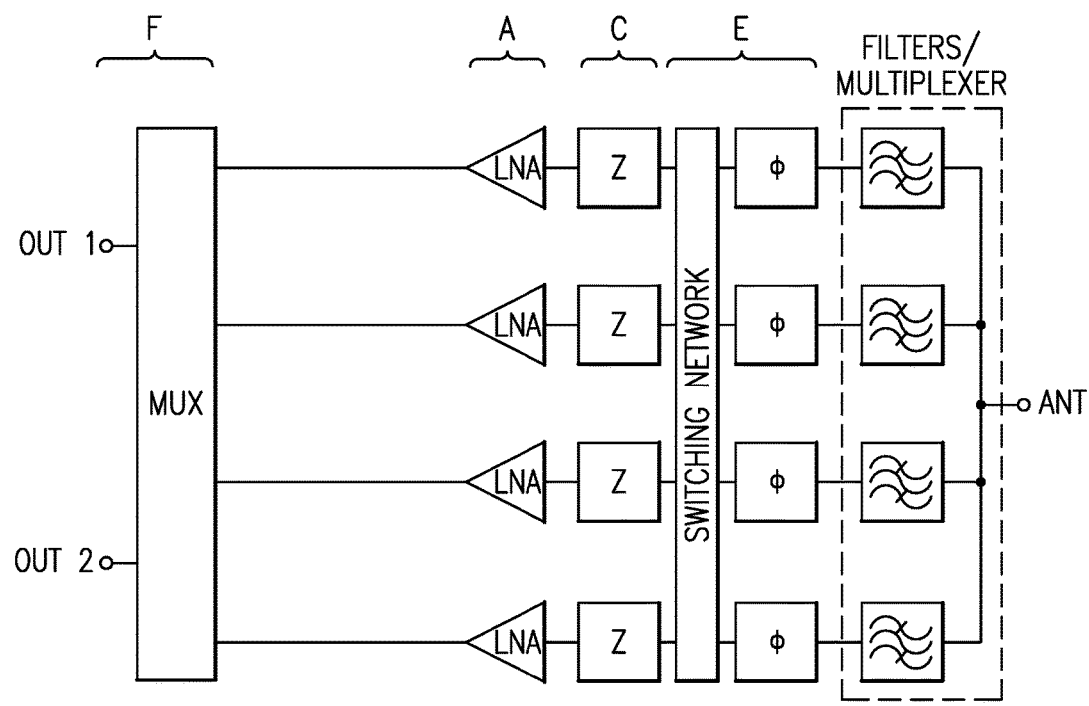
FIG. 111 shows that in some embodiments, a diversity receiver configuration may include one or more features of Example A as described herein, one or more features of Example C as described herein, one or more features of Example E as described herein, and one or more features of Example F as described herein.

FIG. 111 shows that in some embodiments, a diversity receiver configuration may include one or more features of Example A as described herein, one or more features of Example C as described herein, one or more features of Example E as described herein, and one or more features of Example F as described herein. Additional details related to Example A are described herein in reference to various figures, including FIGS. 37-41, 42-46 and 134-136. Additional details related to Example C are described herein in reference to various figures, including FIGS. 37-41, 51, 52, 53-55 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 112:
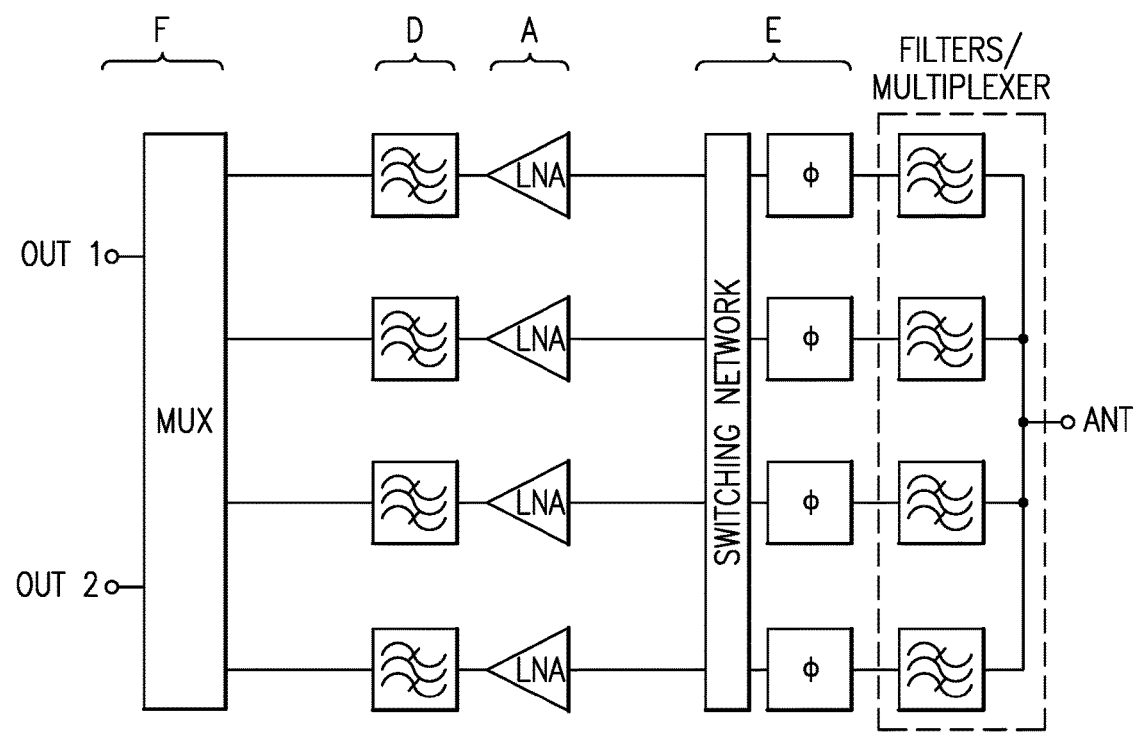
FIG. 112 shows that in some embodiments, a diversity receiver configuration may include one or more features of Example A as described herein, one or more features of Example D as described herein, one or more features of Example E as described herein, and one or more features of Example F as described herein.

FIG. 112 shows that in some embodiments, a diversity receiver configuration may include one or more features of Example A as described herein, one or more features of Example D as described herein, one or more features of Example E as described herein, and one or more features of Example F as described herein. Additional details related to Example A are described herein in reference to various figures, including FIGS. 37-41, 42-46 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 113:
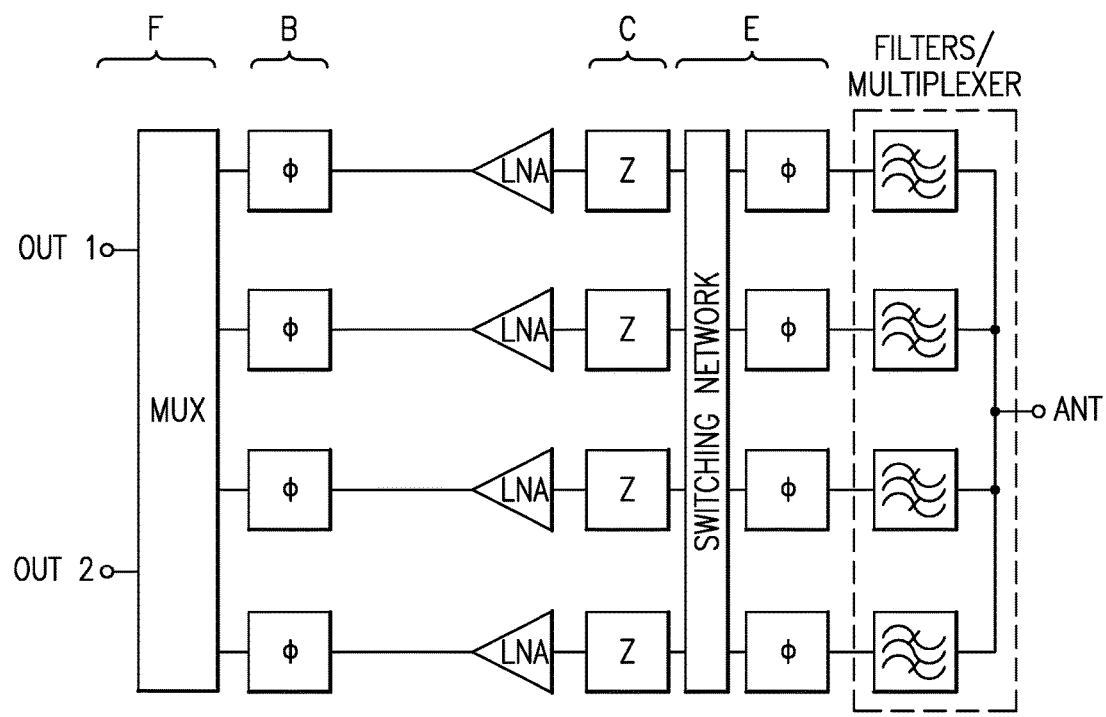
FIG. 113 shows that in some embodiments, a diversity receiver configuration may include one or more features of Example B as described herein, one or more features of Example C as described herein, one or more features of Example E as described herein, and one or more features of Example F as described herein.

FIG. 113 shows that in some embodiments, a diversity receiver configuration may include one or more features of Example B as described herein, one or more features of Example C as described herein, one or more features of Example E as described herein, and one or more features of Example F as described herein. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 114:
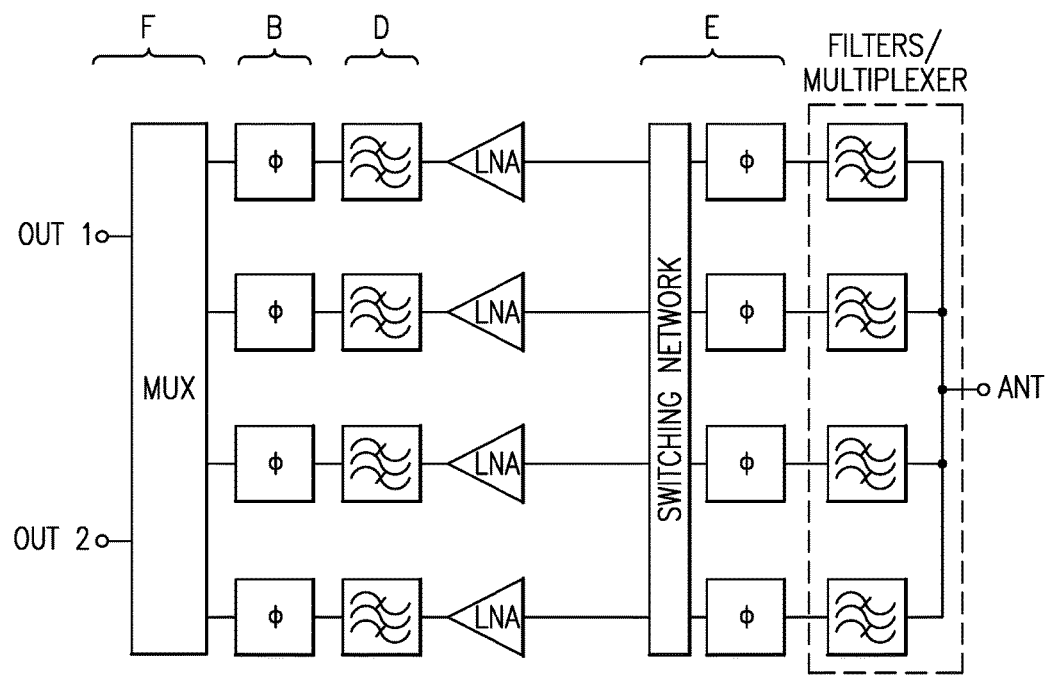
FIG. 114 shows that in some embodiments, a diversity receiver configuration may include one or more features of Example B as described herein, one or more features of Example D as described herein, one or more features of Example E as described herein, and one or more features of Example F as described herein.

FIG. 114 shows that in some embodiments, a diversity receiver configuration may include one or more features of Example B as described herein, one or more features of Example D as described herein, one or more features of Example E as described herein, and one or more features of Example F as described herein. Additional details related to Example B are described herein in reference to various figures, including FIGS. 37-41, 47-50, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 115:
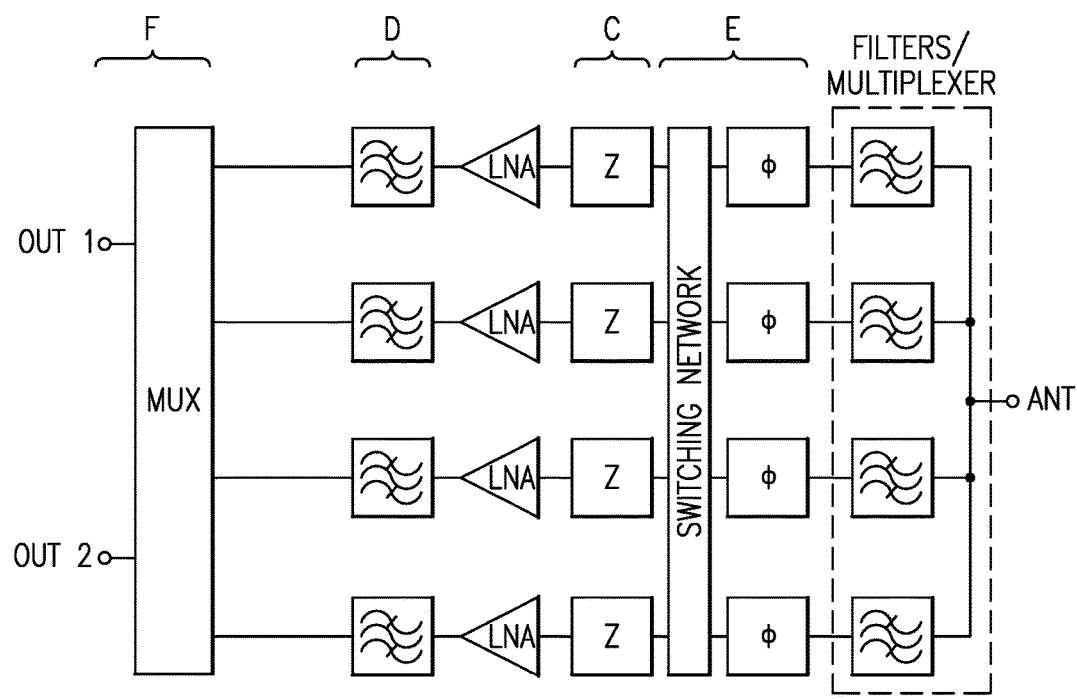
FIG. 115 shows that in some embodiments, a diversity receiver configuration may include one or more features of Example C as described herein, one or more features of Example D as described herein, one or more features of Example E as described herein, and one or more features of Example F as described herein.

FIG. 115 shows that in some embodiments, a diversity receiver configuration may include one or more features of Example C as described herein, one or more features of Example D as described herein, one or more features of Example E as described herein, and one or more features of Example F as described herein. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 116:
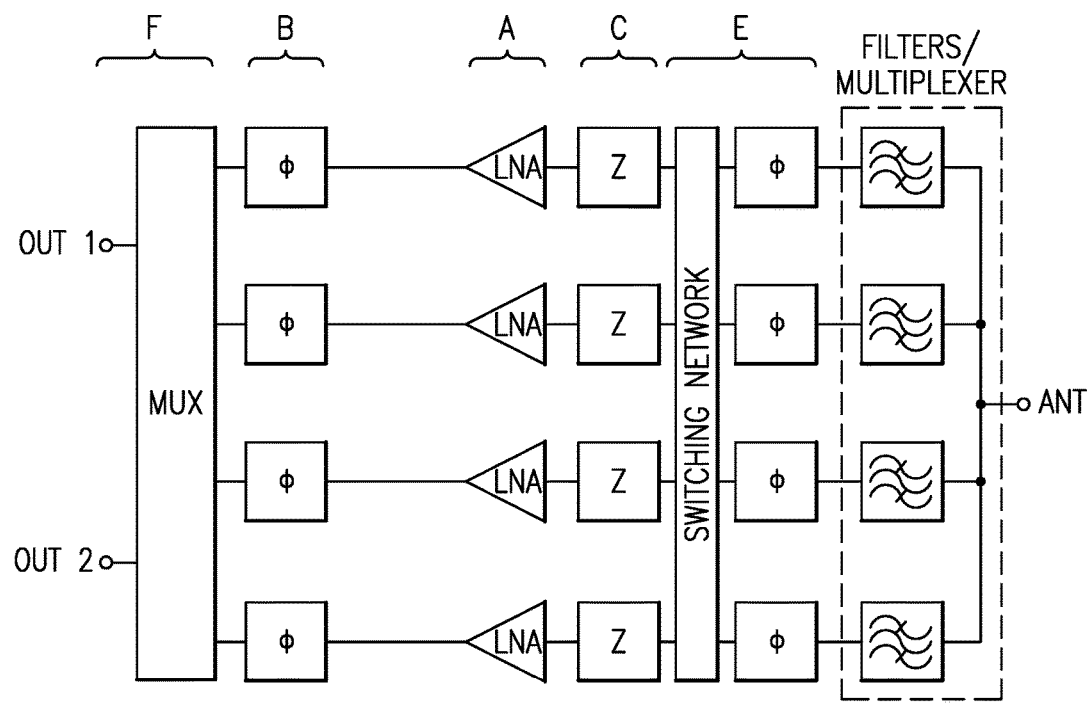
FIG. 116 shows that in some embodiments, a diversity receiver configuration may include one or more features of Example A as described herein, one or more features of Example B as described herein, one or more features of Example C as described herein, one or more features of Example E as described herein, and one or more features of Example F as described herein.

FIG. 116 shows that in some embodiments, a diversity receiver configuration may include one or more features of Example A as described herein, one or more features of Example B as described herein, one or more features of Example C as described herein, one or more features of Example E as described herein, and one or more features of Example F as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 117:
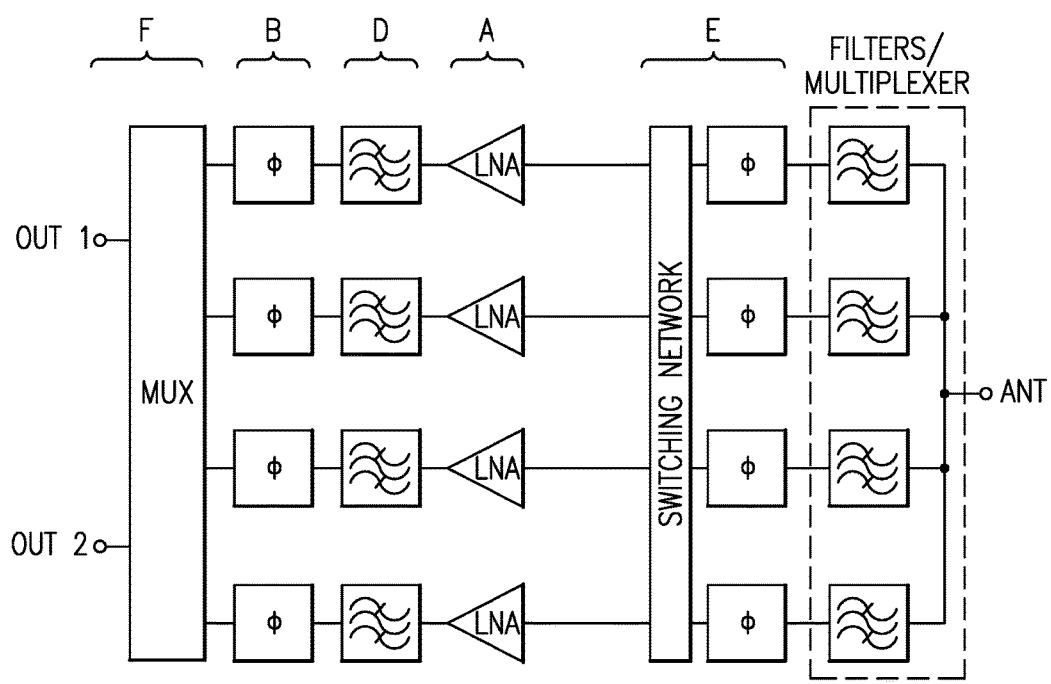
FIG. 117 shows that in some embodiments, a diversity receiver configuration may include one or more features of Example A as described herein, one or more features of Example B as described herein, one or more features of Example D as described herein, one or more features of Example E as described herein, and one or more features of Example F as described herein.

FIG. 117 shows that in some embodiments, a diversity receiver configuration may include one or more features of Example A as described herein, one or more features of Example B as described herein, one or more features of Example D as described herein, one or more features of Example E as described herein, and one or more features of Example F as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 118:
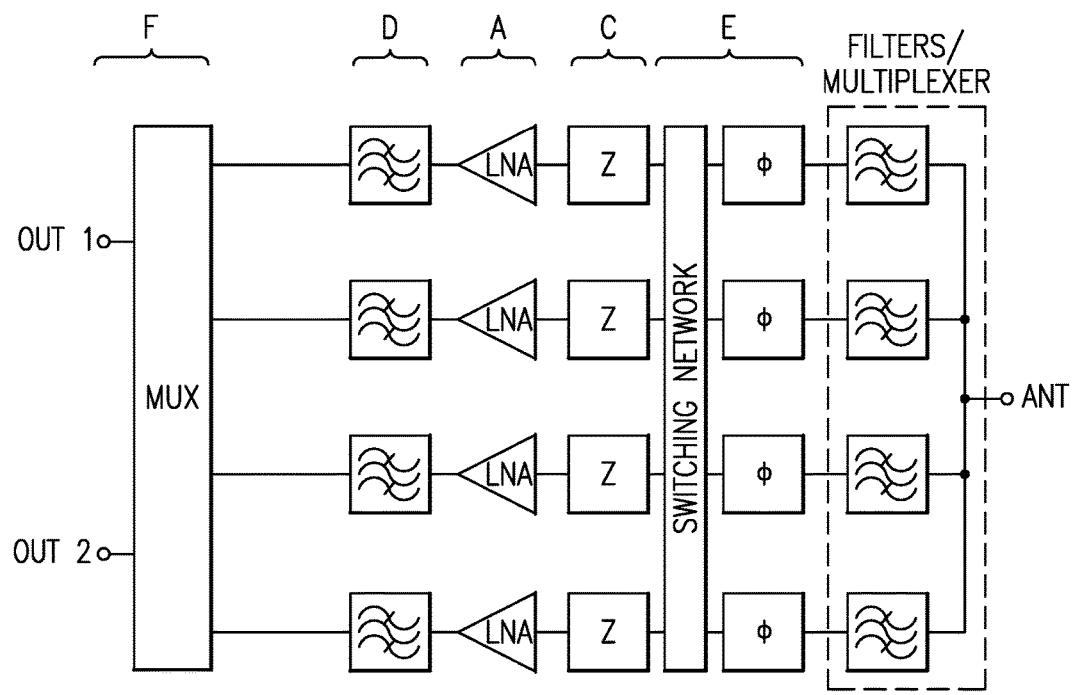
FIG. 118 shows that in some embodiments, a diversity receiver configuration may include one or more features of Example A as described herein, one or more features of Example C as described herein, one or more features of Example D as described herein, one or more features of Example E as described herein, and one or more features of Example F as described herein.

FIG. 118 shows that in some embodiments, a diversity receiver configuration may include one or more features of Example A as described herein, one or more features of Example C as described herein, one or more features of Example D as described herein, one or more features of Example E as described herein, and one or more features of Example F as described herein. Additional details related to Example A are described herein in reference to various figures, including FIGS. 37-41, 42-46 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 119:
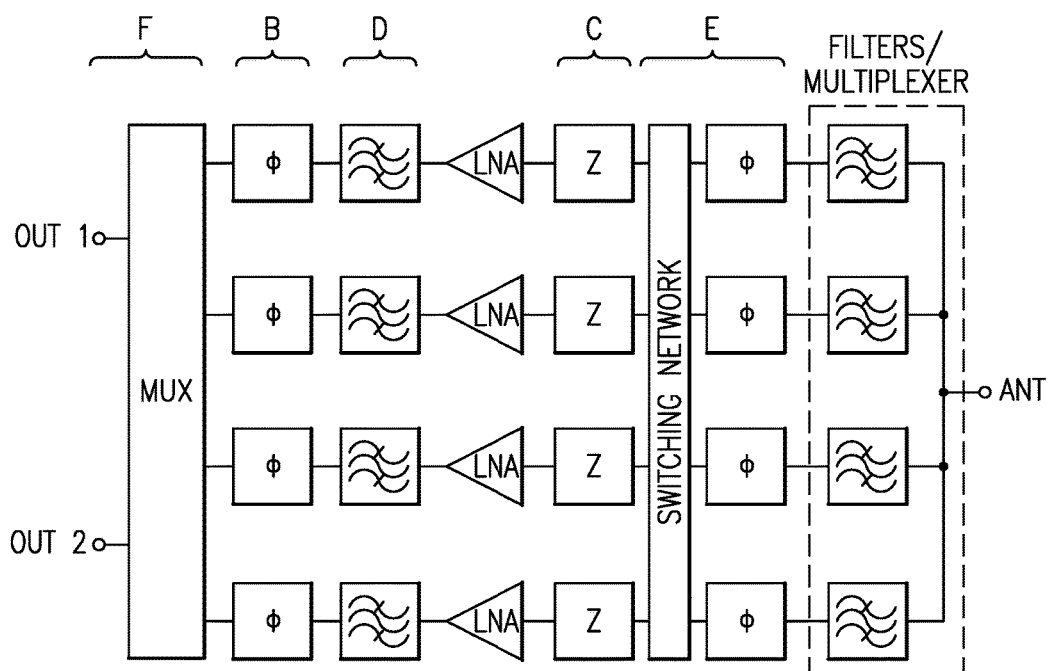
FIG. 119 shows that in some embodiments, a diversity receiver configuration may include one or more features of Example B as described herein, one or more features of Example C as described herein, one or more features of Example D as described herein, one or more features of Example E as described herein, and one or more features of Example F as described herein.

FIG. 119 shows that in some embodiments, a diversity receiver configuration may include one or more features of Example B as described herein, one or more features of Example C as described herein, one or more features of Example D as described herein, one or more features of Example E as described herein, and one or more features of Example F as described herein. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 120:
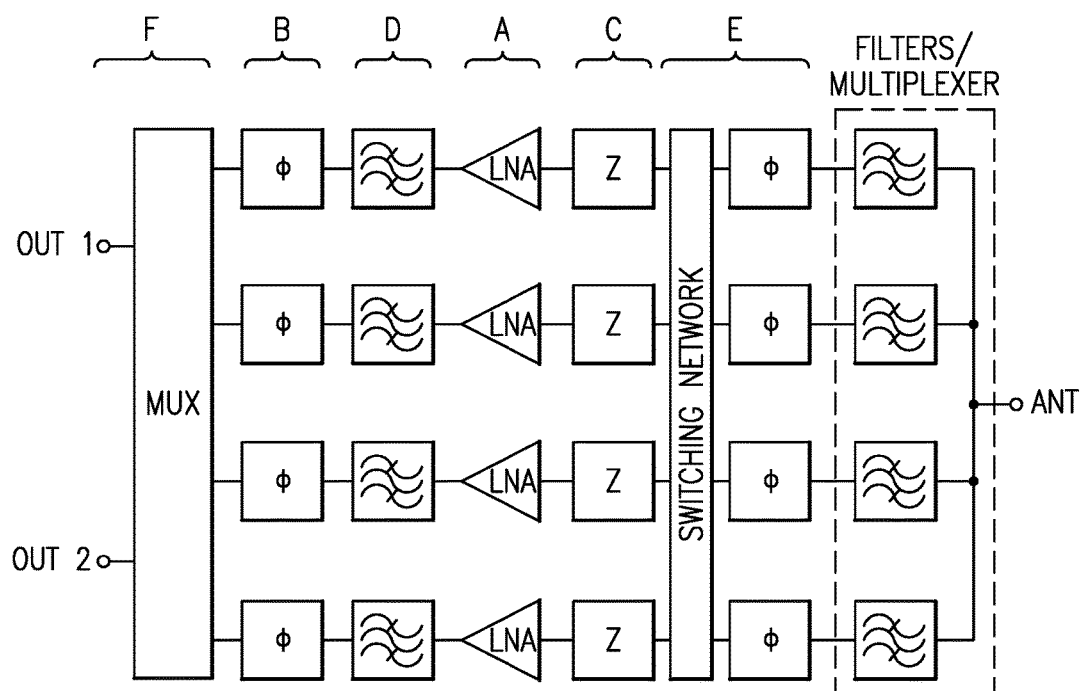
FIG. 120 shows that in some embodiments, a diversity receiver configuration may include one or more features of Example A as described herein, one or more features of Example B as described herein, one or more features of Example C as described herein, one or more features of Example D as described herein, one or more features of Example E as described herein, and one or more features of Example F as described herein.

FIG. 120 shows that in some embodiments, a diversity receiver configuration may include one or more features of Example A as described herein, one or more features of Example B as described herein, one or more features of Example C as described herein, one or more features of Example D as described herein, one or more features of Example E as described herein, and one or more features of Example F as described herein. Additional details related to Example A are described herein in reference to various figures, including FIGS. 37-41, 42-46 and 134-136. Additional details related to Example B are described herein in reference to various figures, including FIGS. 37-41, 47-50, 53-55 and 134-136. Additional details related to Example C are described herein in reference to various figures, including FIGS. 37-41, 51, 52, 53-55 and 134-136. Additional details related to Example D are described herein in reference to various figures, including FIGS. 37-41, 56-59 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 121A:
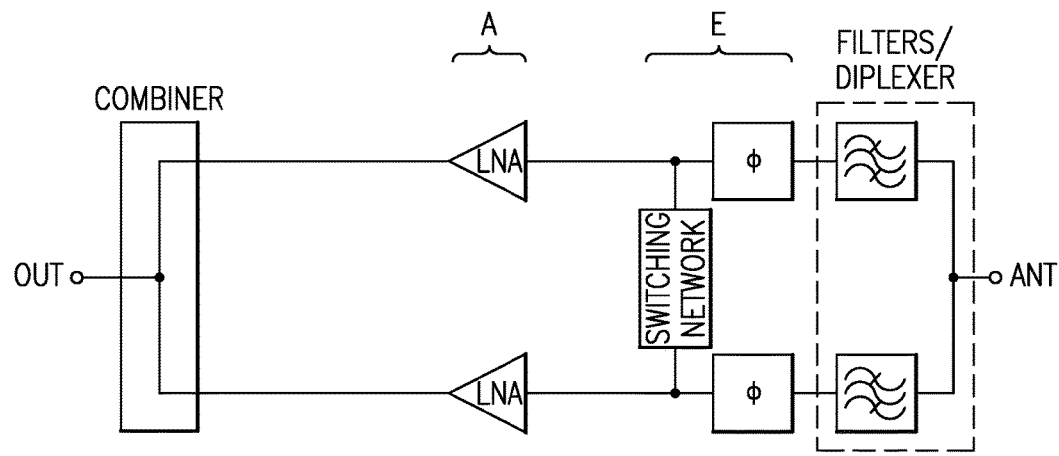
FIGS. 121A and 121B show that in some embodiments, a diversity receiver configuration may include one or more features of Example A as described herein and one or more features of Example E as described herein.
Figure 121B:
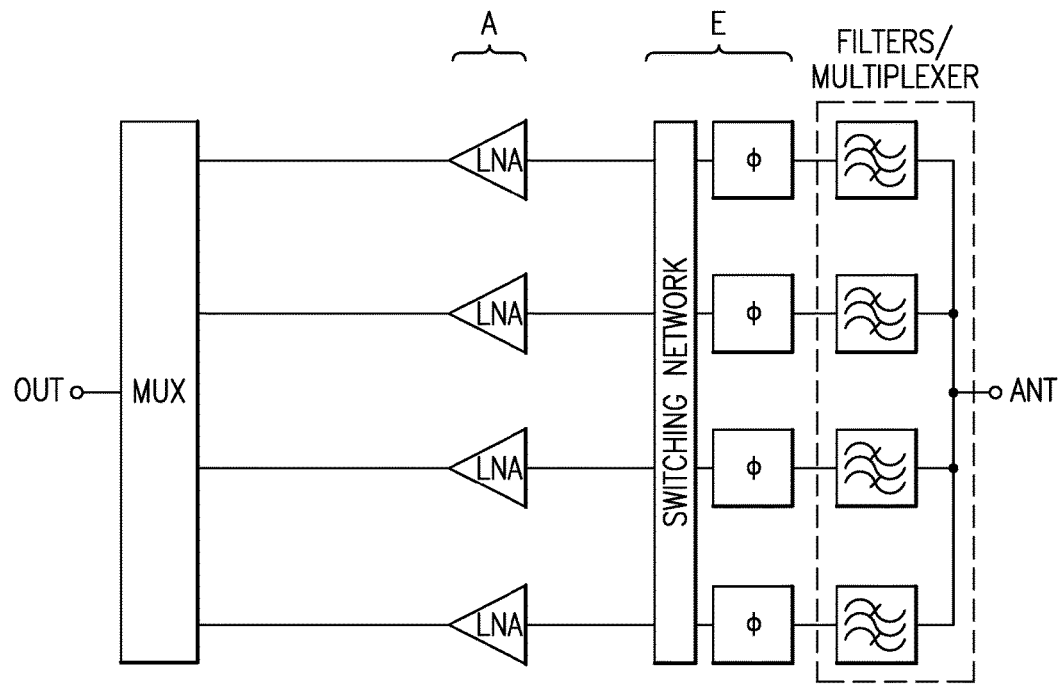

FIGS. 121A and 121B show that in some embodiments, a diversity receiver configuration may include one or more features of Example A as described herein and one or more features of Example E as described herein. Additional details related to Example A are described herein in reference to various figures, including FIGS. 37-41, 42-46 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 122A:
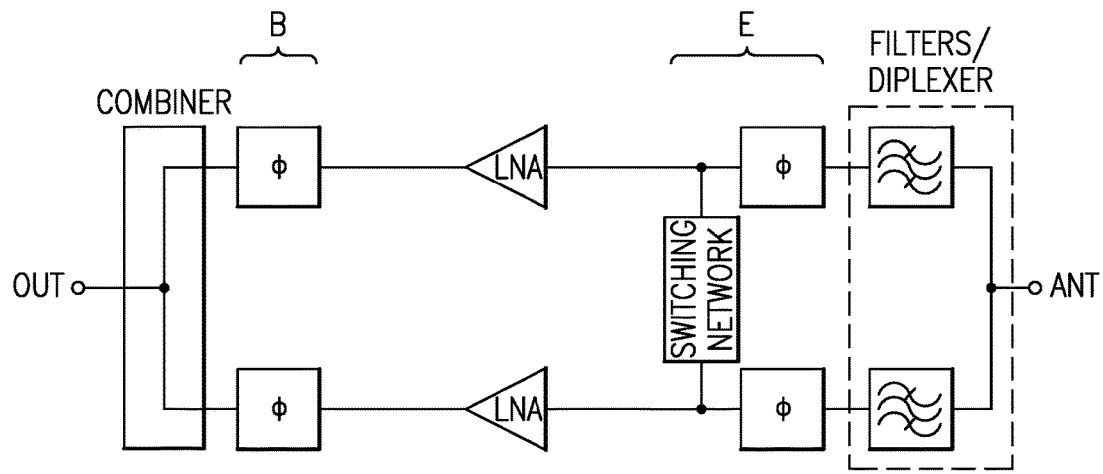
FIGS. 122A and 122B show that in some embodiments, a diversity receiver configuration may include one or more features of Example B as described herein and one or more features of Example E as described herein.
Figure 122B:
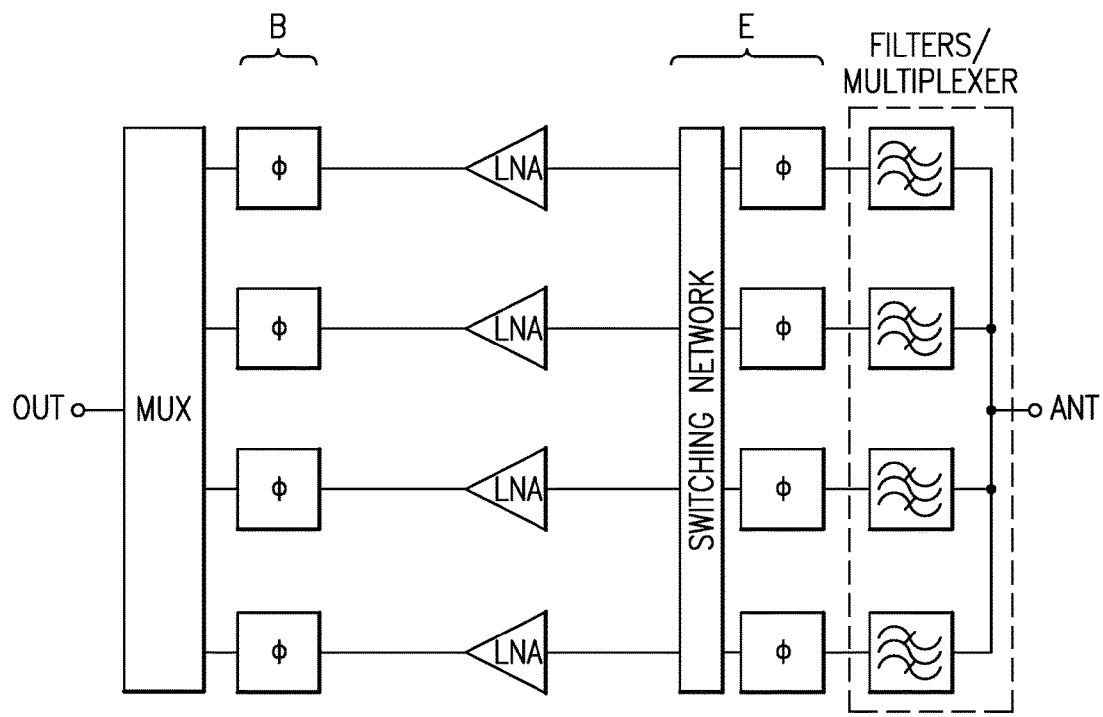

FIGS. 122A and 122B show that in some embodiments, a diversity receiver configuration may include one or more features of Example B as described herein and one or more features of Example E as described herein. Additional details related to Example B are described herein in reference to various figures, including FIGS. 37-41, 47-50, 53-55 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 123A:
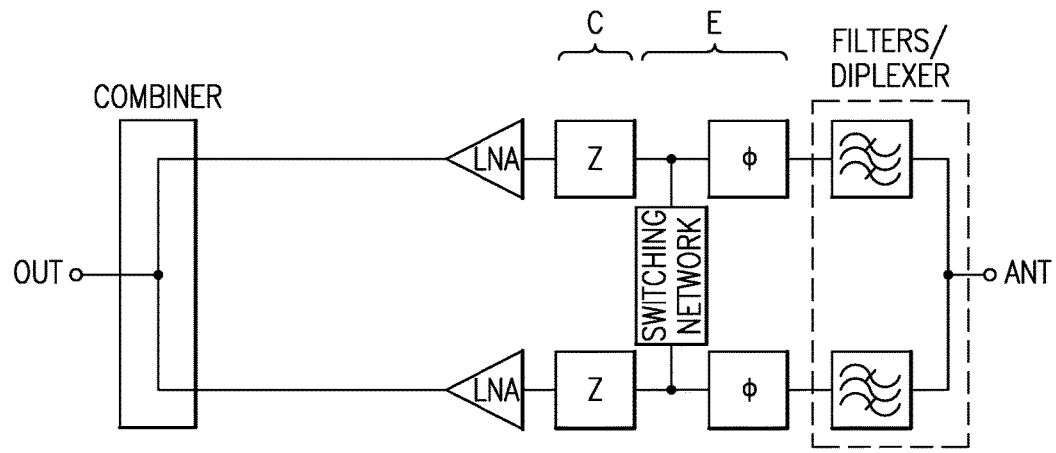
FIGS. 123A and 123B show that in some embodiments, a diversity receiver configuration may include one or more features of Example C as described herein and one or more features of Example E as described herein.
Figure 123B:
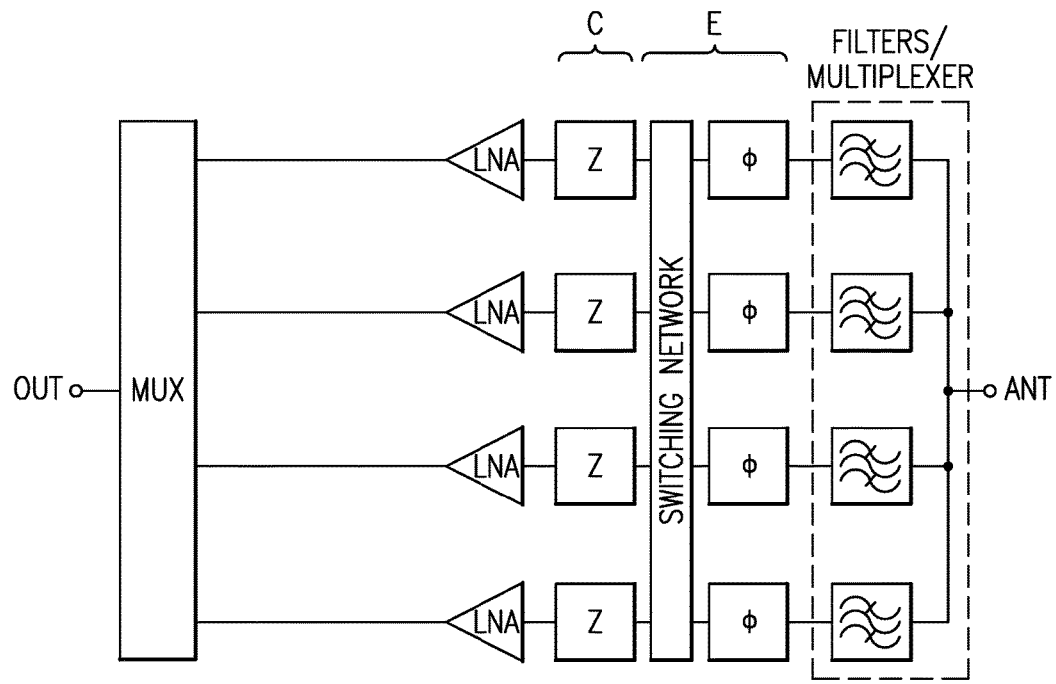

FIGS. 123A and 123B show that in some embodiments, a diversity receiver configuration may include one or more features of Example C as described herein and one or more features of Example E as described herein. Additional details related to Example C are described herein in reference to various figures, including FIGS. 37-41, 51, 52, 53-55 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 124A:
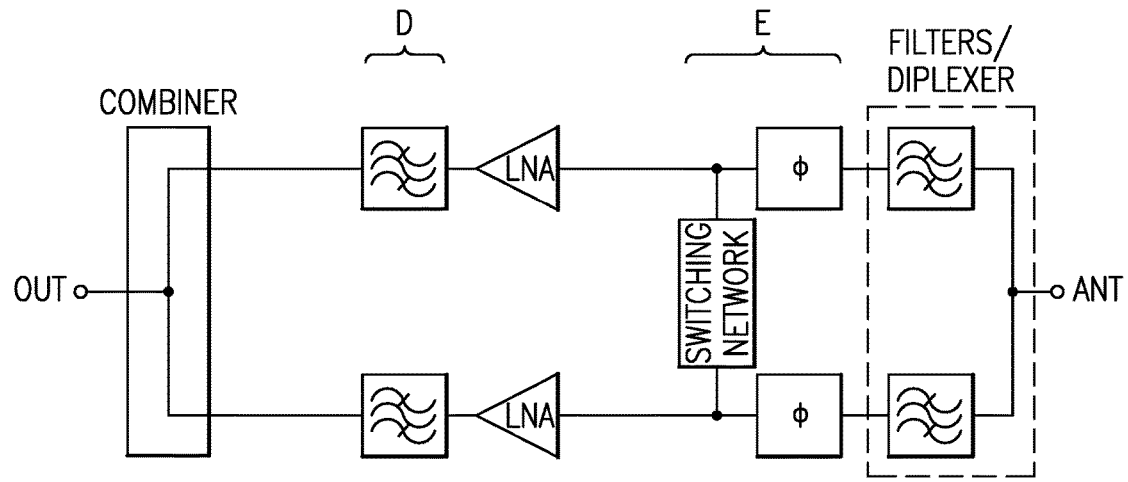
Figure 124B:
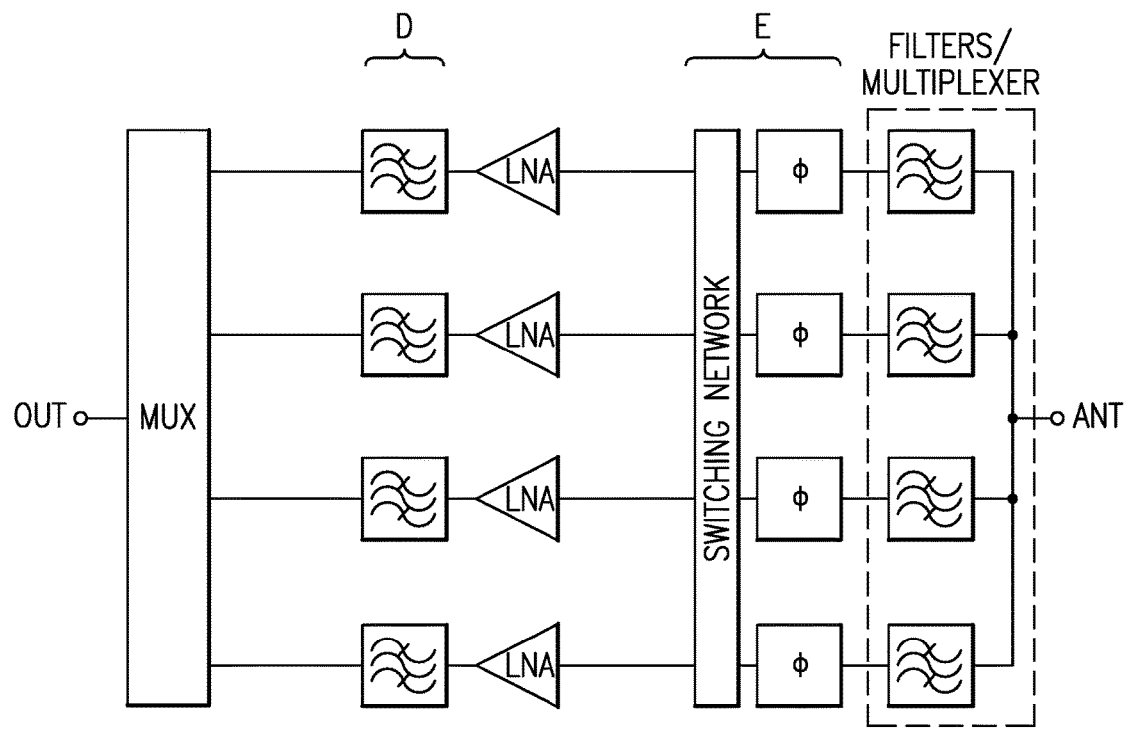

FIGS. 124A and 124B show that in some embodiments, a diversity receiver configuration may include one or more features of Example D as described herein and one or more features of Example E as described herein. Additional details related to Example D are described herein in reference to various figures, including FIGS. 37-41, 56-59 and 134-136. Additional details related to Example E are described herein in reference to various figures, including FIGS. 37-41, 60-62 and 134-136.

In some embodiments, the foregoing combination of features can provide some or all advantages and/or functionalities associated with each Example, all of the Examples in the combination, or any combination thereof.

Figure 125:
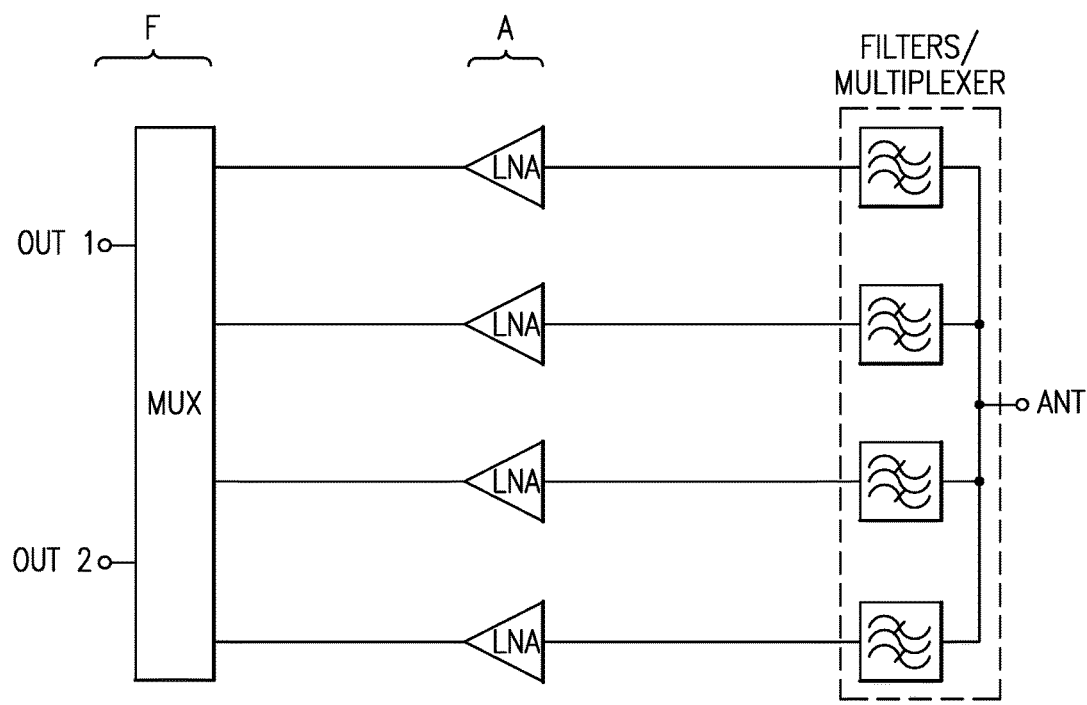

FIG. 125 shows that in some embodiments, a diversity receiver configuration may include one or more features of Example A as described herein and one or more features of Example F as described herein. Additional details related to Example A are described herein in reference to various figures, including FIGS. 37-41, 42-46 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 126:
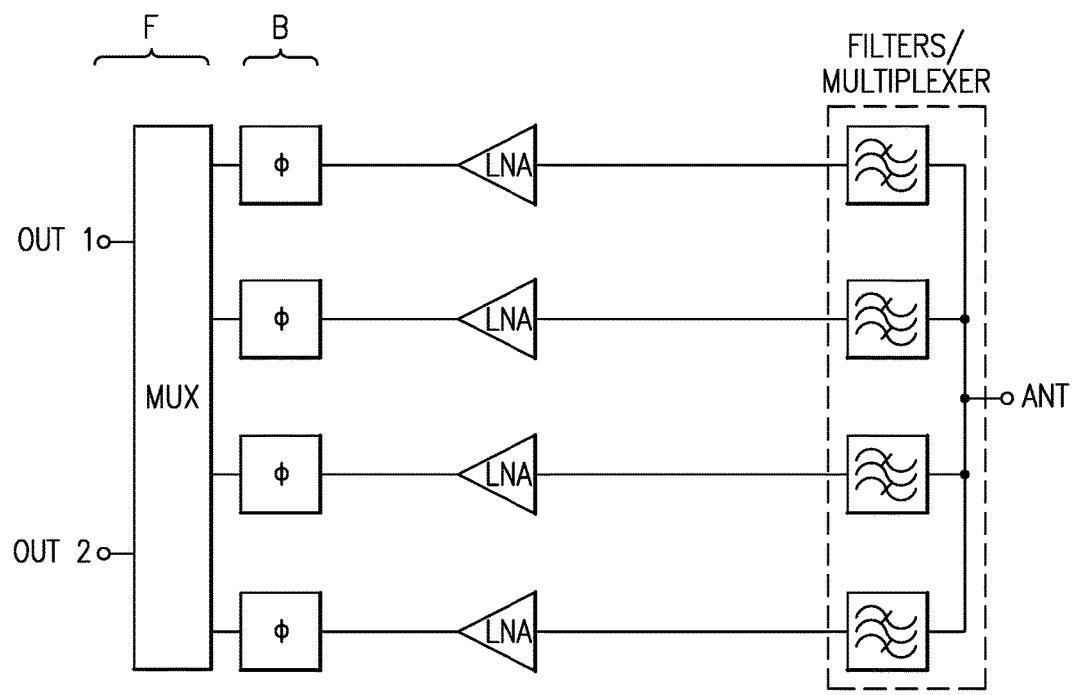

FIG. 126 shows that in some embodiments, a diversity receiver configuration may include one or more features of Example B as described herein and one or more features of Example F as described herein. Additional details related to Example B are described herein in reference to various figures, including FIGS. 37-41, 47-50, 53-55 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 127:
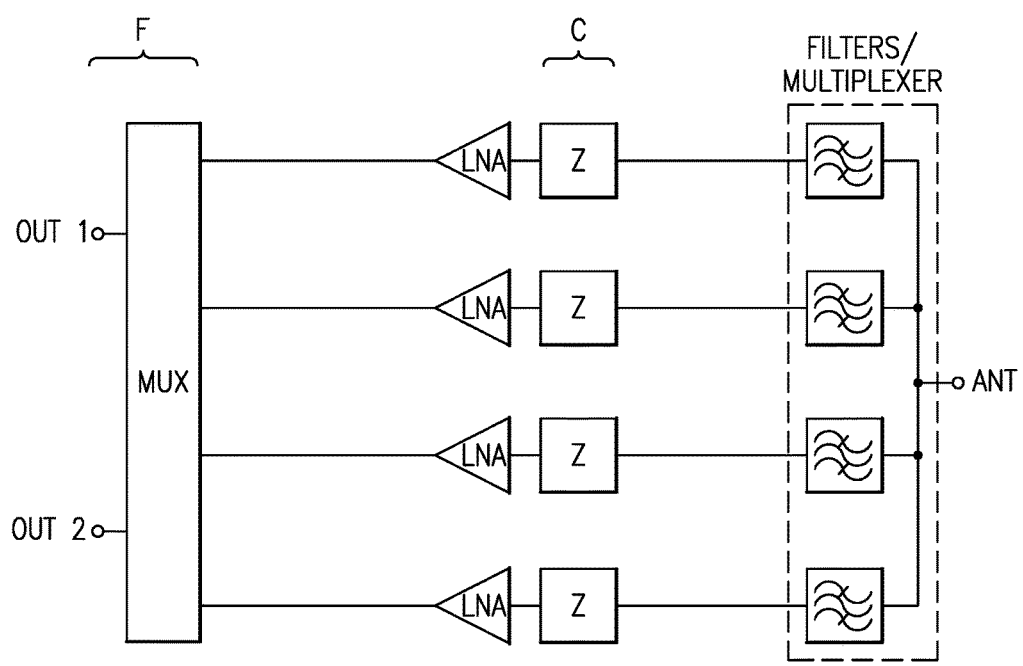

FIG. 127 shows that in some embodiments, a diversity receiver configuration may include one or more features of Example C as described herein and one or more features of Example F as described herein. Additional details related to Example C are described herein in reference to various figures, including FIGS. 37-41, 51, 52, 53-55 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 128:
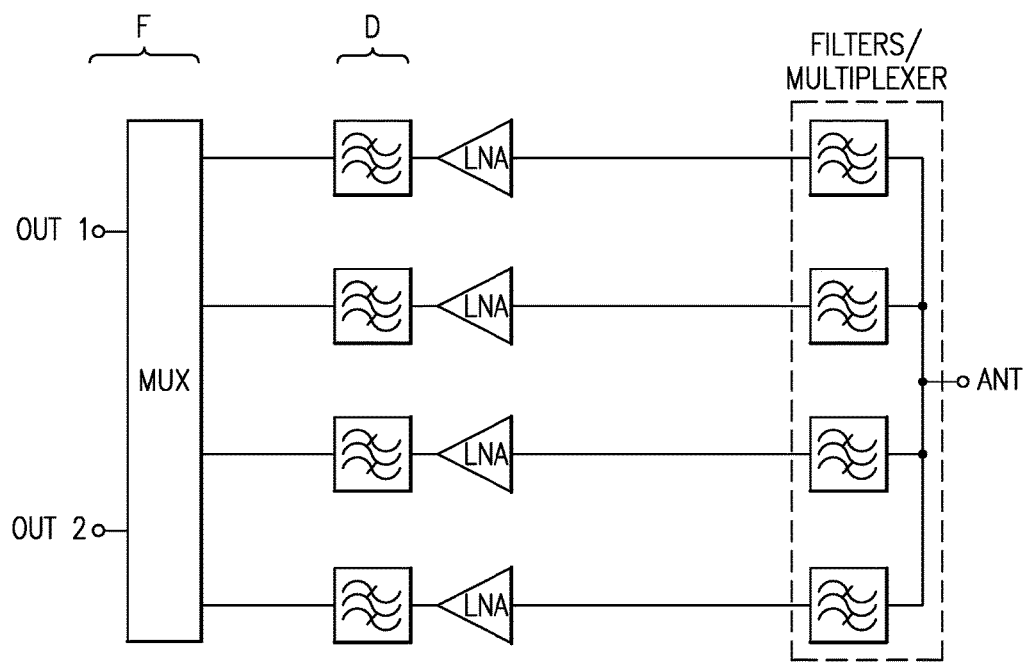

FIG. 128 shows that in some embodiments, a diversity receiver configuration may include one or more features of Example D as described herein and one or more features of Example F as described herein. Additional details related to Example D are described herein in reference to various figures, including FIGS. 37-41, 56-59 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 129:
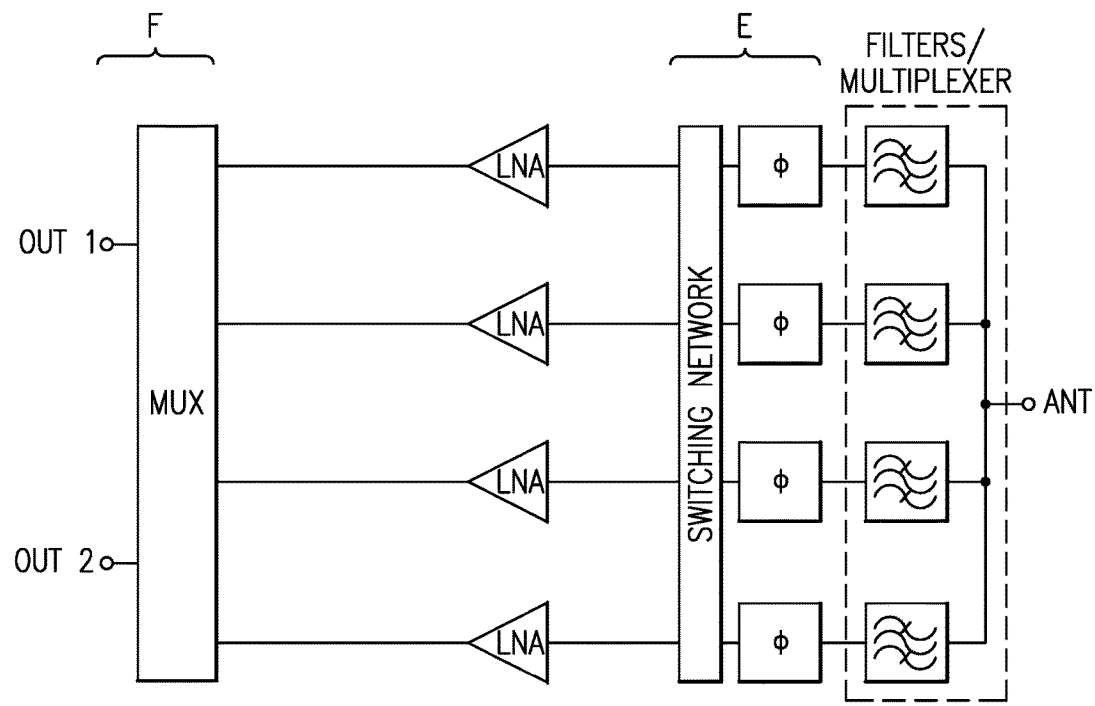

FIG. 129 shows that in some embodiments, a diversity receiver configuration may include one or more features of Example E as described herein and one or more features of Example F as described herein. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 130:
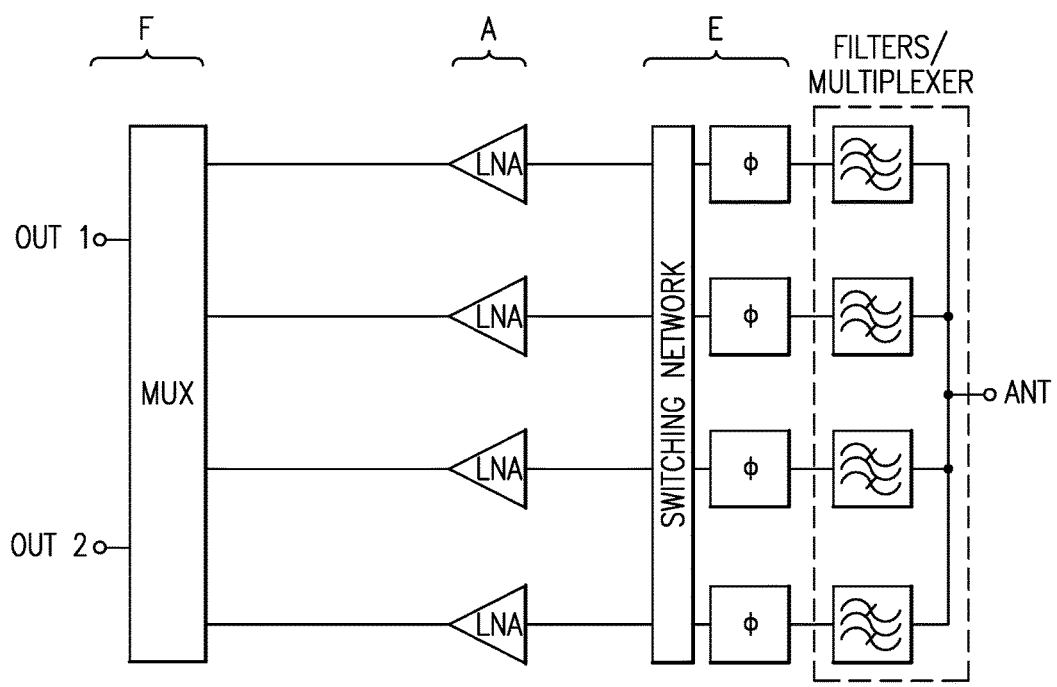

FIG. 130 shows that in some embodiments, a diversity receiver configuration may include one or more features of Example A as described herein, one or more features of Example E as described herein, and one or more features of Example F as described herein. Additional details related to Example A are described herein in reference to various figures, including FIGS. 37-41, 42-46 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 131:
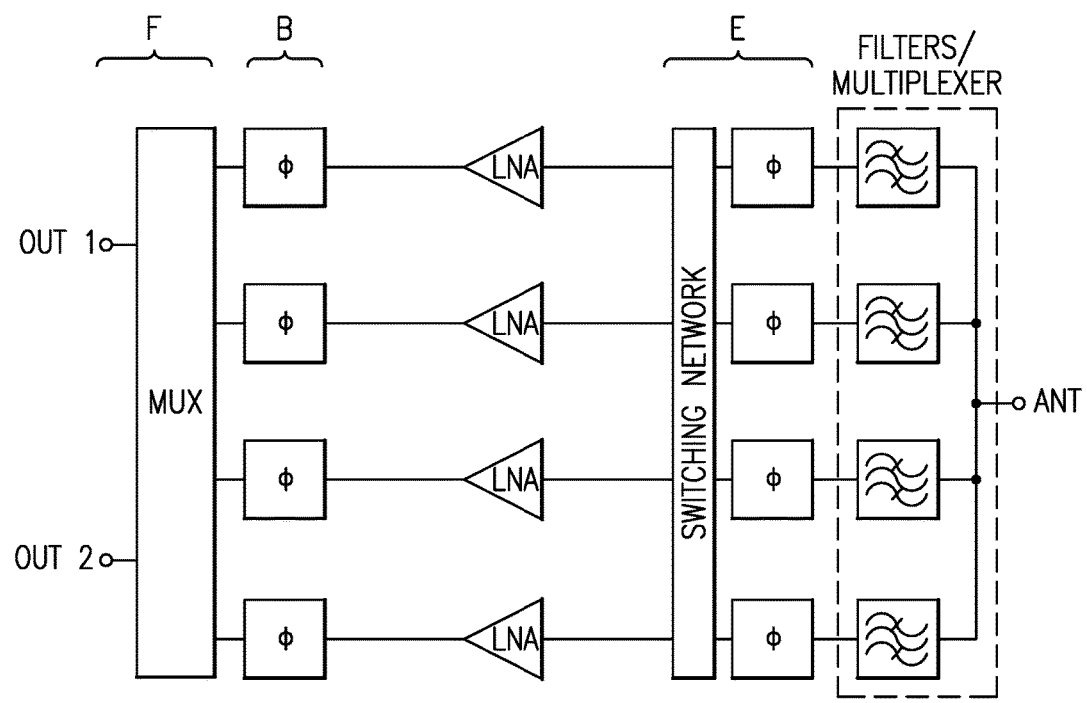

FIG. 131 shows that in some embodiments, a diversity receiver configuration may include one or more features of Example B as described herein, one or more features of Example E as described herein, and one or more features of Example F as described herein. Additional details related to Example B are described herein in reference to various figures, including FIGS. 37-41, 47-50, 53-55 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 132:
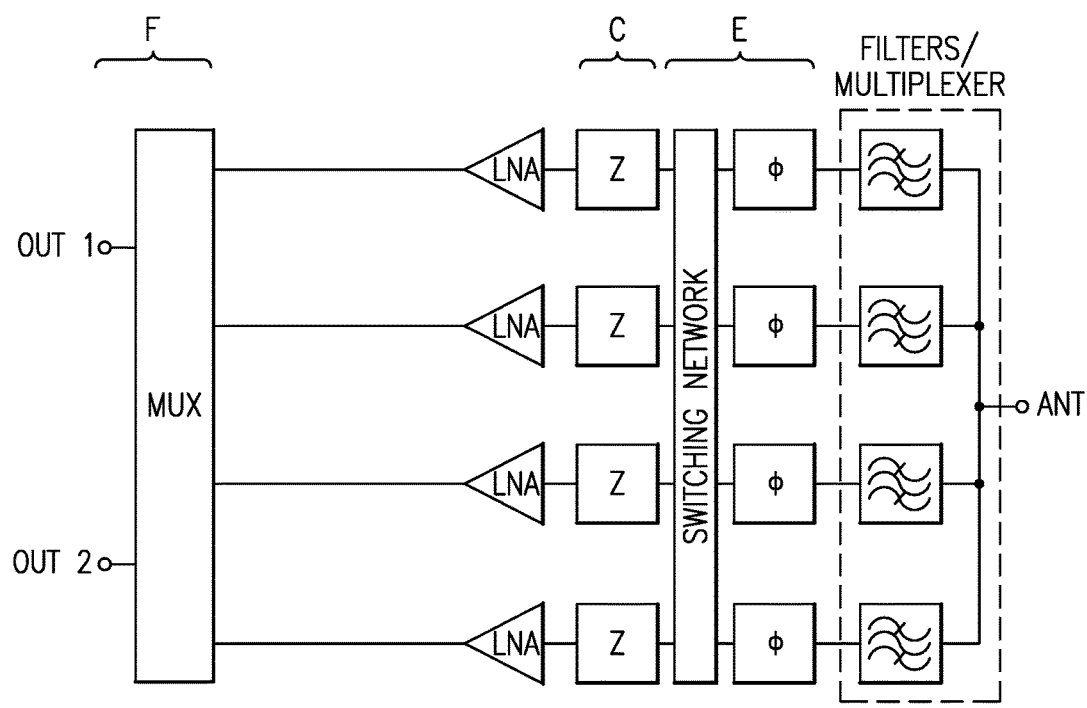

FIG. 132 shows that in some embodiments, a diversity receiver configuration may include one or more features of Example C as described herein, one or more features of Example E as described herein, and one or more features of Example F as described herein. Additional details related to Example C are described herein in reference to various figures, including FIGS. 37-41, 51, 52, 53-55 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Figure 133:
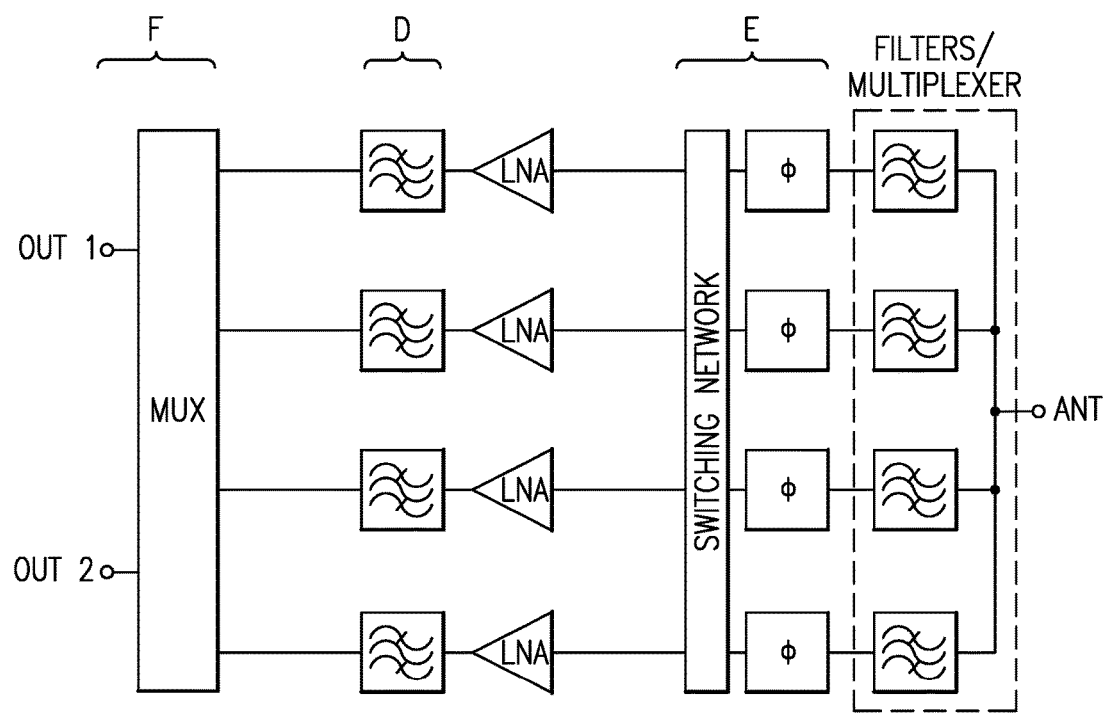

FIG. 133 shows that in some embodiments, a diversity receiver configuration may include one or more features of Example D as described herein, one or more features of Example E as described herein, and one or more features of Example F as described herein. Additional details related to Example D are described herein in reference to various figures, including FIGS. 37-41, 56-59 and 134-136. Additional details related to Example E are described herein in reference to various figures, including FIGS. 37-41, 60-62 and 134-136. Additional details related to Example F are described herein in reference to various figures, including FIGS. 37-41, 63-76 and 134-136.

In some embodiments, the foregoing combination of features can provide some or all advantages and/or functionalities associated with each Example, all of the Examples in the combination, or any combination thereof.

Examples of Products and Architectures

Figure 134:
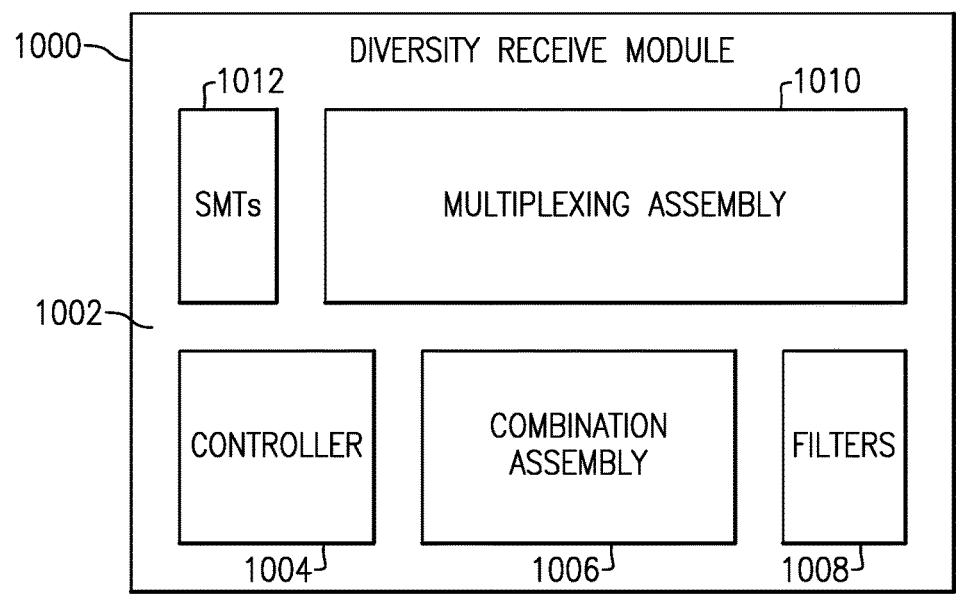

FIG. 134 shows that in some embodiments, some or all of the diversity receiver configurations, including some or all of the diversity receiver configurations having combinations of features (e.g., FIGS. 77-133), can be implemented, wholly or partially, in a module. Such a module can be, for example, a front-end module (FEM). Such a module can be, for example, a diversity receiver (DRx) FEM.

In the example of FIG. 134, a module 1000 can include a packaging substrate 1002, and a number of components can be mounted on such a packaging substrate 1002. For example, a controller 1004 (which may include a front-end power management integrated circuit [FE-PIMC]), a combination assembly 1006 having one or more features as described herein, a multiplexer assembly 1010, and a filter bank 1008 (which may include one or more bandpass filters) can be mounted and/or implemented on and/or within the packaging substrate 1002. Other components, such as a number of SMT devices 1012, can also be mounted on the packaging substrate 1002. Although all of the various components are depicted as being laid out on the packaging substrate 1002, it will be understood that some component(s) can be implemented over other component(s).

Figure 135:
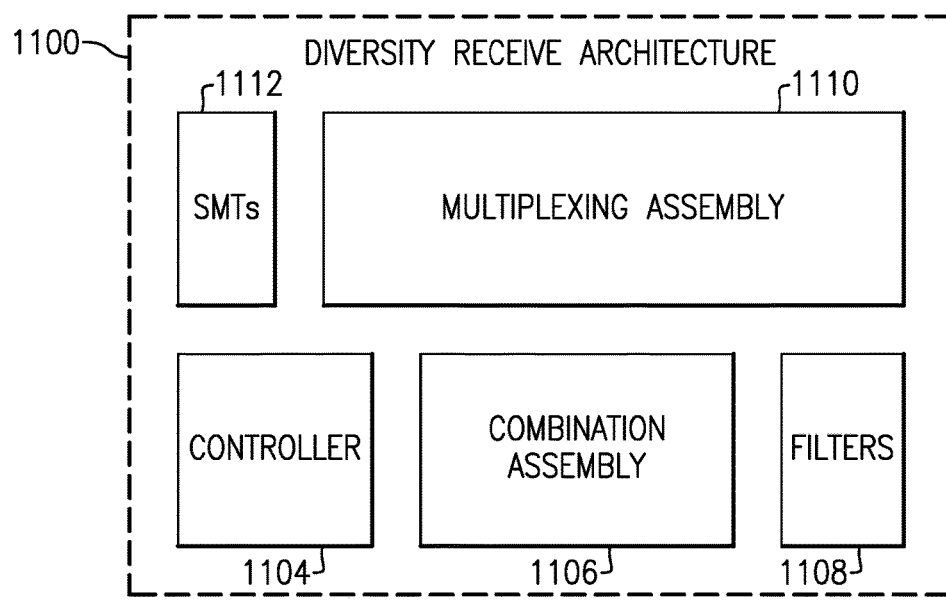

FIG. 135 shows that in some embodiments, some or all of the diversity receiver configurations, including some or all of the diversity receiver configurations having combinations of features (e.g., FIGS. 77-133), can be implemented, wholly or partially, in an architecture. Such an architecture may include one or more modules, and can be configured to provide front-end functionality such as diversity receiver (DRx) front-end functionality.

In the example of FIG. 135, an architecture 1100 can include a controller 1104 (which may include a front-end power management integrated circuit [FE-PIMC]), a combination assembly 1106 having one or more features as described herein, a multiplexer assembly 1110, and a filter bank 1108 (which may include one or more bandpass filters). Other components, such as a number of SMT devices 1112, can also be implemented in the architecture 1100.

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 136 depicts an example wireless device 1400 having one or more advantageous features described herein. In the context of one or more modules having one or more features as described herein, such modules can be generally depicted by a dashed box 1401 (which can be implemented as, for example, a front-end module), a diversity RF module 1411 (which can be implemented as, for example, a downstream module), and a diversity receiver (DRx) module 1000 (which can be implemented as, for example, a front-end module).

Referring to FIG. 136, power amplifiers (PAs) 1420 can receive their respective RF signals from a transceiver 1410 that can be configured and operated to generate RF signals to be amplified and transmitted, and to process received signals. The transceiver 1410 is shown to interact with a baseband sub-system 1408 that is configured to provide conversion between data and/or voice signals suitable for a user and RF signals suitable for the transceiver 1410. The transceiver 1410 can also be in communication with a power management component 1406 that is configured to manage power for the operation of the wireless device 1400. Such power management can also control operations of the baseband sub-system 1408 and the modules 1401, 1411, and 1000.

The baseband sub-system 1408 is shown to be connected to a user interface 1402 to facilitate various input and output of voice and/or data provided to and received from the user. The baseband sub-system 1408 can also be connected to a memory 1404 that is configured to store data and/or instructions to facilitate the operation of the wireless device, and/or to provide storage of information for the user.

In the example wireless device 1400, outputs of the PAs 1420 are shown to be matched (via respective match circuits 1422) and routed to their respective duplexers 1424. Such amplified and filtered signals can be routed to a primary antenna 1416 through an antenna switch 1414 for transmission. In some embodiments, the duplexers 1424 can allow transmit and receive operations to be performed simultaneously using a common antenna (e.g., primary antenna 1416). In FIG. 136, received signals are shown to be routed to "Rx" paths that can include, for example, a low-noise amplifier (LNA).

The wireless device also includes a diversity antenna 1426 and a diversity receiver module 1000 that receives signals from the diversity antenna 1426. The diversity receiver module 1000 processes the received signals and transmits the processed signals via a transmission line 1435 to a diversity RF module 1411 that further processes the signal before feeding the signal to the transceiver 1410.

In some embodiments, Example A described herein can be considered to include a first feature of a radio-frequency (RF) receiving system and related devices and methods. Similarly, Example B described herein can be considered to include a second feature of a radio-frequency (RF) receiving system and related devices and methods. Similarly, Example C described herein can be considered to include a third feature of a radio-frequency (RF) receiving system and related devices and methods. Similarly, Example D described herein can be considered to include a fourth feature of a radio-frequency (RF) receiving system and related devices and methods. Similarly, Example E described herein can be considered to include a fifth feature of a radio-frequency (RF) receiving system and related devices and methods. Similarly, Example F described herein can be considered to include a sixth feature of a radio-frequency (RF) receiving system and related devices and methods.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

Additional Embodiments and Examples

In the following paragraphs, example embodiments and combinations are listed for illustrative purposes. It is to be understood that the combinations provided herein below are not exhaustive and represent enumerated examples of potential combinations supported by the present disclosure.

Enumerated Examples of Fabrication of Shielded RF modules

The following enumerated example embodiments include examples of fabrication of shielded RF modules and examples of shielded RF modules, such as DRx receiver modules, front-end modules, and the like. The shielded RF modules described herein (embodiments of which are included in the claims that follow the description) can include conformal shielding that is made using the methods and/or devices in the enumerated examples. Accordingly, it is to be understood that the shielding in the claims and the description herein includes the methods, devices, and systems enumerated in these example embodiments.

1. A method for processing a plurality of packaged devices, the method comprising:
   forming or providing a first assembly having a stencil and a two-sided adhesive member attached to a first side of the stencil, the stencil having a plurality of openings, the two-sided adhesive member having a plurality of openings corresponding to the openings of the stencil;
   attaching the first assembly to a ring to provide a second assembly, the ring dimensioned to facilitate a deposition process; and
   loading a plurality of packaged devices onto the second assembly such that each packaged device is held by the two-sided adhesive member of the first assembly and a portion of each packaged device extends into the corresponding opening of the two-sided adhesive member.

2. The method of embodiment 1 wherein each packaged device includes a box-shaped body, and the portion of the packaged device extending into the corresponding opening of the two-sided adhesive member includes one or more features implemented on an underside of the box-shaped body.

3. The method of embodiment 2 wherein the one or more features include a plurality of solder balls.

4. The method of embodiment 2 wherein the box-shaped body includes an upper surface and four side wall surfaces.

5. The method of embodiment 4 further comprising performing the deposition process on the second assembly loaded with the packaged devices such that an electrically conductive material is deposited onto the upper surface and four side wall surfaces of the box-shape body of each of the plurality of packaged devices.

6. The method of embodiment 5 wherein the electrically conductive material is deposited in a conformal manner.

7. The method of embodiment 6 wherein the packaged device is a radio-frequency module, and the electrically conductive material is configured to provide shielding for the radio-frequency module.

8. The method of embodiment 1 wherein the forming of the first assembly includes attaching the two-sided adhesive member without the openings to the first side of the stencil, and performing a laser cutting operation to form the openings of the two-sided adhesive member.

9. The method of embodiment 8 wherein the laser cutting operation is performed such that a laser beam is incident on the two-sided adhesive member through the opening of the stencil.

10. The method of embodiment 9 wherein the laser cutting operation is further configured such that the laser beam cuts through the two-sided adhesive member but not through a cover layer on the side of the two-sided adhesive member opposite from the stencil.

11. The method of embodiment 10 further comprising removing the cover layer from the two-sided adhesive member such that the cut portion of the two-sided adhesive member is removed with the cover layer to thereby provide the opening of the two-sided adhesive member.

12. The method of embodiment 11 wherein the removing of the cover layer is performed after the attaching of the first assembly to the ring.

13. The method of embodiment 8 wherein the opening of the two-sided adhesive member is smaller than the corresponding opening of the stencil.

14. The method of embodiment 1 wherein the attaching of the first assembly to the ring includes positioning the first assembly relative to the ring such that the ring encircles the first assembly.

15. The method of embodiment 14 wherein the attaching of the first assembly to the ring further includes positioning an adhesive member on the first assembly and the ring to thereby secure the first assembly to the ring, the adhesive member being attached to a second side of the stencil.

16. The method of embodiment 15 wherein the adhesive member is a one-sided adhesive member.

17. The method of embodiment 15 further comprising performing a laser cutting operation to cut through a portion of the adhesive member covering the stencil to expose at least a portion of each opening of the stencil.

18. The method of embodiment 17 wherein the cut through the portion of the adhesive member results in a single opening in the adhesive member to expose all of the openings of the stencil.

19. The method of embodiment 17 wherein the laser cutting operation is performed such that a laser beam cuts through the adhesive member and does not damage the two-sided adhesive member on the first side of the stencil.

20. The method of embodiment 19 wherein the laser cutting operation is performed such that the laser beam is blocked by the stencil after cutting through the adhesive member.

21. A device for processing a plurality of packaged modules, the device comprising:
a ring configured to be utilized in a deposition apparatus;
a stencil having a plurality of openings, each opening dimensioned to receive a portion of a packaged module to be processed; and
an adhesive member that attaches the stencil to the ring to allow the stencil to be utilized in the deposition apparatus.

22. The device of embodiment 21 further comprising a two-sided adhesive member attached to a first side of the stencil, the two-sided adhesive member having a plurality of openings corresponding to the openings of the stencil.

23. The device of embodiment 22 wherein the ring and the stencil are attached by the adhesive member to be approximately co-planar.

24. The device of embodiment 23 wherein the stencil is positioned within an inner radius of the ring.

25. The device of embodiment 24 wherein the adhesive member is dimensioned to cover at least a portion of a second side of the stencil and at least a portion of a corresponding side of the ring.

26. The device of embodiment 25 wherein the adhesive member is a one-sided adhesive member such that an adhesive side of the one-sided adhesive member engages the second side of the stencil and the corresponding side of the ring.

27. The device of embodiment 25 wherein the adhesive member includes one or more cutouts dimensioned to expose at least a portion of each opening of the stencil on the second side of the stencil to allow ambient gas to escape from the opening of the stencil when the portion of the RF module is placed therein from the first side of the stencil.

28. The device of embodiment 27 wherein the one or more cutouts of the adhesive member includes a single cutout that exposes all of the openings of the stencil, the single cutout resulting in the adhesive member holding the second side of the stencil at a perimeter portion of the stencil.

29. The device of embodiment 28 wherein the single cutout of the adhesive member includes a cut edge at a solid portion of the stencil such that the stencil inhibits damage to the two-sided adhesive member on the first side of the stencil during a cutting operation on the adhesive member from the second side of the stencil.

30. The device of embodiment 27 wherein each opening of the two-sided adhesive member on the first side of the stencil is dimensioned to engage an underside of the packaged module while allowing the portion of the packaged module to enter the corresponding opening of the stencil.

31. The device of embodiment 30 wherein each opening of the two-sided adhesive member on the first side of the stencil is smaller than the corresponding opening of the stencil such that an edge of the opening of the two-sided adhesive member forms an overhang relative to an edge of the corresponding opening of the stencil.

32. The device of embodiment 31 further comprising a cover layer over the two-sided adhesive member, the cover layer configured to be removed prior to positioning of the packaged modules onto the two-sided adhesive member.

33. The device of embodiment 32 wherein the openings of the two-sided adhesive member are configured so that when the cover layer is removed, a cutout of the two-sided adhesive member is removed with the cover layer to thereby provide the corresponding opening of the two-sided adhesive member.

34. The device of embodiment 21 wherein the ring has a generally circular shape.

35. The device of embodiment 21 wherein the ring fully encloses its interior portion.
36. The device of embodiment 21 wherein the deposition apparatus includes a physical vapor deposition apparatus.
37. The device of embodiment 21 wherein the stencil is a rectangular shaped sheet, and the openings are rectangular shaped openings arranged in an array.
38. A system for batch processing of packaged modules, the system comprising:
    a first sub-system configured to prepare or provide a carrier assembly that includes a ring configured to be utilized in a deposition apparatus, a stencil assembly having a plurality of openings, each opening dimensioned to receive a portion of a packaged module to be processed, and an adhesive member that attaches the stencil assembly to the ring to allow the stencil assembly to be utilized in the deposition apparatus; and
    a second sub-system configured to handle a plurality of packaged modules, such that the packaged modules are positioned over the openings of the stencil assembly and held by the stencil assembly to thereby allow the plurality of packaged modules to be processed further in the deposition apparatus.
39. The system of embodiment 38 further comprising a third sub-system including the deposition apparatus and configured to perform a deposition process on the plurality of packaged modules.
40. The system of embodiment 39 wherein the packaged modules being held by the stencil assembly allows the deposition process to deposit a conformal layer of conductive material on upper and side surfaces of each packaged module while maintaining an underside of the packaged module substantially free of the conductive material.
41. A radio-frequency (RF) module comprising:
    a packaging substrate configured to receive a plurality of components;
    a receiving system implemented relative to the packaging substrate, the receiving system including a controller configured to selectively activate one or more of a plurality of paths between an input of the receiving system and an output of the receiving system, the receiving system further including a plurality of amplifiers, each one of the plurality of amplifiers disposed along a corresponding one of the plurality of paths and configured to amplify a signal received at the amplifier, the receiving system further including one or more of a first feature, a second feature, a third feature, a fourth feature, a fifth feature, and a sixth feature, implemented for the RF receiving system, the first feature including a plurality of bandpass filters, each one of the plurality of bandpass filters disposed along a corresponding one of the plurality of paths and configured to filter a signal received at the bandpass filter to a respective frequency band, and at least some of the plurality of amplifiers implemented as a plurality of variable-gain amplifiers (VGAs), each one of the plurality of VGAs configured to amplify the corresponding signal with a gain controlled by an amplifier control signal received from the controller; the second feature including a plurality of phase-shift components, each one of the plurality of phase-shift components disposed along a corresponding one of the plurality of paths and configured to phase-shift a signal passing through the phase-shift component; the third feature including a plurality of impedance matching components, each one of the plurality of impedance matching components disposed along a corresponding one of the plurality of paths and configured to reduce at least one of an out-of-band noise figure or an out-of-band gain of the one of the plurality of paths; the fourth feature including a plurality of post-amplifier bandpass filters, each one of the plurality of post-amplifier bandpass filters disposed along a corresponding one of the plurality of paths at an output of a corresponding one of the plurality of amplifiers and configured to filter a signal to a respective frequency band; the fifth feature including a switching network having one or more single-pole/single-throw switches, each one of the switches coupling two of the plurality of paths, the switching network configured to be controlled by the controller based on a band select signal; the sixth feature including an input multiplexer configured to receive one or more RF signals at one or more input multiplexer inputs and to output each of the one or more RF signals to one or more of a plurality of input multiplexer outputs to propagate along a respective one or more of the plurality of paths, and an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs; and
    a shield implemented to provide RF shielding for at least a portion of the receiving system, the shield being manufactured using any of the methods and/or devices of embodiments 1-40.

Enumerated Examples of DRx Assemblies

The following enumerated example embodiments include examples of DRx assemblies and combinations of features available in such DRx assemblies. The shielded RF modules described herein (embodiments of which are included in the claims that follow the description) can include DRx assemblies as described in the following enumerated examples. Accordingly, it is to be understood that the receiving systems (e.g., DRx modules, front-end modules, RF modules, and the like) described herein include the devices and systems enumerated in these example embodiments.

1. A radio-frequency (RF) receiving system comprising:
    a controller configured to selectively activate one or more of a plurality of paths between an input of the receiving system and an output of the receiving system;
    a plurality of amplifiers, each one of the plurality of amplifiers disposed along a corresponding one of the plurality of paths and configured to amplify a signal received at the amplifier; and
    two or more of a first feature, a second feature, a third feature, a fourth feature, a fifth feature, and a sixth feature, implemented for the RF receiving system, the first feature including a plurality of bandpass filters, each one of the plurality of bandpass filters disposed along a corresponding one of the plurality of paths and configured to filter a signal received at the bandpass filter to a respective frequency band, and at least some of the plurality of amplifiers implemented as a plurality of variable-gain amplifiers (VGAs), each one of the plurality of VGAs configured to amplify the corresponding signal with a gain controlled by an amplifier control signal received from the controller; the second feature including a plurality of phase-shift components, each one of the plurality of phase-shift components disposed along a corresponding one of the plurality of paths and configured to phase-shift a signal passing through the phase-shift component; the third feature including a plurality of impedance matching components, each one of the plurality of impedance matching components disposed along a corresponding one of the plurality of paths and configured to reduce at least one of an out-of-band noise figure or an out-of-band gain of the one of the plurality of paths; the fourth feature including a plurality of post-amplifier bandpass filters, each one of the plurality of post-amplifier bandpass filters disposed along a corresponding one of the plurality of paths at an output of a corresponding one of the plurality of amplifiers and configured to filter a signal to a respective frequency band; the fifth feature including a switching network having one or more single-pole/single-throw switches, each one of the switches coupling two of the plurality of paths, the switching network configured to be controlled by the controller based on a band select signal; the sixth feature including an input multiplexer configured to receive one or more RF signals at one or more input multiplexer inputs and to output each of the one or more RF signals to one or more of a plurality of input multiplexer outputs to propagate along a respective one or more of the plurality of paths, and an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs.

2. The RF receiving system of embodiment 1 wherein the RF receiving system includes the first feature and the second feature.
3. The RF receiving system of embodiment 1 wherein the RF receiving system includes the first feature and the third feature.
4. The RF receiving system of embodiment 1 wherein the RF receiving system includes the first feature and the fourth feature.
5. The RF receiving system of embodiment 1 wherein the RF receiving system includes the second feature and the third feature.
6. The RF receiving system of embodiment 1 wherein the RF receiving system includes the second feature and the fourth feature.
7. The RF receiving system of embodiment 1 wherein the RF receiving system includes the third feature and the fourth feature.
8. The RF receiving system of embodiment 1 wherein the RF receiving system includes the first feature, the second feature and the third feature.
9. The RF receiving system of embodiment 1 wherein the RF receiving system includes the first feature, the second feature and the fourth feature.
10. The RF receiving system of embodiment 1 wherein the RF receiving system includes the first feature, the third feature and the fourth feature.
11. The RF receiving system of embodiment 1 wherein the RF receiving system includes the second feature, the third feature and the fourth feature.
12. The RF receiving system of embodiment 1 wherein the RF receiving system includes the first feature, the second feature, the third feature and the fourth feature.
13. The RF receiving system of embodiment 1 wherein the RF receiving system includes the first feature, the second feature and the fifth feature.
14. The RF receiving system of embodiment 1 wherein the RF receiving system includes the first feature, the third feature and the fifth feature.
15. The RF receiving system of embodiment 1 wherein the RF receiving system includes the first feature, the fourth feature and the fifth feature.
16. The RF receiving system of embodiment 1 wherein the RF receiving system includes the second feature, the third feature and the fifth feature.
17. The RF receiving system of embodiment 1 wherein the RF receiving system includes the second feature, the fourth feature and the fifth feature.
18. The RF receiving system of embodiment 1 wherein the RF receiving system includes the third feature, the fourth feature and the fifth feature.
19. The RF receiving system of embodiment 1 wherein the RF receiving system includes the first feature, the second feature, the third feature and the fifth feature.
20. The RF receiving system of embodiment 1 wherein the RF receiving system includes the first feature, the second feature, the fourth feature and the fifth feature.
21. The RF receiving system of embodiment 1 wherein the RF receiving system includes the first feature, the third feature, the fourth feature and the fifth feature.
22. The RF receiving system of embodiment 1 wherein the RF receiving system includes the second feature, the third feature, the fourth feature and the fifth feature.
23. The RF receiving system of embodiment 1 wherein the RF receiving system includes the first feature, the second feature, the third feature, the fourth feature and the fifth feature.
24. The RF receiving system of embodiment 1 wherein the RF receiving system includes the first feature, the second feature and the sixth feature.
25. The RF receiving system of embodiment 1 wherein the RF receiving system includes the first feature, the third feature and the sixth feature.
26. The RF receiving system of embodiment 1 wherein the RF receiving system includes the first feature, the fourth feature and the sixth feature.
27. The RF receiving system of embodiment 1 wherein the RF receiving system includes the second feature, the third feature and the sixth feature.
28. The RF receiving system of embodiment 1 wherein the RF receiving system includes the second feature, the fourth feature and the sixth feature.
29. The RF receiving system of embodiment 1 wherein the RF receiving system includes the third feature, the fourth feature and the sixth feature.
30. The RF receiving system of embodiment 1 wherein the RF receiving system includes the first feature, the second feature, the third feature and the sixth feature.
31. The RF receiving system of embodiment 1 wherein the RF receiving system includes the first feature, the second feature, the fourth feature and the sixth feature.
32. The RF receiving system of embodiment 1 wherein the RF receiving system includes the first feature, the third feature, the fourth feature and the sixth feature.

33. The RF receiving system of embodiment 1 wherein the RF receiving system includes the second feature, the third feature, the fourth feature and the sixth feature.
34. The RF receiving system of embodiment 1 wherein the RF receiving system includes the first feature, the second feature, the third feature, the fourth feature and the sixth feature.
35. The RF receiving system of embodiment 1 wherein the RF receiving system includes the first feature, the second feature, the fifth feature and the sixth feature.
36. The RF receiving system of embodiment 1 wherein the RF receiving system includes the first feature, the third feature, the fifth feature and the sixth feature.
37. The RF receiving system of embodiment 1 wherein the RF receiving system includes the first feature, the fourth feature, the fifth feature and the sixth feature.
38. The RF receiving system of embodiment 1 wherein the RF receiving system includes the second feature, the third feature, the fifth feature and the sixth feature.
39. The RF receiving system of embodiment 1 wherein the RF receiving system includes the second feature, the fourth feature, the fifth feature and the sixth feature.
40. The RF receiving system of embodiment 1 wherein the RF receiving system includes the third feature, the fourth feature, the fifth feature and the sixth feature.
41. The RF receiving system of embodiment 1 wherein the RF receiving system includes the first feature, the second feature, the third feature, the fifth feature and the sixth feature.
42. The RF receiving system of embodiment 1 wherein the RF receiving system includes the first feature, the second feature, the fourth feature, the fifth feature and the sixth feature.
43. The RF receiving system of embodiment 1 wherein the RF receiving system includes the first feature, the third feature, the fourth feature, the fifth feature and the sixth feature.
44. The RF receiving system of embodiment 1 wherein the RF receiving system includes the second feature, the third feature, the fourth feature, the fifth feature and the sixth feature.
45. The RF receiving system of embodiment 1 wherein the RF receiving system includes the first feature, the second feature, the third feature, the fourth feature, the fifth feature and the sixth feature.
46. The RF receiving system of embodiment 1 wherein the RF receiving system includes the first feature and the fifth feature.
47. The RF receiving system of embodiment 1 wherein the RF receiving system includes the second feature and the fifth feature.
48. The RF receiving system of embodiment 1 wherein the RF receiving system includes the third feature and the fifth feature.
49. The RF receiving system of embodiment 1 wherein the RF receiving system includes the fourth feature and the fifth feature.
50. The RF receiving system of embodiment 1 wherein the RF receiving system includes the first feature and the sixth feature.
51. The RF receiving system of embodiment 1 wherein the RF receiving system includes the second feature and the sixth feature.
52. The RF receiving system of embodiment 1 wherein the RF receiving system includes the third feature and the sixth feature.
53. The RF receiving system of embodiment 1 wherein the RF receiving system includes the fourth feature and the sixth feature.
54. The RF receiving system of embodiment 1 wherein the RF receiving system includes the fifth feature and the sixth feature.
55. The RF receiving system of embodiment 1 wherein the RF receiving system includes the first feature, the fifth feature and the sixth feature.
56. The RF receiving system of embodiment 1 wherein the RF receiving system includes the second feature, the fifth feature and the sixth feature.
57. The RF receiving system of embodiment 1 wherein the RF receiving system includes the third feature, the fifth feature and the sixth feature.
58. The RF receiving system of embodiment 1 wherein the RF receiving system includes the fourth feature, the fifth feature and the sixth feature.
59. A radio-frequency (RF) module comprising:
a packaging substrate configured to receive a plurality of components; and
a receiving system implemented on the packaging substrate, the receiving system including a controller configured to selectively activate one or more of a plurality of paths between an input of the receiving system and an output of the receiving system, the receiving system further including a plurality of amplifiers, each one of the plurality of amplifiers disposed along a corresponding one of the plurality of paths and configured to amplify a signal received at the amplifier, the receiving system further including two or more of a first feature, a second feature, a third feature, a fourth feature, a fifth feature, and a sixth feature, implemented for the RF receiving system, the first feature including a plurality of bandpass filters, each one of the plurality of bandpass filters disposed along a corresponding one of the plurality of paths and configured to filter a signal received at the bandpass filter to a respective frequency band, and at least some of the plurality of amplifiers implemented as a plurality of variable-gain amplifiers (VGAs), each one of the plurality of VGAs configured to amplify the corresponding signal with a gain controlled by an amplifier control signal received from the controller; the second feature including a plurality of phase-shift components, each one of the plurality of phase-shift components disposed along a corresponding one of the plurality of paths and configured to phase-shift a signal passing through the phase-shift component; the third feature including a plurality of impedance matching components, each one of the plurality of impedance matching components disposed along a corresponding one of the plurality of paths and configured to reduce at least one of an out-of-band noise figure or an out-of-band gain of the one of the plurality of paths; the fourth feature including a plurality of post-amplifier bandpass filters, each one of the plurality of post-amplifier bandpass filters disposed along a corresponding one of the plurality of paths at an output of a corresponding one of the plurality of amplifiers and configured to filter a signal to a respective frequency band; the fifth feature including a switching network having one or more single-pole/single-throw switches, each one of the switches coupling two of the plurality of paths, the switching network configured to be controlled by the controller based on a band select signal; the sixth feature including an input multiplexer configured to receive one or more RF signals at one or more input multiplexer inputs and to output each of the one or more RF signals to one or more of a plurality of input multiplexer outputs to propagate along a respective one or more of the plurality of paths, and an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs.

60. The RF module of embodiment 59 wherein the RF module is a diversity receiver front-end module (FEM).
61. A radio-frequency (RF) module comprising:
   a packaging substrate configured to receive a plurality of components;
   a receiving system implemented relative to the packaging substrate, the receiving system being implemented according to any of the embodiments 1-60; and
   a shield implemented to provide RF shielding for at least a portion of the receiving system.
62. A wireless device comprising:
   a first antenna configured to receive one or more radio-frequency (RF) signals;
   a first front-end module (FEM) in communication with the first antenna, the first FEM including a packaging substrate configured to receive a plurality of components, the first FEM further including a receiving system implemented on the packaging substrate, the receiving system including a controller configured to selectively activate one or more of a plurality of paths between an input of the receiving system and an output of the receiving system, the receiving system further including a plurality of amplifiers, each one of the plurality of amplifiers disposed along a corresponding one of the plurality of paths and configured to amplify a signal received at the amplifier, the receiving system further including two or more of a first feature, a second feature, a third feature, a fourth feature, a fifth feature, and a sixth feature, implemented for the RF receiving system, the first feature including a plurality of bandpass filters, each one of the plurality of bandpass filters disposed along a corresponding one of the plurality of paths and configured to filter a signal received at the bandpass filter to a respective frequency band, and at least some of the plurality of amplifiers implemented as a plurality of variable-gain amplifiers (VGAs), each one of the plurality of VGAs configured to amplify the corresponding signal with a gain controlled by an amplifier control signal received from the controller; the second feature including a plurality of phase-shift components, each one of the plurality of phase-shift components disposed along a corresponding one of the plurality of paths and configured to phase-shift a signal passing through the phase-shift component; the third feature including a plurality of impedance matching components, each one of the plurality of impedance matching components disposed along a corresponding one of the plurality of paths and configured to reduce at least one of an out-of-band noise figure or an out-of-band gain of the one of the plurality of paths; the fourth feature including a plurality of post-amplifier bandpass filters, each one of the plurality of post-amplifier bandpass filters disposed along a corresponding one of the plurality of paths at an output of a corresponding one of the plurality of amplifiers and configured to filter a signal to a respective frequency band; the fifth feature including a switching network having one or more single-pole/single-throw switches, each one of the switches coupling two of the plurality of paths, the switching network configured to be controlled by the controller based on a band select signal; the sixth feature including an input multiplexer configured to receive one or more RF signals at one or more input multiplexer inputs and to output each of the one or more RF signals to one or more of a plurality of input multiplexer outputs to propagate along a respective one or more of the plurality of paths, and an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs; and
   a transceiver configured to receive a processed version of the one or more RF signals from the receiving system and generate data bits based on the processed version of the one or more RF signals.
63. The wireless device of embodiment 62 wherein the wireless device is a cellular phone.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional subcomponents to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits.

Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) module comprising:
a packaging substrate configured to receive a plurality of components;
a radio-frequency (RF) receiving system implemented relative to the packaging substrate, the RF receiving system including a controller configured to selectively activate one or more of a plurality of paths between an input of the RF receiving system and an output of the RF receiving system, the RF receiving system further including a plurality of amplifiers, each one of the plurality of amplifiers disposed along a corresponding one of the plurality of paths and configured to amplify a signal received at the amplifier, the RF receiving system further including one or more of a first feature, a second feature, a third feature, a fourth feature, a fifth feature, and a sixth feature, implemented for the RF receiving system, the first feature including a plurality of bandpass filters, each one of the plurality of bandpass filters disposed along a corresponding one of the plurality of paths and configured to filter a signal received at the bandpass filter to a respective frequency band, and at least some of the plurality of amplifiers implemented as a plurality of variable-gain amplifiers (VGAs), each one of the plurality of VGAs configured to amplify the corresponding signal with a gain controlled by an amplifier control signal received from the controller; the second feature including a plurality of phase-shift components, each one of the plurality of phase-shift components disposed along a corresponding one of the plurality of paths and configured to phase-shift a signal passing through the phase-shift component; the third feature including a plurality of impedance matching components, each one of the plurality of impedance matching components disposed along a corresponding one of the plurality of paths and configured to reduce at least one of an out-of-band noise figure or an out-of-band gain of the one of the plurality of paths; the fourth feature including a plurality of post-amplifier bandpass filters, each one of the plurality of post-amplifier bandpass filters disposed along a corresponding one of the plurality of paths at an output of a corresponding one of the plurality of amplifiers and configured to filter a signal to a respective frequency band; the fifth feature including a switching network having one or more single-pole/single-throw switches, each one of the switches coupling two of the plurality of paths, the switching network configured to be controlled by the controller based on a band select signal; the sixth feature including an input multiplexer configured to receive one or more RF signals at one or more input multiplexer inputs and to output each of the one or more RF signals to one or more of a plurality of input multiplexer outputs to propagate along a respective one or more of the plurality of paths, and an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs; and a shield implemented to provide RF shielding for at least a portion of the RF receiving system, the shield including an overmold formed over the packaging substrate, the overmold having a conductive layer on an upper surface of the overmold that is electrically coupled to one or more ground planes implemented within the packaging substrate, the electrical connection between the conductive layer and the one or more ground planes made through one or more conductive features that are implemented within the packaging substrate and partially exposed to the corresponding side walls.

2. The RF module of claim 1 wherein the shield includes a conformal shield implemented on an upper side and side walls of the RF module.

3. The RF module of claim 1 wherein side walls of the overmold include the conductive layer.

4. The RF module of claim 1 wherein an underside of the packaging substrate is configured for a circuit board to be mounted thereon.

5. The RF module of claim 4 wherein the packaging substrate includes a plurality of contact features formed on the underside of the packaging substrate, the plurality of contact features configured to provide mounting and electrical connection functionalities to the RF module.

6. The RF module of claim 1 wherein an underside of the packaging substrate is configured for an underside component to be mounted thereon.

7. The RF module of claim 1 further comprising an underside component mounted to the underside of the packaging substrate.

8. The RF module of claim 7 wherein the underside of the packaging substrate includes an array of solder balls.

9. The RF module of claim 8 further comprising a circuit board mounted to the underside of the packaging substrate using the array of solder balls.

10. The RF module of claim 1 wherein the RF receiving system includes a combination of at least two of the first feature, the second feature, the third feature, the fourth feature, the fifth feature, or the sixth feature.

11. The RF module of claim 1 wherein the RF receiving system includes a combination of at least three of the first feature, the second feature, the third feature, the fourth feature, the fifth feature, or the sixth feature.

12. The RF module of claim 1 wherein the RF receiving system includes a combination of at least four of the first feature, the second feature, the third feature, the fourth feature, the fifth feature, or the sixth feature.

13. The RF module of claim 1 wherein the RF receiving system includes a combination of at least five of the first feature, the second feature, the third feature, the fourth feature, the fifth feature, or the sixth feature.

14. The RF module of claim 1 wherein the RF receiving system includes the first feature, the second feature, the third feature, the fourth feature, the fifth feature, and the sixth feature.

15. A wireless device comprising:
a first antenna configured to receive one or more radio-frequency (RF) signals;
a first front-end module (FEM) in communication with the first antenna, the first FEM including a packaging substrate configured to receive a plurality of components, the first FEM further including a radio-frequency (RF) receiving system implemented on the packaging substrate, the RF receiving system including a controller configured to selectively activate one or more of a plurality of paths between an input of the RF receiving system and an output of the RF receiving system, the RF receiving system further including a plurality of amplifiers, each one of the plurality of amplifiers disposed along a corresponding one of the plurality of paths and configured to amplify a signal received at the amplifier, the RF receiving system further including one or more of a first feature, a second feature, a third feature, a fourth feature, a fifth feature, and a sixth feature, implemented for the RF receiving system, the first feature including a plurality of bandpass filters, each one of the plurality of bandpass filters disposed along a corresponding one of the plurality of paths and configured to filter a signal received at the bandpass filter to a respective frequency band, and at least some of the plurality of amplifiers implemented as a plurality of variable-gain amplifiers (VGAs), each one of the plurality of VGAs configured to amplify the corresponding signal with a gain controlled by an amplifier control signal received from the controller; the second feature including a plurality of phase-shift components, each one of the plurality of phase-shift components disposed along a corresponding one of the plurality of paths and configured to phase-shift a signal passing through the phase-shift component; the third feature including a plurality of impedance matching components, each one of the plurality of impedance matching components disposed along a corresponding one of the plurality of paths and configured to reduce at least one of an out-of-band noise figure or an out-of-band gain of the one of the plurality of paths; the fourth feature including a plurality of post-amplifier bandpass filters, each one of the plurality of post-amplifier bandpass filters disposed along a corresponding one of the plurality of paths at an output of a corresponding one of the plurality of amplifiers and configured to filter a signal to a respective frequency band; the fifth feature including a switching network having one or more single-pole/single-throw switches, each one of the switches coupling two of the plurality of paths, the switching network configured to be controlled by the controller based on a band select signal; the sixth feature including an input multiplexer configured to receive one or more RF signals at one or more input multiplexer inputs and to output each of the one or more RF signals to one or more of a plurality of input multiplexer outputs to propagate along a respective one or more of the plurality of paths, and an output multiplexer configured to receive one or more amplified RF signals propagating along the respective one or more of the plurality of paths at one or more respective output multiplexer inputs and to output each of the one or more amplified RF signals to a selected one of a plurality of output multiplexer outputs;

a shield implemented to provide RF shielding for at least a portion of the RF receiving system, the shield including an overmold formed over the packaging substrate, the overmold having a conductive layer on an upper surface of the overmold that is electrically coupled to one or more ground planes implemented within the packaging substrate, the electrical connection between the conductive layer and the one or more ground planes made through one or more conductive features that are implemented within the packaging substrate and partially exposed to the corresponding side walls; and a transceiver configured to receive a processed version of the one or more RF signals from the RF receiving system and generate data bits based on the processed version of the one or more RF signals.

16. The wireless device of claim 15 wherein the wireless device is a cellular phone.

\* \* \* \* \*